(12) United States Patent
Anderson et al.

(10) Patent No.: US 11,069,790 B2
(45) Date of Patent: Jul. 20, 2021

(54) QUANTUM TUNNELING MATTER-WAVE TRANSISTOR SYSTEM

(71) Applicant: ColdQuanta, Inc., Boulder, CO (US)

(72) Inventors: Dana Zachary Anderson, Boulder, CO (US); Brad Anthony Dinardo, Boulder, CO (US)

(73) Assignees: ColdQuanta, Inc., Boulder, CO (US); The Regents of the University of Colorado, Denver, CO (US)

( * ) Notice: Subject to any disclaimer, the term of this patent is extended or adjusted under 35 U.S.C. 154(b) by 56 days.

(21) Appl. No.: 16/687,193

(22) Filed: Nov. 18, 2019

(65) Prior Publication Data

US 2020/0161446 A1 May 21, 2020

Related U.S. Application Data

(60) Provisional application No. 62/769,868, filed on Nov. 20, 2018.

(51) Int. Cl.
| | |
|---|---|
| *H01L 29/66* | (2006.01) |
| *H01L 29/15* | (2006.01) |
| *H01L 49/00* | (2006.01) |
| *H01L 29/775* | (2006.01) |
| *G06N 10/00* | (2019.01) |

(52) U.S. Cl.
CPC ....... *H01L 29/66439* (2013.01); *G06N 10/00* (2019.01); *H01L 29/15* (2013.01); *H01L 29/66977* (2013.01); *H01L 29/775* (2013.01); *H01L 49/006* (2013.01)

(58) Field of Classification Search
None
See application file for complete search history.

(56) References Cited

U.S. PATENT DOCUMENTS

2018/0107938 A1* 4/2018 Morello ................. G01R 33/60
2020/0395448 A1* 12/2020 Conradson ............ H01L 29/045

* cited by examiner

*Primary Examiner* — Benjamin P Sandvik
(74) *Attorney, Agent, or Firm* — Clifton Leon Anderson

(57) ABSTRACT

The present invention provides an matter-wave transistor in which the flow of particles (e.g., atoms and molecules) through the transistor is a result of resonant tunneling from a source well, through a gate well and into a drain well (as opposed to being a result of collisions, as in a classical atomtronic transistor). The transistor current of matter-wave particles can be controlled as a function of the breadth of resonant tunneling conditions of the gate well. For example, the resonant tunneling conditions of a gate well that does not include a dipole-oscillating Bose-Einstein condensate (DO-BEC) can be broadened by including a DOBEC in the gate well. Similarly, the breadth of resonant tunneling conditions of the gate well can be changed by changing the particle population of a DOBEC in the gate well.

16 Claims, 110 Drawing Sheets

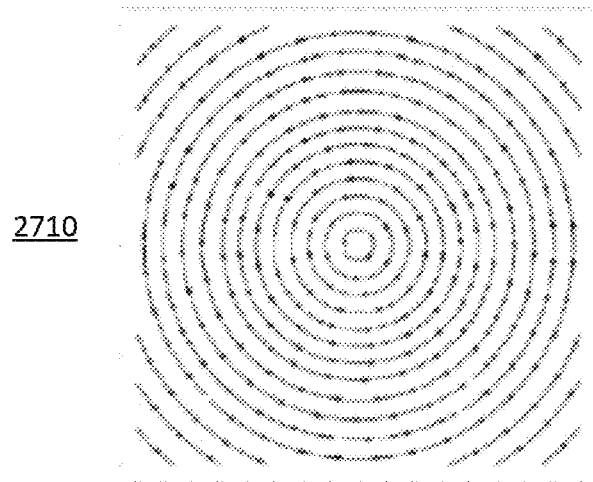
2710    FIG. 27A
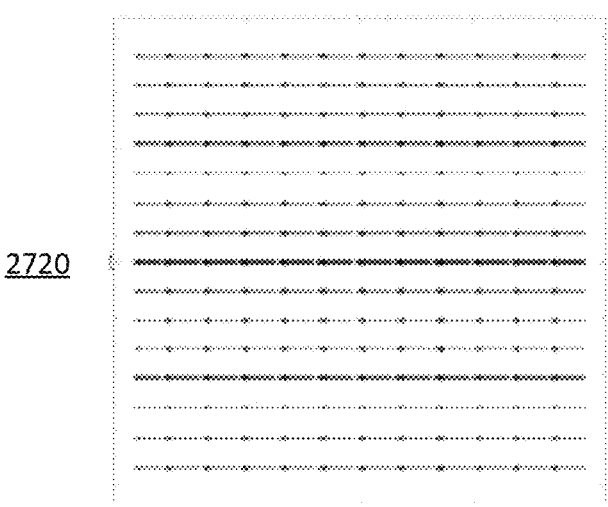
2720    FIG. 27B
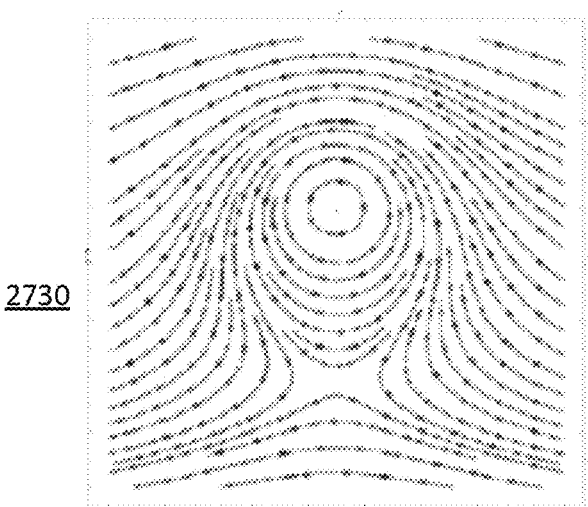
2730    FIG. 27C

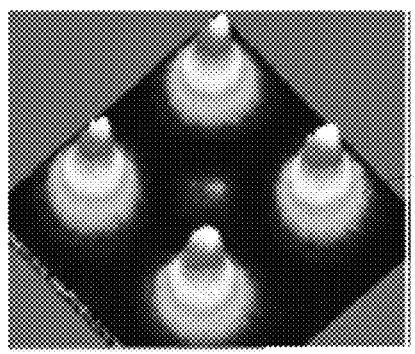
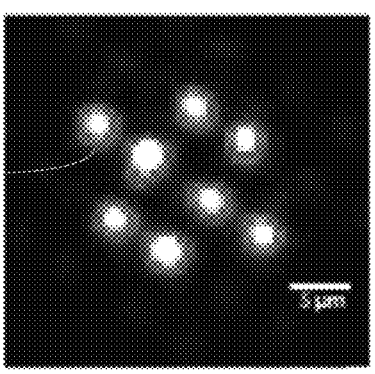
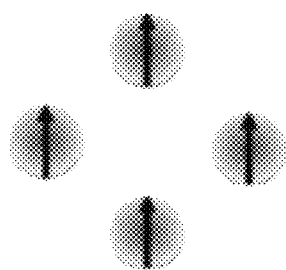
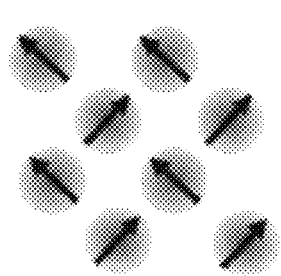
FIG. 39A
FIG. 39C
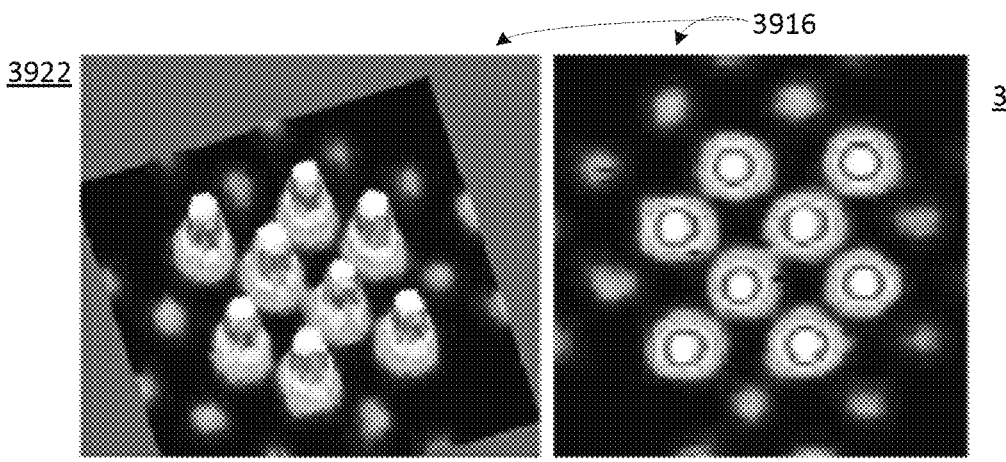
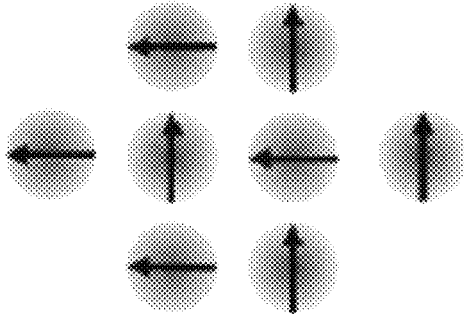
FIG. 39B

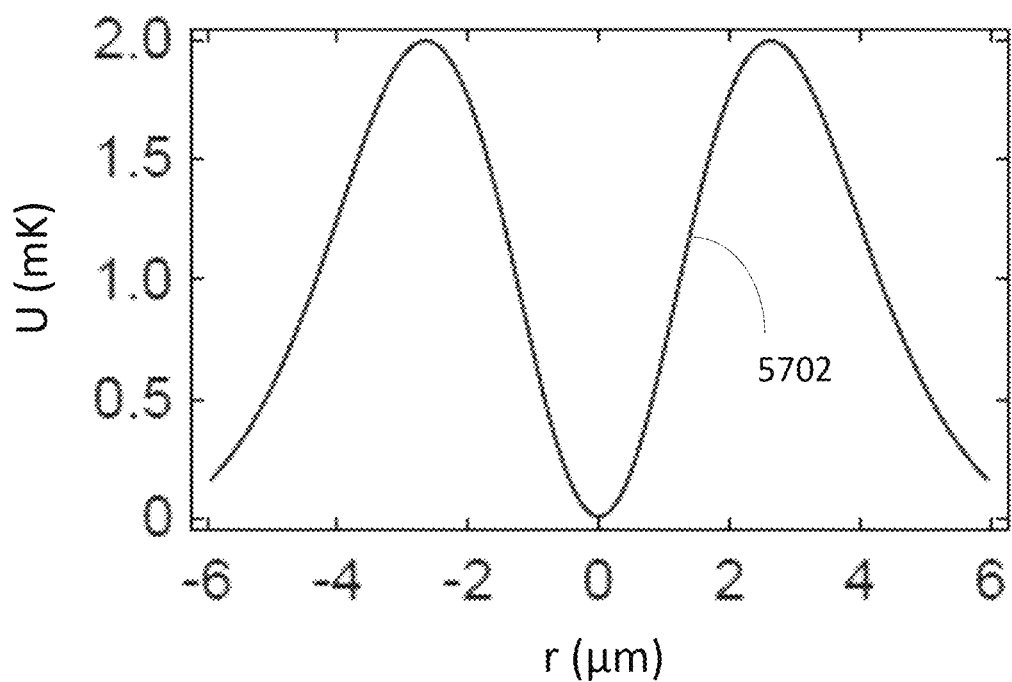
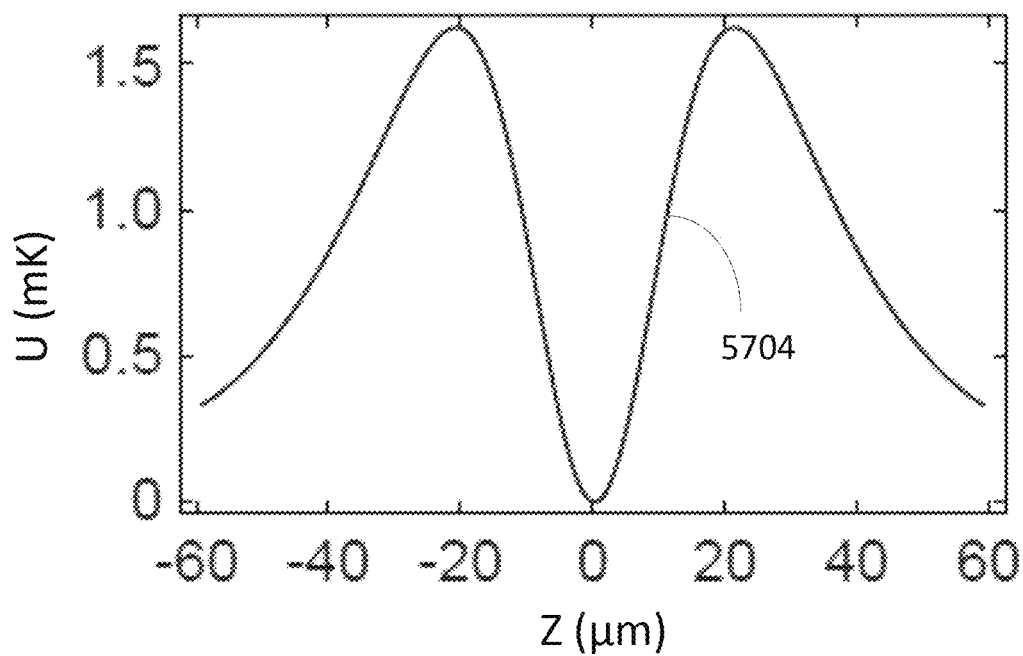
FIG. 57

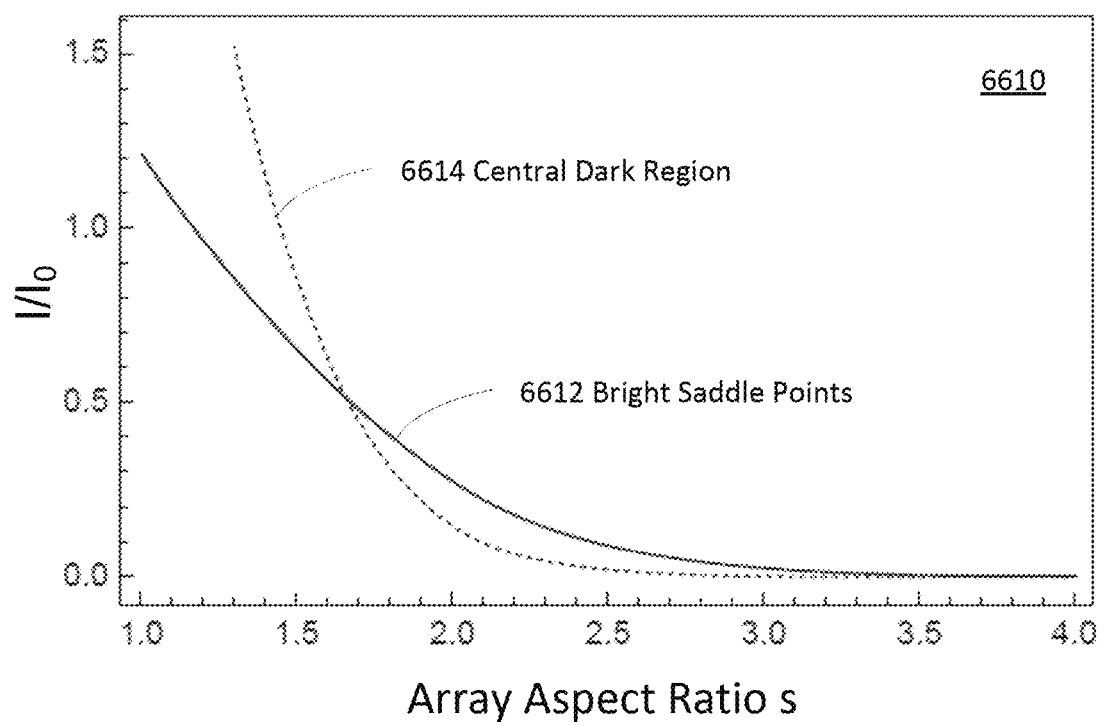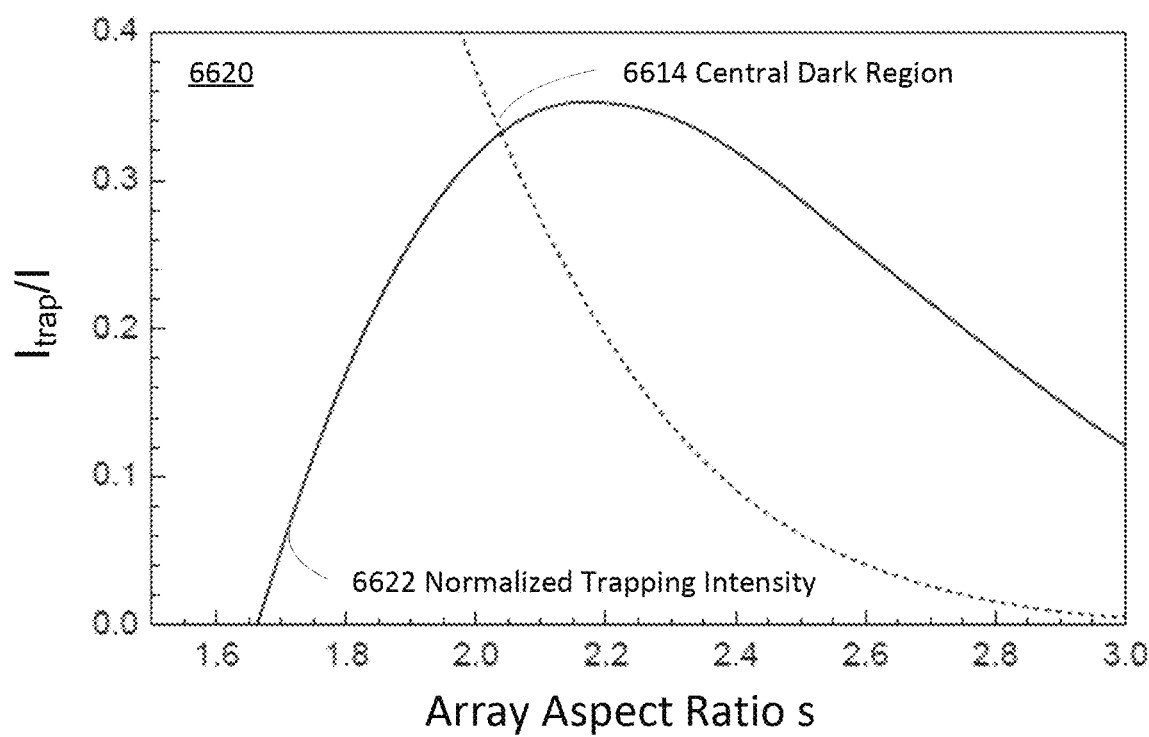
FIG. 66

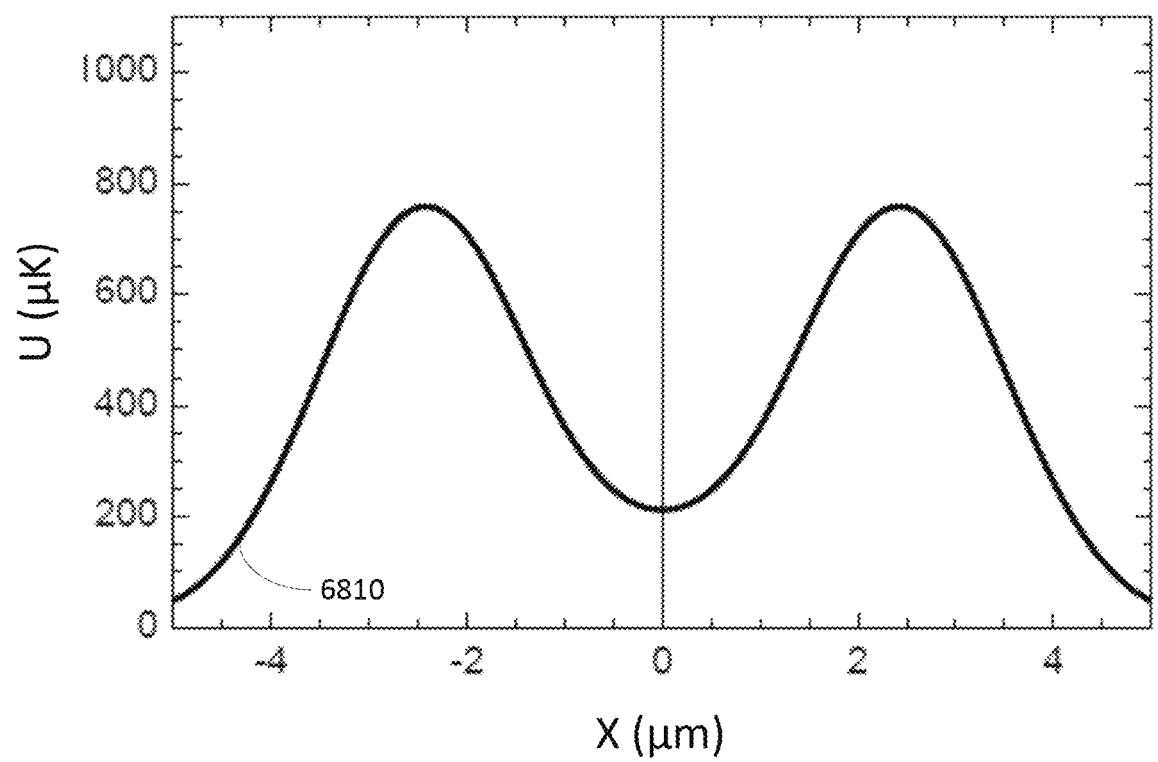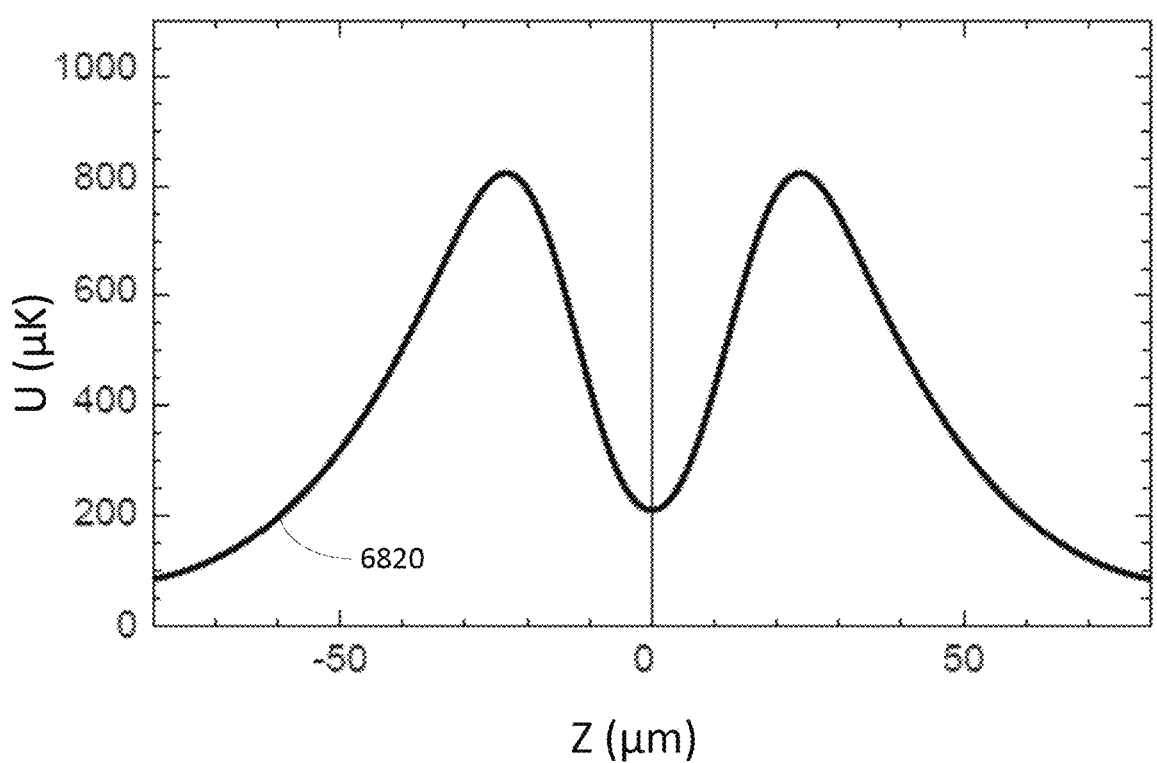
FIG. 68

Photoelectron Counts x $10^3$ per 50 ms

Photoelectron Counts x $10^3$ per 50 ms

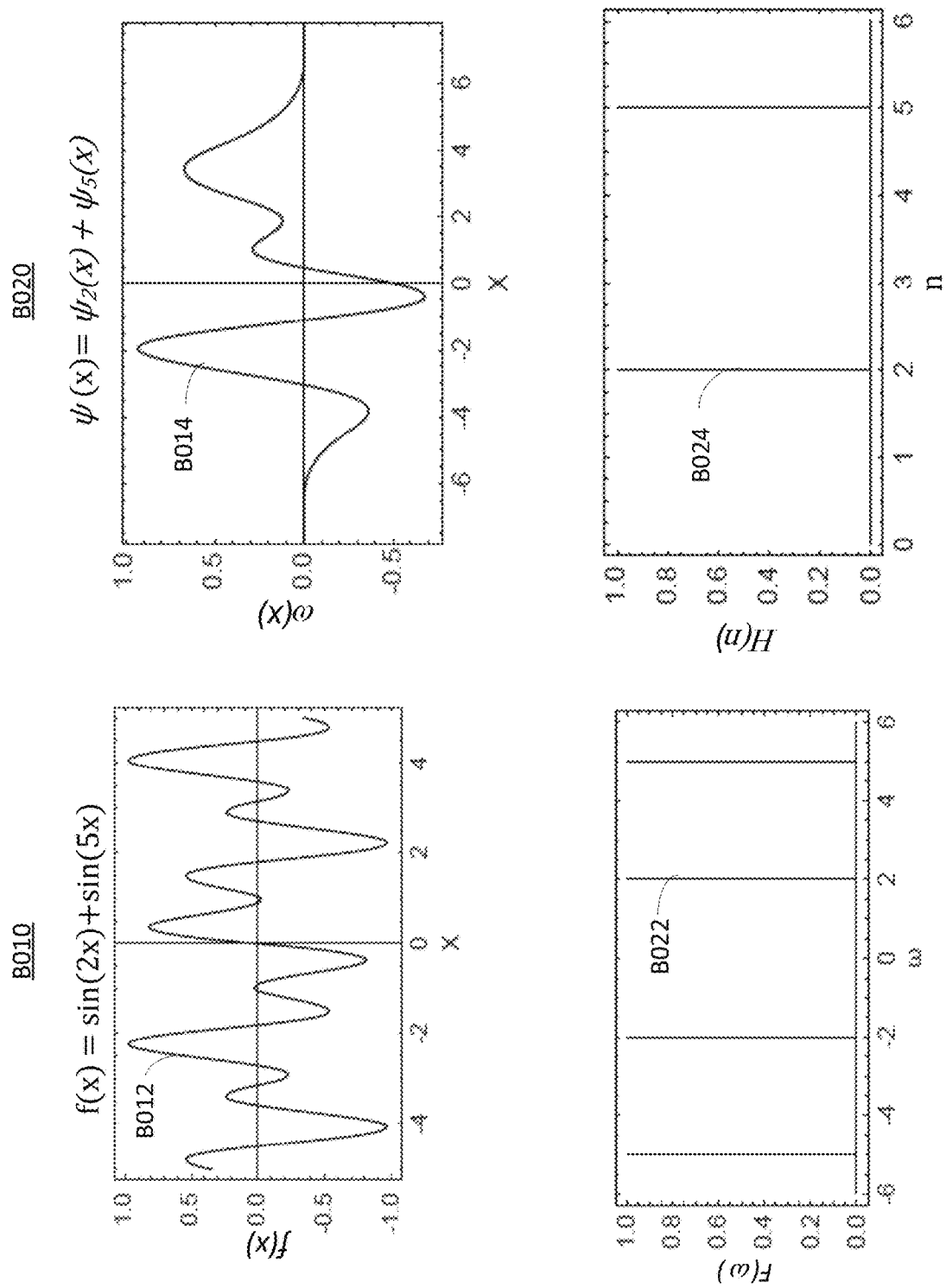

US 11,069,790 B2

QUANTUM TUNNELING MATTER-WAVE TRANSISTOR SYSTEM

BACKGROUND

Atomtronics is an emerging field of ultra-cold atomic physics that focuses on quantum circuits that operate as atom analogues to electrical circuits, where an atom current takes the place of an electron current and the chemical potential takes the place of a voltage. In their design, atomtronic circuits are drastically different from their electronic circuit counterparts, as they involve manipulating ensembles of ultra-cold atoms to flow through a variety of potential energy landscapes, such as optical potentials produced from laser beams and/or harmonic magnetic potentials, e.g., created with atom chips.

The electronic transistor is the fundamental building block of modern electronic devices, and is ubiquitous in modern electronic systems. An electronic transistor is a semiconductor device used to amplify or electronic signals and electrical power. In a field effect transistor (FET), an electric field (or lack thereof) at a transistor gate can be used to control a current from a source terminal to a drain terminal.

An analogous atomtronic transistor can include a source (chemical potential) well, a gate well, and a drain well. The source well and the gate well are separated by a source-gate barrier, while the gate is separated from the drain by a gate-drain barrier. Atoms with thermal energy in excess of the chemical potentials associated with the source-gate barrier and the gate-drain barrier can flow from source to drain.

BRIEF DESCRIPTION OF THE DRAWINGS

Most of the drawings herein have counterparts in the form of illustrations in the 2018 Ph.D. Thesis of Brad A. Dinardo, "Single Atom Delivery into a Bottle Beam Trap Using an Optical Conveyor Belt and an Ultracold Gain Mechanism in a Matterwave Transistor Oscillator", incorporated by reference herein. This document is available online at https://scholar.colorado.edu/phys_gradetds/. Accordingly, in the listing below, illustration numbers in parentheses following figure numbers identify the illustration number in the thesis that corresponds to the referenced figure in this application. Similarly, formula numbers in parenthesis following formula numbers for the application are indicative of the formulas in the thesis.

MOT chamber of the hex-cell vacuum system of FIG. 19.

FIG. 27A (3.6C) is a two-dimensional cross section of the magnetic field lines produced by running current through one guide wire. FIG. 27B (3.6D) is a two-dimensional cross section of a uniform bias field oriented purely in the y-direction. FIG. 27C (3.6E) is a two-dimensional cross section of a summation of the guide wire field of FIG. 27A and the y-bias field of FIG. 27B.

FIG. 39A (4.5a) includes intensity and linear polarization diagrams of for an array of four identical Gaussian beams taken after a single Gaussian beam passes through a diffractive beam splitter. FIG. 39B (4.5b) includes intensity and polarization diagrams for the array after the four identical Gaussians beams of FIG. 39A pass through a calcite crystal and are focused by a demagnifying telescope. FIG. 39C (4.5c) is an intensity and polarization plot of the array of FIG. 39B after focusing with a demagnifying telescope.

FIG. 57 (4.21) is a pair of graphs showing numerically calculated radial (on the left) and longitudinal (on the right) trap depths produced by the crossed vortex bottle-beam trap.

FIG. 59B 423*b* is a graph showing the size of the atom clouds at different TOF expansion times when extra polarization gradient cooling (PGC) (circles) is applied compared to no PGC (squares).

FIG. 66 (5.4) is a pair of graphs including plots of normalized trapping intensity at points in a Gaussian bottle-beam array.

FIG. 68 (5.6) is a pair of graphs showing optical trapping potential in the radial (upper graph) and axial (lower graph) directions.

In FIG. 93A, the pair of vertically oriented MOT beams intersect in an X shape 15 mm below the bottom surface of the atom chip. In FIG. 93B, a third set of MOT beams is oriented normal to the X-shape beams.

FIG. 97A is of a Bose-Einstein condensate with approximately 6,000 atoms at a temperature of 50 nanoKelvin (nK) loaded into the harmonic magnetic potential. FIG. 97B shows the atoms confined into a transistor source well as a result of sweeping the source-gate barrier from the longitudinal edge of the magnetic potential. FIG. 97C corresponds to the source-gate barrier lowered to its desired height of 30 kHz and the gate-drain barrier being raised to 31 kHz. FIG. 97D shows a source-well atom ensemble after raising the source-well chemical potential.

FIG. 110A (9.1) and 110B are a set of plots for comparing a Hermite-Gaussian transform with a Fourier transform. The upper plot of FIG. 110A is a function $f(x)$ composed of sine waves with different frequencies. The lower plot of FIG. 110 A is the Fourier transform showing what frequencies are present in $f(x)$. The upper plot of FIG. 110B is a function $\psi(x)$ that is comprised of a linear combination of harmonic oscillator functions. The lower plot of FIG. 110B is the Hermite-Gaussian transform of $\psi(x)$ which shows what harmonic modes are present in the function $\psi(x)$.

DETAILED DESCRIPTION

The present invention provides a quantum tunneling matterwave transistor in which the flow of particles (e.g., atoms and molecules) through the transistor is a result of resonant tunneling from a source well, through a gate well and into a drain well (as opposed to being a result of collisions, as in a classical atomtronic transistor). The transistor current of matterwave particles can be controlled as a function of the breadth of resonant tunneling conditions of the gate well. For example, the resonant tunneling conditions of a gate well that does not include a dipole-oscillating Bose-Einstein condensate (DOBEC) can be broadened by including a DOBEC in the gate well. Similarly, the breadth of resonant tunneling conditions of the gate well can be changed by changing the particle population of a DOBEC in the gate well.

Figure 1:
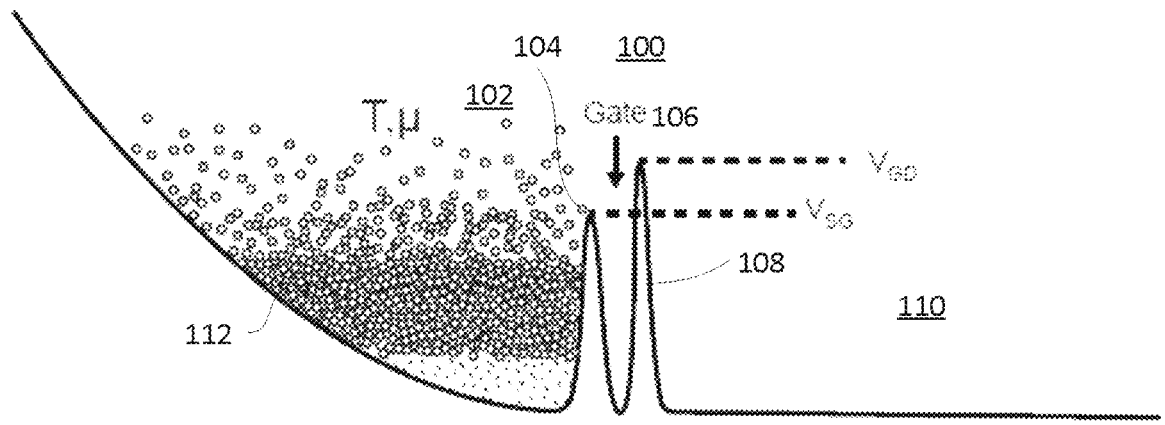
FIG. 1 (7.3a) is a schematic elevational view of a triple-well matter-wave transistor with a source well populated with matter-wave particles.

As shown in FIG. 1, a triple-well matter-wave transistor 100 includes a source well 102, a source-gate barrier 104, a gate well 106, a gate-drain barrier 108, and a drain well 110. Source well 102 and drain well 110 are separated from the gate well 106 by repulsive Gaussian barriers 104 and 108. The respective peak chemical potentials and a slightly anharmonic spacing of the source-gate barrier 104 and gate-drain barrier 108 help trap and confine in the gate well matter-wave particles 112 (e.g., atoms) from which a DOBEC is formed. The particles 112 in source well 102 are at a chemical potential p and a temperature T.

Figure 2A:
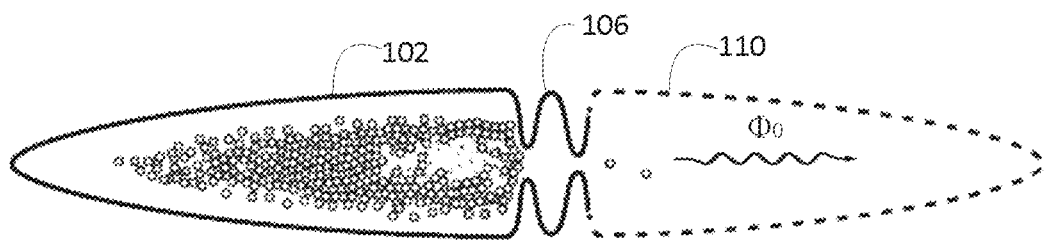
FIG. 2A (7.3b) is a schematic plan view of the matter-wave transistor of FIG. 1 with a gate-well that is empty in that it does not include a dipole-oscillating Bose-Einstein condensate (DOBEC) resulting in a relatively small source-to-drain matter-wave flux.
Figure 2B:
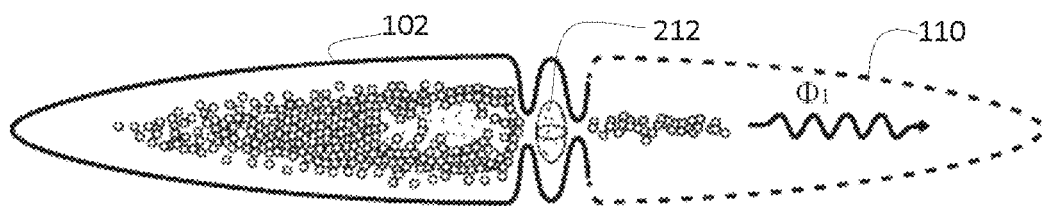
FIG. 2B (7.3c) is a schematic plan view of the matter-wave transistor of FIG. 2A but with the gate well populated with a DOBEC resulting in a relatively large source-to-drain matter-wave flux.
Figure 3A:
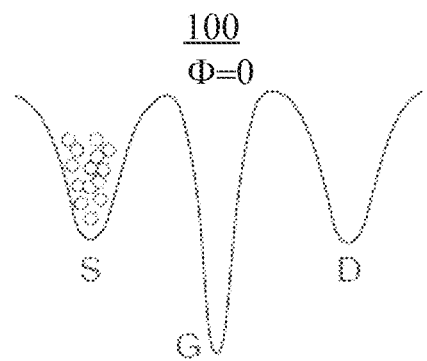
FIG. 3A (7.1a) is a schematic elevational view of a matter-wave transistor with a populated source-well, an empty (DOBEC-less) gate well, and zero source-drain matter-wave flux.

As a comparison of FIGS. 2A and 2B indicates, the source-to-drain matter-wave flux $\Phi_1$ when a DOBEC 212 occupies gate well 106 is much greater than the matter-wave flux $\Phi_0$ is when gate well is empty, that is, not occupied by a DOBEC. In some scenarios, when the gate well is empty, the source-to-drain matter-wave flux is zero ($\Phi$=0), as shown in FIG. 3A. As a comparison of FIGS. 3B and 3C indicates, the source-to-drain matter-wave flux can correlate positively with an increasing matter-wave particle count for the DOBEC.

Herein, ultra-cold means temperatures at or below 120 nanoKelvin (nk). In one embodiment, the mean temperature of the source well particles is initially 78 nK and rises to 109 nK once particles begin to flow into the gate well. The source well temperature then starts cooling as particles flow into the drain well. In this embodiment, the flux is not a Bose-Einstein condensate (BEC). In another embodiment, the initial temperature of the source well is 54 nK and the resulting flux is or includes a BEC.

Figure 4:
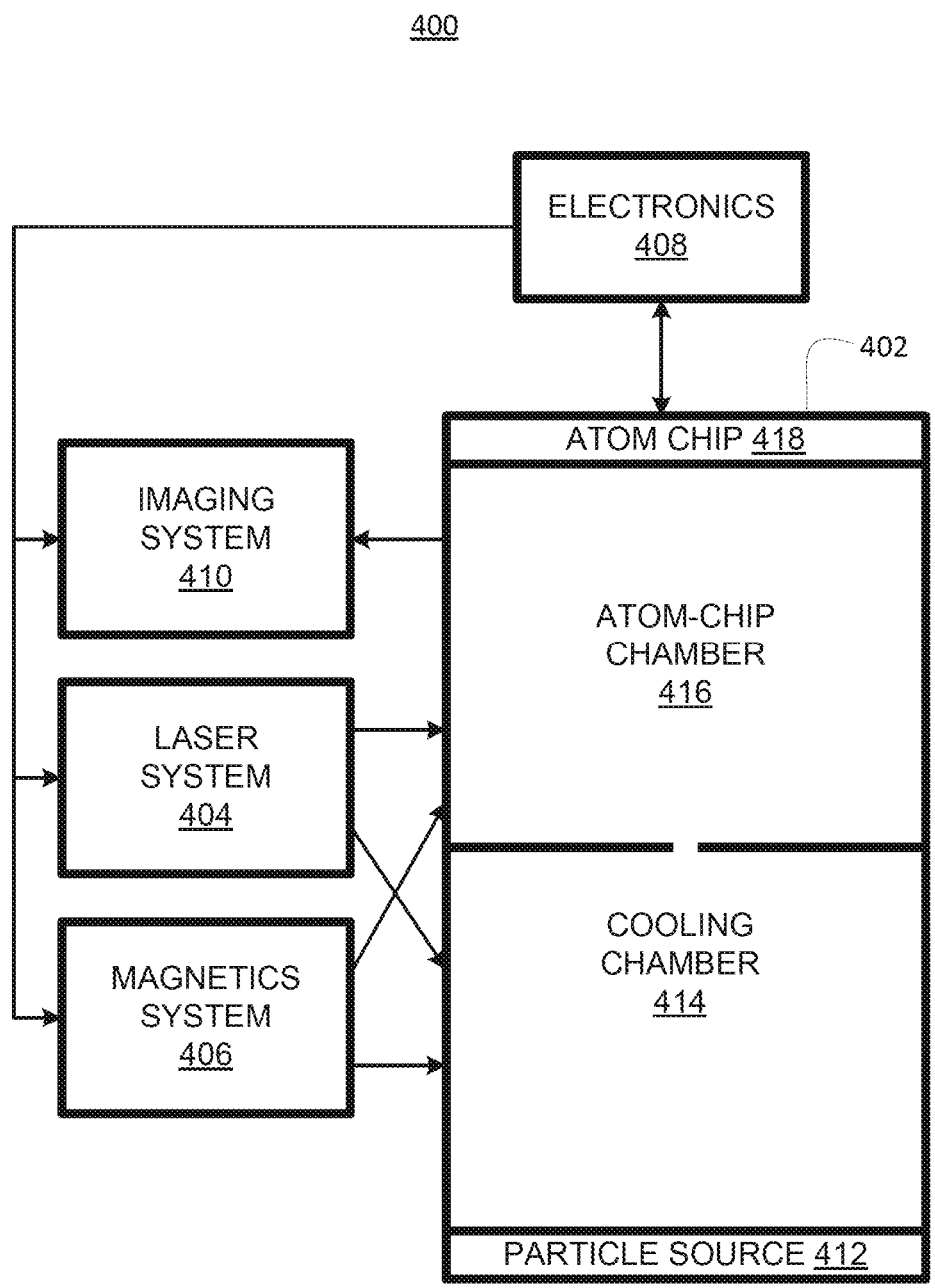
FIG. 4 is a schematic diagram of a matter-wave transistor system for forming and operating the matter-wave transistors of FIGS. 1 through 3C.

The wells and barriers of transistor 100 are formed using: 1) optical potentials produced from laser beams; and 2) harmonic magnetic potentials created using an atom chip. As shown in FIG. 4, an ultra-cold physics system 400 includes a vacuum cell 402, a laser system 404, a magnetics system 406, electronics 408, and an imaging system 410. Vacuum cell 402 includes a particle source 412, a cooling chamber 414, and an atom chip 416 (which serves to manipulate and sense particles as well as a wall of vacuum cell 402).

Particle source 412 introduces atoms or other particles into cooling chamber. Laser system 404 and magnetic system 406 cooperate to produce two-dimensional and three-dimensional magneto-optical traps used to cool the atoms in cooling chamber 414. Electronics 410 provides radio-frequency signals used to modulate laser beams to implement evaporative cooling in the 3D MOT to achieve ultra-cold temperatures. Laser system 404 cooperates with harmonic magnetic potentials generated by atom chip 418 to produce the chemical potentials that define transistor 100. Electronics 408 can modulate laser beams so that the positions of the source-gate and gate-drain barriers can be adjusted and varied.

Figure 5:
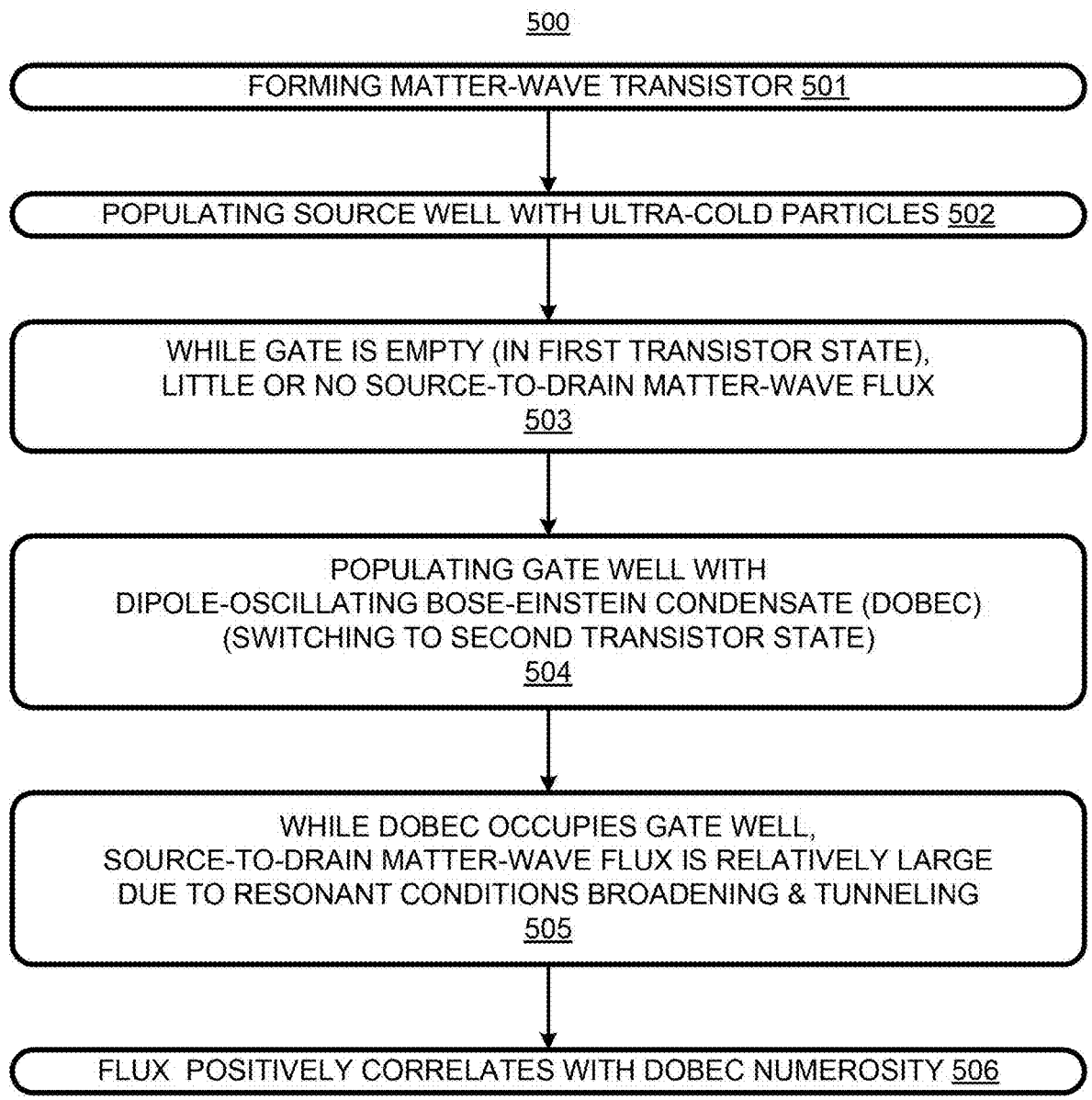
FIG. 5 is a flow chart of a matter-wave transistor process applicable to the matter-wave transistors of FIGS. 1 through 3A.

A matter-wave transistor process 500 is flow charted in FIG. 5. At 501, a matter-wave transistor is formed such that a DOBEC can be confined to the gate well. Thus, the gate-drain barrier is at a higher potential (e.g., 31 Hz) than the potential characterized the source-gate barrier. The spacing between the barriers is selected so that the oscillator potential is anharmonic. This anharmonicity establishes a degeneracy between transitions between first and second gate-well eigenstate transitions, the first transitions being between a ground eigenstate and a first excited eigenstate, the second transistors being between highest pair of energy eigenstates.

At 502, in effect, the source well is populated with ultra-cold particles. In practice, the ultra-cold particles can be loaded before the source-drain barrier is instantiated. The source-drain barrier can then be formed over the eventual position of the gate well, the gate-drain barrier, or the drain well. The source-gate drain barrier is then swept into its final position, moving particles on its way so that they end up densely packed against the source-gate barrier by the time it reaches its eventual position.

At 503, while the transistor is in a first state in which the gate well is empty, that is, does not contain a DOBEC, the source-to-drain matter-wave flux is at a relatively low level, e.g., zero or relatively small.

Figure 6:
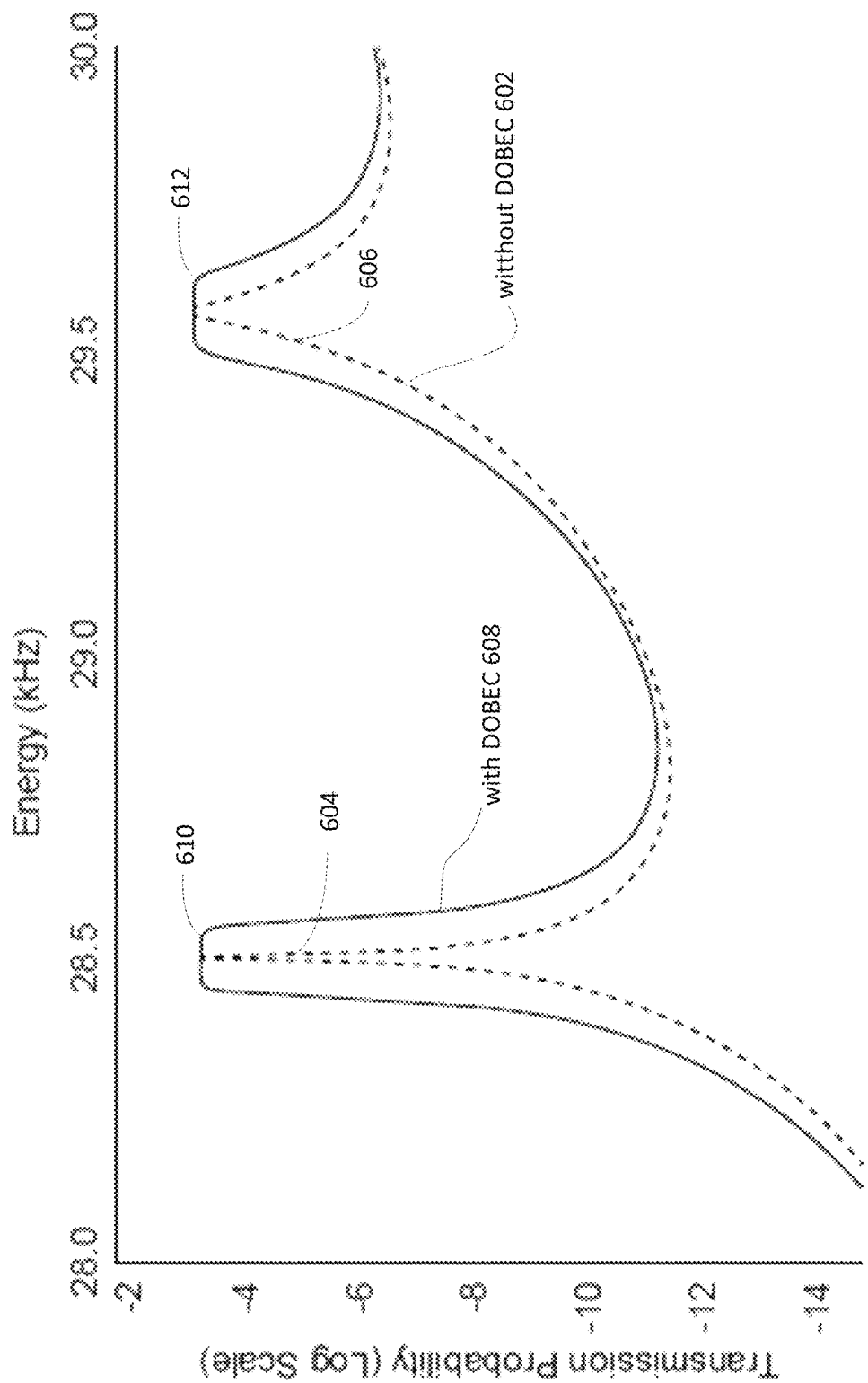
FIG. 6 (7.11a) is a graph of transmission probability as a function of energy demonstrating how the presence of a DOBEC in a gate well broadens the resonant conditions for tunneling.

At 504, the transistor is switched to a second state in which the gate well is populated with a DOBEC. Due to the degeneracy between eigenstate transitions, this DOBEC has the effect of broadening the resonance boundary conditions of the gate, increasing the likelihood of source-particle energies that can tunnel into the gate well via the source-drain barrier and tunnel out of the gate well and into the drain well via the gate-drain barrier. This increase in likelihood is represented in the graph of FIG. 6 which compares transmission probabilities as a function of energy with and without the presence of a DOBEC in the gate well; in FIG. 6, the "without DOBEC" curve 602 has narrower peaks 604 and 606 than does "with DOBEC" curve 608, which has relatively broad peaks 610 and 612. At 505, in response to the DOBEC, the source-to-drain flux increases so that it is relatively large. At least half of the increase is due to matter-wave particles tunneling through the source-gate barrier.

At 506, changes in DOBEC numerosity (number of particles constituting the DOBEC) positively correlate with changes in flux. In other words, flux positively correlates with DOBEC numerosity. Thus, the addition of particles to the DOBEC results in increased flux.

This description details: 1) transporting and loading single neutral cesium atoms into optical bottle beam traps in order to facilitate a continuously operating quantum computer; and 2) developing a purely quantum thermodynamic model and experiment for a matter-wave transistor oscillator that demonstrates the existence of a matter-wave gain mechanism.

In the first section below, a single atom can be loaded from a reservoir into a blue-detuned crossed vortex bottle beam trap using a dynamic one-dimensional optical lattice. The lattice beams are frequency chirped using acousto-optic modulators, which causes the lattice to move along its axial direction and behave like an optical conveyor belt. A stationary lattice is initially loaded with approximately 6000 atoms from a reservoir, and the conveyor belt transports them 1.1 millimeters (mm) from the reservoir to a bottle beam trap, where a single atom is loaded via light-assisted collisions. Photon counting data confirm that an atom can be delivered and loaded into the bottle beam trap 13.1% of the time.

Further below, the second section addresses the field of atomtronics and aims to demonstrate the existence of a matterwave gain mechanism in an atomtronic transistor oscillator for the eventual use in ultracold atomic experiments. An ultracold gain mechanism for a matter-wave transistor oscillator is described. The description starts with a well-established semi-classical model of an atomtronic transistor and model the system with a purely quantum mechanical formalism. The quantum model predicts dynamics differently from the semi-classical results only when the atoms owing through the transistor oscillator have sufficiently low enough temperatures such that the motional state of a DOBEC, placed in the transistor itself, couples atom transitions between high lying transistor energy eigenstates. In this ultra-cold temperature regime, interesting physics not observed in the semi-classical theory or experiments includes the presence of a gain mechanism that broadens the resonant tunneling conditions of a matter-wave current flowing from the source-well, through the gate-well, and into the drain-well. Experiments indicate that the transistor gain mechanism is coherent and increases the range of matter-wave energies (and by extension, momenta) that flow into the transistor drain-well.

First proposed by Richard Feynman at Caltech in 1959, quantum computing is a general, all-encompassing term that describes storing information in a two-state quantum system in order to perform algorithms analogous to how classical computers perform algorithms using binary transistor states, or bits. The two-state quantum system, called a qubit, could be the spin of an atomic ground state, a ground state and Rydberg state atom pair, electronic states of an ion, a Josephson junction, or a SQUID to name a few examples. Irrespective of the type of qubit, the ambition of quantum computing is to perform algorithms exponentially faster than classical computers. A major milestone in the field was achieved in 1995, when quantum computing was first demonstrated by using a single trapped ion to serve as a qubit to perform quantum logic. Since then, multi-qubit quantum logic gate operations have been performed experimentally with multiple trapped ions, numerous superconductors, collections of photonic qubits, and neutral Rydberg atom pairs. Just like a classical computer, the number of qubits in a quantum computer directly influences its productivity. Most recently, using superconducting qubits, IBM has steadily increased their commercially available quantum computer from two qubits in 2016, to sixteen qubits in 2017, and finally to using a 20-qubit register in 2018.

Further progress calls for increasing numbers of qubits. Large scale quantum computers that would compute with tens to hundreds of qubits would exceed the capabilities of classical computers by being able to solve integer factorization, such as using Shor's algorithm, or inverting functions by using Grover's algorithm, faster than any classical computer. While experiments with trapped ions and superconducting qubits have already succeeded in realizing high fidelity many-qubit quantum gates, using an array of neutral atom qubits also remains an attractive and viable solution to scaling a qubit register to an arbitrarily large amount.

Figure 7:
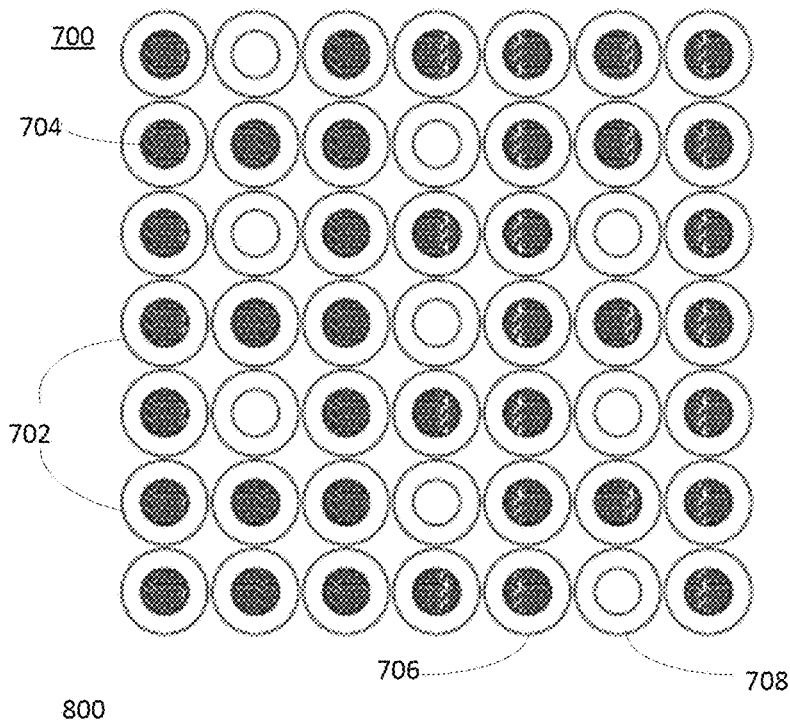
FIG. 7 (1.1a) is a schematic view of an array of optical traps for confining neutral atoms to a 7×7 qubit array.

As shown in FIG. 7 (1.1), a neutral-atom qubit array 700 features a 7×7 array of optical traps 702, with equal separation between neighboring traps. Each trap is capable of confining a single neutral atom qubit 704. As shown in FIG. 7, some traps 706 are occupied by trapped qubits 704, while other traps 708 are empty.

Herein, qubit gates are based on exciting neutral atoms to Rydberg states. Using neutral atoms, one can theoretically scale the amount of qubits N to as high as one desires with very minimal crosstalk between the remaining N−1 qubits. This is because neutral atoms differ from ions with respect to their state dependent interaction properties. This is evident in the graph 800 of FIG. 8 (1.2), which shows the two particle interaction strength as a function of separation distance r for two ions 802, two neutral ground state rubidium atoms 804, and two rubidium atoms excited to Rydberg state at the 100s level 806.

First, ions separated by a distance r interact predominantly with the 1/r Coulomb potential. Because the Coulomb potential only decreases with a single power of r, it remains strongly interacting, even at long distances, which are great attributes for qubits. The drawback is the Coulomb interaction is always on, making it difficult to create an arbitrarily large register of ion qubits. Next, the interaction between two ground state neutral atoms is dominated by the $1/r^6$ van der Waals potential at short distances and by the $1/r^3$ magnetic dipole-dipole interaction at large distances. With a separation of 10 microns (m), this $1/r^6$ ground state interaction is very weak at approximately $U/\hbar \approx 10^{-5}$ Hz in frequency units. However, at this same separation, two Rydberg state atoms have a very strong $r^3$ electric dipole-dipole interaction of approximately $10^7$ Hz.

Figure 9:
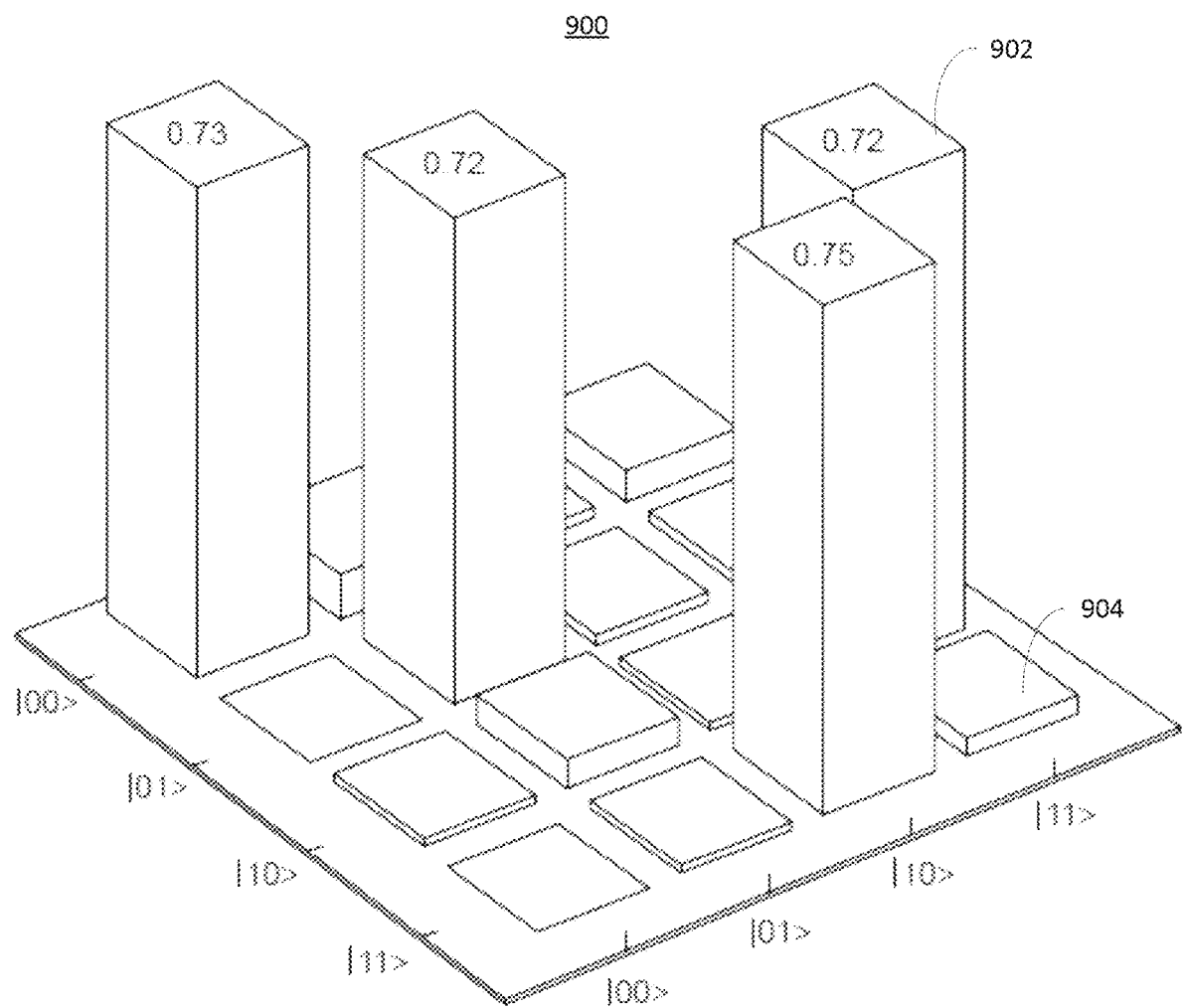
FIG. 9 (1.2b) is a graphic truth table for a neutral-atom CNOT gate.

This result gives the core principle of operation of the neutral atom qubit array: selectively turning on the Rydberg interaction (by exciting an atom to such a state) allows one to selectively increase an atom-atom interaction by 12 orders of magnitude. The ability to control the interaction (2 Here, long distances refers to any atom separation r 30 nm.) strength by a factor of $10^{12}$ over a wide spatial range (e.g., >30 nanometers (nm)) appears to be unique to the Rydberg system and makes an array of Rydberg-mediated quantum gates a viable solution to a many-qubit quantum computer. In fact, recently, a controlled-NOT (CNOT) gate has been demonstrated between two Rydberg state qubits. The measured truth table 900 for this CNOT gate is shown in FIG. 9 (1.2b). In truth table 900, the four large (tall) measured values corresponds to "true" outcomes, while the twelve small (short) values correspond to "false" outcomes.

A drawback of using neutral atom qubits, as opposed to ion qubits and superconducting qubits, is that neutral atoms must be held in optical traps enclosed inside ultra-high vacuum chambers. This results in unavoidable atom losses due to finite lifetimes on all of the neutral atom qubits trapped in the array shown in FIG. 7. Atom loss poses a serious problem since finite trapping lifetimes endangers the ability of using an array of neutral atom qubits to perform arbitrarily long quantum algorithms. The solution to this problem is to reload any array traps that lose a qubit (due to background gas collisions) with a new, pre-cooled atom from some distant cold atom reservoir. Providing or transporting a precooled atom from some reservoir has been accomplished in the prior art. However, the prior-art transports take place in large vacuum systems where optical isolation and stray field isolation throughout the chamber occurs easier than in a very compact vacuum cell. Moreover, these transports all involve loading single atoms into a physically visible object (such as a cavity) as opposed to an infrared optical trap, whose location cannot be assumed a priori.

A solution to atom loss includes transporting Atoms to Reload Distant Unoccupied Array Optical Traps. Site selective atom reloading of a qubit array can be accomplished by using a dynamic, one-dimensional optical lattice (also called an optical conveyor belt) to deliver a single atom to an unoccupied array site. The concept of such an atom reloading scheme is shown in FIG. 10 (1.3).

Moreover, the atom transport system can be scalable such that it is capable of addressing and delivering to an array of sites and not just to a single site. Accordingly, the atom transport system must be "steerable" in that it can deliver an atom to one site and then be repositioned to deliver an atom to another array site. Finally, the qubit array in the AQuA-49 project is located in a miniaturized and portable vacuum chamber which makes optical isolation an intricate problem. Any stray light from the atom transportation lasers can destroy the qubit array coherence and will disrupt any ongoing quantum computations. Thus, to transport atoms from a reservoir to an empty qubit array site without disrupting any occupied array sites, the issue of optical isolation presents a compelling problem.

Figure 10:
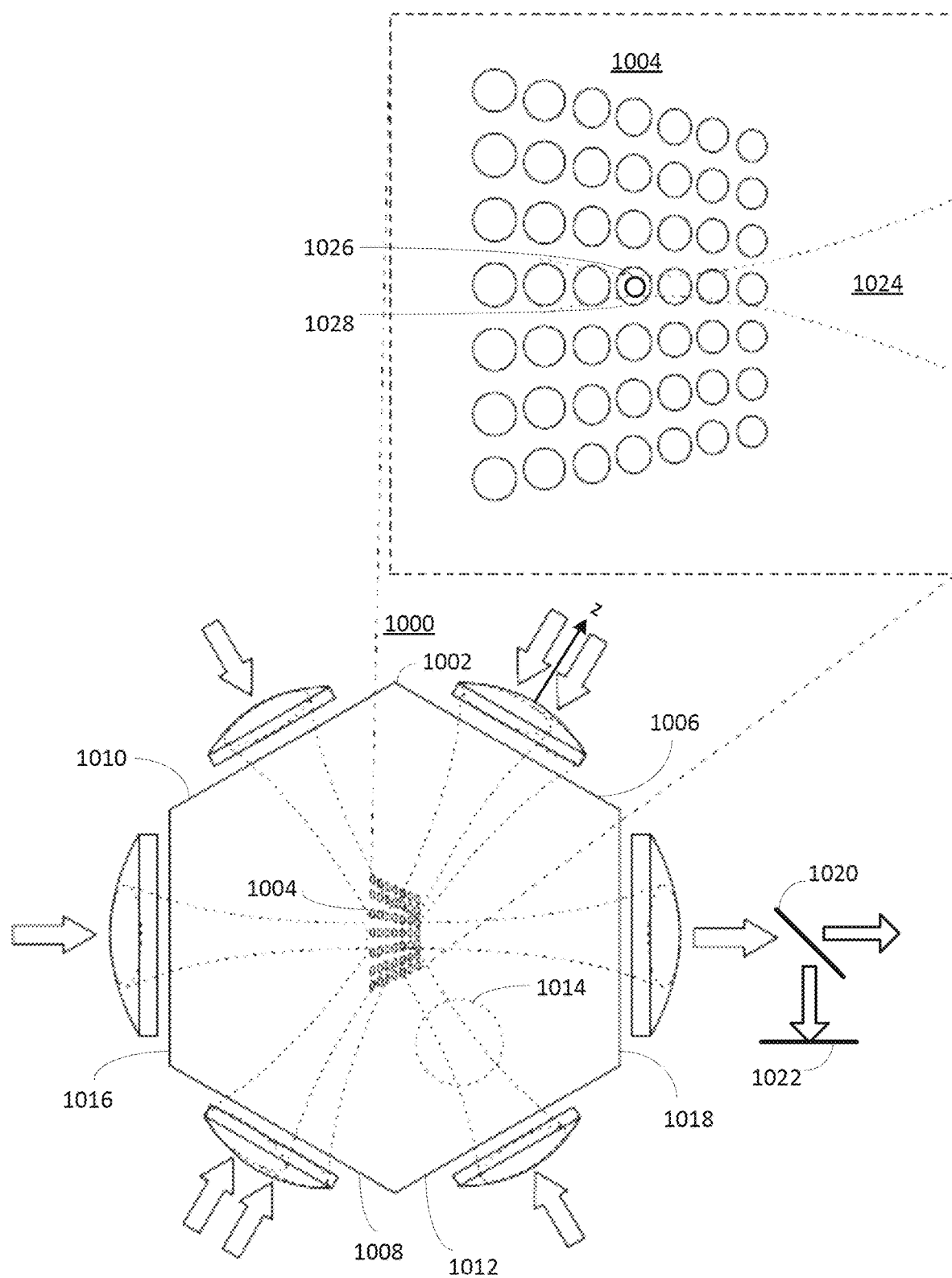
FIG. 10 (1.3) is an illustration of a system for reloading atoms missing from a qubit array.

A system 1000 providing for such an atom reloading is shown in FIG. 10.

System 1000 includes a vacuum cell 1002 with a hexagonal cross section. A qubit array 1004 is centrally located within the cell. A face 1006 is used for transmitting laser beams used for readout, cooling, optical pumping, AC Stark compensation, Raman lasers, and excitation lasers used for Rydberg atoms. An opposing face 1008 is used for counter-propagating beams used for readout, cooling, and Rydberg excitation. Faces 1010 and 1012 are used to admit counter-propagating beams that interfere to produce an optical conveyor belt for transporting ultra-cold atoms from a reservoir 1014 to vacated trap sites of array 1004. Face 1016 is used to admit 532 nm laser light for forming bottle beams to help guide transported atoms into their target trap sites. Face 1018 is used as an exit for readout of array 1004. A dichroic mirror 1020, external to cell 1002, reflects the light used to form the bottle beams to remove that light from the readout and direct it to a 532 nm beam dump 1022. As shown in the detail to the right in FIG. 10, the bottle beam 1024 helps guide an atom 1026 to its respective target site 1028. A magnetic field is directed in the z direction.

System 1000, FIG. 10, provides for manipulating and imaging cold and ultra-cold atoms. Filling a single vacancy in qubit array 1004 calls for cooling, for example, cesium 133 ($^{133}$Cs) atoms to a temperature of approximately 15 μK and confining them in optical dipole traps. Application of the matter-wave transistor 100, FIG. 1, calls for trapping even colder atoms of rubidium 87 ($^{87}$Rb) in magnetic potentials and rapidly condensing them to a Bose-Einstein condensate with a temperature of about 50 nK. Remarkably, the atoms used in our experiments begin at a considerably higher temperature of 300 K, meaning the atoms for our experiment must be cooled by as much as twelve orders of magnitude. Thus, producing any type of successful results relies on our ability to efficiently cool and trap atoms in a compact vacuum apparatus. Therefore, a brief overview on the fundamental principles involved in laser cooling and trapping techniques is presented.

Starting from the Hamiltonian of a two-level atom interacting with a laser field leads to forces that give rise to optical dipole trapping, magneto-optical trapping, and polarization gradient cooling; all of which are absolutely essential to the experiments in this dissertation and can cool an initially room temperature ensemble of 10 atoms to about 10 to 20 μK in about one second. The resulting pre-cooled atoms are subsequently trapped in magnetic potentials that are produced on an atom chip, which allows further cooling with forced radio-frequency evaporation to produce a Bose-Einstein condensate with a temperature as low as 50 nK.

Consider a two-level atom with a ground state |g⟩ and an excited state |e⟩, with energies $E_g$ and $E_e$, respectively. By placing the atom in an oscillating electric field E produced by a laser beam with frequency) the atoms will gain an induced electric dipole moment $-\hat{d}$. In such a configuration, the atom experiences an energy shift given by the interaction Hamiltonian $$H' = -d \cdot E \qquad (1)(2.1)$$

Because H' is a perturbation to the energy of the atom, the associated change in the atom's ground state energy $E_g$ is given by standard perturbation theory as $$\Delta E_g = \sum_{e \neq g} \frac{|\langle e|H'|g\rangle|^2}{E_e - E_g} \qquad (2)(2.2)$$

$$= \langle g|\hat{d} \cdot E|e\rangle \underbrace{\frac{1}{E_e - E_g + \hbar\omega}}_{\text{absorption}} \langle e|\hat{d} \cdot E|g\rangle +$$

$$\langle g|\hat{d} \cdot E|e\rangle \underbrace{\frac{1}{E_e - E_g - \hbar\omega}}_{\text{emission}} \langle e|\hat{d} \cdot E|g\rangle$$

where the first term is the energy shift due to the atom absorbing a photon of energy $\hbar\omega$ from the laser and the second term represents the energy change due to the atom emitting a photon of energy $\hbar\omega$. In both the single atom loading and transistor oscillator experiments described in this dissertation, the cooling laser frequency $\omega$ is very close to resonance. That is $E_e - E \approx \hbar\omega$. Thus, the absorption contribution to the ground state energy shift (equation 2) is negligible compared to the emission contribution. Using this approximation, the ground state energy shift for an atom in the laser field can be approximated as $$\Delta E_g \approx \langle g|\hat{d} \cdot E|e\rangle \frac{1}{E_e - E_g - \hbar\omega} \langle e|\hat{d} \cdot E|g\rangle = \qquad (3)(2.3)$$

$$\frac{|\langle g|\hat{d} \cdot E|e\rangle|^2}{E_e - E_g - \hbar\omega} = \frac{|\langle g|\hat{d} \cdot \hat{\epsilon}|e\rangle|^2}{E_e - E_g - \hbar\omega} E^2$$

where $\hat{\epsilon}$ is a unit vector indicating the direction of the electric field with magnitude E produced by the laser.

The ground state energy shift (equation 3) can also be examined using classical electrodynamics. Using that the induced dipole moment is proportional to the electric field by means of the atom polarizability, the shift to the ground state energy of the atom in the laser beam can also be expressed as $$\Delta E_g = -\hat{d} \int dE = -\alpha(\omega) \int E \cdot dE \qquad (4)(2.4)$$

$$= -\frac{1}{2}\alpha(\omega) E^2$$

where the relation $\hat{d} = \alpha(\omega) E$ was used with the atomic polarizability $\alpha(\omega)$) defined as a function of the frequency $\omega$ of the laser electric field E. By equating equations 3 and 4, one finds that the atomic polarizability for a two-level atom in the laser electric field is $$\alpha(\omega) \approx \frac{|\langle g|\hat{d} \cdot \hat{\epsilon}|e\rangle|^2}{E_e - E_a - \hbar\omega}. \qquad (5)(2.5)$$

In its current state, the result of equation 5 intrinsically assumes an infinite lifetime for an atom in the excited state $|e\rangle$. The infinite lifetime arises because the energy $E_e$ of the excited state $|e\rangle$ is purely real. Thus, the probability of finding the atom in the excited state is a stationary state and will never decay, since $$|\Psi|^2 = |A|^2 \exp\left[i\frac{E_e}{\hbar}t\right]\exp\left[-i\frac{E_e}{\hbar}t\right] = |A|^2 = \text{constant.} \qquad (6)$$

This, of course, is false since an excited state decays exponentially with time constant $\tau = 1/\Gamma_e$, where $\Gamma_e$ is the linewidth of the transition $|e\rangle \to |g\rangle$. The polarizability in equation 5 can be corrected to reflect this finite lifetime by including the complex energy shift of $i\hbar\Gamma_e/2$ due to transitions to the ground state. That is $Ee \to Ee - i\hbar\Gamma_e/2 = \Delta E_e$. By including the imaginary energy shift $i\hbar\Gamma_e/2$ to the excited state energy, the probability amplitude correctly reflects a decay with time constant $\tau = 1/\Gamma_e$ due to the finite lifetime $1/\Gamma_e$ of the excited state.

$$|\Psi|^2 = |A|^2 \exp\left[i\frac{E_e}{\hbar}t\right]\exp\left[-i\frac{E_e}{\hbar}t\right] = |A|^2 = \text{constant.} \qquad (7)$$

Applying this energy shift in equation 5, the atomic polarizability becomes:

$$\alpha(\omega) = \frac{|\langle g|\hat{d} \cdot \hat{\epsilon}|e\rangle|^2}{E_e - i\hbar\Gamma_e/2 - E_g - \hbar\omega} = \frac{|\langle g|\hat{d} \cdot \hat{\epsilon}|e\rangle|^2}{\hbar(\delta^2 + \Gamma_e^2/4)}\left(\delta + i\frac{\Gamma_e}{2}\right) \qquad (8)(2.6)$$

where the laser detuning is $\delta = \omega_e - \omega_g - \omega$ with $\omega_e = E_e/\hbar$ and $\omega_g = E_g/\hbar$ being the energy eigenvalues of the $|e\rangle$ and $|g\rangle$ states, respectively, as expressed in frequency units.

This argument is also extended to the ground state $|g\rangle$ where in a very general case, the ground state energy shift $\Delta E_g$ in a laser beam is also written as a complex quantity $$\Delta E_g = V_g - i\hbar\Gamma_g/2. \qquad (9)(2.7)$$

The real component $V_g$ represents the energy shift of the atom ground state due to the laser electric field E and the imaginary component $i\hbar\Gamma_R$ accounts for the finite lifetime $\tau = 1/\Gamma_g$ of $|g\rangle$ due to transitions $|g\rangle \to |e\rangle$ that are induced by the atom absorbing the laser radiation field. Equation 8 can be inserted into equation 4 and equate the result to equation 9 to formulate an expression representing the ground state energy shift of an atom due to a laser field:

$$V_g - i\hbar\Gamma_g/2 = -\frac{1}{2}\alpha(\omega) E^2 \qquad (10)(2.8)$$

$$= -\frac{1}{2}\frac{|\langle g|\hat{d} \cdot \hat{\epsilon}|e\rangle|^2}{\hbar(\delta^2 + \Gamma_e^2/4)}\left(\delta + i\frac{\Gamma_e}{2}\right) E^2$$

$$= -\frac{\hbar}{2}\frac{\Omega^2}{\delta^2 + \Gamma_e^2/4}\left(\delta + i\frac{\Gamma_e}{2}\right)$$

where we have introduced the Rabi frequency $\Omega = |\langle g|\hat{d} \cdot E|e\rangle|/\hbar$, which is merely the magnitude of the original perturbation $H' = -d \cdot E$ (equation 1) expressed in frequency units. Equation 10 is a very important result for the laser cooling and trapping used herein. By equating the purely real components, equation 10 gives the atom energy shift due to scattering photons from the laser electric field and directly leads to the optical dipole force that is used to trap and repel atoms. Additionally, by equating the purely imaginary components of equation 10, one arrives at the atom energy shift due to absorbing photons from the laser field and leads immediately to the radiation force, which permits the cooling of atoms in an optical molasses and leads to more effective cooling by means of a magneto-optical trap.

An expression for the effective potential Vg can be attained by equating the purely real components of both sides of equation 10:

$$V_g = -\frac{\hbar\delta}{2}\frac{\Omega^2}{\delta^2 + \Gamma_e^2/4}. \quad (11)(2.9)$$

This effective potential $V_g$ is called the optical dipole potential. Equation 11 can be rewritten to make it clear that $V_g$ permits atom trapping at the maxima of an intense laser beam:

$$V_g = -\frac{\hbar\delta}{2}\frac{\Omega^2}{\delta^2 + \Gamma_e^2/4} \quad (12)(2.10)$$

$$= -\frac{\hbar}{2}\frac{\delta}{\delta^2 + \Gamma_e^2/4}\frac{|\langle g|\hat{d}\cdot\hat{\epsilon}|e\rangle|^2}{\hbar^2}E^2$$

$$= -\frac{3}{2}\frac{\pi c^2}{\omega_0^3}\left(\frac{\delta}{\delta^2 + \Gamma_e^2/4}\right)\epsilon_0 cE^2\left(\frac{|\langle g|\hat{d}\cdot\hat{\epsilon}|e\rangle|^2}{3\hbar c^3\pi\epsilon_0}\omega_0^3\right)$$

where c is the velocity of light, $\omega_0 = \omega_e - \omega_g$, and $\epsilon_0$ is the permittivity of free space. Some identities can be used to further simplify this result. The intensity I(x) of an electromagnetic wave with amplitude E can be expressed as $I = c\epsilon_0 R^2$. Additionally, we use that linewidth of the excited state |e⟩ can be alternatively expressed as $$\Gamma_e = \omega_0^3 |\langle g|\hat{d}\cdot\hat{\epsilon}|e\rangle|^2/3\hbar c^3\pi\epsilon_0 \quad (13)$$

Finally, the lasers used for dipole trapping in the experiments described herein are detuned far from resonance; hence $\delta^2 \gg \Gamma_e^2$. Examples described further below use 1064 nm and 760 nm lasers for dipole trapping and repelling of $^{133}$Cs and $^{87}$Rb atoms, respectively. That corresponds to detunings of order $10^{12}$ Hz for $^{133}$Cs and 109 Hz for $^{87}$Rb. For both types of atoms, the linewidths are of order 106 Hz, thus validating $\delta^2 \gg \Gamma_e^2$. Using these identities and the approximation $\delta^2 \gg \Gamma_e^2$, the optical dipole potential imparted onto an atom by a far-detuned laser beam can be written as:

$$V_{dip} \approx -\frac{3}{2}\frac{\pi c^2}{\omega_0^3}\left(\frac{\Gamma_e}{\delta}\right)I(x). \quad (14)(2.11)$$

Figure 11:
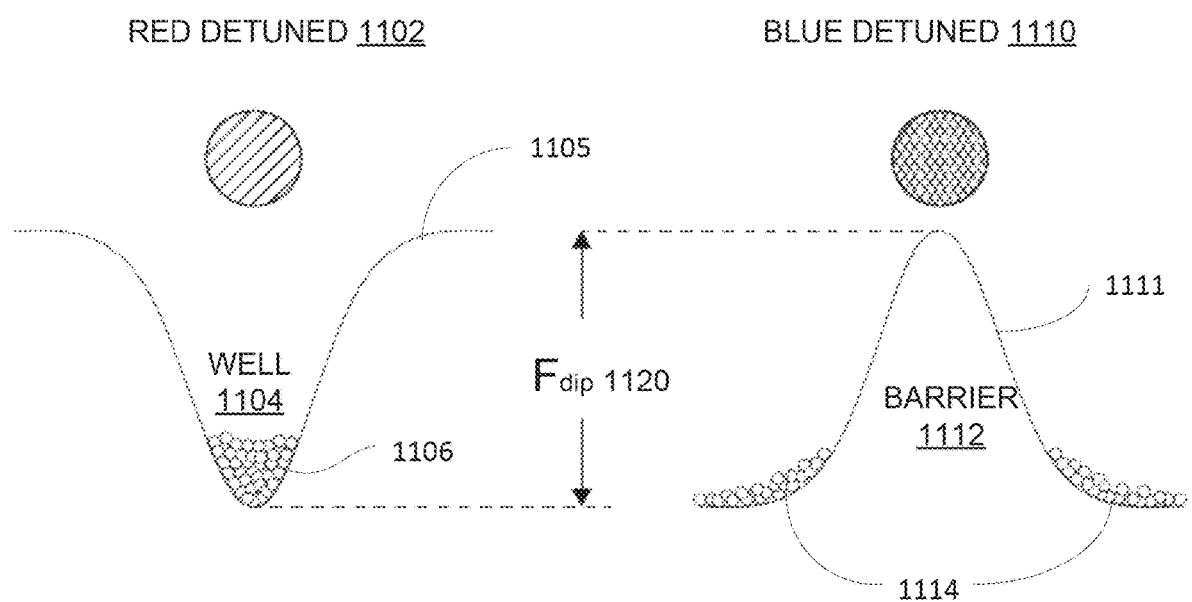
FIG. 11 (2.1) is an Illustration showing how a laser beam red-detuned ($\delta$<0) or blue-detuned ($\delta$>0) from resonance can trap or repel atoms, respectively.

Equation 14 shows that the optical dipole potential can be attractive (and trap atoms) or repulsive (and repel atoms) depending on the sign of the laser detuning. As shown in FIG. 11 (2.1), in the case of red detuning 1102, the potential energy curve $V_{dip}$ 1105 is a potential energy well 1104 that can trap sufficiently cooled atoms 1106. In the blue-tuned case 1110, $V_{dip}$ 1111 is a potential energy barrier 1112, which can repel atoms 114. It immediately follows that if the laser features a spatially varying intensity ($r\nabla I(x) \neq 0$), then the atom will experience an attractive or repulsive force (depending on the sign of the laser detuning δ) directed towards or away from the laser intensity maximum given as $$F_{dip} = \frac{3}{2}\frac{\pi c^2}{\omega_0^3}\left(\frac{\Gamma_e}{\delta}\right)\nabla I(x). \quad (15)(2.12)$$

The result $F_{dip}$ 1120 of equation 15 is called the optical dipole force and is a very useful tool to trap (or repel) neutral atoms that have been previously cooled to milliKelvin temperatures or lower. The experimental consequences of equation 15 are used for facilitating the optical trapping and transport of single neutral $^{133}$Cs atoms and for constructing and preparing atoms in a matter-wave transistor oscillator potential.

Figure 12A:
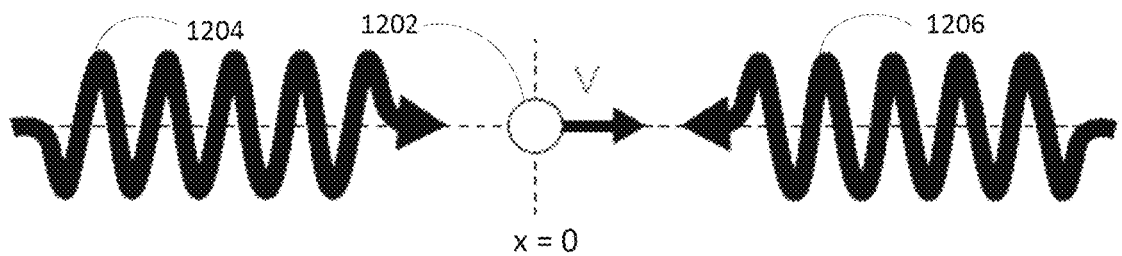
FIG. 12A (2.2a) is a schematic diagram of a one-dimensional configuration for optical molasses featuring two counter-propagating laser beams of equal intensity overlapping an atom.
Figure 12B:
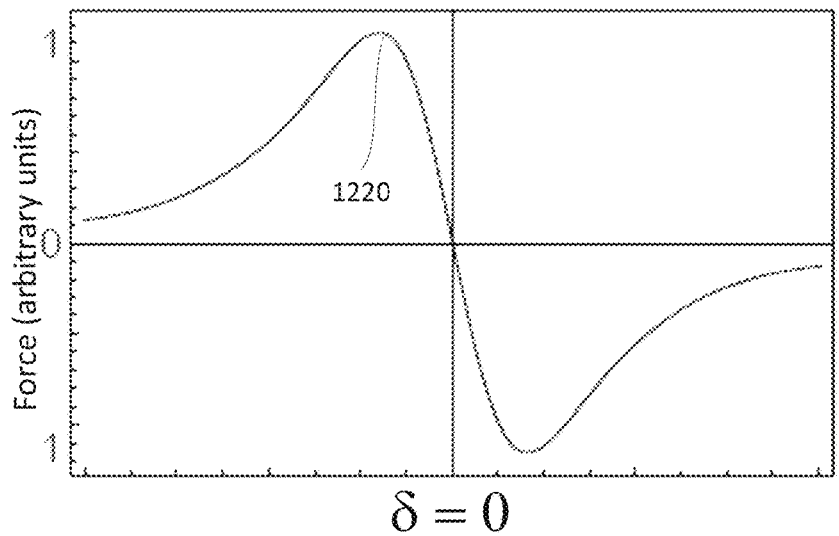
FIG. 12B (2.2b) is a plot showing the maximum frictional force imparted to the atom occurs at a frequency detuning to the red ($\delta$>0) of the atomic resonance.
Figure 12C:
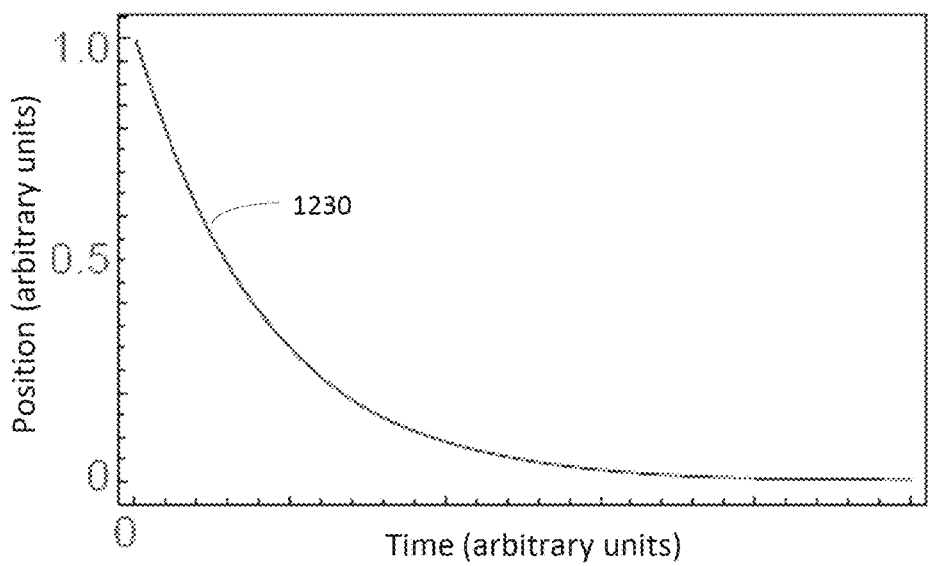
FIG. 12C (2.2c) is a graph representing the solution to the equation of motion for an atom subjected to the radiation force from a pair of counter-propagating lasers when placed in an inhomogeneous magnetic field.

Equating the purely imaginary components of equation 10 yields an expression for $\Gamma_g$, or the rate that atoms absorb a photon from the laser beam:

$$\Gamma_g = \frac{\Gamma_e}{2}\frac{\Omega^2}{\delta^2 + \Gamma_e^2/4} \quad (16)(2.13)$$

where δ is the detuning of the laser beam from resonance. Now, for simplicity, consider a two-level atom 1202 placed in a one-dimensional light field produced by a single pair of counter propagating laser beams 1204 and 1206 along the $\hat{x}$ direction as shown in FIG. 12A (2.2a). Since the atom receives $\hbar k$ momentum after absorbing a photon from the beam, the rate of change of momentum, or force, due to absorbing a quanta of light from each laser beam is then $$F_{rad} = \hbar k \Gamma_g = \hbar k \frac{\Gamma_e}{2}\frac{\Omega^2}{\delta^2 + \Gamma_e^2/4} \quad (17)(2.14)$$

which is called the radiation force. Equation 17 (2.14) is only valid when the atom in the laser field is at rest. Atoms move with some non-zero velocity. An atom moving along the $+\hat{x}$ direction with velocity v observes the frequency of each laser beam (with wavenumber k) to be Doppler shifted by an amount k·v. (This Doppler shift of the laser beams is observed by the atom in its rest frame.) Thus, the radiation forces on an atom moving at velocity v due to a pair of counter-propagating laser beams is $$F_{rad} = \quad (18)(2.15)$$
$$F_{-\hat{x}} + F_{+\hat{x}} = \hbar k \frac{\Gamma_e}{2}\left[\frac{\Omega^2}{(\delta + kv)^2 + \Gamma_e^2/4} - \frac{\Omega^2}{(\delta - kv)^2 + \Gamma_e^2/4}\right]$$

where the subscripts ±x denote the force from each laser beam propagating in the ±x direction. For a red-detuned laser beam (δ>0), equation 18 (2.15) imparts a velocity dependent, frictional force on the atoms with the dependence on δ shown in FIG. 12B (2.2b). FIG. 12B is a plot showing the radiation force $F_{rad}$ from equation 18 (2.15) that is imparted on an atom moving with velocity v in the $\hat{x}$ direction from a pair of laser beams detuned from resonance by δ. The plot shows the maximum frictional force 1220 imparted to the atom occurs at a frequency detuning to the red (δ>0) of the atomic resonance. FIG. 12C shows a solution 1230 to the equation of motion for an atom subjected to the radiation force from a pair of counter-propagating lasers when placed in an inhomogeneous magnetic field.

Physically, the radiation force occurs due to the Doppler effect: the atom absorbs (and scatters) more photons from the laser that propagates against the atom's motion because this light, if red-detuned by some amount δ, is subsequently blue-shifted in the atom frame back onto (or near) resonance with the |g⟩ →|e⟩ transition. Consequently, the atoms absorb far less light from the other laser beam (which propagates in the same direction of the atom) since in the atom frame this laser is Doppler shifted out of resonance. By red-detuning the lasers to the optimal δ (FIG. 12b, 2.2b), the radiation pressure from the laser light imparts a maximum frictional force, or optical molasses, that removes kinetic energy from the atoms, cooling them in the process. This method of laser cooling is called Doppler cooling, since it relies on the Doppler effect to systematically remove energy from atoms that move against a counter-propagating laser beam.

While the radiation force given in equation 18 (2.15) has the capabilities of cooling atoms to a few hundred microKelvin (μK), atom trapping with it is unstable as the radiation force $F_{rad}$ is divergenceless. Because the electric-field intensity (encapsulated in the Rabi frequency) from the laser beam is Gaussian, the radiation force can be described more generally in cylindrical coordinates as:

$$F_{rad} \propto \hat{z}\frac{z}{z^2}e^{-r^2/z^2} + \hat{r}\frac{r}{z^3}e^{-r^2/z^2} \quad (19)$$

and taking the divergence yields $$\nabla \cdot F_{rad} = \frac{1}{r}\frac{\partial}{\partial r}\frac{r}{z^3}e^{-r^2/z^2} + \frac{\partial}{\partial z}\frac{1}{z^2}e^{-r^2/z^2} = 0. \quad (20)$$

Because $\nabla F_{rad}=0$, the radiation force cannot possibly be center-seeking at all points in space and consequently fails as a stable means to trap atoms. The force given in equation 18 (2.15) can be made stable by introducing a positionally dependent magnetic force in addition to the radiation force by placing the entire atom-radiation field system into an inhomogeneous magnetic field.

Figure 13A:
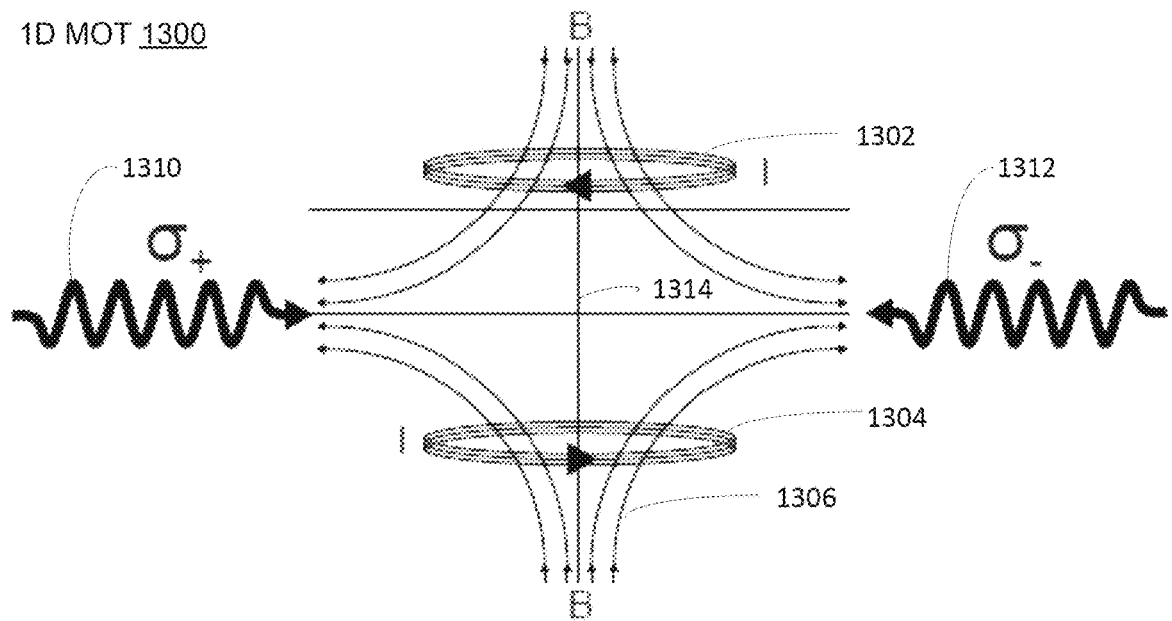
FIG. 13A (2.3a) is a schematic representation of a one-dimensional magneto-optical trap (1D MOT).
Figure 13B:
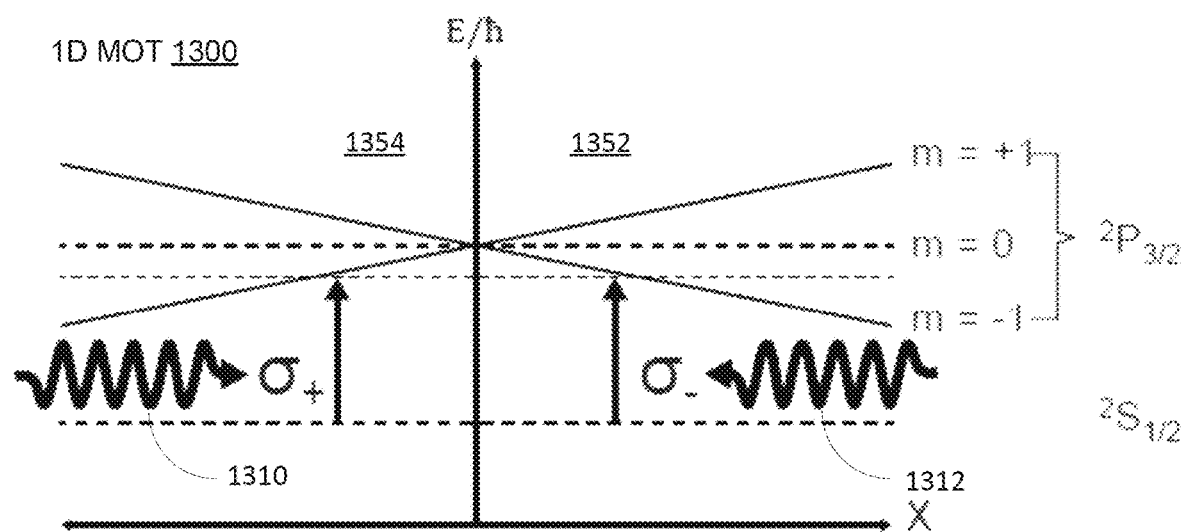
FIG. 13B (2.3b) is an energy-level diagram for the 1D MOT of FIG. 13A.

In the one-dimensional MOT 1300 of FIG. 13A, current is running in opposite directions through a pair of coils 1302 and 1304, producing an anti-Helmholtz field 1306 with an approximate linear gradient B°. A pair of counter-propagating lasers 1310 and 1312 with orthogonal, circular polarization overlaps the zero point 1314 of the B-field. The energy-level diagram 1350 of FIG. 13b shows how the spatially varying B-field Zeeman shifts the m=∓1 sublevel closer to resonance with the σ+− laser when in the ±x̂ region of the B-field. Thus, the atom is always experiencing a net force directed towards the zero point of the B-field.

Consider a one-dimensional case where an atom is placed into a magnetic quadrupole field generated by anti-Helmholtz coils FIG. 13A (2.3a). The magnetic field B varies linearly along the x direction with a gradient of magnitude B'=∂B/∂x. Due to the Zeeman effect, when the atom is located at position x in the magnetic field B, the atomic energy levels change according to $$\Delta E = g\mu_b m\, B'x \quad (22)(2.16)$$

where g is the Lande g factor, $\mu_b$ is the Bohr magneton, and m is the magnetic quantum number of the atom. The important result of equation 22 (2.16) is that magnetic field establishes a positionally dependent energy shift for the atom. Given an atom moving with velocity v in an inhomogeneous magnetic field, the atomic transition |g⟩ →|e⟩ experiences an effective Doppler shift (in frequency units) of $\Delta v_{dop}=\pm kv$ as well as an additional Zeeman shift (in frequency units) of $\Delta v_{zee}=g\,\mu_b \times B'/\hbar$. Therefore, when inserting values for the total detuning δ for the radiation force $F_{rad}$ given in equation 18 (2.15), the effects of both the Doppler shift of the laser light and the Zeeman shift of the atomic transition. In this case, the total radiation force on an atom becomes $$F_{rad} = \hbar k \frac{\Gamma_e}{2}\left[\frac{\Omega^2}{\left(\delta + kv + \frac{g\mu_b B'}{\hbar}x\right)^2 + \frac{\Gamma_e^2}{4}} - \frac{\Omega^2}{\left(\delta - kv - \frac{g\mu_b B'}{\hbar}x\right)^2 + \frac{\Gamma_e^2}{4}}\right] \quad (23)(2.17)$$

$$= -2\hbar k \Gamma_e \left(\frac{\Omega^2 \delta}{\left(\delta^2 + \frac{\Gamma_e^2}{4}\right)^2}\right)\left(kv + \frac{g\mu_b B'}{\hbar}x\right).$$

With the result of equation 23 (2.17), the radiation force $F_{rad}$ is now proportional to both the velocity and position of the atom. In this instance, the divergence of $F_{rad}$ is non-zero and in cases where $k^2 \gg g\,\mu_b\,B'/\hbar$ (which is common in cold atom experiments), the motion of an atom subjected this force is that of an overdamped harmonic oscillator (FIG. 12C (2.2c)). Thus, the radiation force in equation 23 (2.17) permits the trapping of atoms in the minimum of the magnetic quadrupole field.

To ensure that atoms remain trapped, the radiation force must be directed towards the B-field minimum (located at x=0). This can occur by giving the counter-propagating lasers orthogonal, circular polarizations σ+ and σ− (FIG. 12A (2.2a)). The physics behind this trapping scheme is illustrated in FIG. 13B (2.3b) and is explained as follows: the atom in the +x̂ region of the magnetic field absorbs the greatest amount of light from the σ− laser 1312 due to the magnetic field Zeeman shifting the m=−1 magnetic sublevel much closer to resonance with the σ− laser while subsequently shifting the m=+1 magnetic sublevel further out of resonance with the σ+ laser. Thus, when the atom is in the +x̂ region 1352, it experiences a net force opposing its motion. The opposite effect occurs when the atom is in the −x̂ region 1354 of the magnetic field, as the atom absorbs a greater amount of σ+ laser 1310 and experiences a net force directed in the +x direction. Thus, the total net force is always directed towards the origin x=0. This atom trapping configuration is called a magneto-optical trap (MOT) and with it, atoms can be cooled to the Doppler temperature limit, which corresponds to a temperature of 145.57 μK for $^{87}$Rb and 125 μK for $^{133}$Cs.

Using the laser cooling methods, a MOT of approximately 10⁹ $^{133}$Cs or $^{87}$Rb atoms can be created but only cooled to their respective Doppler temperature limits of 125 μK and 145.57 μK. To further cool the atoms to between 10-20 μK, kinetic energy can be continuously removed from the atoms by utilizing polarization gradient cooling (PGC).

Figure 14A:
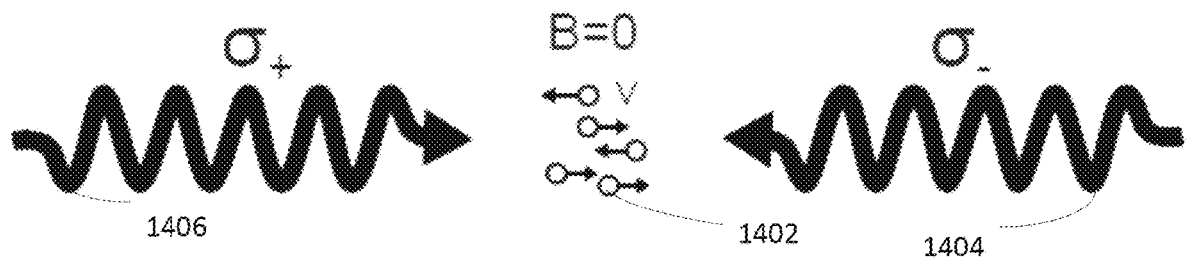
FIG. 14A (2.4a) is a diagram showing a one-dimensional polarization gradient cooling set up.
Figure 14B:
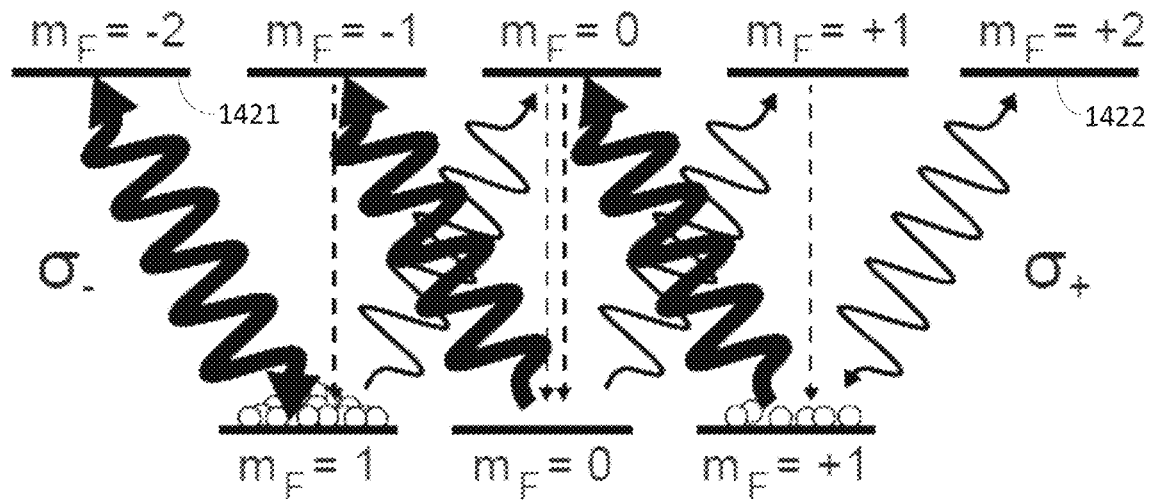
FIG. 14B (2.4b) shows that atoms moving against an $\sigma_-$ laser feature a greater probability of absorbing the $\sigma_-$ beam.

Real atoms have multiple ground states. As a simple example, consider an atom with a triplet ground state ($J_g=1$) coupled to a quintuplet excited state ($J_e=2$) in a region with no external magnetic field. Since the cooling lasers are red-detuned from resonance, atoms absorb more light from the laser beam they are propagating against. Thus, in the one-dimensional setup of FIG. 14A (2.4a) with no external magnetic field), an atom 1402 moving with positive velocity v>0 absorbs considerably more light from the σ− laser 1404 than the σ+ laser 1406. As a result, there is a considerably greater population of atoms optically pumped to the |m=−2⟩ magnetic sublevel 1421 than to the |m=+2⟩ sublevel 1422, as shown in FIG. 14B (2.4b). This results in an unbalanced radiation pressure and, subsequently, in a net frictional force directed in the propagation direction of the σ− laser. Atoms moving against the σ− laser feature a greater probability of absorbing the σ− beam and are preferentially pumped to the m=−2 Zeeman sublevel over the m=+2 sublevel.

Figure 14C:
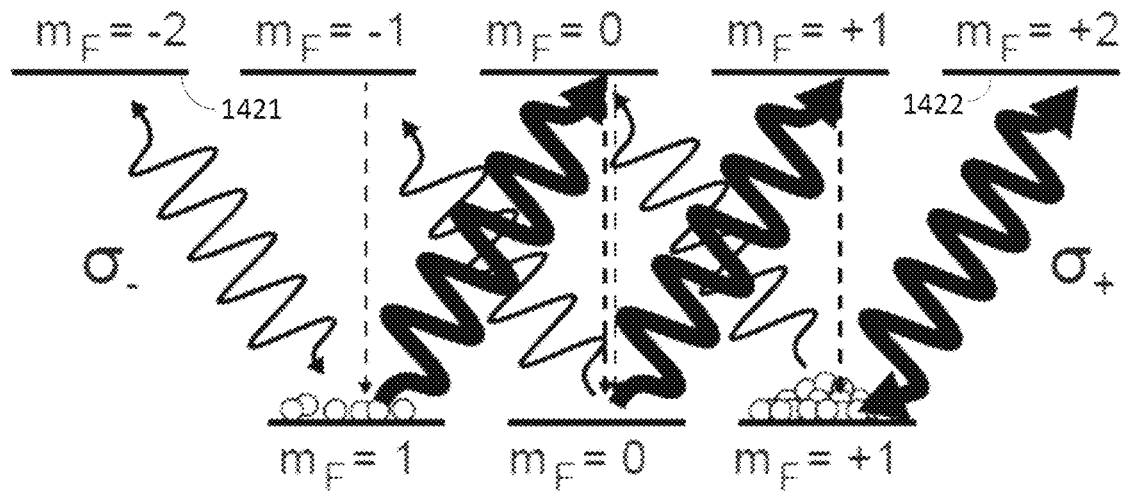
FIG. 14C (2.4c) shows that atoms moving against an $\sigma+$ laser feature a greater probability of absorbing the $\sigma+$ beam.

The opposite effect occurs when the atoms move with negative velocity v<0, illustrated in FIG. 14C (2.4c). There is a considerably greater population of atoms optically pumped to the |m=+2⟩ magnetic sublevel 1422 than to the |m=−2⟩ sublevel 1421. The population imbalance of the Zeeman sublevels creates an unbalanced radiation pressure and subsequently establishes a net frictional force directed against the atom's motion. Therefore, the σ−/σ+ polarization gradient creates a net damping force that would (theoretically) continue until the atoms absorb both σ− and σ+ beams with equal efficiency. This additional damping mechanism is capable of removing energy well below the Doppler limit because the actual atom cooling in σ−/σ+ PGC is a direct result of a population imbalance of magnetic sublevels and not purely from a Doppler shift. The lowest obtainable temperature is limited by the recoil energy atoms gain when emitting a photon during the cooling process. This temperature limit, called the recoil limit, corresponds to T=198 nK and T=180 nK for $^{133}$Cs and $^{87}$Rb atoms, respectively.

Laser cooling and trapping methods are used to cool ensembles of both $^{133}$Cs and $^{87}$Rb to about 10-20 μK. This temperature is sufficiently cold enough for the IARPA single atom transport and loading, but is still too warm by orders of magnitude for an ultra-cold matter-wave transistor. Ensembles of $^{87}$Rb atoms are cooled, forced radio-frequency (RF) evaporative cooling, to approximately 50 nK, which is beyond the capabilities of the laser cooling methods. Furthermore, the phase space density of the atoms must be high enough such that the $^{87}$Rb atoms transition into a Bose-Einstein condensate (BEC). To reach BEC, pre-cooled atoms (by means of PGC described above) are confined to a harmonic magnetic potential produced on an atom chip and then cooled to degeneracy by performing forced radio-frequency (RF) evaporative cooling.

Consider a neutral atom placed in a magnetic field. The potential 9 energy between the atom's magnetic moment y and the external magnetic field B is given by the Zeeman effect as $$U=-\hat{\mu}\cdot B=m_f g_F \mu_B B \qquad (24)(2.18)$$

where $m_f$ is the z-component of the atomic angular momentum (or magnetic quantum number), $g_F$ is the Landé-g factor, $\mu_B$ is the Bohr magneton, the Bohr magneton is $\mu_B=e\hbar/2 m_e$ where e and $m_e$ are the charge and mass of the electron. While this interaction is very weak, magnetically trapping atoms provides a very efficient method to compress and manipulate previously cooled atoms into a Bose-Einstein condensate. If the magnetic field is spatially varying, then the atom experiences a force given by the gradient of equation 24 (2.18)

$$F=-\nabla U=\nabla(\hat{\mu}\cdot B)=-m_f g_F \mu_B \nabla B \qquad (25)(2.19)$$

The magnetic force can be attractive (thus strong-field seeking) or repulsive (weak-field seeking) depending on the sign of $m_f g_F$. This is very important for carrying out magnetic trapping experiments as all magnetic fields are divergenceless ($\nabla \cdot B=0$), which means they do not feature a local maximum. This renders strong-field seeking magnetic potentials useless as a means to magnetically trap neutral atoms. Thus, the potential in equation 24 2.18 must be made to be a repulsive, weak-field seeking potential. This can be achieved by optically pumping the atoms into a magnetic sublevel where $m_f g_F<0$. With $U=-\hat{\mu}\cdot B<0$ fulfilled, atoms can be magnetically trapped but only if the external magnetic field B features a local minimum.

An ensemble of atoms at a temperature of approximately $10^{-20}$ μK can be prepared in a harmonic magnetic trap. To further cool the atoms such that their phase space density is high enough to form a BEC, a process called "radio frequency (RF) evaporation" can be used to continuously remove the warmest atoms from the magnetic trap, leaving only the "coldest of the cold" to remain in the magnetic potential. An ensemble of $^{87}$Rb atoms can be optically pumped to a magnetic trapping sublevel, such as |F=3, $m_f$=2⟩. To lower the temperature of this trapped atom ensemble, RF radiation with frequency $\omega_{RF}$ irradiates the atoms. Since the magnetic field strengths are small, the energy difference between adjacent Zeeman sublevels in the magnetic potential is approximately $\Delta E=g_F \mu_B B/\hbar$, RF photons that are tuned to the frequency $$\omega_{RF}=g_F \mu_B B/\hbar \qquad (26)(2.20)$$

induce RF spin ips where atoms undergo multi-photon transitions from the |m=+2⟩ trapped state to the |$m_f$=−2⟩ anti-trapped state and are subsequently scattered from the trap.

Consequently, by sweeping the RF frequency $\omega_{RF}$ from infinity down to some arbitrary $\omega_{flip}$, atoms with energy above $\hbar\omega_{flip}$ are pumped from the |$m_F$=+2⟩ →|$m_F$=−2⟩ magnetic sublevel and subsequently expelled from the trap. This process permits selectively removes warmer atoms above a certain energy in the magnetic potential without changing the tightness of the trap, allowing for efficient rethermalization. The expelled atoms carry away energy, leaving the atom ensemble at a reduced temperature. By continuously ramping $\omega_{RF}$ lower and lower, forced RF evaporation can maintain a high cooling rate by regularly removing the hottest atoms in the trap as long as the RF sweeping speed is slow enough to allow the remaining cooler atoms time to rethermalize. RF evaporation and rethermalization is repeated until the atom phase space density is high enough for a BEC. RF evaporation to cool 20 μK atoms to energies 10-20 kHz above the trap bottom, which then condense into a 50 nK BEC. The phenomenon of runaway evaporation, which is the maximum efficiency of RF evaporative cooling, occurs when the time per collision, $\tau_{col}$ decreases as the atom ensemble cools. Runaway evaporation emerges when the trap tightness and RF sweeping rate are such that $\tau_{trap}=\tau_t$ is about equal to or greater than 100 where $\tau_{trap}$ is the 1/e lifetime of the magnetic trap.

Figure 15A:
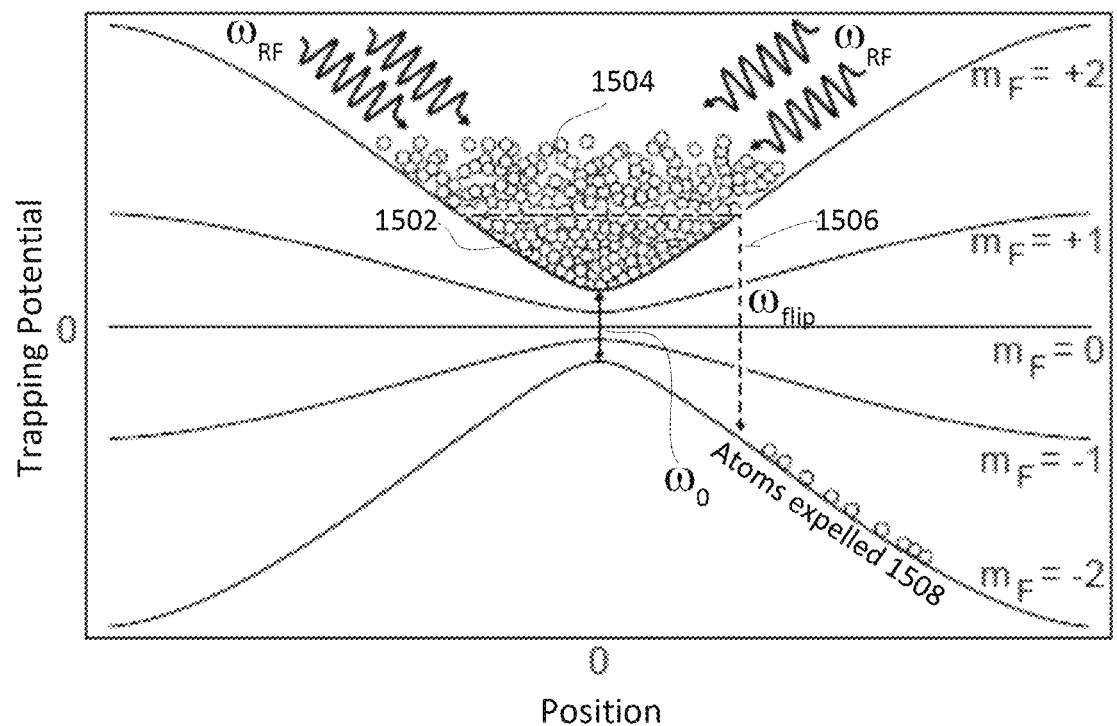
FIG. 15A (2.5a) is an illustration of a radio-frequency evaporation process.

An RF evaporation process is illustrated in FIG. 15A (2.5a). An ensemble 1502 of atoms is initially pumped to the |$m_F$=+2⟩ trapping state and confined in a magnetic potential. The RF photon frequency is the swept from infinity down to $\omega_{flip}$. All atoms 1504 with energy above the energy corresponding to the $\omega_{flip}$ RF photons 1504 (pictured above the thick dotted line 1506) undergo spin flips and are pumped to the |$m_F$=−2⟩ anti-trapping state and expelled from the trap as shown at 1508. By continuing the RF sweep down to just above the trap bottom $\omega_b$, only the coldest of the cold atoms will remain in the trap and can undergo transition into a Bose-Einstein condensate.

Figure 15B:
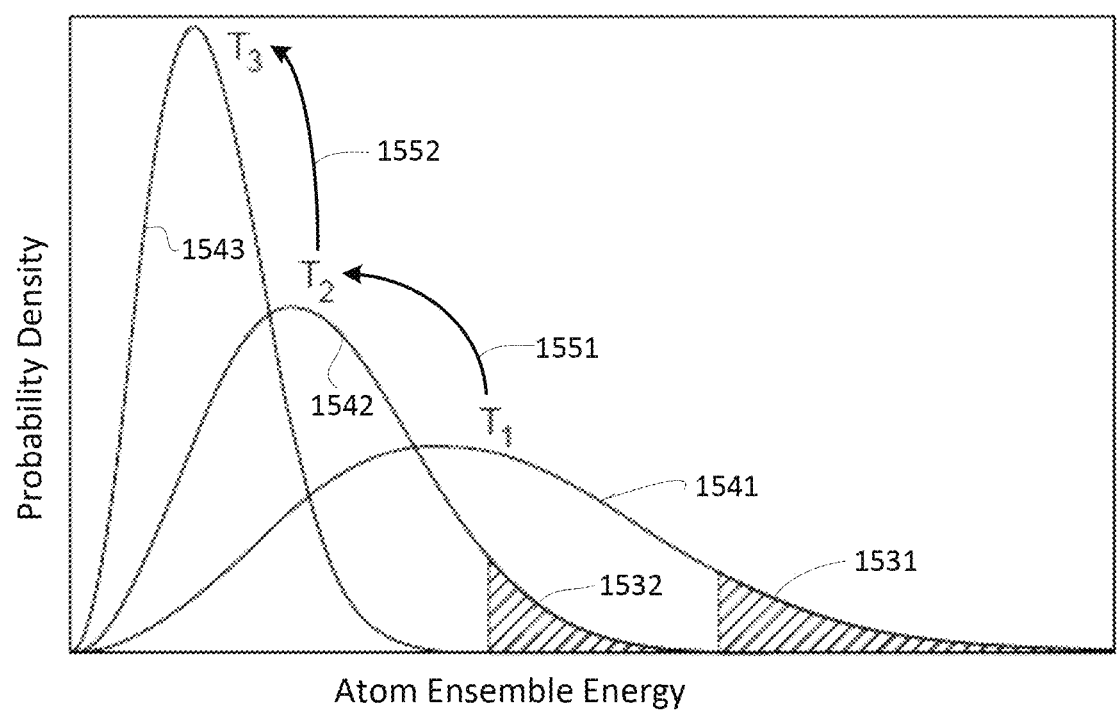
FIG. 15 (2.5b) shows how each radio-frequency knife sweep cuts out the remaining hottest atoms.

FIG. 15B (2.5b) shows how each RF knife sweep plus rethermalization removes the outer tails 1531, 1532 of the Maxwell-Boltzmann distributions 1541, 1542 of the trapped atom ensemble. By continuously cutting out the hottest atoms while allowing rethermalization 1551, 1552, the RF evaporation process leaves a large enough density of atoms at low temperature to result in a high enough phase space density for Bose-Einstein condensation to occur, as shown by the final Maxwell-Boltzman distribution 1543.

Figure 16:
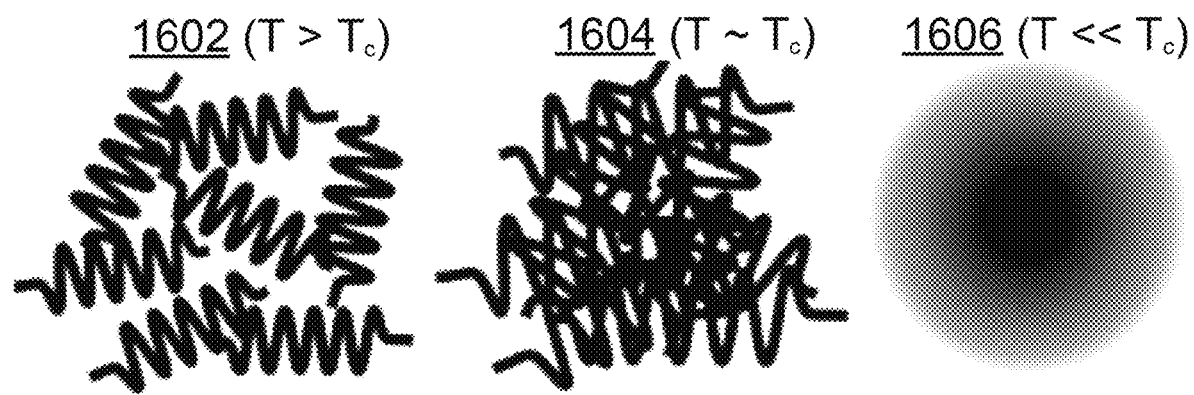
FIG. 16 (2.6) shows on the left atoms above a critical temperature, in the center, atoms near the critical temperature, and to the right, atoms well below the critical temperature, in which case, the de Broglie waves overlap so much that all atoms are completely indistinguishable from one another.

RF evaporation is the final stage to condensing atoms into a BEC. For the transition from a gas to a BEC to occur during evaporation, the de Broglie wavelength $$\lambda = \frac{\hbar}{p} = \frac{\hbar}{\sqrt{3mkT}}. \qquad (27)(2.21)$$

of each atom with momentum p and temperature T must become larger than the inter-atomic spacing of the gas. That is, the phase space density, PSD must be greater than unity $$PSD = \lambda^3 n \geq 1 \qquad (28)(2.22)$$

where n is the number of atoms per unit volume. Equation 2.21 reveals that as the gas is cooled, the de Broglie wavelength of each atom increases, eventually reaching a critical temperature Tc whereby the de Broglie waves of each atom begin to overlap. By cooling the gas even further to the ultra-cold regime (T<<Tc), the de Broglie wavelength of each atom becomes so large that all of the atom de Broglie waves completely overlap, rendering each atom of the gas indistinguishable. At this temperature, nearly the entire gas has condensed into a BEC that must be treated quantum mechanically and is described en masse according to the Bose-Einstein distribution. (For temperatures where the de Broglie wavelengths of each atom are much smaller than the inter-atomic spacing d between each atom, the particles are distinguishable from each other and hence the gas behaves classically and is described with Maxwell-Boltzmann statistics). FIG. 16 (2.6) schematically represents a comparison between atoms 1602 above the critical temperature (T>$T_c$) so that de Broglie waves overlap at most negligibly, atoms 1604 at about the critical temperature (T≈$T_c$) so that atoms partially overlap, and well below the critical temperature (T<<$T_c$) so that atoms are indistinguishable from each other and thus form a BEC 1606.

Consider an ensemble of atoms in a state of thermal equilibrium at temperature T and chemical potential p in a magnetic potential with the simplification that the atoms are not interacting with each other. The average occupancy $\bar{n}$ of a state with energy $\in$ is described by the Bose-Einstein distribution:

$$\bar{n}(\epsilon) = \frac{1}{e^{(\epsilon-\mu)/kT} - 1}. \qquad (29)(2.23)$$

Moreover, in the matter-wave transistor detailed further below, the cold atom gas is confined to an anisotropic harmonic oscillator potential given as $$V(x,y,z) = \tfrac{1}{2}m(w_x^2 x^2 + \omega_y^2 y^2 + \omega_z^2 z^2) \qquad (30)(2.24)$$

where m is the mass of each atom and the $\omega_i$ represents the atom oscillation frequencies along the i=$\hat{x}$, $\hat{y}$, $\hat{z}$, axis of the potential. The corresponding energy levels of the anisotropic potential are $$\epsilon(n_x, n_y, n_z) = \underbrace{\left(n_x + \tfrac{1}{2}\right)\hbar\omega_x}_{\epsilon_x} + \underbrace{\left(n_y + \tfrac{1}{2}\right)\hbar\omega_y}_{\epsilon_y} + \underbrace{\left(n_z + \tfrac{1}{2}\right)\hbar\omega_z}_{\epsilon_z} \qquad (31)(2.25)$$

where $n_x$, $n_y$ and $n_z$ are integers. Each atom thus has an energy $\in_x$, $\in_y$ and $\in_z$ due to oscillation along the respective axis. The energy of this system (equation 31 (2.25)) is plotted in FIG. 17 (2.7) and the number of available energy states of this system when the atom has total energy $\in=\in_x+\in_y+\in_z$ is readily given by the integral $$\eta(\epsilon) = \frac{1}{\hbar^3 \omega_x \omega_y \omega_z} \int_0^\epsilon d\epsilon_x \int_0^{\epsilon-\epsilon_x} d\epsilon_y \int_0^{\epsilon-\epsilon_x-\epsilon_y} d\epsilon_z = \frac{\epsilon^3}{6\hbar^3 \omega_x \omega_y \omega_z}. \qquad (32)(2.26)$$

Figure 17:
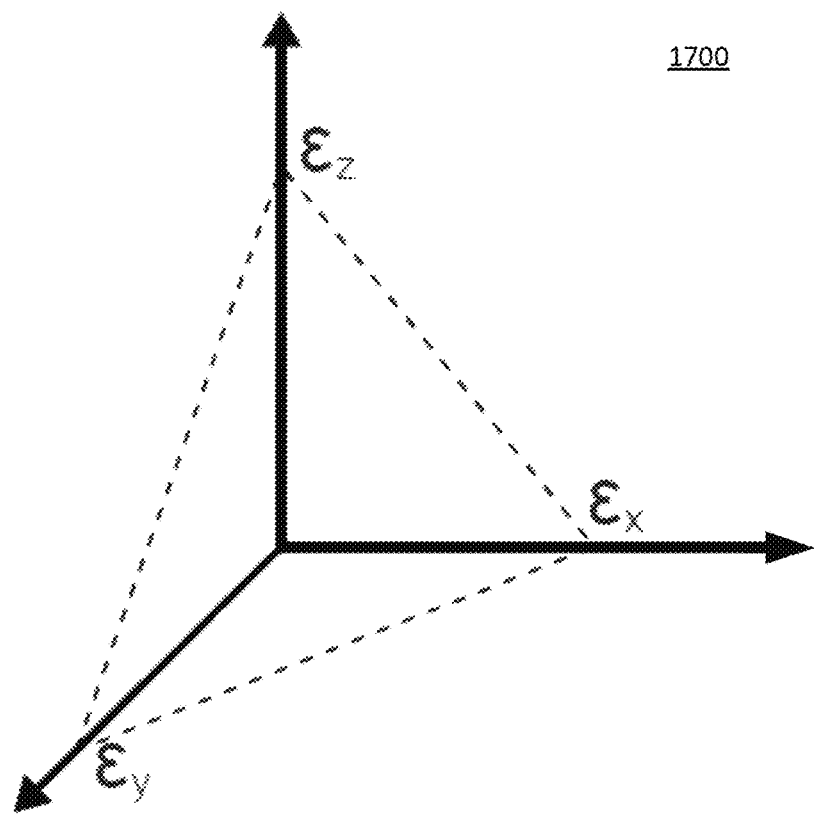
FIG. 17 (2.7) is a plot in "energy space" showing the energy of an atom in an anisotropic harmonic oscillator as a function of $n_x$, $n_y$, and $n_z$ energy levels.

The integral $\eta(\in_x)$, and hence the number of available energy states in the anisotropic potential, is merely the volume of first octant of FIG. 17 (2.7) bounded by the plane $\in=\in_x+\in_y+\in_z$. FIG. 17 is a plot 1700 in "energy space" showing the energy of an atom in the anisotropic harmonic oscillator as a function of occupying the $n_x$, $n_y$, and $n_z$ energy levels. Note that for an atom occupying some arbitrary energy state $\in(n_x, n_y, n_z)$, the total atom energy is a plane $\in=\in_x+\in_y+\in_z$.

It immediately follows that the density of states, or the number of available energy states between $\in$ and $\in+d\in$ is:

$$g(\epsilon) = \frac{d\eta(\epsilon)}{d\epsilon} = \frac{\epsilon^2}{2\hbar^3 \omega_x \omega_y \omega_z}. \qquad (33)(2.27)$$

Knowing the density of states (equation 33 (2.27)), as well as the Bose-Einstein distribution (equation 29 (2.23)), one can readily determine the experimental conditions on atom temperature T and trapped atom number N where all atoms of the gas are in an excited state (meaning the ensemble temperature is exactly at criticality $T_c$). For this simplified case of a non-interacting gas, the number of particles in the excited state $N_{ex}$ reaches a maximum when the chemical potential $\mu=0$. That is $$N_{ex}(\mu = 0, T_c) = \int_0^\infty g(\epsilon)\bar{n}(\epsilon)d\epsilon \qquad (34)(2.28)$$

$$= \frac{1}{2\hbar\omega_x\omega_y\omega_z} \int_0^\infty \frac{\epsilon^2}{e^{\epsilon/kT_c} - 1} d\epsilon$$

$$= \frac{k^3 T_c^3}{2\hbar\omega_x\omega_y\omega_z} \Gamma(3)\zeta(3)$$

where $\Gamma(n)$ and $\iota(n)$ are the Gamma and Riemann zeta functions, respectively. Rearranging equation 34 (2.28) and solving for $T_c$ gives the critical temperature $$T_c = \hbar k N^{1/3} \left[\frac{\omega_x \omega_y \omega_z}{\Gamma(3)\zeta(3)}\right]^{1/3} \approx 0.94 \hbar \bar{\omega} N^{1/3} \qquad (35)(2.29)$$

where for T>T$_c$, all atoms in the gas are in an excited state. It immediately follows that if the atom ensemble is cooled lower than T$_c$, atoms begin to abruptly occupy the anisotropic harmonic potential ground state, which is the onset of Bose-Einstein condensation. By cooling the atom temperature T<<T$_c$, one achieves a macroscopic occupation of the harmonic oscillator ground state and can produce a pure BEC.

In the matter-wave transistor oscillator, interactions between low energy, ultra-cold atoms are not only omnipresent, but they drive the matter-wave gain mechanism. Specifically, the interactions that we must address are binary elastic scattering events between pairs of atoms with very small total energy. By "small" is meant that the scattering process is dominated by the s-wave contribution to the wavefunction: that is components of each atom's wavefunction with orbital angular momentum l=0 are considered. As a result, the total scattering cross section a drastically simplifies to $$\sigma = \frac{4\pi}{k^2} \sum_{l=0}^{\infty} (2l+1)\sin^2\delta_l \to \frac{4\pi}{k^2}\sin^2\delta_0 \quad (36)$$

where $\delta_l$ is the phase shift experienced by the l=0 partial wave due to the scattering event.

For s-wave scattering of identical bosons, the scattering cross section is $\sigma = 8\pi a^2$ where a is the scattering length given in the Born approximation as $$a = \frac{m_r}{2\pi\hbar^2} \int e^{i(k'-k)\cdot r} V(r) d^3r \quad (37)(2.30)$$

where $m_r$ is the reduced mass of the two atoms, V(r) is the effective two-body interaction and where k and k' are the wave vectors of the atom before scattering and after scattering, respectively. Because the interactions here are due to s-wave scattering, the momentum transfer $\hbar k' - \hbar k$ due to the scattering process is approximately zero. Thus, equation 37 (2.30) can be approximated as $$a = \frac{m_r}{2\pi\hbar^2} \int V(r) e^{i(k'-k)\cdot r} d^3r \approx \frac{m}{4\pi\hbar^2} \int V(r) d^3r. \quad (38)(2.31)$$

The effective two-body interaction V (r; r') between identical atoms at points r' and r in equation 38 (2.31) is treated as a discrete contact interaction $$V(r',r) = g\delta(r'-r) \quad (39)(2.32)$$

where g denotes the energy of the interaction (defined shortly) and $\delta(r'-r)$ is the Dirac delta function.

Inserting equation 39 (2.32) into equation 38 (2.31), one arrives at the scattering length between two atoms in the BEC as $$a \approx g\frac{m}{4\pi\hbar^2} \int \delta(r'-r) d^3r = g\frac{m}{4\pi\hbar^2}. \quad (40)(2.33)$$

Using equation 40 (2.33), the result, important for transistor oscillator theory, that the effective interaction between two colliding atoms at low energy in the BEC is constant and is given by $$g = \frac{4\pi\hbar^2 a}{m}. \quad (41)(2.34)$$

Given that there are N interacting atoms in the BEC, the BEC is described with a many bodied Hamiltonian $$H = \sum_{i=1}^{N} \left[ -\frac{\hbar^2}{2m}\nabla_i^2 + V(r_i) \right] + g\sum_{i<j} \delta(r_i - r_j). \quad (42)(2.35)$$

Using this many-bodied Hamiltonian in the Schrödinger equation yields the Gross-Pitaevskii equation $$\left[ -\frac{\hbar^2}{2m}\nabla^2 + V(r) + g|\psi(r)|^2 \right]\psi(r) = \mu\psi(r) \quad (43)(2.36)$$

2.36 where the eigenvalue $^1@=@E/@N$ is the BEC chemical potential and Ã(r) is the total wavefunction for a system of N indistinguishable bosons making up the BEC, which is given as $$\psi(r) = \psi_1(r_1)\psi_2(r_2)\ldots\psi_N(r_N) \quad (44)(2.37)$$

where $r_i$ refers to the position of the ith boson in the BEC. The Gross-Pitaevskii equation is a form of the Schrödinger equation that consists of a linear contribution from the external potential (r) confining the atoms and a non-linear contribution $g|Ã(r)|^2$ modeling the averaged, or mean field, interaction with all of the other atoms in the BEC.

At equilibrium, the mean-field pseudopotential and the external potential are both proportional to $R^2$, while the kinetic energy is proportional to $1/R^2$. Additionally, the mean-field increases linearly with atom number N. Thus, the kinetic energy of atoms in the BEC is negligible compared to V and g.

An important approximation can be made to equation 43 (2.36) when the kinetic energy of the atoms is much less than the mean-field. In such cases, the kinetic energy operators $-\hbar^2\nabla_i^2/2m$ are ignored, which reduces the Gross-Pitaevskii equation to the much simpler $$[V(r) + g|\psi(r)|^2]\psi(r) = \mu\psi(r). \quad (4s)(2.38)$$

This result is called the Thomas-Fermi approximation and equation 45 (2.38) has the solution $$|\psi(r)|^2 = \frac{\mu - V(r)}{g}. \quad (46)(2.39)$$

Equation 46(2.39) gives the atom density profile of a BEC. It states that in the Thomas-Fermi approximation, atoms condensed into a BEC fill the external trapping potential V(r) uniformly up to the condensate chemical potential.

Figure 18:
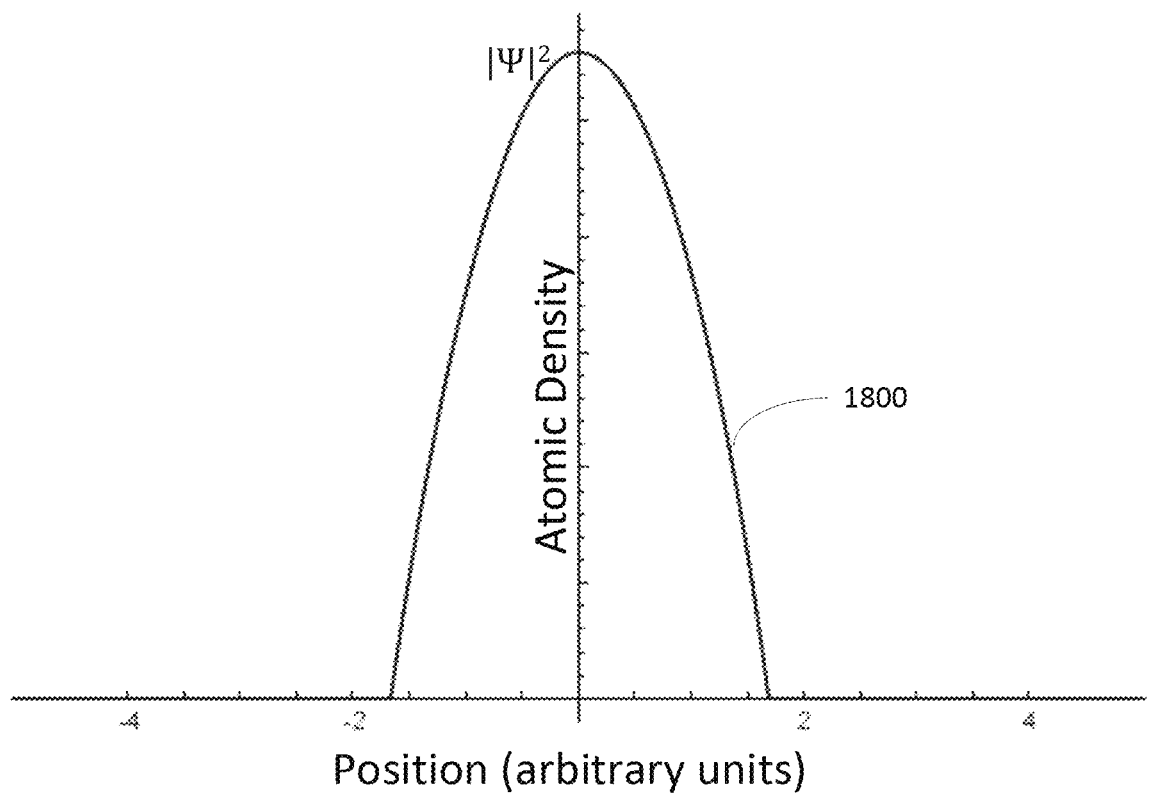
FIG. 18 (2.8) is a density profile of a Bose-Einstein condensate in a Thomas-Fermi approximation when confined to a harmonic potential.

The external trapping potential is harmonic along the $\hat{x}$, $\hat{y}$, and $\hat{z}$ axes. From equation 46 (2.39), the atomic density n of the BEC is an inverted parabola 1800 (FIG. 18 (2.8). This characteristic inverted parabola profile for the atom density establishes that the atoms have reached Bose-Einstein condensation. The radius R (in position space) of the BEC, or Thomas-Fermi radius, is defined as the distance from the center of the condensate to the position r that satisfies μ=V(r). Atoms located within this radius are Bose condensed while atoms outside the radius remain as thermal atoms. For a harmonic potential V(r)=mω³r²/2, the Thomas-Fermi radius, R is readily calculated as $$R = \sqrt{\frac{2\mu}{m\omega}}. \qquad (47)(2.40)$$

The number of atoms in the condensate can be found by inserting the harmonic potential into the solution to the Gross-Pitaevskii equation 46 (equation 2.39) giving $$|\psi(r)|^2 = \frac{m\mu}{4\pi\hbar^2 a}\left(1 - \frac{1}{2}\frac{m\omega^2 r^2}{\mu}\right) \qquad (48)(2.41)$$
$$= \frac{m\mu}{4\pi\hbar^2 a}\left(1 - \frac{r^2}{R^2}\right).$$

Integration over the radial coordinate from the origin to the Thomas-Fermi radius R gives the total atom number in the BEC as a function of the chemical potential [1].

$$N = \int |\psi(r)|^2 dr = \frac{m\mu}{4\pi\hbar^2 a}\int_0^R \left(1 - \frac{r^2}{R^2}\right) 4\pi r^2 dr \qquad (49)(2.42)$$
$$= \frac{m\mu}{4\pi\hbar^2 a}\frac{8\pi}{15}R^3$$
$$= \frac{8\pi}{15}\left(\frac{2\mu}{m\omega^2}\right)^{3/2}\frac{\mu}{g}$$

where in the final line of equation 49 (2.42), the definitions of the Thomas-Fermi radius (equation 47 (2.40)) and the scattering length (equation 40 (2.33)) are used. Rearranging this result and solving for yields the Thomas-Fermi approximation for the BEC chemical potential:

$$\mu = \frac{\hbar\omega}{2}\left(\frac{15Na}{a'}\right)^{2/5} \qquad (50)(2.43)$$
where $a' = \sqrt{\hbar/m\omega}$.

Vacuum chambers described herein can be compact (small enough to carry on a commercial airplane) and provide UHV (pressures below $10^{-10}$ Torr) environments suitable for MOTs and BECs. A vacuum chamber for atom transport minimizes unwanted magnetic fields that could introduce noise by containing no metall nuts, bolts, or screws and being completely held together with optical and anodic bonds.

Figure 19:
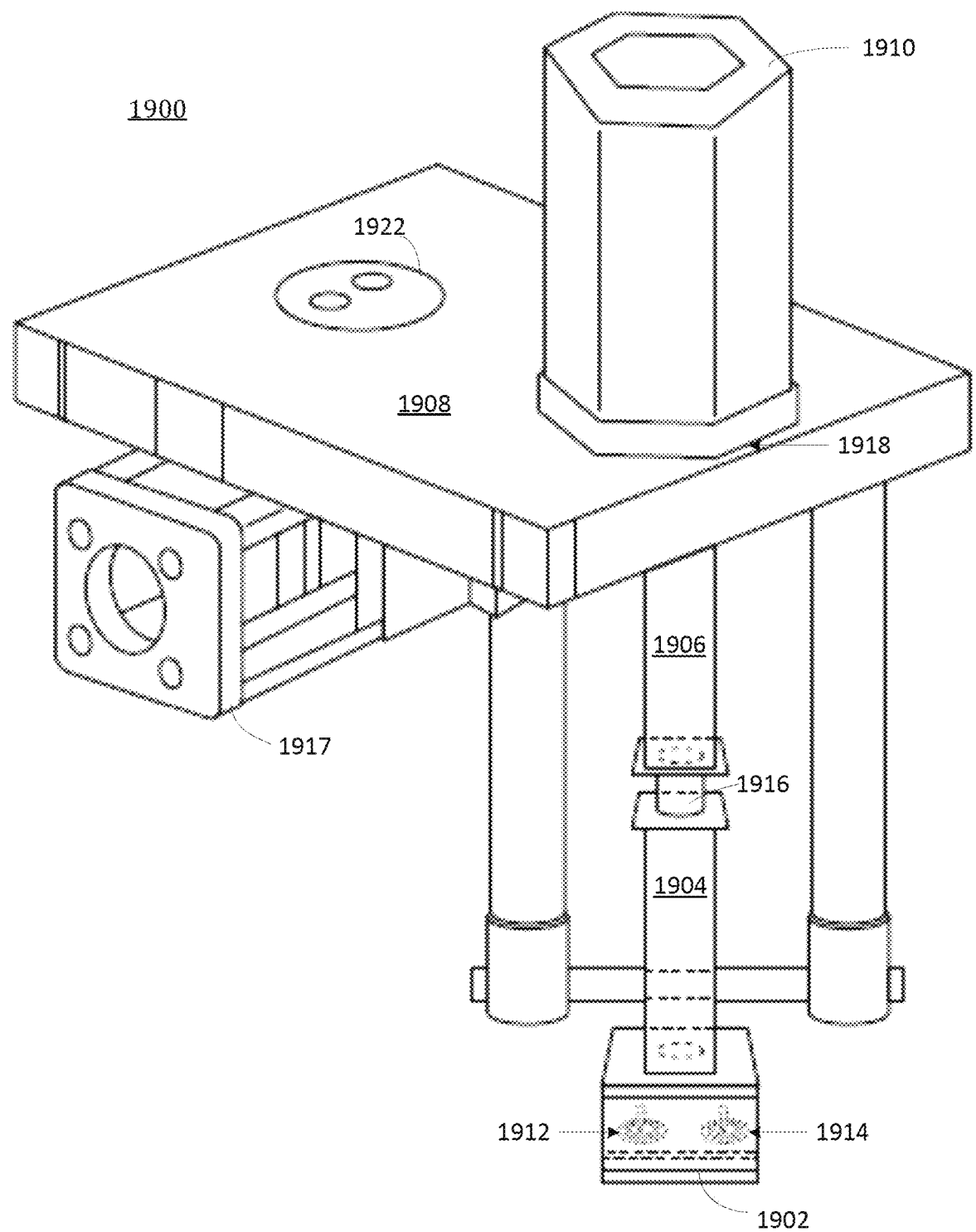
FIG. 19 (3.1a) is a perspective view of a hex-cell vacuum system.

Transport and delivery of single atoms into optical bottle beam traps is conducted in a hex-cell vacuum system 1900, shown in FIG. 19 (3.1). This system is designed to provide a small footprint, portable, UHV environment with six windows of optical access in order to provide: a) single atom transport and reloading into vacant optical bottle beam sites of the qubit array with an optical conveyor belt during simultaneously occurring qubit logic gate operations; b) a continuous source of pre-cooled cesium atoms in an adjacent chamber for use in the atom transport and reloading procedure; c) isolation between the atom production and dispenser region (a region of higher pressure) and the MOT, bottle beam, and atom transport regions (regions of UHV pressures); d) multiple ion pumps assigned to different chambers of the vacuum system in order to permit differential pumping between higher and lower pressure regions; and e) apertures between each adjacent chamber such that atoms can be deterministically transported from lower 2D and 3D MOT chambers into a hex cell using a movable optical molasses.

To achieve the above listed performances, the hex-cell system design is based on of a double MOT vacuum configuration featuring a $^{133}$Cs source region, a 2D MOT region, a 3D MOT region, and a hexagonal chamber featuring six windows with anti-reflection (AR) coating on both ambient and vacuum faces. The hex cell was fabricated with no metal nuts, bolts, or screws and is entirely held together by over 50 optical contact bonds and anodic bonds. Even the ion pumps themselves are anodically bonded to the cell. Using a much larger vacuum pump in conjunction with a bake-out process, the hex cell can be pumped down to UHV pressures.

FIG. 19 (3.1a) is a schematic of the hex-cell vacuum system 1900, which includes a source chamber 1902, a 2D MOT chamber 1904, a 3D MOT chamber 1906, a cell manifold 1908, and a hex cell 1910. Source chamber 1902 can include a cesium source 1912 and a non-evaporable getter (NEG) 1914. 3D MOT chamber 1906 is coupled to 2D MOT chamber 1904 via a pinhole 1916 so that 3D MOT chamber 1906 can be at a lower pressure that 21) MOT chamber 1904. Likewise, hex cell 1910 is in fluid communication with 3D MOT chamber 1906 so that hex cell can be at a lower pressure than 3D MOT chamber 1906.

Cell manifold 1908 serves as a mechanical foundation for hex-cell vacuum system 1900. Manifold 1908 is a 1 cm thick, machined Pyrex™ block that is polished on all faces. Channels are machined throughout the interior of manifold 1908 to connect the 3D MOT chamber 1906 to Hex cell 1910 and also to connect ion pumps 1917 to their respective pumping loads. Two Pyrex™ support rods 1920 are fixed to the bottom of the 2D MOT chamber 1902 and are connected to manifold 1908. A vacuum seal 1922 is completed by anodically bonding a Pyrex window in-vacuo (while still connected to a bake-out station) onto manifold 1908.

Figure 20A:
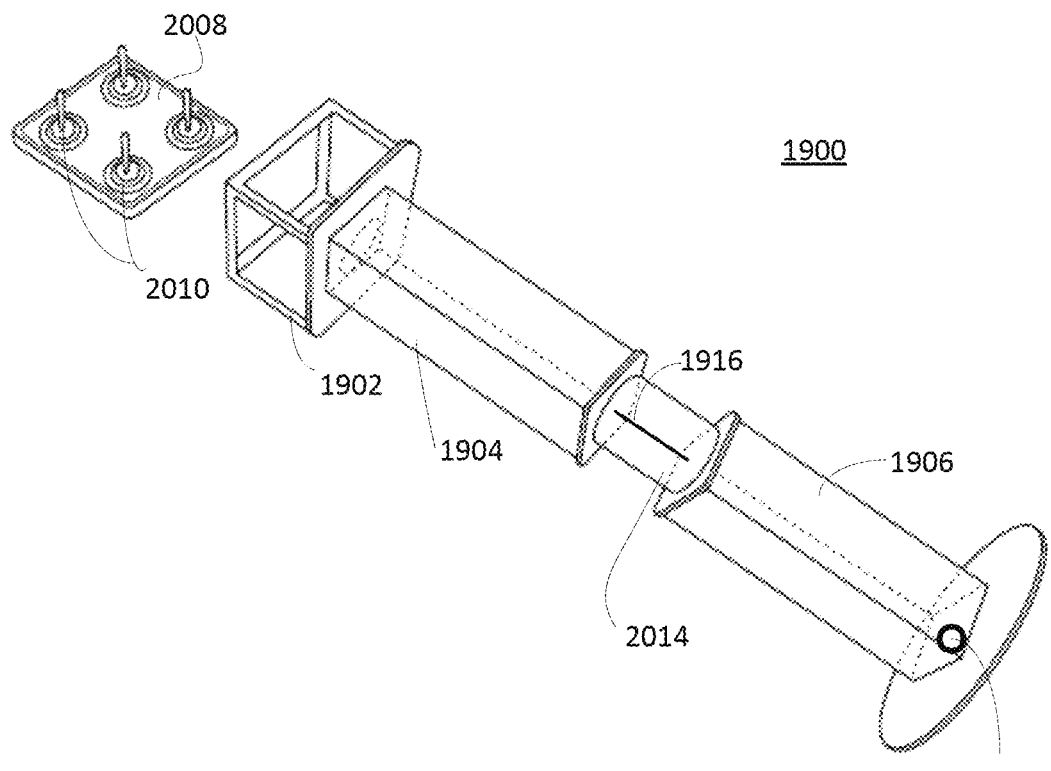
FIG. 20A (3.2A) is a perspective view of a portion of the hex-cell vacuum chamber of FIG. 19.

As shown in FIG. 20A (3.2a), a MOT chamber assembly 2000 of system 1900 (FIG. 19) includes anodically bonded source tube 1902, 2D MOT chamber 1904, and 3D MOT chamber 1906. The bottom 2008 of source tube 1902, which contains conductive feedthroughs 2010, is not yet anodically bonded to the rest of source tube 1902. Locations of pinhole 2016 and aperture 1918 are also shown. As best seen in FIG. 19B, source tube 1902 contains a glowing Cs dispenser 1912 and a non-evaporable getter 1914. Dispenser 1912 is glowing due to running 3.5 A through to expel a cesium gas via thermal emission. FIG. 20C presents a view looking up vertically through the bottom of source tube 1902 through the 2D MOT chamber 1904 where a bright dot in the center is due to fluorescence from a 2D+ MOT 2032 that centered on the 2D-3D pinhole. FIG. 20D shows 2D MOT chamber 1904 and 3D MOT chamber 1906 with the permanent MOT magnets attached 2040. The silver contacts 2042 that connect to Cs dispenser 1912 (FIG. 20B) and serve as dispenser contacts are also shown.

Figure 20B:
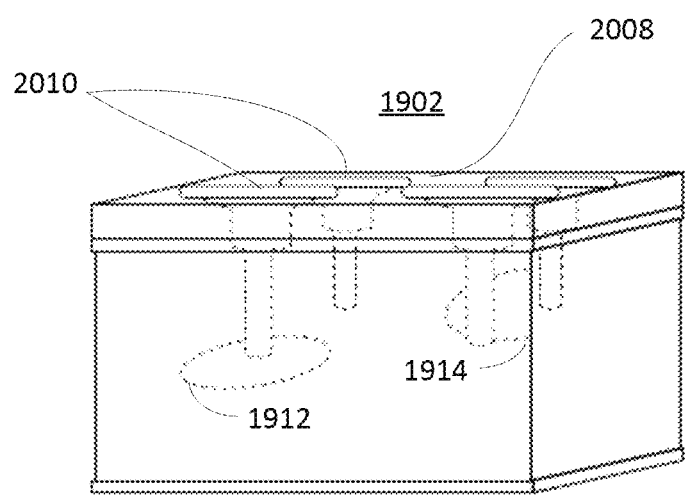
FIG. 20B (3.2B) is a perspective view of a source tube of the hex-cell vacuum system of FIG. 19.
Figure 20C:
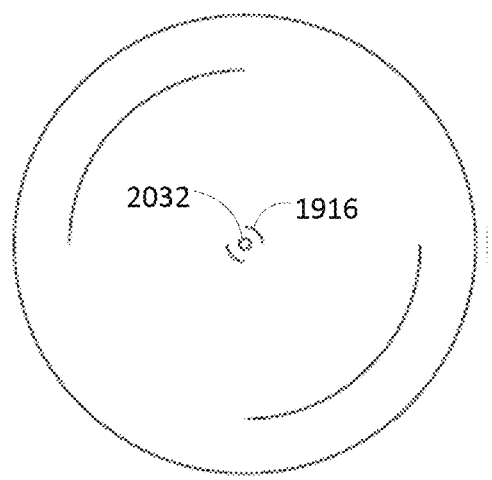
FIG. 20C (3.2C) is a bottom view showing a pinhole between a 2D MOT chamber and a 31)
Figure 20D:
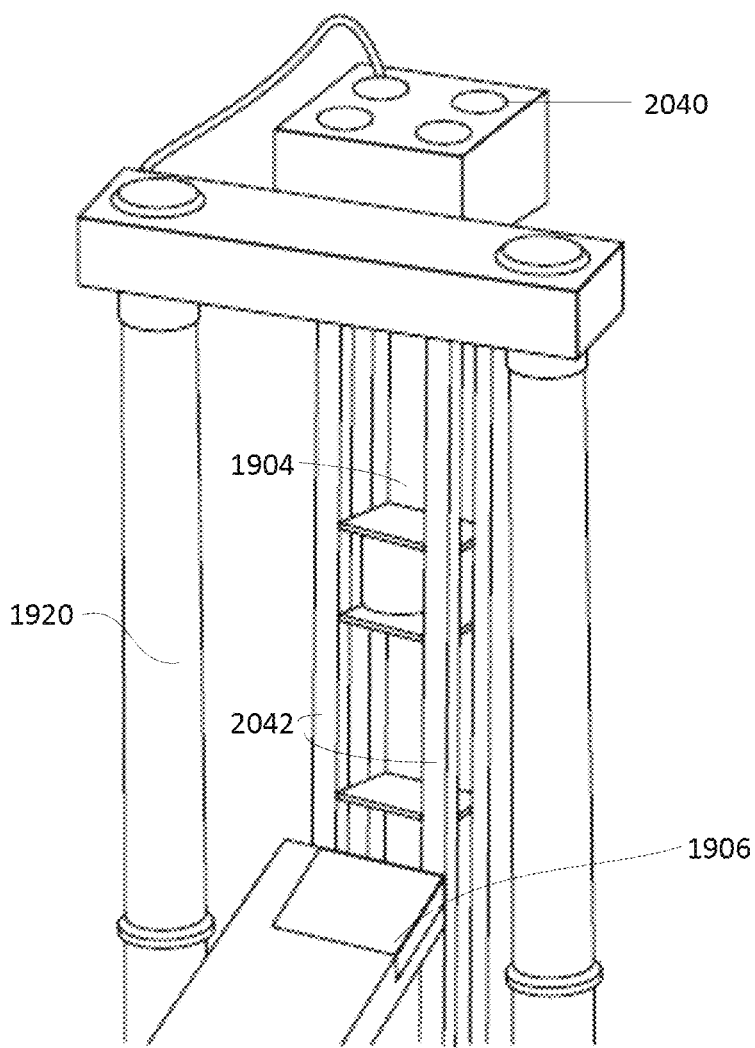
FIG. 20D (3.2D) is a bottom perspective view of a portion of the hex-cell vacuum system of FIG. 19 showing locations of MOT magnets and dispenser contacts.

Shown in FIG. 20A (3.2a), at the very bottom of system 1900 is the cesium source tube 1902, which contains an SAES Industrial Group (of Italy) alkali metal cesium dispenser 1912 FIG. 20B(3.2b) that evaporates a nearly pure gas of $^{133}$Cs into the 2D MOT chamber when the dispenser is heated above a critical temperature. The dispenser temperature is held constant by running an electrical current of 3.5 Amperes (A) through it at all times during the experiments. Additionally, a SAES non-evaporable getter (NEG) 1914 is also included inside cesium source tube 1902 for improved vacuum quality. Current is supplied to dispenser 1912 and NEG 1914 via electrical feedthroughs 2010 connected to conductive silicon pads located on the bottom, ambient side of the source chamber (FIGS. 20A, 20D (3.2a and *d*)).

Anodically bonded directly above the cesium source tube 1902 is the 2D MOT chamber 1904, which is a 1 cm×1 cm×4.5 cm Pyrex vacuum chamber designed to support a 2D+ MOT from the background $^{133}$Cs gas produced in the source. Because this chamber is filled with warm, cesium vapor, the pressure in this chamber is higher than UHV at approximately 10-100 nanoTorr. 2D MOT chamber 1904 is capped with a 500 $^1$m thick silicon wafer that features a 750 $^1$m diameter pinhole drilled in the center. A 2D+ MOT 2032 (FIG. 20C) loaded from this background vapor provides a transversely cooled beam of atoms that can be vertically transported to the 3D MOT chamber 1906 by passing through the 2D-3D pinhole 1916 (FIG. 20C (3.2c). Also separating the 2D and 3D MOT chambers is a Pyrex™ cylinder 2014 (FIG. 20A), which is bonded to the 2D MOT pinhole and contains an additional getter for improved vacuum quality.

Anodically bonded to the top of cylinder 2014 is the 3D MOT chamber 1906, which has the same dimensions as 2D MOT chamber 1904 and is also made of Pyrex. In order to have MOT lifetimes of 10-20 seconds, the 3D MOT chamber is kept at a lower pressure of approximately 0.1 nanoTorr, which is orders of magnitude lower than the adjacent connecting 2D MOT chamber pressure. Sufficient isolation between the high and low pressure MOT chambers is provided by the 2D-3D pinhole, as the 0.024 mL/sec conductance of pinhole 1916 is negligible compared to the 0.4 L/sec pumping rate of the ion pumps described further below.

Figure 21:
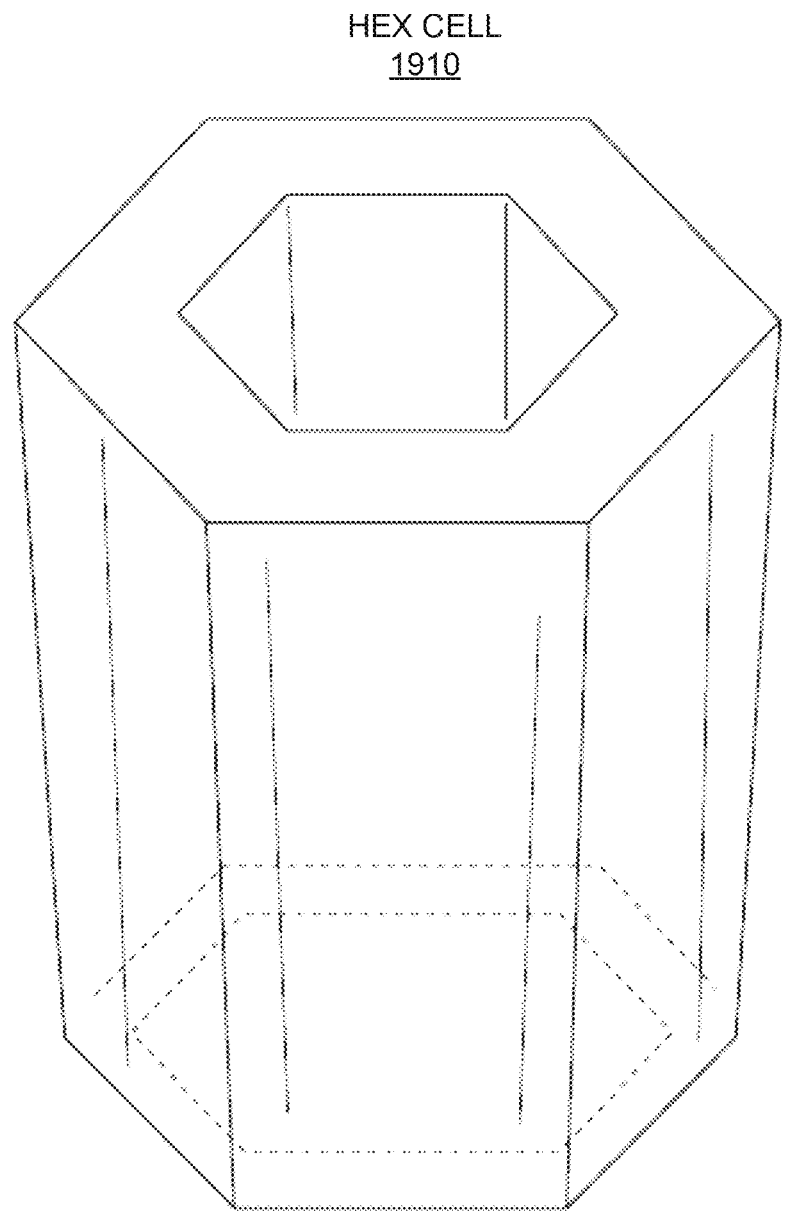
FIG. 21(3.3) is a perspective view of a hex cell of the hex-cell vacuum system of FIG. 19.

Because of the very low background pressure of 0.1 nanoTorr in the 3D chamber, a 3D MOT cannot be loaded from a background gas. Instead, a stream of pre-cooled 2D+ MOT atoms are pushed through the 2D-3D pinhole 1916 and into 3D MOT chamber 1906, where the atoms are used to source the 3D MOT. This design of using a 2D MOT to directly source a 3D MOT in an entirely separate vacuum chamber is called a double-MOT cell and it improves the 3D MOT lifetime by decoupling the atom lifetime (which is set by the 3D chamber vapor pressure) from the MOT load time (which is set by the 2D chamber vapor pressure). Similar to 2D MOT chamber 1904, 3D MOT chamber 1906 is capped with a silicon disc but features a larger pinhole (aperture 1918) with a 3.18 mm diameter. This pinhole is larger so that the 3D MOT itself can be transported vertically into Hex cell 1910, located above 31) MOT chamber. 1906. This entire source-2D-3D MOT vacuum ensemble is then anodically bonded to manifold 1908. The magnetic fields that are required to make the 2D+ and 3D MOTs are produced with permanent magnets 2042 (FIG. 20D) that are mounted on 3D printed braces that firmly mate to the outside of the MOT chambers. Hex cell 1910 is shown in greater detail in FIG. 21.

Located above the 3D MOT chamber is the six sided Hex Cell 1910 (3.3), which provides an UHV environment of less than 0.1 nanoTorr with six faces of optical access. The Hex cell walls are AR coated on all inside and outside faces for the 532, 780, 852, 1038, and 1064 nm wavelength lasers used herein. Hex cell 1910 is optically contact bonded to the top of the Pyrex manifold 1908 (FIG. 19) and is pumped by its own individual ion pump, separate from the 2D-3D ion pump 1920. At the base of Hex cell 1910 is an elliptically shaped aperture 1910 that is aligned with 2D-3D pinhole 1916 to allow the 2D+ MOT atoms to be transported directly into Hex cell 1910, bypassing 3D chamber 1906 entirely, such that a small 3D MOT can be created in Hex cell 1910 to serve as a cold atom reservoir.

Figure 22:
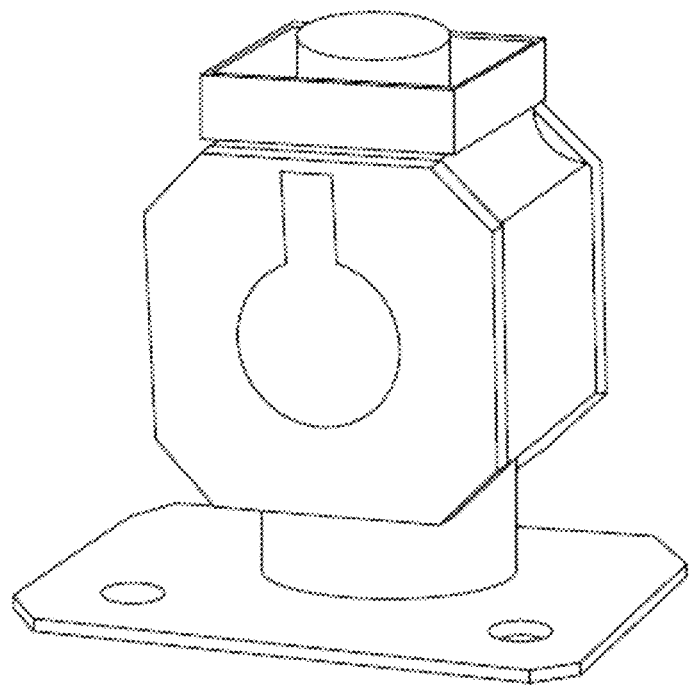
FIG. 22 (3.4b) is a perspective view of an ion pump of the hex-cell vacuum system of FIG. 19.
Figure 23:
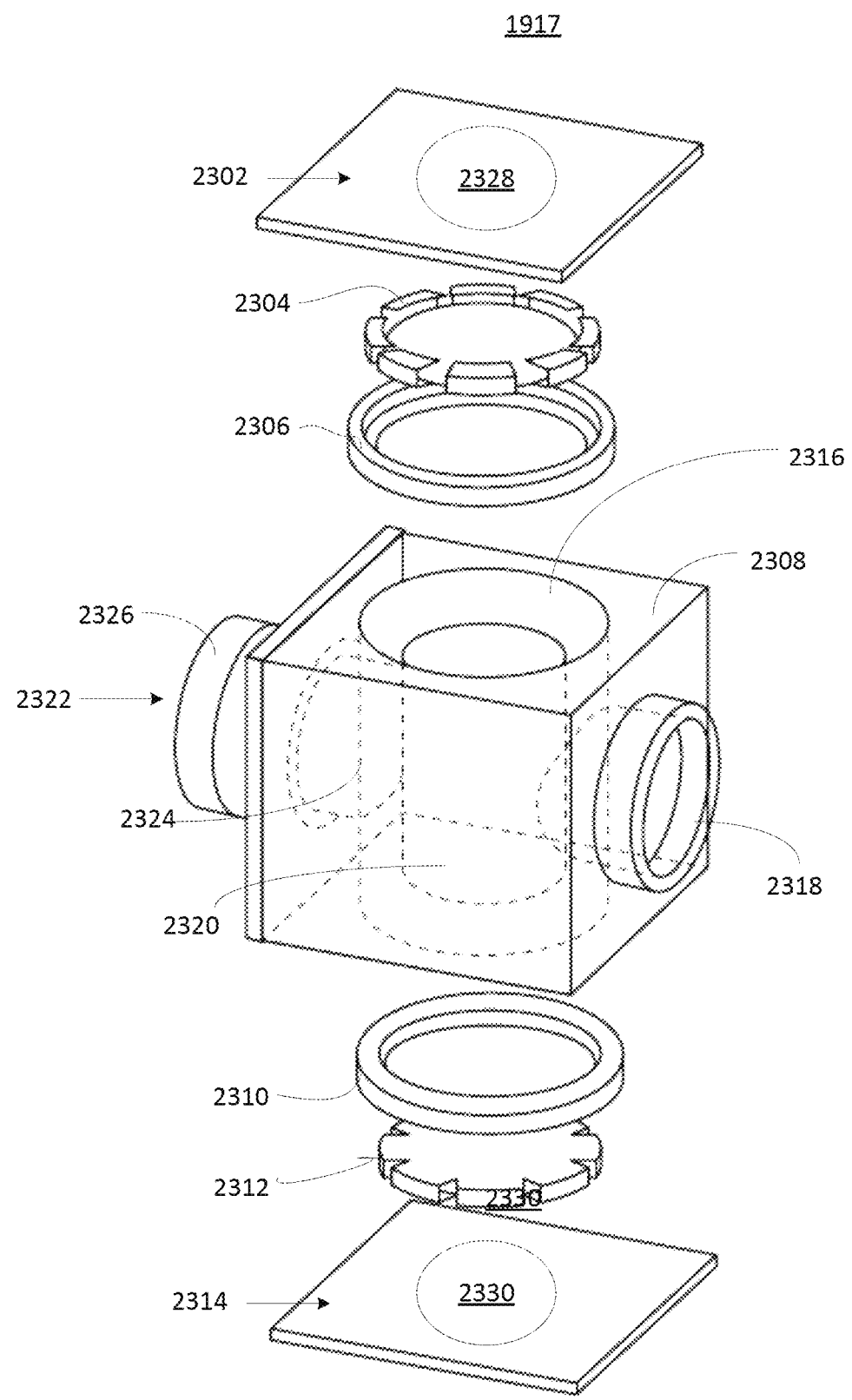
FIG. 23(3.4A) is an exploded view of the ion pump of FIG. 22.

System 1900 features two 0.4 L/sec ion pumps 1917, one of which shown in FIG. 22 (3.4b), that are constructed by anodically bonding each component together rather than using large nuts, bolts, screws, or epoxies. An exploded view of one of ion pumps 1917 is presented in FIG. 23 (3.4a). From top to bottom, ion pump 1917 includes an upper cathode 2302, an upper titanium disk 2304, an upper Pyrex™ retainer 2306, a Pyrex™ body 2308, a lower Pyrex™ retainer 2310, a lower titanium disk 2312 and a lower cathode 2314.

Body 2308 of each ion pump 1917 is a machined Pyrex block that features ta vertically oriented bore hole 2316 and a horizontally oriented bore hole 2318. A titanium cylinder 2020, which serves as an anode 2022, extends most of the way through vertically oriented bore hole 2216. A conductive rod 2324 is placed inside horizontally oriented hole 2318 and is welded to titanium cylinder 2320. This rod 2324 extends all the way to the very left-most side of ion pump 1917. Horizontal bore hole 2318 is sealed at the distal end of rod 2324 with a metalized conductive silicon cap 2326. Electrical contact between cap 2326 and rod 2324 is made with a metal spring to form an anode feedthrough.

Metalized silicon cathodes 2302 and 2314 respectively cap the top and the bottom of ion pump 1917. Small Pyrex rings anodically respectively bonded to each cathode 2302, 2314. Placed in between the Pyrex rings and the cathodes are titanium discs 2304, 2312 that serve as cathode feedthroughs. Titanium disks 2304 and 2312 are slightly bowed, giving the discs spring-like properties. Connectivity between the anode and cathode is provided by the spring force present in the titanium discs. Due to its slight radius of curvature, the disc is constantly pushing on both the cathode and the titanium cylinder, which maintains constant electrical connectivity. Neodymium magnets 2328 and 2330 are mounted, respectively, on top and bottom cathodes 2302 and 2314 to produce the magnetic field required for ion pump 1917 to function. A custom Mu Metal box placed over the ion pumps provides magnetic shielding. The bottoms of ion pumps 1917 are anodically bonded directly to Pyrex manifold 1908 (FIG. 19). The 1 cm thick Pyrex manifold 1908 features channels machined throughout its interior to connect the ion pumps to their respective vacuum loads.

Figure 24:
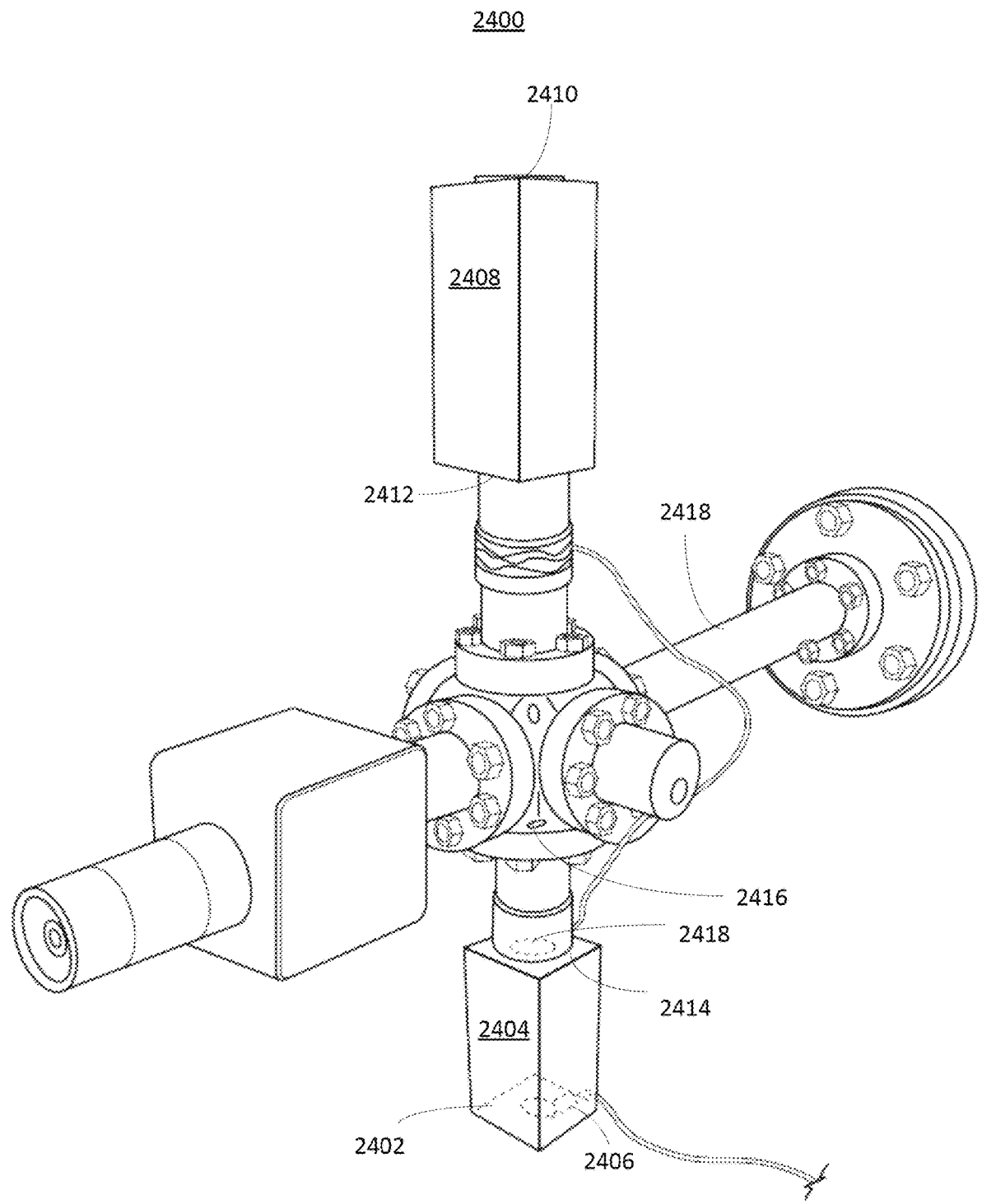
FIG. 24 (3.5) is a perspective view of an atomtronics vacuum system.

An atomtronics vacuum system 2400 is shown in FIG. 24 still attached to a bake-out station via a copper pinch tube 2018 that has not yet been pinched off. Atomtronics vacuum system 2400 includes a 3D MOT chamber 2408 that is used as a site for a matter-wave transistor oscillator. System 2400 includes an AES alkali metal ($^{87}$Rb) dispenser 2402 located at a base of a 2D MOT chamber 2404. An NEG 2406 is included adjacent to dispenser 2402 to improve vacuum quality. The 2D MOT chamber 2404 and a 3D MOT chamber 2408 are made with Pyrex walls and have dimensions of 2 cm×2 cm×4 cm. The ambient and vacuum side walls of 3D MOT chamber are AR coated for 780 nm laser light. An atom chip 2410 is anodically bonded to the top of 3D MOT chamber 2408 and forms the upper surface of atomtronics system 2400. Atom chip 2410 is used for generating BECs within a 3D MOT chamber 2408.

Bases of the 2D and 3D MOT chambers 2404 and 2408 are attached to ConFlat flanges via glass-to-metal anodic bonds 2412 and 2414. Atomtronics system 2400 is then held together by bolting each MOT chamber 2404, 2408 onto a spherical cube 2416. Isolation between the 2D and 3D MOT chambers 2404 and 2408 is provided by a 750 μm pinhole 2418, which is drilled into a silicon wafer placed at the top of the 2D MOT chamber 2404. The pinhole permits differential pumping between the 2D and 3D chambers, resulting in a background pressure 0.1 nanoTorr in 3D chamber 2408.

An Agilent 2 L/sec ion pump is also bolted to the spherical cube 2416 to maintain UHV. When bolting each chamber or ion pump onto the spherical cube 2416, a copper gasket is placed between the base of the ConFlat and the spherical cube. A vacuum seal is established when knife edges, found at the base of the ConFlat, as well as on the spherical cube, are tightly pressed into the copper gaskets, creating a knife-edge seal.

Atomtronics system 2400 is initially pumped down to UHV by bolting the entire vacuum system to a much larger vacuum station via a copper pinch off tube 2418 and following a standard bake-out procedure at approximately 300° C. Following bake-out, the atomtronics system was separated from the bake-out station by "pinching" pinch off tube 2418 with a set of hydraulic jaws. After removal, the system is soft baked for 5-7 days at 120° C. to remove any water moisture that erroneously entered the cell 2400 during pinch-off.

Figure 25:
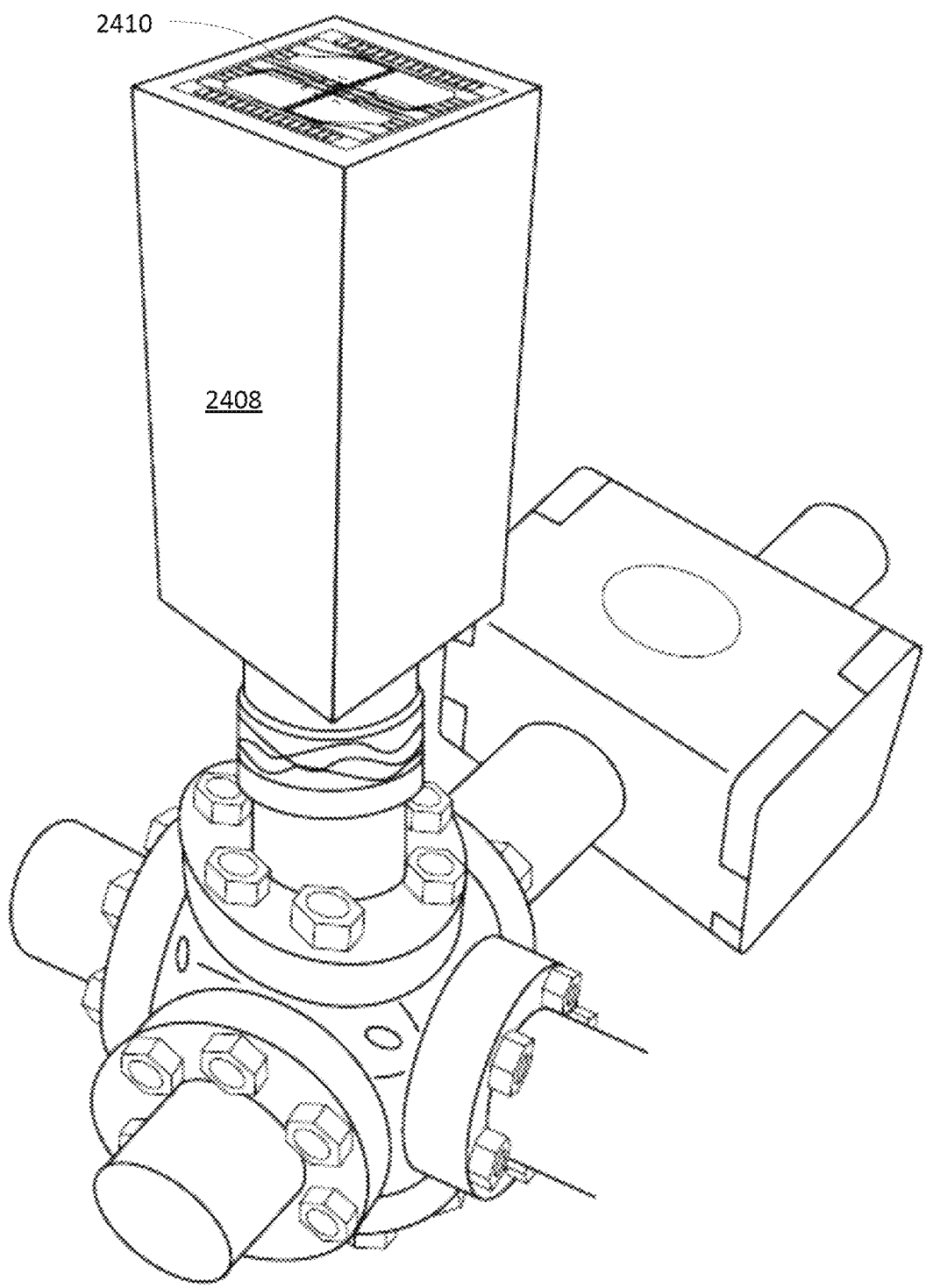
FIG. 25 (3.6a) is a perspective view of the atomtronics vacuum system of FIG. 24 showing an atom chip at the top of the cell.

As best seen in FIG. 25 (3.6a), the top surface of the 3D MOT chamber 2408 is an atom chip 2410. Not shown in FIG. 25 are conductive leads between atom chip 2410 and external electronics. Found on both the ambient and vacuum sides of atom chip 2410 are small gold wires 2602, shown in FIG. 26(3.6b) and ranging in width from 100-500 μm. Running electrical currents through various atom chip wires produces the magnetic fields necessary to setup a harmonic magnetic potential in order to perform magnetic trapping, evaporative cooling, and ultimately Bose-Einstein condensation of an ensemble of $^{87}$Rb atoms. Atom chip 2410 is also used to form the harmonic magnetic potential for a matter-wave transistor oscillator. A 2 mm wide Pyrex window 2604 built into the center of the atom chip 2410 allows for optical access of atoms trapped in the magnetic potentials as well as in-situ imaging of a BEC confined to a magnetic potential.

Figure 26:
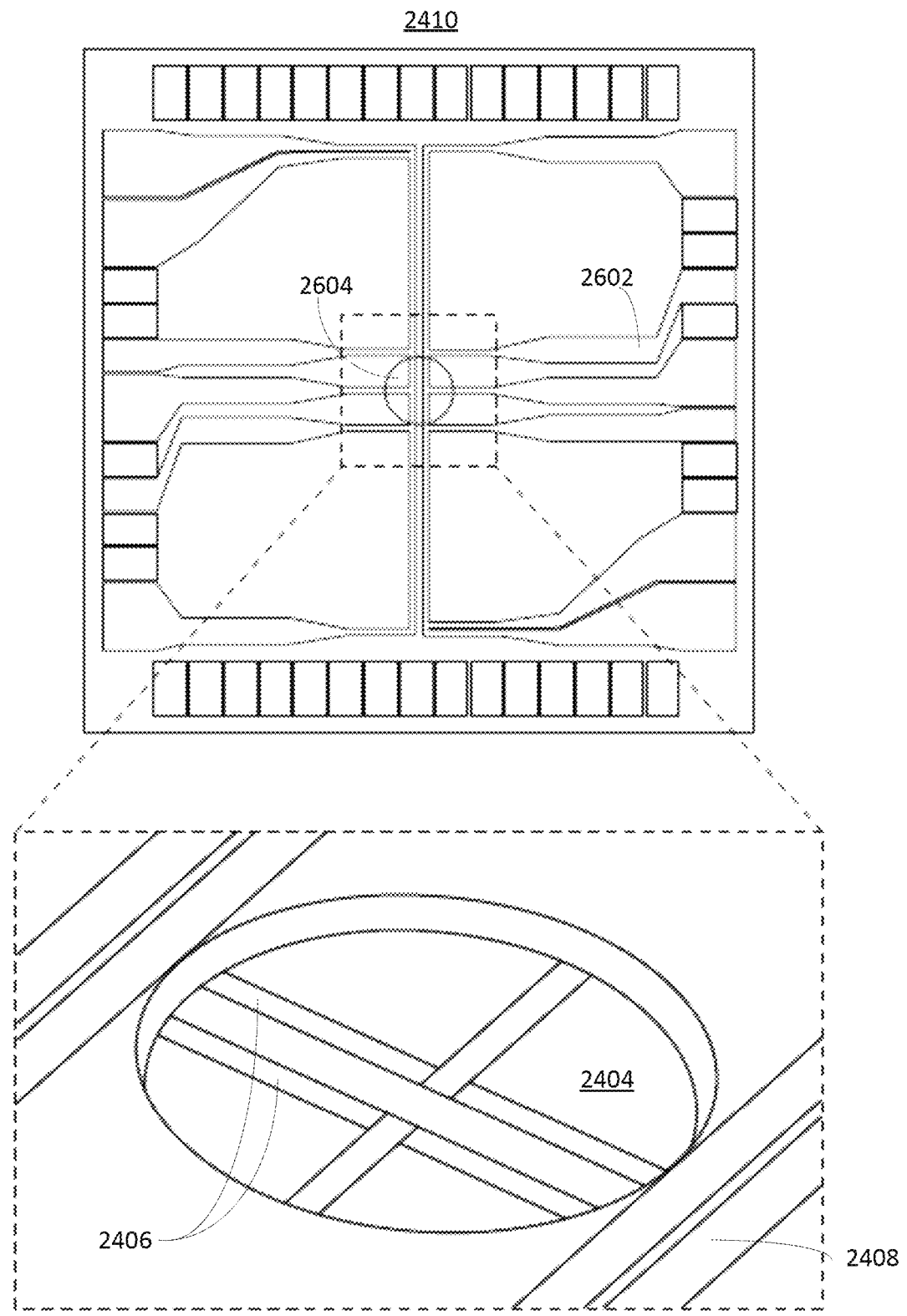
FIG. 26 (3.6b) shows the underside (vacuum side) of the atom chip of FIG. 25.

Formation of harmonic potentials for the transistor uses guide wires 2406 and H-wires 2408 positioned at the centrally located chip window. A single pair of parallel guide-wires 2606 is shown in the detail of FIG. 26 (3.6b) as the set of parallel running wires extending over the atom chip window 2604. Two pairs of parallel oriented "H-wires" 2608 can also run along the outer edge of the chip window and are oriented perpendicular to guide-wires 2406.

Consider running a current I, through one of the chip guide-wires 2406. Compared to the size of the atoms as well as the dimensions of a BEC, the guide-wire is considered to be infinitely long. (Herein, typical BEC dimensions are 50-100 μm in the longitudinal direction.) From Ampere's law, the current I, running through the guide-wire produces a magnetic "guide-wire" field $$B = \frac{\mu_0}{2\pi} \frac{I_x}{r} \hat{\phi} \tag{51}(3.1)$$

with corresponding field gradient B' and curvature B" of $$B' = -\frac{\mu_0}{2\pi} \frac{I_x}{r^2} \hat{\phi} \tag{52}(3.2)$$

-continued $$B'' = \frac{\mu_0}{\pi} \frac{I_x}{r^3} \hat{\phi}$$

where $\mu_0$ is the permeability of free space and r is the distance from the guide wire. The corresponding field lines for the magnetic field 2710 generated using the guide wire are shown in FIG. 27A (3.6c). To produce a local minimum in this field (to permit magnetic trapping), a bias field 2720, represented in FIG. 27B (3.6d), is applied in the ŷ direction with strength $B_y \hat{y}$. As shown in FIG. 27C, the vector summation of the y-bias field of FIG. 27B with the guide-wire field of FIG. 27A creates a quadrupole field 2730, shown in FIG. 27C, by canceling the guide-wire field below the wire at a depth d given by $$d = \frac{\mu_0}{2\pi} \frac{I_x}{B_y}. \tag{53}(3.3)$$

Since the magnetic field 2730 is symmetric along the axis of the guide-wire (in and out of the page with FIG. 27C 3.6e), a local minimum exists a distance d below the entire length of the guide-wire. This forms a hollow, tube-like region of zero magnetic field surrounded by high magnetic field, which permits loose confinement along the direction of the guide-wire (i.e. the longitudinal direction) and strong confinement perpendicular to the guide-wire (i.e. the radial direction). While the guide-wire magnetic field, gradient, and curvature features symmetry in $\hat{r}$, $\hat{\phi}$, $\hat{z}$, cylindrical coordinates, it is useful to express all fields and their derivatives in rectilinear coordinates. Accordingly, the total guide-wire magnetic field from equation 51 (with the y-bias field included) in rectilinear coordinates is $$B = \frac{\mu_0 I_x}{2\pi} \left[ \left( \frac{z}{y^2 + z^2} - \beta_y \right) \hat{y} + \frac{y}{y^2 + z^2} \hat{z} \right]. \tag{54}(3.4)$$

By choosing to orient the guide-wire along the $\hat{x}$ axis, the local minima of the quadrupole field is found by simply taking the limit of equation 54 as y→0 and z→d. In this limit, the guide-wire fields can be approximated:

$$B_y \approx \frac{\mu_0 I_x}{2\pi} \frac{1}{z^2} - \beta_y \tag{55a}(3.5a)$$

$$B_z \approx \frac{\mu_0 I_x}{2\pi} \left( \frac{y}{y^2 + d^2} \right). \tag{55b}(3.5b)$$

Figure 28A:
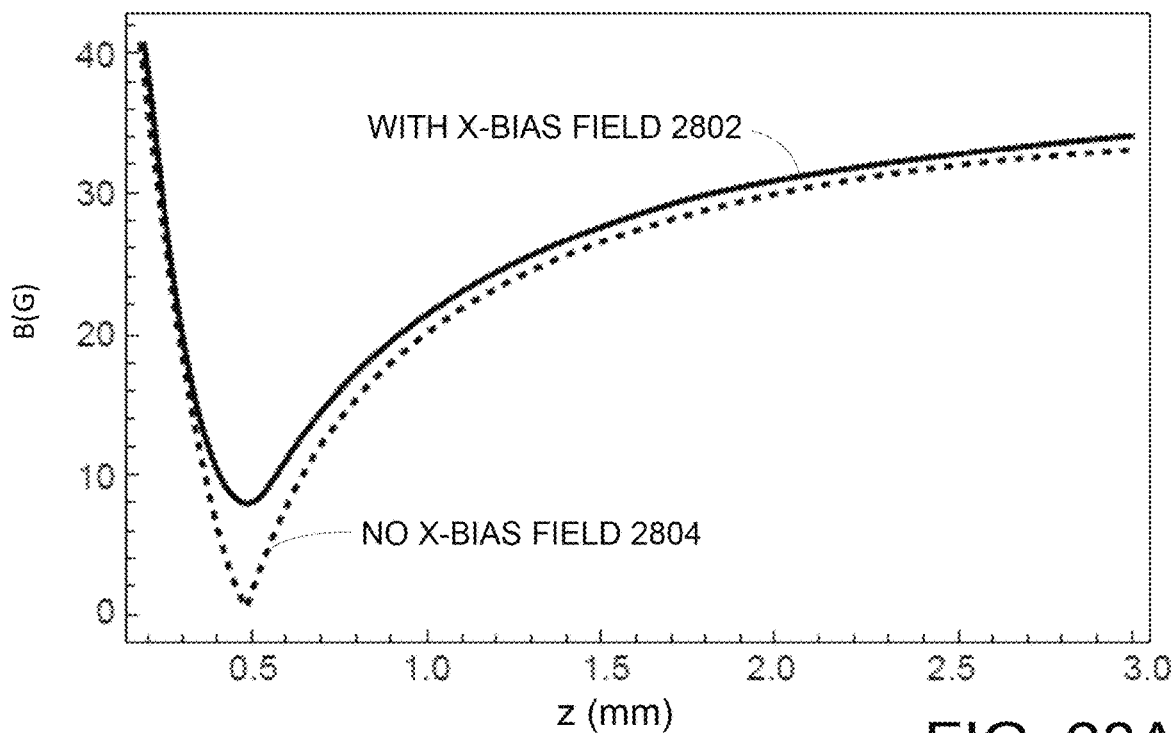
FIG. 28A (3.7A) is a plot of a guide-wire magnetic field in the $\hat{z}$ direction.
Figure 28B:
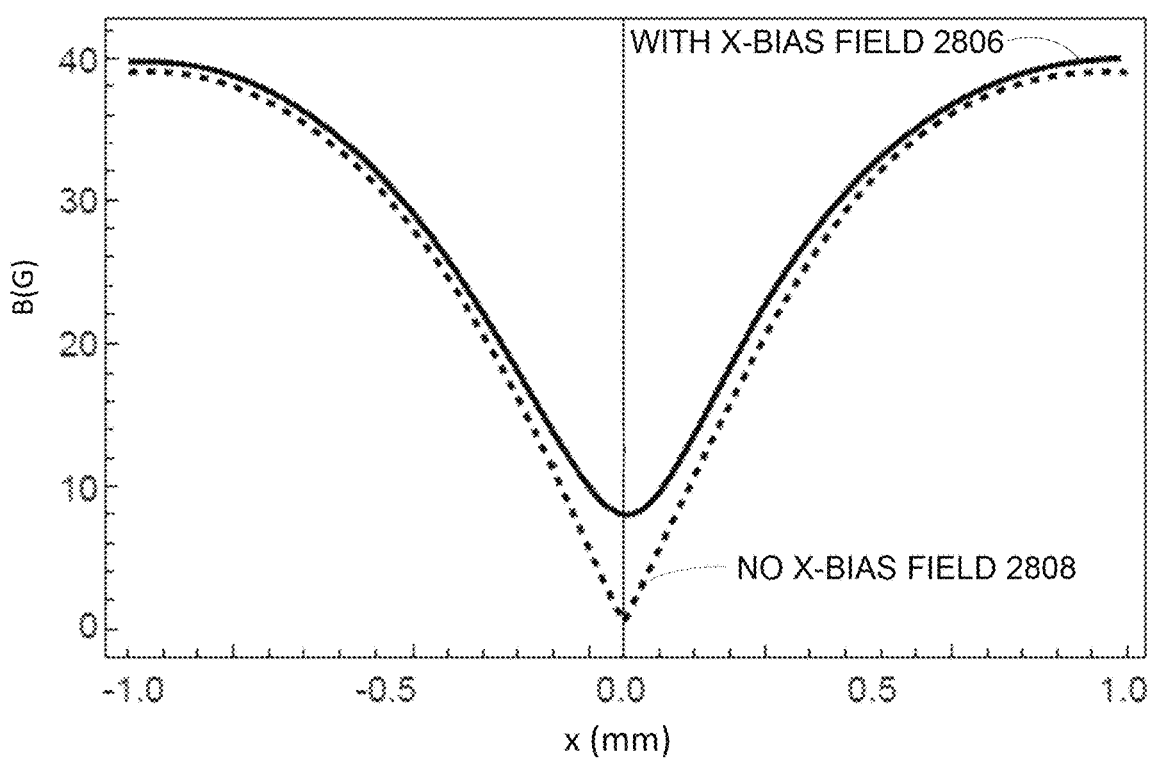
FIG. 28B (3.7B) is a plot of the guide-wire magnetic field of FIG. 28A in the $\hat{x}$ direction.

With equations 55a and 55b, one of the requirements for magnetic trapping is satisfied: a localized minimum for a magnetic field has been produced. However, the quadrupole fields from equations 55a and 55b produced by the atom chip can be problematic for atom trapping and reaching BEC. Plotting the fields $B_y$ and $B_z$ (FIG. 28A), one can immediately observe that a cusp exists at the zero of both fields. (The cusp in the magnetic field creates a discontinuity where the atoms cannot adiabatically follow the field. At the zero crossing, the field gradient is undefined, which can induce spin flips (called "Majorana spin flips") into a strong-field seeking state (that is $m_f g_F > 0$) where the atom can no longer be trapped. This cusp not only perturbs the harmonic potential, but it also results in atom losses due to heating via Majorana spin flips. The cusp in fields $B_y$ and $B_z$ can be removed by adding another bias field $B_x\hat{x}$, along the direction of the guide-wire. FIG. 28A shows the z direction with the x-bias field 2802 and without the x-bias field 2804; FIG. 28B shows the x direction magnetic with the x-bias field 2806 and without the x-bias field 2808. With the addition of this x-bias field, the total field of the guide-wire is approximately $$B = \beta_x \hat{x} + \left(\frac{\mu_0 I_x}{2\pi} \frac{1}{z^2} - \beta_y\right)\hat{y} + \left(\frac{\mu_0 I_x}{2\pi} \frac{y}{y^2 + d^2}\right)\hat{z}. \quad (56)(3.6)$$

Using the magnetic field from equation 56 3.6, we can form a magnetic potential that can confine atoms along the radial direction but cannot trap atoms along the longitudinal direction, since $\nabla_x B = 0$. To confine atoms along the $\hat{x}$, or longitudinal direction, a current $I_H$ can be run through a pair of H-wire 2602 (FIG. 26) centered about the atom chip window that run perpendicular to the guide wire. The H-wires are fabricated to be a rectangular wire with a width w. They are wider than the guide-wires because they carry a considerably higher current load. Each pair of H-wires and its conjugate pair placed symmetrically on the opposite side of the chip window is separated by distance l. Therefore, running a current $I_H$ through the H-wire pair produces a magnetic field given by Ampere's law as $$B_H = \frac{\mu_0 I_H}{2\pi\omega}\left[\ln\left(1 + \frac{\omega}{x + l/2}\right) - \ln\left(1 + \frac{\omega}{x + l/2}\right)\right]\hat{x}. \quad (57)(3.7)$$

Figure 29A:
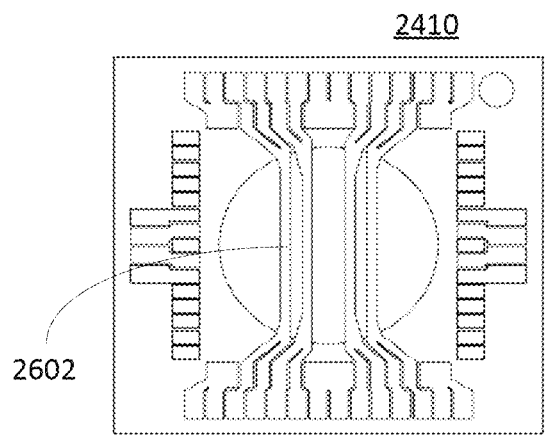
FIG. 29A (3.8a) is a top plan view of the ambient side of the atom chip. The vertically running pairs of wires are the H-wires and are centered about the chip window.
Figure 29B:
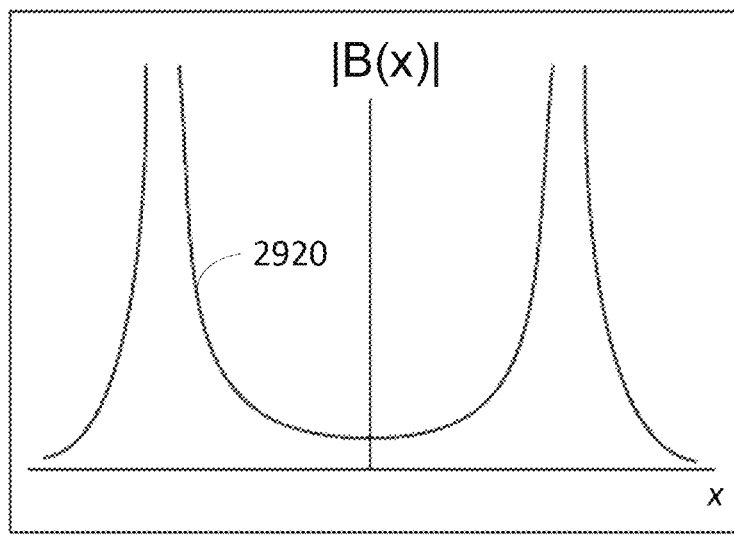
FIG. 29B (3.8b) is a plot of the H-wire magnetic field $B_H$ produced by running current of equal direction and magnitude through two pairs of H-wires centered about the chip window.
Figure 29C:
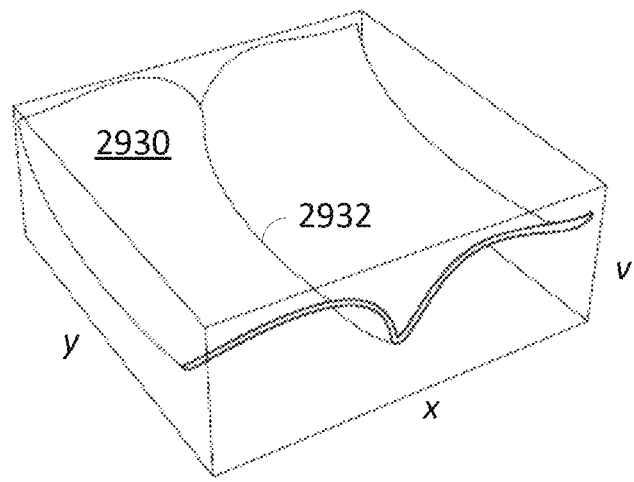
FIG. 29C (3.8c) is a plot of a combined magnetic potential forming an Ioffe-Pritchard trap from the guide-wire field and the H-wire field.

By combining the magnetic fields from the guide-wire (equation 56 (3.6)) and the H-wire (equation 3.7), the total field forms a three-dimensional harmonic magnetic potential capable of trapping atoms in a local field minimum. This configuration is called an Ioffe-Pritchard trap. Accordingly, FIG. 29A shows the ambient side of atom chip 2410. The vertically running pairs of wires are the H-wires 2602 and are centered about the chip window. FIG. 29B is a plot of the H-wire magnetic field $B_H$ 2920 (equation 57) produced by running current of equal direction and magnitude through two pairs of H-wires centered about the chip window. FIG. 29C illustrates a combined magnetic potential 2930 forming an Ioffe-Pritchard trap 2932 from the guide-wire field (equation 56 (3.6)) and the H-wire field (equation 57 (3.7)).

Figure 30A:
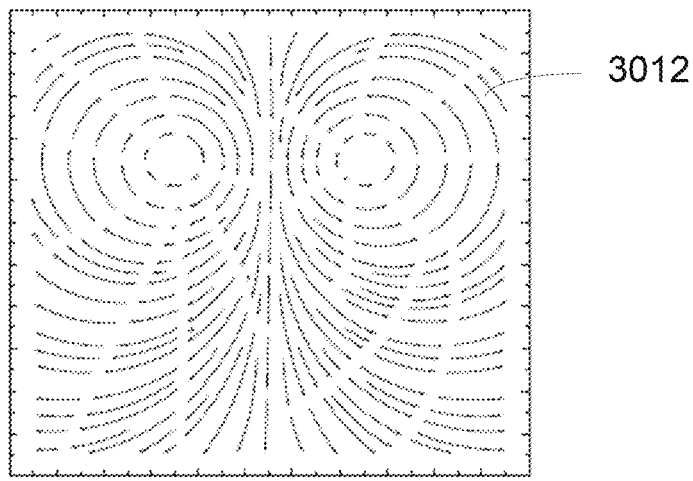
FIG. 30A (3.9a) is a two-dimensional cross section of the magnetic field produced by running opposing currents through the pair of guide-wires.

The magnetic fields used to radially confine ultra-cold atoms (equation 56 (3.6)) was formed by running current $I_x$ through a single guide-wire. This places the magnetic trap a distance d (equation 53 (3.3)) below the wire, which blocks optical access. In order to gain optical access to ultra-cold atoms trapped in the magnetic potential, the trap must be located out from under the guide wire. This can be accomplished by adiabatically ramping up an oppositely flowing current through the second guide-wire (running parallel to the first, separated by distance l; FIG. 26B (3.6b)) from 0 to $-I_x$. Under this new set of conditions, the magnetic field (and hence the potential) is shifted directly under the chip window, forming what is called the "split guide-wire trap." This is readily shown by applying Ampere's law to the case of running currents of equal magnitude Ix but with opposite directions through both guide wires separated by distance l (FIG. 26 (3.6b)). The resulting magnetic field is $$B = \frac{\mu_0 I_x}{2\pi}\left[\left(\frac{z}{(y+l/2)^2 + z^2} - \frac{z}{(y-l/2)^2 + z^2}\right)\hat{y} + \left(\frac{y+l/2}{(y+l/2)^2 + z^2} + \frac{y-l/2}{(y-l/2)^2 + z^2}\right)\hat{z}\right] \quad (58)(3.8)$$

and is plotted in FIG. 30A (3.9a).

Figure 30B:
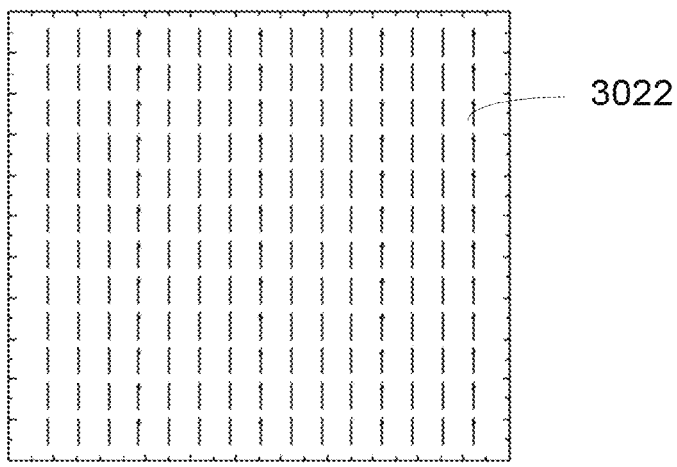
FIG. 30B (3.9b) represents a uniform bias field oriented purely in the z-direction.
Figure 30C:
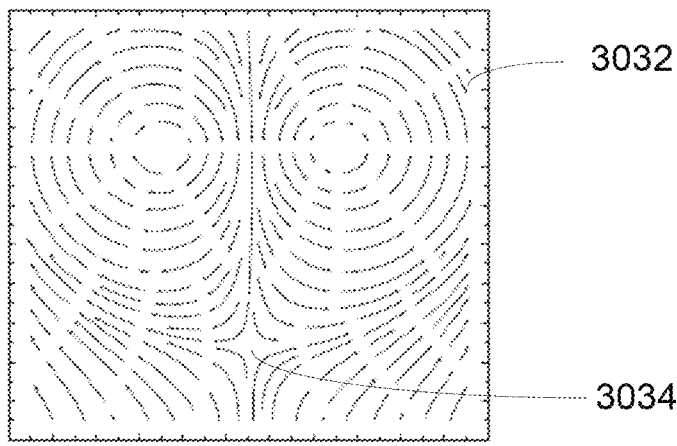
FIG. 30C (3.9c) represents a summation of a split guide-wire field of FIG. 30A and the z-bias field of FIG. 30B.

FIG. 30A (3.9) is a two-dimensional cross section of the magnetic field 3012 produced by running currents $I_x$ and $-I_x$ through the pair of guide-wires separated by distance l (equation 58 (3.8)). FIG. 30B represents a uniform bias field 3022 oriented purely in the z-direction. FIG. 30C represents a summation of the split guide-wire field (equation 58 (3.8)) and the z-bias field. The result gives a magnetic quadrupole field 3032 featuring a local minimum 3034 a distance D below the center of the atom chip window. This plot is a 2D cross-section that is symmetric in and out of the page and thus the field minimum runs below the entire chip window, giving a region where both magnetic trapping of atoms and optical access is permitted.

Similar to the single guide-wire trap, a local minimum in equation 58 (3.8) can be formed by applying a bias field, this time oriented in the $\hat{z}$ direction with magnitude $B_z$ (FIG. 30 3.9b). By adding the bias field to equation 58 (3.8), a quadrupole field oriented along the x-axis is formed at a depth D below the chip window where $$\mathcal{D} = \sqrt{\frac{\mu_0}{2\pi}\frac{I_x l}{\beta_z} - \frac{l^2}{4}}. \quad (59)(3.9)$$

Physically, the quantity D represents the z value where the z-bias field, $\beta_z$, cancels the $\hat{z}$ component of the split-guide wire field (equation 58 (3.8)) along the entire line y=0 (FIG. 30C (3.9c)). As in the single-guide wire case, Majorana spin flipping is avoided by transforming the quadrupole trap into an Ioffe-Pritchard trap by adding an x-bias field $\beta_x$ along the direction of the split guide-wires. Therefore, the total field that gives rise to the split guide-wire Ioffe-Pritchard trap is $$B = \frac{\mu_0 I_x}{2\pi}\left[\frac{z}{(y+l/2)^2 + z^2} - \frac{z}{(y-l/2)^2 + z^2}\right]\hat{y} + \left[\frac{\mu_0 I_x}{2\pi}\left(\frac{y+l/2}{(y+l/2)^2 + z^2} + \frac{y-l/2}{(y-l/2)^2 + z^2}\right) + \beta_z\right]\hat{z} + \beta_x\hat{x}. \quad (60)(3.10)$$

The local minima of the total magnetic field that forms the split guide-wire Ioffe-Pritchard trap is found by taking the limit of equation 60 (3.10) as y→0 and z→d, giving $$B_x = \beta_x \quad (61a)(3.11a)$$

$$B_y = \frac{\mu_0 I_x}{2\pi}\left[\frac{\mathcal{D}}{(y+l/2)^2 + \mathcal{D}^2} - \frac{\mathcal{D}}{(y-l/2)^2 + \mathcal{D}^2}\right] \quad (61b)(3.11b)$$

$$B_z = \frac{\mu_0 I_x}{2\pi}\left[\frac{l}{l^2/4 + z^2}\right] - \beta_z. \quad (61c)(3.11c)$$

Recall from equation 59 (3.9) and the sentence that follows it, that B, vanishes when z=D. Therefore, equation 61a (3.11a) is not used in the magnitude of the total field at the location z=D. From equations 61b (3.11b) and 61c (3.11c), the magnitude of the total field at the location z=D is $$|B| = \sqrt{B_x^2 + B_y^2} \qquad (62)(3.12c)$$

$$= \left(\left[\frac{\mu_0 I_x}{2\pi}\left(\frac{\mathcal{D}}{(y+l/2)^2 + \mathcal{D}^2} - \frac{\mathcal{D}}{(y-l/2)^2 + \mathcal{D}^2}\right)\right]^2 + \beta_x^2\right)^{1/2}.$$

While this expression gives the total B-field located a distance D under the chip window, it can be more useful to also only consider the field at small y values, since, after all, atoms are localized to y≈0 when trapped in the field minimum. Therefore, the field is expanded in a Maclaurin series $$|B| = \beta_x + \frac{8\pi^2}{\mu_0^2 I_x^2}\frac{\mathcal{D}^2}{l^2}\frac{\beta_z^4}{\beta_x}y^2 + O(4). \qquad (63)(3.13)c$$

The trapping forces on an atom in this spatially varying magnetic field are readily calculated by evaluating the first and second spatial derivatives of equation 63 (3.13), giving corresponding field gradient B' and curvature B" of $$|B'| = \frac{16\pi^2}{\mu_0^2 I_x^2}\frac{\mathcal{D}^2}{l^2}\frac{\beta_z^4}{\beta_x}y \qquad (64a)(3.14a)$$

$$|B''| = \frac{8\pi}{\mu_0 I_x l}\frac{\beta_z^3}{\beta_x} \qquad (64b)(3.14b)$$

where the definition of D given in equation 59 3.9 is used in solving |B"|. Using equations 64a (3.14a) and 64b (3.14b), the radial trapping force imparted onto atoms in the split guide wire trap is:

$$F_{rad} = -\nabla(\hat{\mu}\cdot B) \approx -\mu_b B' = -\frac{16\mu_b\pi^2}{\mu_0^2 I_x^2}\frac{\mathcal{D}^2}{l^2}\frac{\beta_z^4}{\beta_x}y \qquad (65)(3.15)$$

which features a trapping frequency in the radial direction of $$\omega_{rad} = \sqrt{\frac{\mu}{m}B''} = \sqrt{\frac{8\pi}{\mu_0 I_x}\frac{\mu}{ml}\frac{\beta_z^3}{\beta_x}}. \qquad (66)(3.16)$$

The trapping potential along the longitudinal direction is still provided by the same H-wire field given in equation 57 (3.7). Thus the trapping force and corresponding trapping frequencies in the longitudinal direction are found by evaluating the first and second spatial derivatives of equation 57 3.7 and are $$F_{long} = -\nabla_x(\hat{\mu}\cdot B_H) = -\frac{4\mu_0 I_H}{\pi\omega}\left(\frac{x}{l^2 - 4x^2}\right) \qquad (67)(3.17)$$

$$\omega_H = \sqrt{\frac{\mu}{m}B_H''} \approx \sqrt{\frac{\mu\mu_0}{\pi w}\frac{2I_H}{ml}}. \qquad (68)(3.18)$$

Figure 31A:
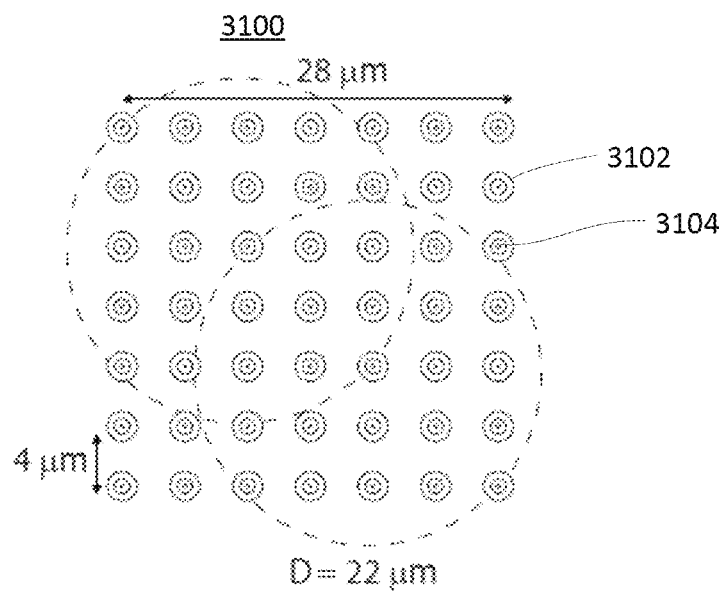
FIG. 31A (4.1a) is a schematic of a qubit array constructed with a 2D grid of equally spaced optical bottle beam traps.
Figure 31B:
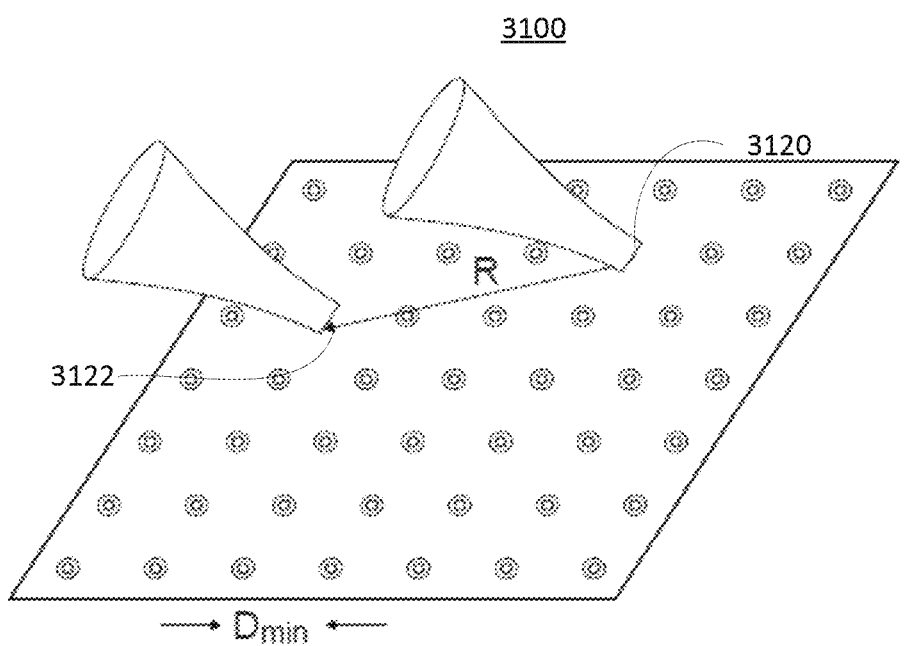
FIG. 31B (4.1b) is a perspective view of a qubit array with a pair of bottle-beam traps being used to entangle a pair of atoms.

Advances in neutral atom quantum computing have led to the development and demonstration of a 49-element atomic qubit array, where quantum information is stored in the ground states of neutral cesium atoms and two-qubit gates implemented with Rydberg states. As shown in FIG. 31A, a 7×7 49-qubit array 3100 includes 49 individual optical bottle beam (BoB) traps 3102. Each BoB trap 3102 confines exactly one cesium atom 3104. What is needed is to use such a qubit array, located inside an UHV chamber, to form quantum logic gates involving multiple qubits for an arbitrarily long length of time. FIG. 31B illustrates the use of pairs of entangled Rydberg state atoms 3420 and 3422 to perform quantum logic gates and operations involving multiple qubits simultaneously.

Figure 32A:
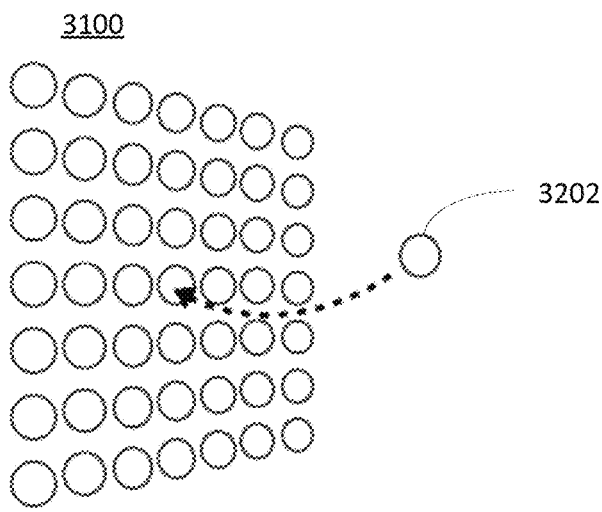
FIG. 32A (4.1c) represents astray background gas atom colliding with a trapped qubit so as to expel it from a bottle beam (BoB) trap.
Figure 32B:
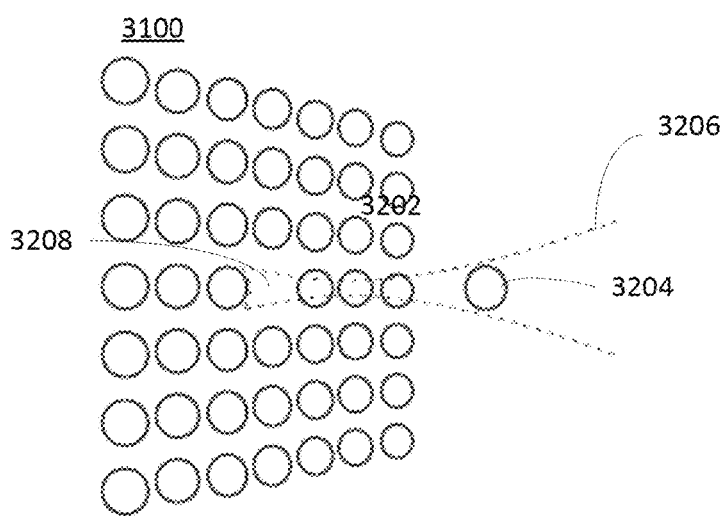
FIG. 32B represents a new pre-cooled cesium atom being transported with an optical (4.1d) conveyor belt to the vacated BoB site.
Figure 32C:
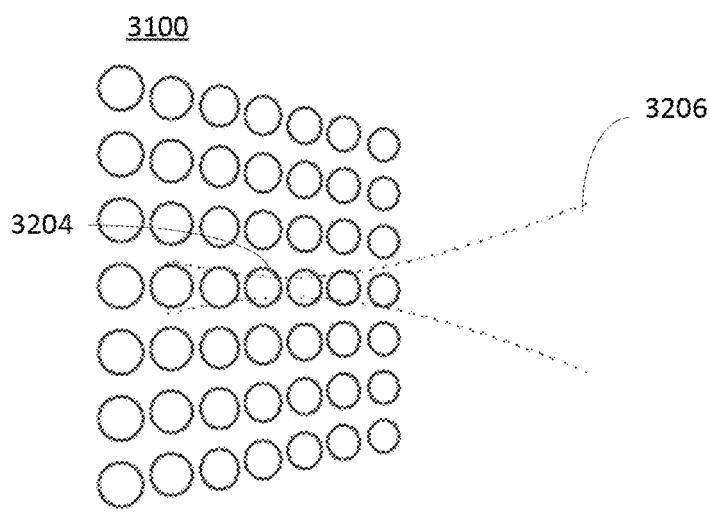
FIG. 32C (4.1e) represents at most one atom being transferred into the BoB trap, reloading the vacated site.

Due to collisions with thermal background atoms 3202, FIG. 32A (3.1c) in the surrounding vacuum chamber, trap lifetimes of qubits are on the order of τ=100 seconds (s). Thus, an array of N=49 cesium qubits can lose one qubit every τ/N≈2.0 s, on average. Even with extreme high vacuum of $10^{-4}$ nanoTorr, trapped atom lifetimes would be about one day. For a quantum computer to run arbitrarily long algorithms, atom loss would be an issue. Therefore, to sustain a functional neutral atom qubit array for an indefinite period of time, a new atom must be reloaded into the vacant BoB array site in a timely manner. One approach to loading single atoms into BoB traps involves overlapping the BoB with a magneto-optical trap (MOT). This approach reloads the newly vacant BoB site but can also disturb other loaded, neighboring sites due to collisions with other MOT atoms. Herein, a vacated BOB trap is reloaded by delivering a new atom from a distant cold atom reservoir by means of a movable, dynamic 1D lattice. FIGS. 32B and 32C show a new pre-cooled cesium atom 3204 being transported with an optical conveyor belt 3206 to the empty BoB site 3208. Exactly one atom at most is then transferred into the BoB trap, reloading the empty site and keeping the array fully occupied.

Initially, a few thousand atoms are loaded into a red-detuned 1D optical lattice from a background cold atom reservoir. Precise frequency control over the lattice beams causes the lattice to move back-and-forth along its axial direction, making it function as an "optical conveyor belt." This optical conveyor belt can be used to transport the small atom ensemble approximately 1.1 mm to an empty optical BoB trap followed by transferring exactly one atom at most into the BoB trap.

The single atom transport and reloading experiment requires the use of three sets of lasers with various detunings from the $^{133}$Cs D2 line (λ=852.347 nm, ν=351.725 THz): 1) three 852 nm lasers that are on resonance with the $^{133}$Cs D2 line; 2) one 780 nm laser for BoB traps that is blue-detuned from resonance; and 3) one 1064 nm laser for atom transport that is red-detuned from resonance.

852 nm resonant laser light can be produced using Vescent Photonics D2-100-DBR-852 distributed Bragg reactor (DBR) diode lasers. Atom transport and reloading uses three individual DBRs: one to provide cooling light, one to provide repump light, and one to act as a probe laser to perform absorption imaging. In addition, a New Focus VAMP TA-7616 tapered amplifier (TA) can be used to amplify the light emitted from the cooling DBR from 70 mW to 500 mW of total usable laser power. Blue detuned light at 780 nm, used to form optical bottle beam traps and bottle beam arrays, is produced with a Sanyo DL 7140-201 S laser diode and is amplified by a Toptica BoosTA Pro to 3 W of laser power. Finally, the red detuned 1064 nm laser that is used for optical dipole trapping is a 30 W, IPG Photonics YLR-30-1064-LP-SF laser. A block diagram of the 852 nm, 780 nm, and 1064 nm laser systems are shown in FIGS. 33-37 (4.2 and 4.3).

Figure 33:
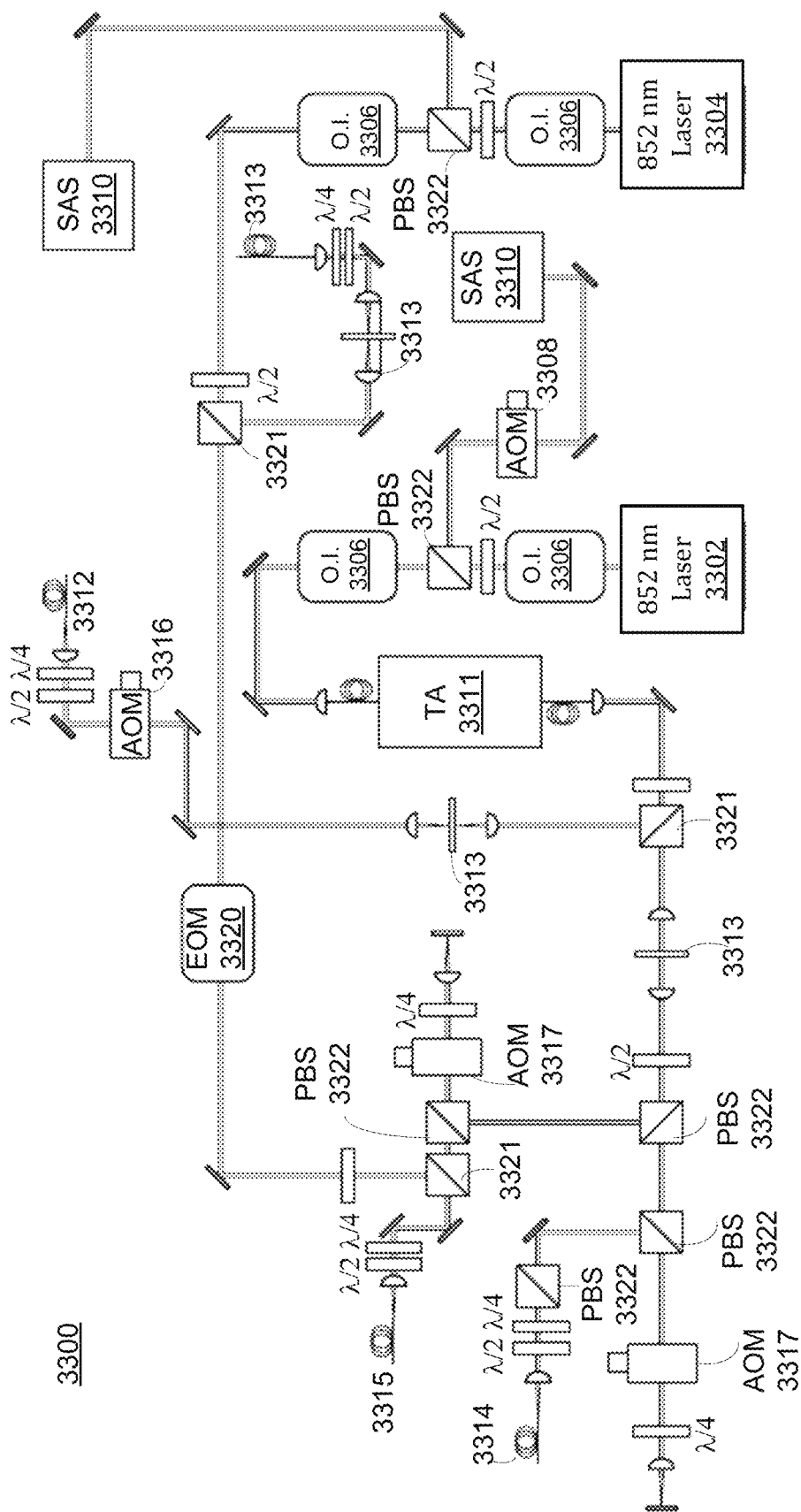
FIG. 33 (4.2a) is a schematic for 852 nm cooling and repump lasers.

FIG. 33 (4.2a) is a schematic of a setup 3300 for 852 nm cooling and repump lasers. Components include an 852 nm cooling laser 3302, an 852 nm repump laser 3304, optical isolators 3306, a 145 MHz acousto-optical isolator 3308, SAS (Statistical Analysis System) modules 3310, a tapered amplifier 3311, an optical guide 3312 for 2D MOT cooling, mechanical shutters 3313, an optical guide 3314 for 3D MOT cooling, an optical guide 3315 for 3D optical cooling and 3D optical repump, a 130 MHz acousto-optical modulator 3316, 66.5 MHz acousto-optical modulators 3317, beam splitters 3321, polarizing beam splitters 3322, half wave plates $\lambda/2$, and quarter-wave plates $\lambda/4$.

Figure 34:
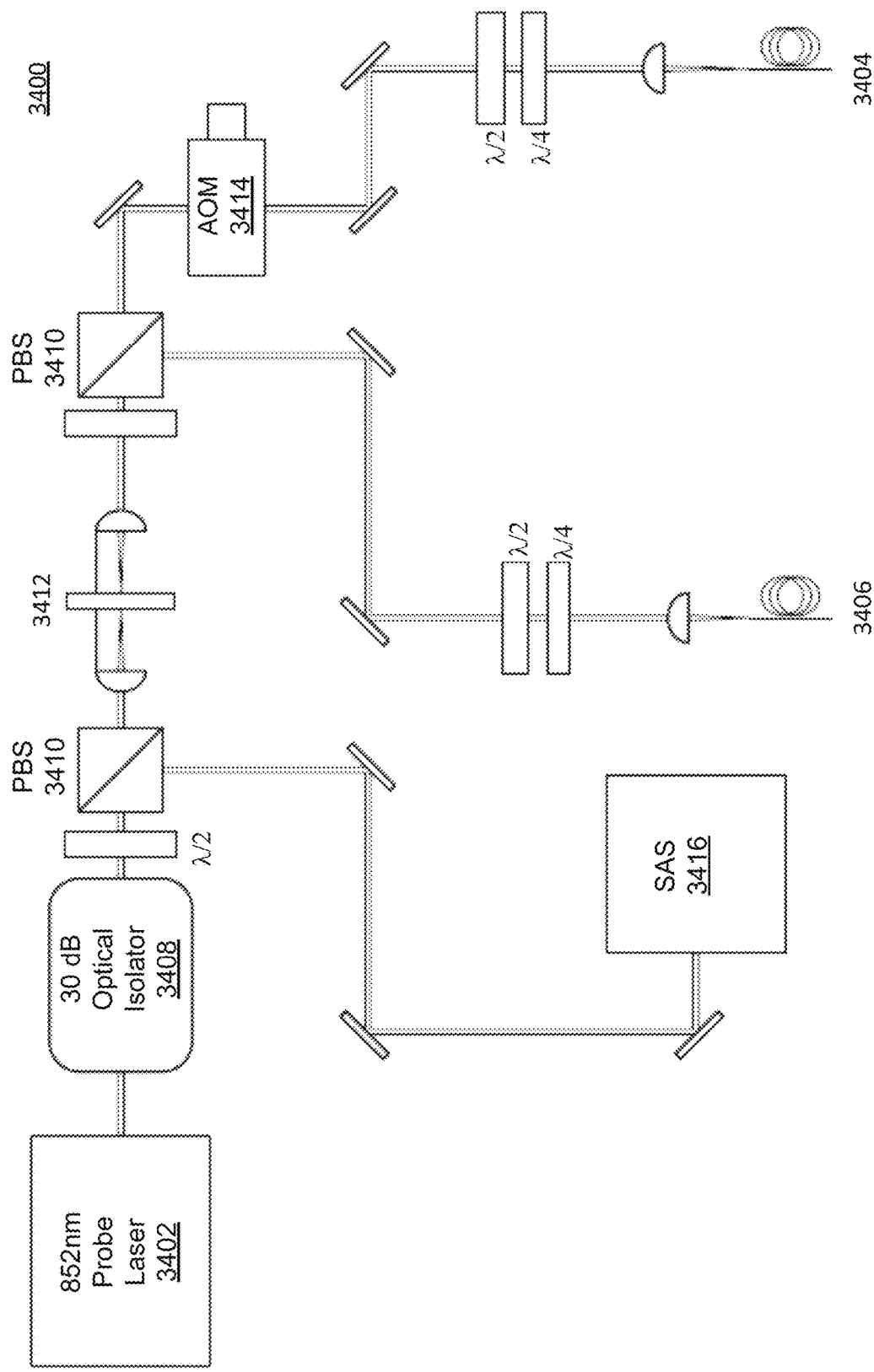
FIG. 34 (4.2b) is a schematic for 852 nm probe lasers.

FIG. 34 (4.2b) is a schematic of a setup 3400 for 852 nm probe lasers 3402. Components include a fiber optic guide 3404 for a probe laser, a fiber optical guide 3406 for a resonant laser beam, a 30 dB (decibel) optical isolator 3408, half-wave plates $\lambda/2$ and quarter-wave plates $\lambda/4$, polarizing beam splitters 3410, a mechanical shutter 3412, a 125 MHz acousto-optical module 3414, and an SAS module 3416. Mechanical shutter 3412 are used to turn on and off the laser beams, as are mechanical shutters 3313 in FIG. 33. Additionally, all fibers are 852 nm, polarization maintaining fibers.

Figure 35:
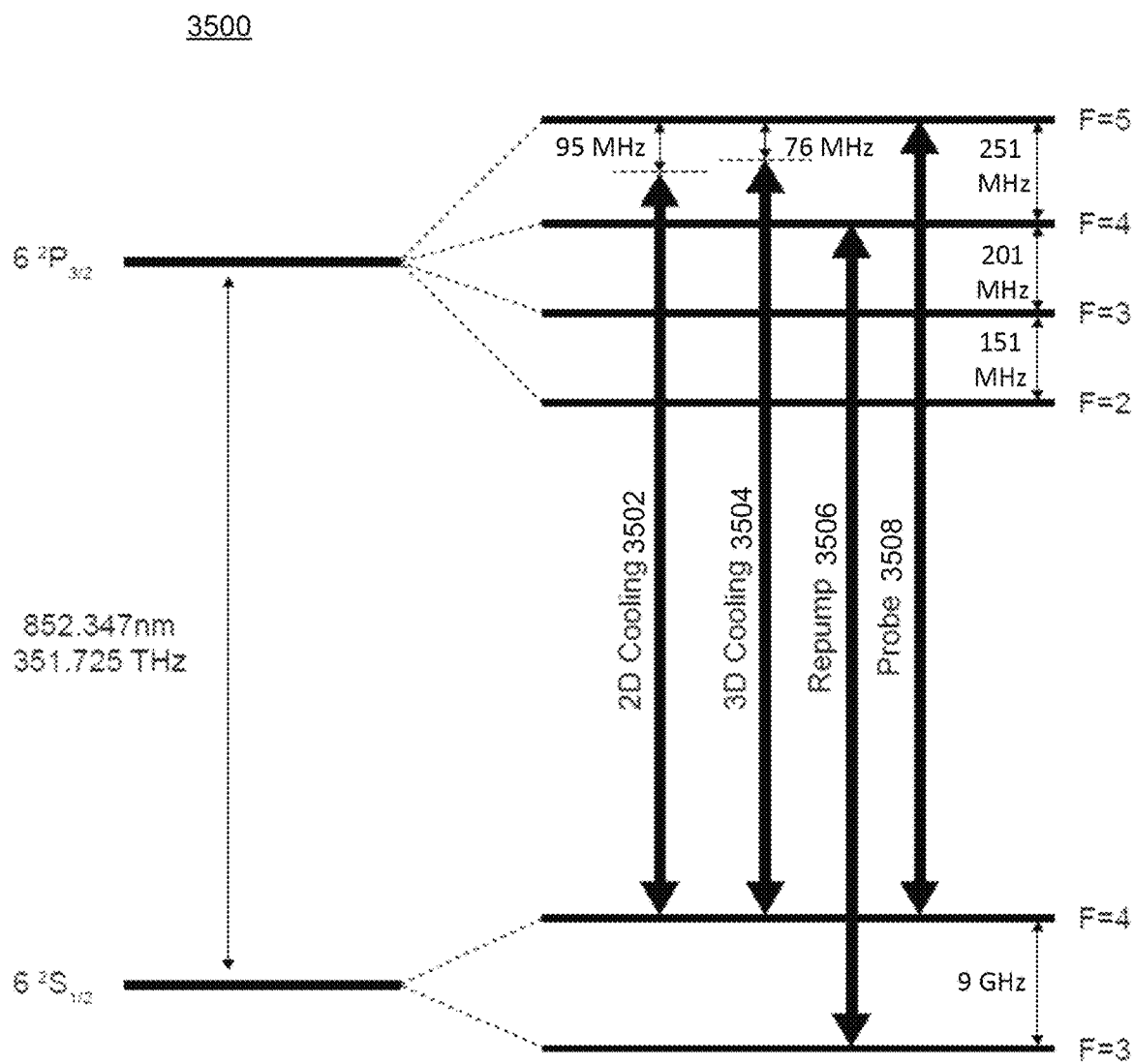
FIG. 35 (4.2c) is an energy level diagram for a laser locking scheme for Cesium D2 transitions used in single atom transport and loading work.

FIG. 35 (4.2c) is an energy-level diagram 3500 of a laser locking scheme 3400 for the Cs D2 transitions used in the single atom transport and loading work. The relevant 2D cooling transition 3502, 3D cooling transition 3504, repump transition 3506, and the probe transition 3508 are shown.

Figure 36:
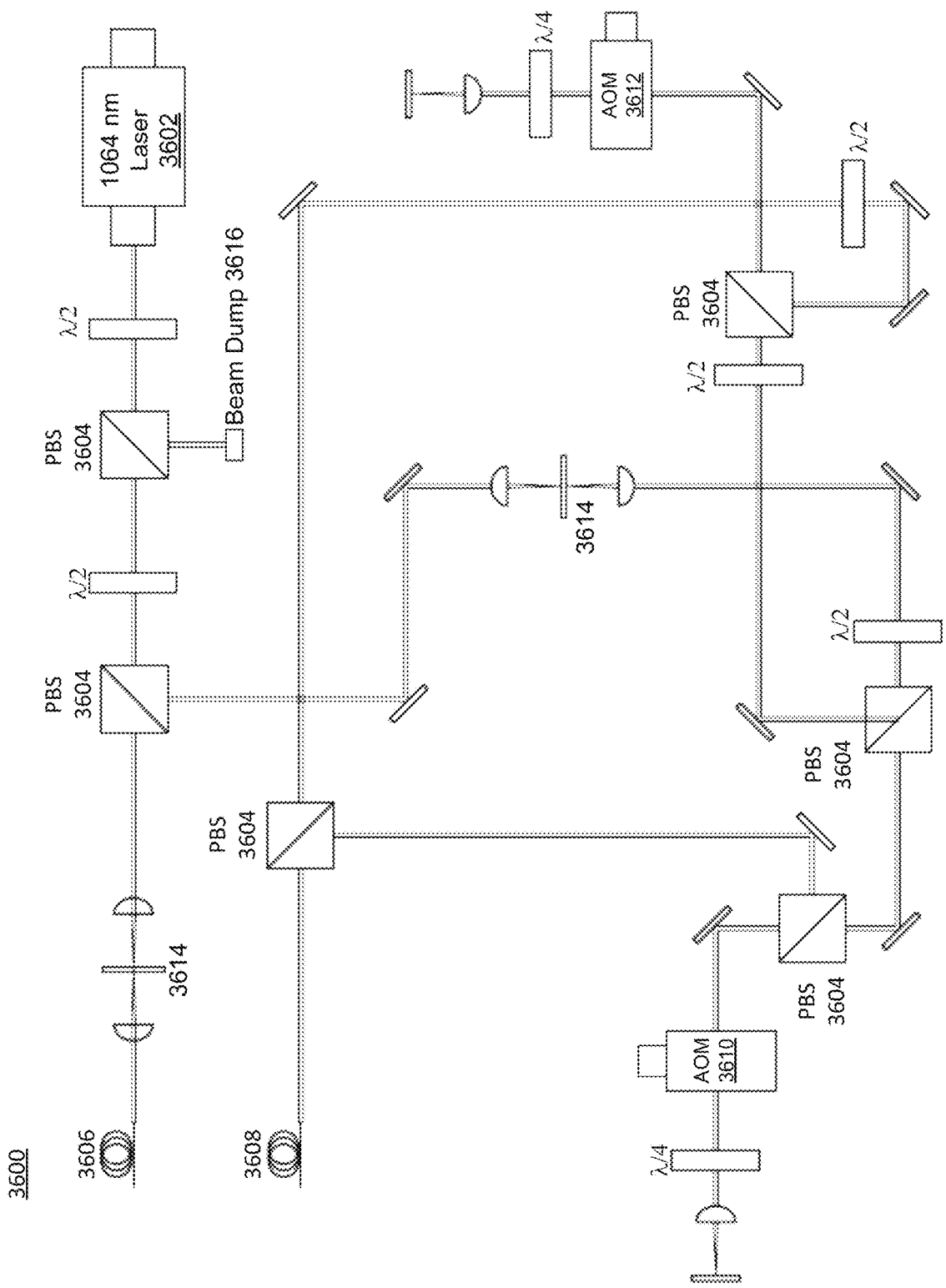
FIG. 36 (4.3a) is a schematic of a setup of a 1064 nm atom transport laser system.

FIG. 36 (4.3a) is a schematic of a setup 3600 of the 1064 nm atom transport laser system. Components include a 1064 nm laser 3602, polarizing beam splitters 3604, a fiber optic output 3606 to a vertical dipole trap, a fiber optic output 3608 to a moving dipole trap, a 78 MHz double-pass acousto-optic modulator 3610, a 78+δ double-pass acousto-optic modulator 3612, mechanical shutters 3614 to turn laser beams on and off, a beam dump 3616, half-wave plates $\lambda/2$ and quarter-wave plates $\lambda/4$.

Figure 37:
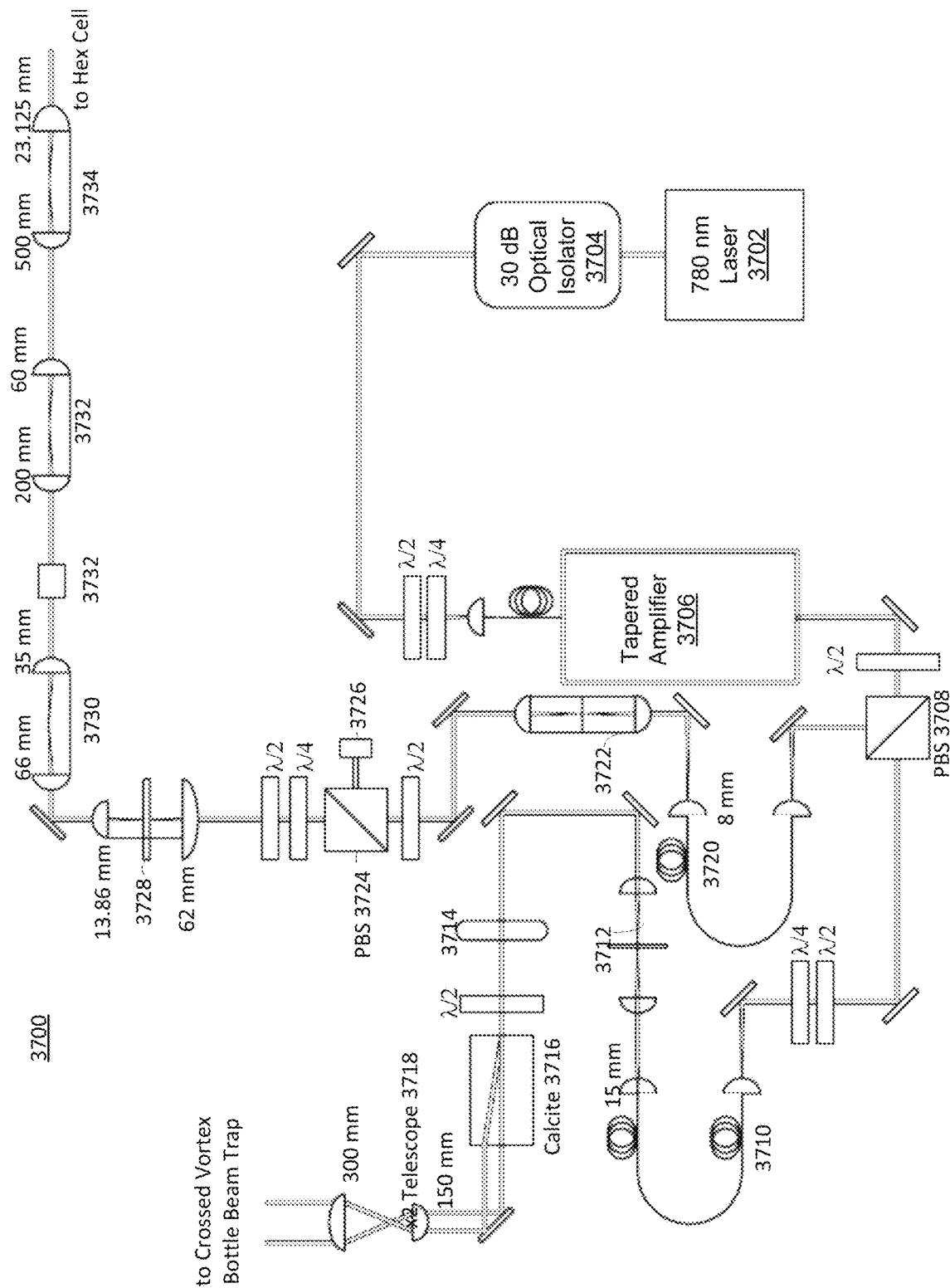
FIG. 37 (4.3b) is a schematic of a 780 nm blue-detuned bottle beam laser system.

FIG. 37 is a schematic of a setup 3700 for the 780 nm blue-detuned bottle beam laser system. Setup 3700 includes a 780 nm laser 3702, a 30 dB optical isolator 3704, a Toptica BoosTA tapered amplifier 3706, a polarizing beam splitter 3708, an anti-reflection coated single-mode fiber 3710, a mechanical shutter 3712, a spiral phase plate 3714, a calcite crystal 3716, a 2× telescope 3618, an anti-reflection coated single-mode fiber 3720, a shutter 3722, a polarizing beam splitter 3724, a beam dump 3726, a diffractive beam splitter 3728, a 2:1 telescope 3730, a 3:1 telescope 3732, a 20:1 telescope 3734, half-wave plates $\lambda/2$, quarter-wave plates $\lambda/4$, and lenses, some of which are identified by their focal lengths.

The 852 nm cooling, repump, and probe laser setup 3300 (FIG. 33) as well as each laser's corresponding atomic transition used within the $^{133}$Cs D2 manifold is shown in FIG. 33 (4.2). The lasers are distributed Bragg reflector (DBR) lasers, which are extremely sensitive to back-reflected light. Thus, outputs from the cooling laser 3302 and repump laser 3304 initially pass through two optical isolators 3306 each, providing 60 dB of isolation. The frequency locking scheme for the cooling laser involves picking off 5 milliWatts (mW) of the cooling light from the main beam and blue shifting it by 145 MHz with an acousto-optic modulator (AOM) 3308. This blue-shifted light can then be sent into a Vescent Photonics saturated absorption spectroscopy (SAS) module 3310 and locked to the $|F=4\rangle \rightarrow |F'=5\rangle$ D2 cycling transition. The main cooling light that is not picked off is subsequently left red-detuned from the cycling transition by 145 MHz. This red-detuned light can then be used to seed the "New Focus™" tapered amplifier (TA) 3310, which then outputs 500 mW of laser light. The output of TA 3310 supplies cooling light for both 2D MOT cooling 3312 and 3D MOT cooling 3314. Acousto-optic modulators 3316 are used to shift the frequency of the 2D and 3D MOT light such that the 2D beam is detuned $-2:9$ $\Gamma \approx 95$ megaHertz (MHz) and the 3D beam is detuned $-2:3\Gamma \approx 76$ MHz from the $|F=4\rangle \rightarrow |F'=5\rangle$ cycling transition. AOMs 3308 are setup in a cat's eye, double pass configuration, which allows one to shift the 3D MOT frequency without imparting any spatial deflections to the beam. After passing through AOMs 3308, a total of 100 mW of 2D MOT light and 60 mW of 3D MOT light is then coupled into a polarization maintaining fiber.

To keep atoms contained within the cycling transition, repump laser 3304 is locked resonant to the $|F=3\rangle \rightarrow |F'=4\rangle$ transition FIG. 35 (4.2c). Repumping light is then split such that it can be supplied to both 2D and 3D MOT setups. Variable attenuation of the 3D repumping light is provided by the combination of an electo-optic modulator (EOM) 3320 and a polarizing beam splitter (PBS) on the input and output of the EOM. As seen in the laser schematic shown in FIG. 33 (4.2a), the 2D MOT repumping light is coupled into its own polarization maintaining optical fiber while the 3D MOT repump light first spatially overlaps the 3D cooling light and is coupled into the 3D MOT polarization maintaining fiber. (While the 3D MOT cooling and 3D repumping light are coupled into the same polarization maintaining fiber, the repump light polarization is oriented perpendicular to the polarization maintaining axis.) This arrangement results in 10 mW of 2D repump and 5 mW of 3D repump light coupled into the respective fibers.

Finally, the probe laser 3402 (FIG. 34), which is used for absorption imaging is locked to the $|F=4\rangle \rightarrow |F=3\rangle$ crossover transition. The probe light is blue shifted onto resonance with the $|F=4\rangle \rightarrow |F'=5\rangle$ cycling transition by using an AOM driven at 125.5 MHz. Additionally, a small amount of probe light is picked off from the main beam line to act as a resonant beam.

The setup 3600 for the 1064 nm atom transport laser 3602 is shown in FIG. 36 (4.3a), while the setup 3700 for the 780 nm bottle beam laser 3702 is shown in FIG. 37 (4.3b). The red-detuned, 1064 nm fiber laser supplies 30 W of laser power that is split with a PBS 3604 to send 18 W to a vertical dipole trap setup 3606 and 12 W to form the optical conveyor belt 3608. After PBS 3604, a 2:1 telescope 3610 de-magnifies the beam waist from 3 mm to the desired waist of 1.5 mm. The light is then equally split with another PBS, where each beam subsequently passes through a double pass AOM setup 3612. Each AOM 3612 is driven by its own individual Agilent 33250 80 MHz arbitrary waveform generator (AWG) that shifts the frequency of one beam by $\Delta v_1 = 2 \times 78 = 156$ MHz and the other by a variable amount of $\Delta v_2 = 2 \times (78+s) = 156+26$ MHz, where the amount δ is tunable. To minimize phase jitter between the two beams, both AWGs are frequency locked and phase synchronized via their internal 10 MHz clocks. The frequency shifted light emerging from the double pass AOMs is then combined and spatially overlapped at a final PBS. This setup produces two co-propagating 1064 nm beams with orthogonal linear polarizations with a mutual frequency detuning of $\Delta v = 2\delta$. The pair of beams is then sent to the Hex-cell vacuum 1900 (FIG. 19) to form the optical conveyor belt for atom transport and delivery.

Shown in FIG. 37 4.3b, for the blue detuned, 780 nm laser 3702, 30 mW of light is sent directly to seed the Toptica BoosTA 3706, which outputs a total of 3 W of light. Output from the TA 3706 splits at a PBS 3708 where it is either sent to a crossed vortex bottle beam setup or a Gaussian beam array bottle beam setup. For both paths, the light is first spatially filtered by passing through an anti-reflection coated, single mode fiber 3710, 3720 and then propagated through a system of beam shaping lenses to set the correct beam waist of $w_0$=0.8 mm for crossed vortex BoB setup and $w_0$=1.2 mm for the BoB array setup.

The objective of the crossed vortex BoB setup is to generate two co-propagating Laguerre-Gaussian (LG01) beams with equal intensity and orthogonal polarizations. Shown in FIG. 38A (4.4a), the LG01 beams are created by propagating a TEM00 mode, Gaussian laser beam with initial beam waist of 0.8 mm, through an RPC Photonics spiral phase plate (SPP) 3714. The SPP imparts an azimuthal-dependent phase delay of the form $e^{\pm il\phi}$ on the incident TEM00 mode by slowing the phase of the Gaussian beam as a function of its azimuthal angle, where l is an integer called the topological charge of the outgoing LG mode. Here, l indicates how many times the phase of the beam is shifted by $2\pi$ for every full azimuthal rotation of the TEM00 beam mode. The $\pm$sign of the topological charge indicates the sign of the helicity of the outgoing LG beam.

Figure 38A:
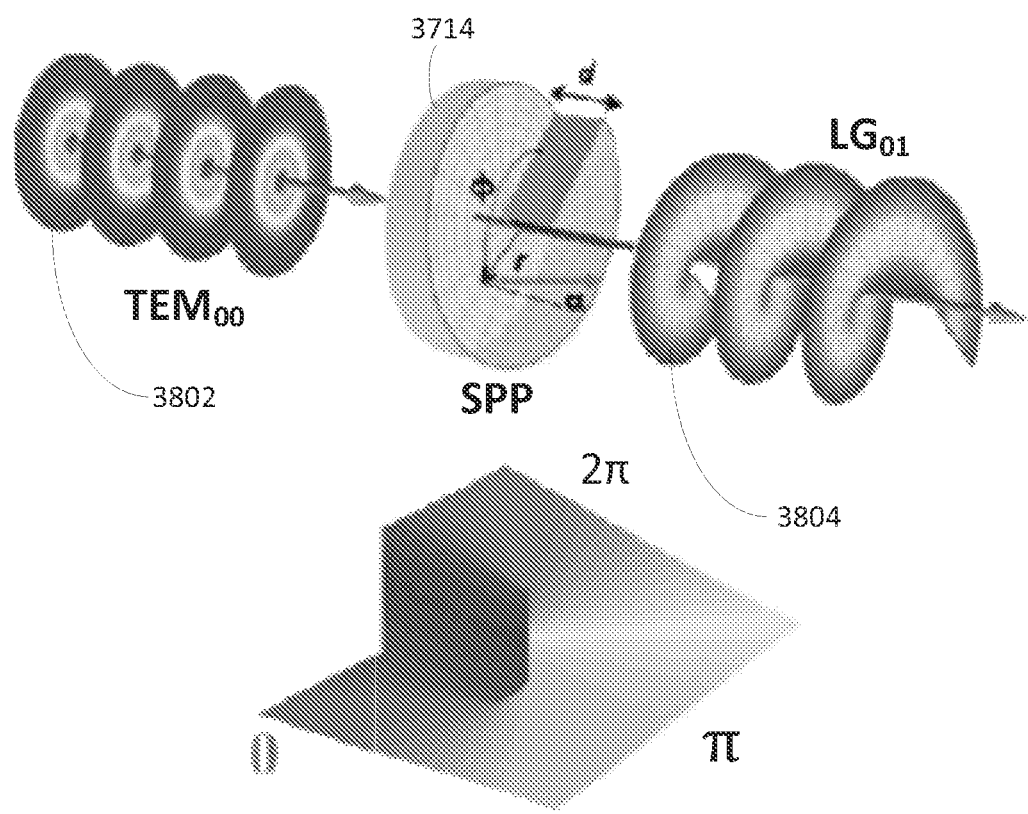
FIG. 38A (4.4a) illustrates a spiral phase plate transforming a TEM00 mode Gaussian laser beam into an LG01 mode Laguerre-Gaussian beam.
Figure 38B:
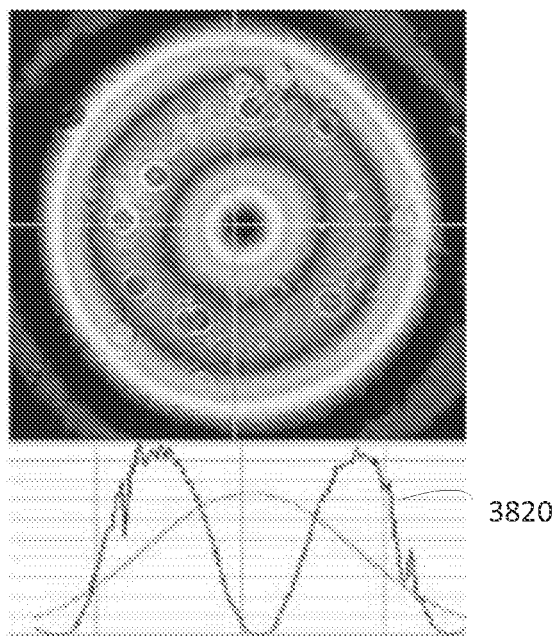
FIG. 38B (4.4b) shows an LG01 mode being created by sending the TEM00 mode through the spiral phase plate of FIG. 38A.

As shown in FIG. 38A, a spiral phase plate 3714 transforms a TEM00 mode Gaussian laser beam 3802 into an LG01 mode Laguerre-Gaussian beam 3804. The phase profile of the SPP 3714 shows how one full azimuthal rotation retards the TEM00 phase by $2\pi$ below. In FIG. 38B, the LG01 mode 3820 is created by sending the TEM00 mode through the spiral phase plate 3714.

For every complete $2\pi$ rotation of the azimuthal angle $\phi$ of the TEM00 mode, the total phase delay $\Delta\phi$ imparted on the light with wavelength $\lambda$ passing through SPP 3714 is $$\Delta\phi = 2\pi l = \frac{2\pi}{\lambda}(n-1)d \quad (6.9)(4.1)$$

where d and n are the thickness and refractive index of SPP 3714, respectively. As a result of the phase delay, SPP 3714 transforms the laser electric field from a Gaussian mode into a Laguerre-Gaussian mode LG, described by $$E(r,\phi,z) = \sqrt{\frac{2p!}{\pi(p+|l|)!}}\frac{1}{\omega(z)}\left(\frac{r\sqrt{2}}{\omega(z)}\right)^{|l|}\exp\left(-\frac{r^2}{\omega^2(z)}\right)L_p^{|l|}\left(\frac{2r^2}{\omega^2(z)}\right) \quad (70)(4.2)$$

$$\exp\left(-ik\frac{r^2}{2R(z)}\right) \times e^{-il\phi}e^{-ilz}\exp\left[i(|l|+2p)\tan^{-1}\left(\frac{z}{z_R}\right)\right]$$

where p is the radial index, l is the topological charge, $L_p^l(x)$ are the associated Laguerre polynomials, and R(z) is the radius of curvature of the beam, given as $R(z)=z+z_R^2/z$. The phase profile of SPP 3714 is shown in 38A (4.4a) and it was carefully manufactured to impart a topological charge of exactly l=+1 on the incoming TEM00 mode of 780 nm light, which transforms it into an LG01 mode beam in the far-field (FIG. 38B (4.4b)) with intensity profile $$I(r,z) = \frac{2P}{\pi w_0^2}\left(\frac{2r^2}{w^2(z)}\right)\exp\left(-\frac{2r^2}{w^2(z)}\right)\left[L_0^1\left(\frac{2r^2}{w^2(z)}\right)\right]^2 \quad (71)(4.3)$$

$$= \frac{4P}{\pi w_0^2}\left(\frac{r^2}{w^2(z)}\right)\exp\left(-\frac{2r^2}{w^2(z)}\right)$$

where P is the total laser power in the LG01 mode. The LG01 beam is then split into two co-propagating beams separated by 2.5 mm with equal intensity and orthogonal polarizations by passing the beam through a calcite beam displacer 3716. Upon exit from the calcite, the two LG01 beams pass through a 2× telescope designed to increase both the beam separation to 5 mm and the beam waist to 1.61 mm. This configuration of two co-propagating "vortex" LG01 beams with orthogonal polarization is then sent to the hex cell 1910 (FIG. 21), where tightly overlapping them forms a crossed vortex BoB trap 3718 (FIG. 37).

Returning to the 780 nm laser system shown in FIG. 37 (4.3b), blue-detuned light can also be directed to the Gaussian beam array setup to create an array of bottle beam traps. After emerging from the AR coated, single-mode fiber, the beam is focused through a Holo/Or MS-248-X-Y-A diffractive beam splitter 3720 which diffracts a single TEM00 mode beam into a 2×2 array of identical Gaussian beams, all with parallel linear polarizations.

FIGS. 39A, 39B, and 39C show the formation of a Gaussian beam array at various locations of the optical setup of FIG. 37. FIG. 39A includes an intensity plot 3912 and polarization diagram 3914 representing the direction of linear polarization of an array 3916 of four identical Gaussian beams 3918 taken after a single Gaussian beam passes through diffractive beam splitter 3720. FIG. 39B includes plan and perspective intensity plots 3922 and 3924 and a polarization diagram 3926 of the array after the four identical Gaussians pass through the calcite 3722 (FIG. 37) and are focused by the 200:60 demagnifying telescope 3724 (FIG. 37). FIG. 39C includes an intensity plot 3932 and polarization diagram 3934 showing array 3916 after focusing with a 500:23.125 demagnifying telescope 3726 (FIG. 37). The intensity profile in FIG. 39C is what is focused into Hex 2910 cell to make an array of bottle beam traps.

A set of telescopes 3724, 3726, and 3728 and additional calcite beam displacers 3722 (FIG. 37) serve to de-magnify array 3916 to the desired dimensions while increasing the number of beams in the array. First, a 66:35 telescope 3728 images the 2×2 array through a calcite beam displacer 3722 cut to a thickness of 353 μm which replicates the 2×2 array into an array of 8 identical Gaussian beams separated from their nearest neighbor by 353 μm), as shown in FIG. 39B. Since the calcite is a birefringent material, the four replicated Gaussian beams have an orthogonal polarization to the four original beams. Additionally, in order to have equal spacing of each array beam (from their nearest neighbor), the fast axis of the calcite must be rotated by 45° degrees with respect to the diffractive beam splitter 3720.

After passing through the calcite beam displacer 3722, the array of eight Gaussian beams is further de-magnified by a 200:60 telescope 3724 and then demagnified again with a 500:23.125 telescope 3726 FIG. 37 (4.3b) with the result shown in FIG. 39C and imaged into the center of hex cell 1910. At the focus of the 0.4 NA, 23.125 mm lens 3726, each Gaussian beam has a focused beam waist of $\omega_0$=2:21 μm and is separated from its nearest neighboring beam by a distance d=4:95 μm. The aspect ratio s, which is defined as the ratio of the focused beam spacing to focused beam waist, is s=d/w=2:23. After passing through all of the optics required to produce the array, the total optical power remaining in the array is 750 mW, which gives a uniform distribution of 47 mW per beam in the array. The optical intensity profile of the array at the focus of the 23.125 mm lens creates a two BoB traps.

Figure 40:
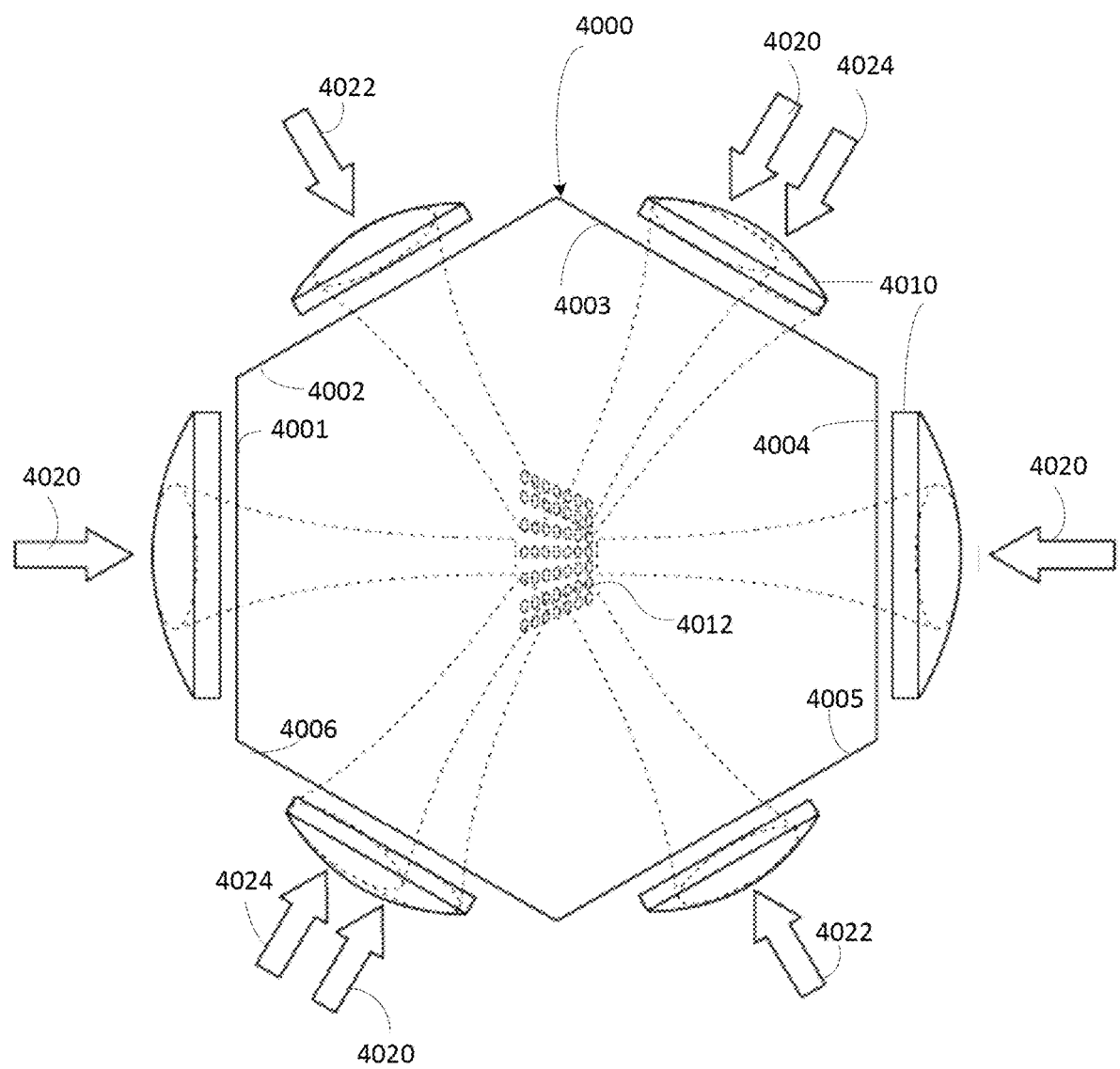
FIG. 40 (4.6) shows the placement of laser beam with respect to the hex cell of FIG. 21.

The 852 nm cooling and MOT lasers 3302 and 3304 (FIG. 33), the 1064 nm transport laser 3602 (FIG. 36), and the 780 nm transport and BoB lasers 3702 (FIG. 37) all converge at the center of h hex cell. 1910. FIG. 40 (4.6) shows the placement of each beam inside the hex-cell vacuum chamber 4000. Vacuum chamber 4000 includes six walls 4001, 4002, 4003, 4004, 4005, and 4006. Laser beams are directed an array 4012 of bottle-beam traps through respective walls via respective lenses 4010. Two pairs of counter-propagating 852 nm cooling beams 4020 enter chamber 4000 via walls 4001 and 4004 for one pair and via walls 4003 and 4006 for the other pair. A counter-propagating pair of 780 nm bottle beams 4022 enters via walls 4002 and 4005. A counter-propagating pair of 1064 nm atom transport beams 4024 enters via walls 4003 and 4006. The 780 nm beams generate 4022 the BoB trap at the center of the cell, while 1064 nm lasers 4024 are used to generate the dynamic a one-dimensional (1D) optical lattice for atom transport. Finally, laser cooling, optical molasses, and fluorescence imaging are performed with the 852 nm beams 4020.

BoB traps 4012 are formed at the focus of the 780 nm BoB lasers 4022 and are offset from the 1064 nm atom transport lasers (4024 functioning as an optical conveyor belt) by an angle of θ=60°. Additionally, the cooling lasers 4020 that form a 3D MOT intersect at an angle of θ=60° (as opposed to the traditional 90° angle from most MOT setups).

A 3D magneto-optical trap of cesium atoms located in the hex cell provides a continuous reservoir of cold atoms for replenishing the qubit array. Atoms that source the 3D MOT are initially trapped and cooled in a 2D+ MOT located in a chamber below the Hex cell and then sent upwards into the 3D MOT chamber via a "push beam".

Figure 41:
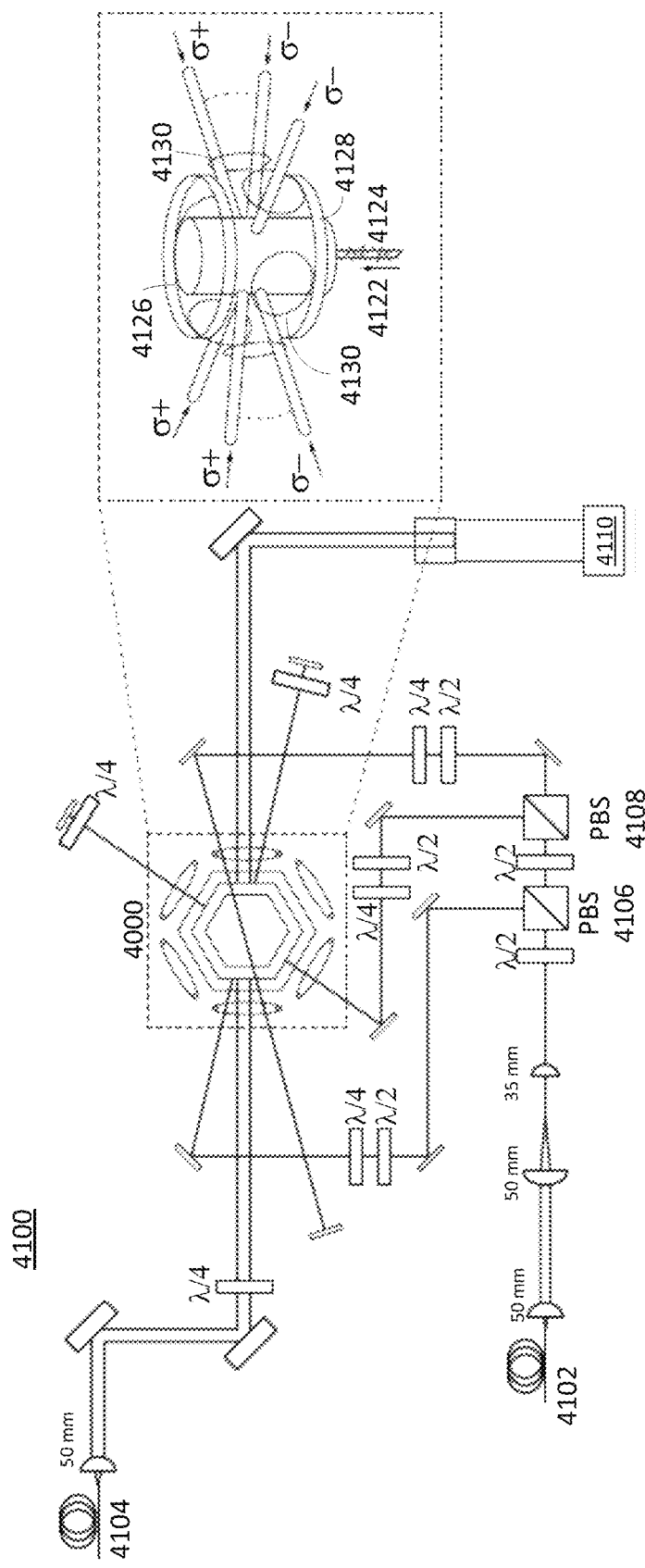
FIG. 41 (4.7a) is a schematic of an optical setup to form a 3D MOT in the hex-cell vacuum system of FIG. 19.

An optical setup 4100, shown in FIG. 41, is used to form a 3D MOT in hex cell 1910. Input for a 3D cooling beam and a 3D repump beam is provided by an optical fiber 4102; input for a probe beam is provided by an optical fiber 4104. The 3D cooling and repump beams are shaped by a series of lenses, identified in FIG. 41 by their focal lengths and are then conditioned by a half-wave plate λ/2 before being split by a polarizing beam splitter 4108. A first branch from PBS 4106 is directed through a half-wave plate λ/2 and a quarter-wave plate λ/4 before entering hex-cell vacuum chamber 4000. This beam exits the chamber 4000, passes through a quarter-wave plate λ/4 and is reflected back through the quarter-wave plate λ/4 and into chamber 4000.

A second branch from PBS 4106 is split further by a PBS 4108 after passing through a half-wave plate λ/2. A first branch from PBS 4108 passes through a half-wave plate λ/2 and a quarter-wave plate λ/4 before entering hex-cell vacuum chamber 4000. The beam exits chamber 4000 only to be reflected back into chamber 4000. passing through a quarter-wave plate λ/4 coming and going. A second branch from PBS 4108 passes through a half-wave plate λ/2 and a quarter-wave plate λ/4 before entering hex-cell vacuum chamber 4000. This branch then exits chamber 4000 and is then reflected back into chamber 4000.

The probe beam exits fiber 1104, is shaped by a lens with a 50 mm focal length, and rotated by a quarter-wave plate λ/4 before entering chamber 4000 to acquire an image of bottle-beam array 4012 (FIG. 40). The image-bearing beam then exits chamber 4000 to be captured by a Basler CCD camera 4110, available from Basler AG.

The inset for FIG. 41 shows the orientation of the six 3D cooling beams σ+ and σ−, the vertically oriented push beam 4120 and the atoms 4124 it brings from the 2D+ MOT, MOT coils 4126, and shim coils 4128. A weak probe beam intersects the MOT location and is focused onto Basler CCD for absorption imaging.

FIG. 41 (4.7a) diagrams the 3D MOT setup 4100. The 3D MOT is created by retroreflecting three pairs of λ=852 nm laser beams that are red-detuned δ=−2:9Γ from the |F=4⟩→|F'=5⟩ cycling transition and overlapped with repumping light resonant with the |F=3⟩ →|F'=4⟩ transition at the center of hex cell 1910. Both cooling and repump beams enter the system through the same fiber 4104. A total of 30 mW of 3D cooling light and 5 mW of 3D repump light is collimated from the fiber launcher by using an f=50 mm aspherical lens. 4102. Immediately after collimation, a 90:35 telescope 4106 demagnifies the beams to a collimated beam waist of $\omega_0$=1.5 mm. A series of polarizing beam splitters 4108 and 4110 then separates the laser light into three beams of equal intensity. Lastly, before entering the hex cell 1910, each beam passes through a λ/2 waveplate 4112 followed by a λ/4 waveplate 4114 combination to give the MOT beams a $\sigma_+$ (or $\sigma_-$) circular polarization. The optics of 3D MOT setup 4100 are completed by retroreflecting each beam to spatially overlap itself inside the Hex cell. An additional λ/4 waveplate 4116 located in front of each retroreflecting mirror 4118 ensures the circular polarization of the retroreflected light is orthogonal to the initial light beam. Thus, as shown in the inset of FIG. 41 4.7a, each pair of 3D MOT beams has the $\sigma_+/\sigma_-$ circular polarization necessary for cooling.

The final orientation of the 3D MOT beams as they appear in the actual experiment in the lab is shown in the inset of FIG. 41 (4.7a). The three pairs of $\sigma_+/\sigma_-$ MOT beams do not actually overlap at 90° angles along three orthogonal directions (which is the "modus operandi" for most MOT setups). Rather, two pairs of $\sigma_+/\sigma_-$ MOT beams oriented on the same vertically oriented plane intersect in an "X" shape which crosses at an angle of $\theta_{1,2}$=40°. The third pair of $\sigma_+/\sigma_-$ beams intersects the "X" pair at an angle of $\theta_3$=120° (see inset of FIG. 41 4.7a). While this optical setup 4100 differs from the conventional MOT setup of three pairs of orthogonal beams, 3D atom confinement is still achieved (although it is weaker than the conventional setup) since components of each beam are projected along the orthogonal $\hat{x}$, $\hat{y}$, and $\hat{z}$ directions.

With the laser setup completed, a pair of coils 4130, where each is made with 100 turns of 20 gauge wire, is oriented along the $\hat{z}$ direction of the hex cell 1910. Running 1 A of current through the coils when the coil pair is oriented in the anti-Helmholtz configuration generates a positionally dependent magnetic field B(x) with gradient magnitude of |B'|=16 G/cm. A flux of atoms is sent into Hex cell 1910 from the 2D+ MOT formed in a chamber 1906 below Hex cell 1910 and sources the 3D MOT 4302. Using this described 2D+/3D double MOT setup, a 3D MOT of approximately 10' atoms is created within 1 second of loading time.

Figure 42:
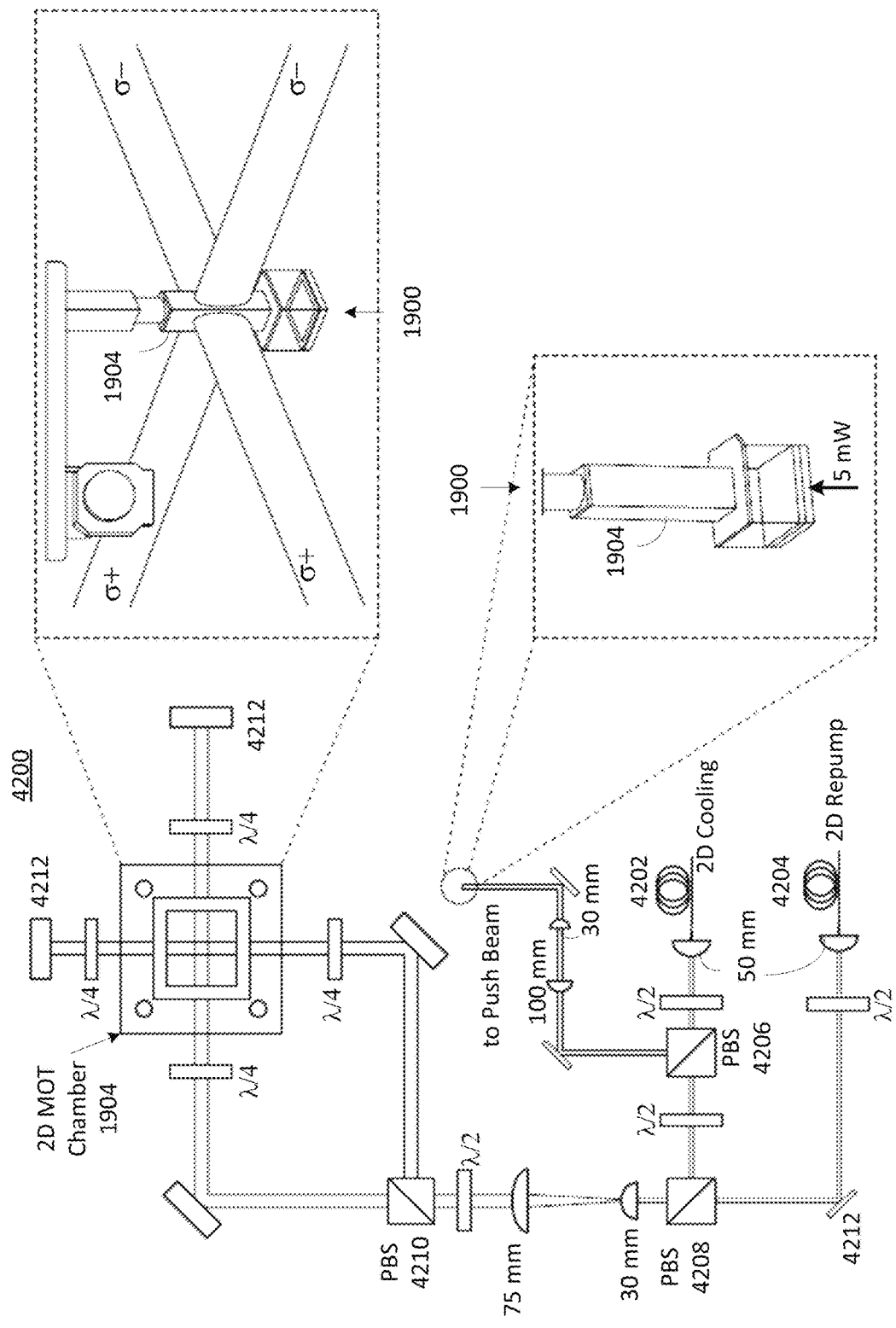
FIG. 42 (4.7b) is a schematic of an optical setup to form a 2D+ MOT in a 2D-MOT chamber of the hex-cell vacuum system of FIG. 19.

An optical setup 4200 to form a 2D+ MOT in the 2D chamber is shown in FIG. 42. An optical fiber 4202 receives laser light for 2D cooling, while an optical fiber 4204 receives laser light for a 2D repump. The two paths are merged at a PBS 4208. The 2D repump light is first collimated using a 50 mm lens, the polarization is changed using a half-wave plate λ/2, and the light is reflected powered PBS 4208 using a mirror 4212. The 2D cooling light is collimate 4d using a 50 mm lens, polarization rotated using a half-wave plate λ/2 and split using a PBS 4206. A first branch from PBS 4206 is rotated using another half-wave plate λ/2 and steered into the path of the 2D repump light by PBS 4208.

A beam exiting PBS 4208 is expanded using a 30 mm lens and a 75 mm lens. The result is polarization rotated using a half-wave plate λ/2 and then split using a PBS 4210. Both outputs are processed by respective quarter-wave plates λ/4 and directed through adjacent walls of 2D MOT chamber 1904. Each of the beams passes through chamber 1904, processed by a respective quarter-wave plate λ/4, reflected back through the respective quarter-wave plate λ/4 on its way back into chamber 1904. The two direct σ+ beams and their respective reflection beams σ– are shown with the 2D MOT chamber 1904 in the upper inset of FIG. 42. Thus, the upper inset of FIG. 42 shows the orientation of the 4 cooling beams.

A second 2D cooling beam output from PBS 4206 passes through a 100 mm lens and then a 30 mm lens to be used as a push beam to move atoms into and through 2D MOT chamber 1904, as indicated in the lower inset of FIG. 42. The push beam enters at the base of the 2D chamber and propagates vertically through the entire system 1900, exiting through the top surface of hex cell 1910 (FIG. 19). Since the push beam overlaps the 2D MOT, it "pushes" atoms into Hex cell 1910 that are used to seed the 3D MOT.

Shown in FIG. 42, the 2D+ MOT is created by overlapping two pairs of retroreflecting 50 mW, cylindrically shaped beams with orthogonal $\sigma_+/\sigma_-$ circular polarizations in the lower, 2D MOT chamber 1904. Both beams consist of a combination of 2D cooling and repump light that enters the system through individual fibers 4202 and 4204, is collimated with an f=50 mm aspherical lens 4102, and is spatially overlapped at a polarizing beam splitter (PBS). Prior to overlapping the cooling and repump, approximately 3 mW of cooling light is picked off and sent vertically through the cell to function as the push beam.

A telescope made from a pair of cylindrical lenses then enlarges the beam and gives it an elliptical profile with a beam waist of ω=0.5 mm along the semi-minor axis and a waist of ω=1.0 mm along the semi-major axis. Using a PBS 4210, the light is then split into two beams with equal intensity. A pair of λ/4 waveplates for each beam controls the circular polarization such that all beams overlap at an angle of 90° at the center of the 2D chamber (upper inset of FIG. 42 with orthogonal $\sigma_+/\sigma_-$ circular polarizations.

Additionally, four permanent magnets located outside the 2D chamber create a 2D quadrupole field with gradient 15 G/cm. A 2D+ MOT is then created by red-detuning the 2D cooling light by δ=2:9Γ. The resulting MOT force provides strong confinement of atoms in the $\hat{x}$ and $\hat{y}$ directions, but no confinement in the $\hat{z}$ direction. A vertically oriented push beam overlaps the 2D MOT along the loose $\hat{z}$ axis (inset 2 of FIG. 42 4.7b) and provides a momentum kick to transfer cooled atoms up through the 2D and 3D pinholes to provide a flux of approximately $10^9$ cooled atoms per second into the Hex cell 1910 to subsequently source a 3D MOT.

Figure 43:
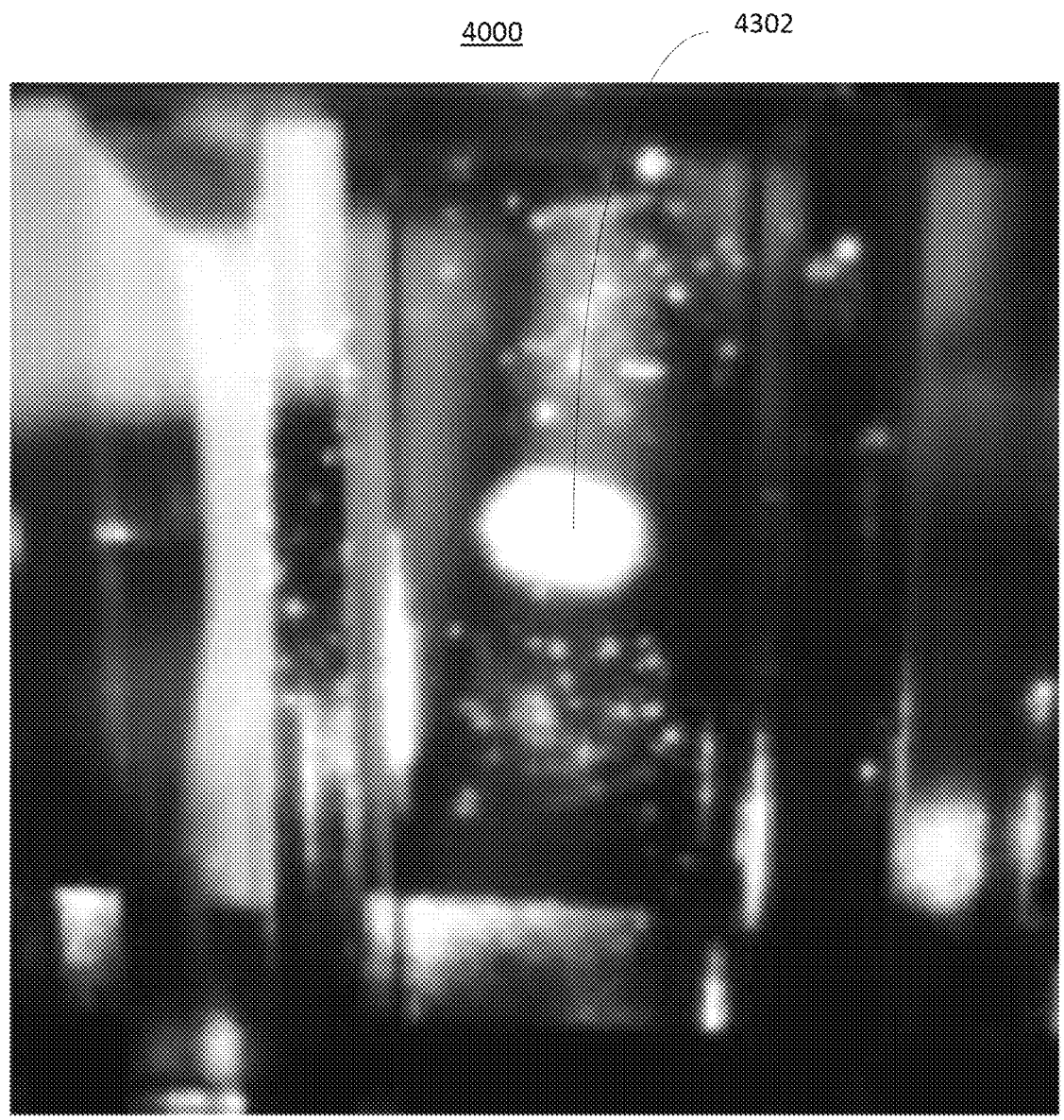
FIG. 43 (4.8) is a florescence image of a hex cell of the optical setup of FIG. 41 showing the location of a 3D MOT within the hex cell.

FIG. 43 (4.8) is a grey-scale conversion of a fluorescence image of a 31) MOT 4302 of approximately 10 cesium atoms and a diameter of 3 mm created in the hex cell 4000. The atoms that source 3D MOT 4302 are initially cooled in a 2D+ MOT located in a chamber below hex cell 4000. The 2D+ MOT atoms are subsequently pushed up into hex cell 4000 by use of a push beam. This small 3D MOT 4302 functions as the reservoir of pre-cooled $^{133}$Cs atoms for use in atom transport and loading.

After loading 3D MOT 4302, the cooling beams can be further detuned to –20Γ which serves to act as an effective compressed MOT (CMOT) stage, since only atoms at the most intense region of the MOT beams will consistently absorb the laser light. After the CMOT stage, time-of-flight absorption imaging can be performed to measure the temperature of the atoms to be $T_x$=80.1 μK and $T_y$=67.7 μK along the $\hat{x}$ and $\hat{y}$ directions, respectively, giving an average 3D MOT temperature of T=73.9 μK.

Figure 44:
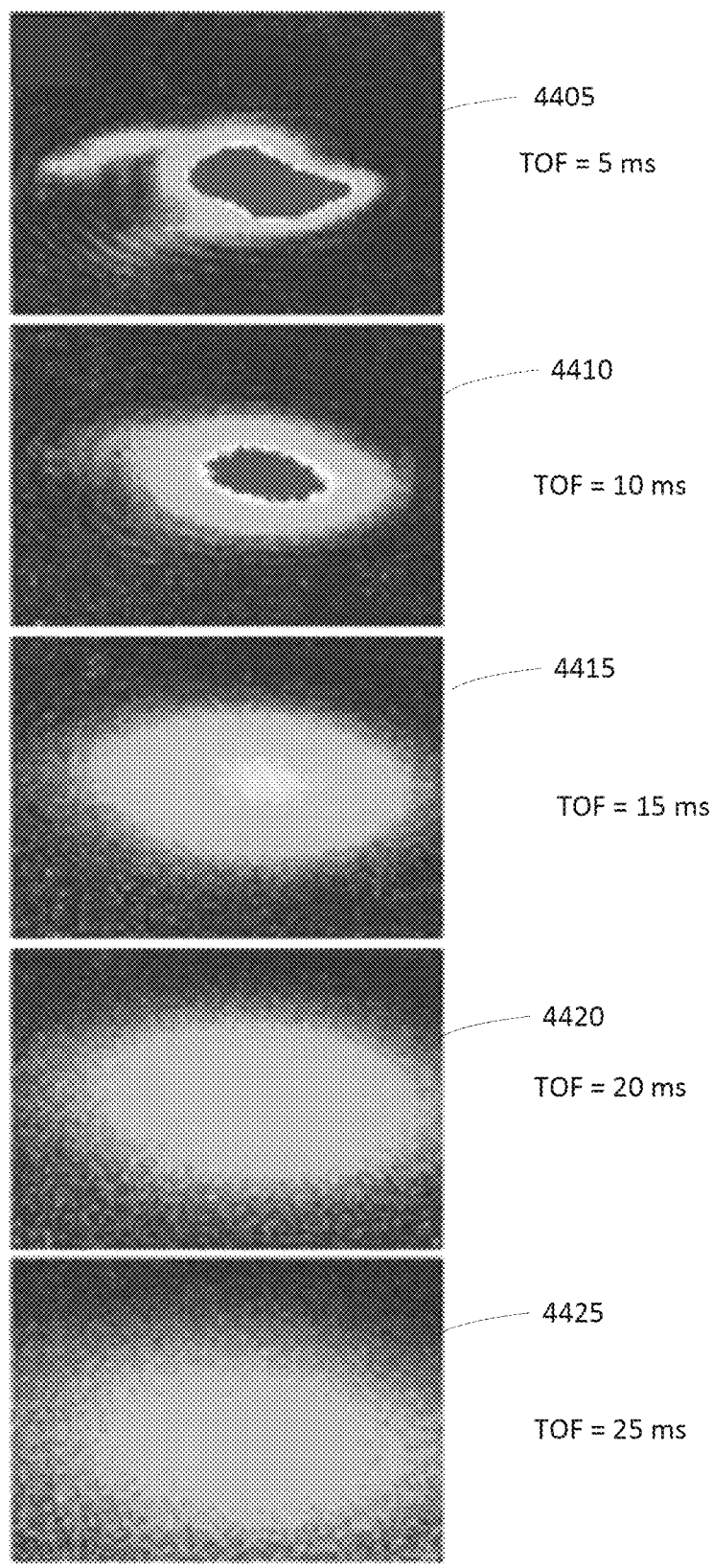
FIG. 44 (4.9a) is a series of Time-of-Flight (TOF) absorption images of the 3D MOT after performing a compressed MOT stage.
Figure 45A:
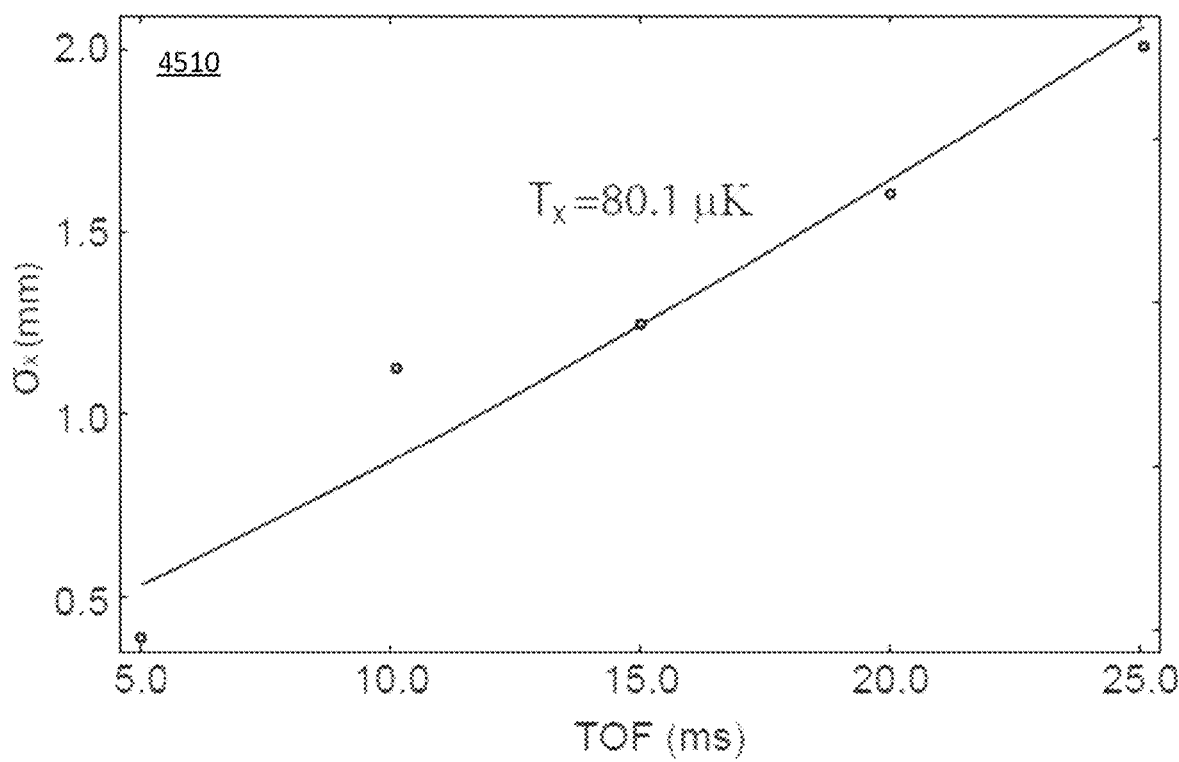
FIGS. 45A (4.9B) and 45B (4.9C) are graphs respectively showing the expansion of the Gaussian width $\sigma_x(t)$ and $\sigma_y(t)$ of the 3D MOT of FIG. 41 as a function of time.
Figure 45B:
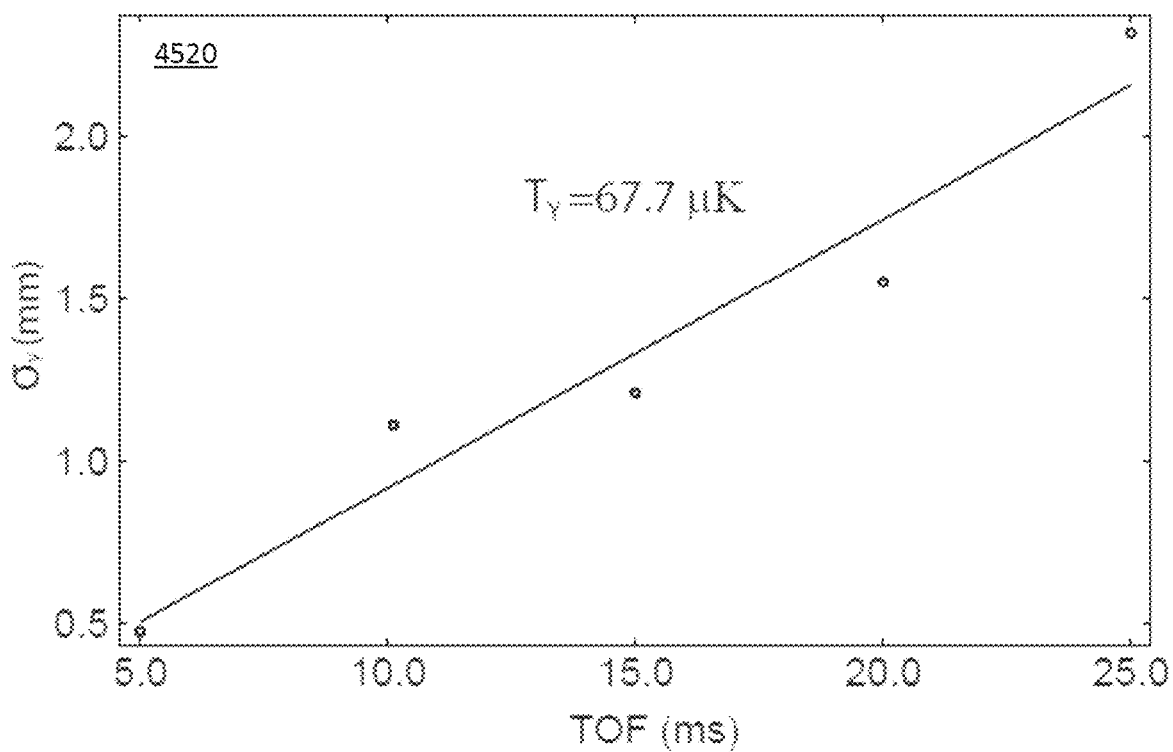

FIG. 44 (4.9a) is a grey-scale conversion of a series of time-of-flight (TOF) absorption images 4405, 4410, 4415, 4420, and 4425 of the 3D MOT after performing a CMOT stage. From top to bottom the TOF expansion times are 5 ms, 10 ms, 15 ms, 20 ms and 25 ms. FIGS. 45A and 45B are graphs showing the expansion of the Gaussian width $\sigma_x$(t) 4510 and $\sigma_y$(t) 4520 of the 3D MOT 4302 as a function of time. The TOF expansion data corresponds to atom temperatures of $T_x$=80.1 μK and $T_y$=67.7 UK along the $\vec{x}$ and $\hat{y}$ directions, respectively, giving an average temperature of 73.9 μK.

Figure 46A:
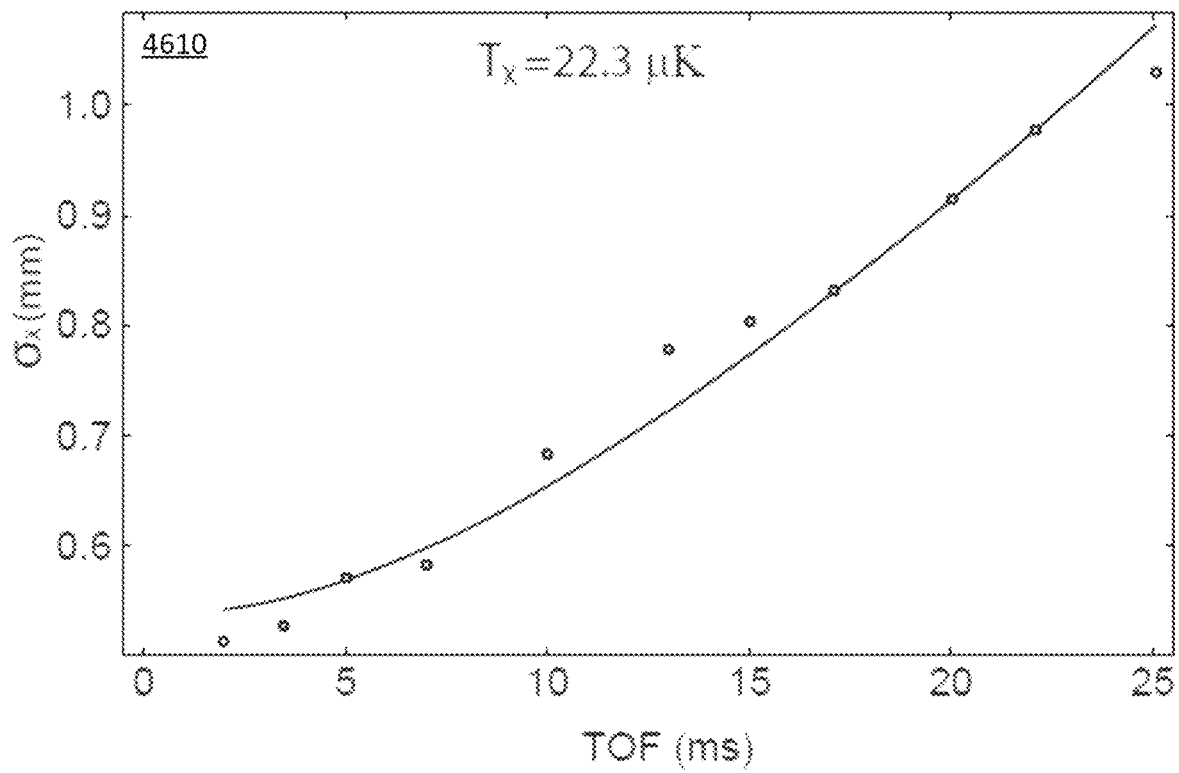
FIG. 46A (4.10a) 46B (4.10)b are graphs of Gaussian width $\sigma_x$ and $\sigma_y$, respectively, time of flight expansions of a 3D MOT atom cloud after performing 10 milliseconds (MS) of polarization gradient cooling.
Figure 46B:
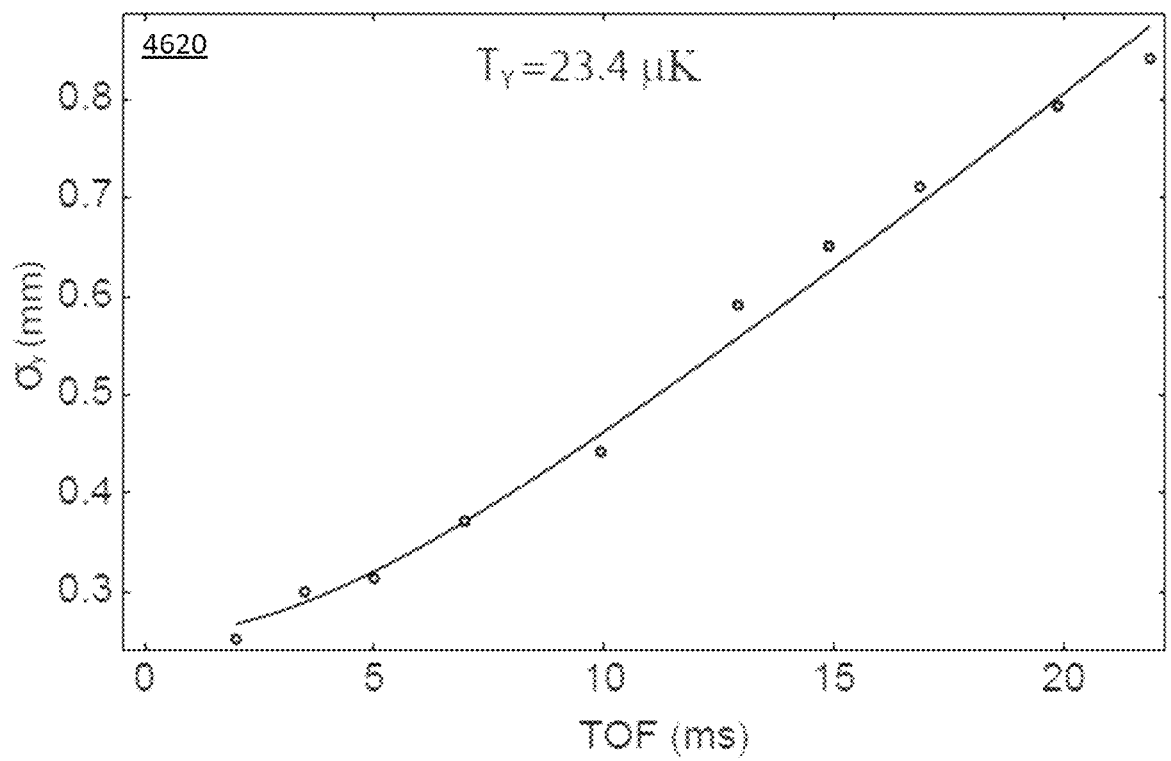

Polarization gradient cooling (PGC) is used to obtain maximum single atom loading probability and transport efficiency in the BoB trap and optical conveyor belt (after forming the 3D MOT to decrease the MOT temperature and increase the MOT atom density). To perform PGC, the MOT coils 4128 (FIG. 41) are switched off while shim coils 4130 are turned on in order to eliminate or reduce stray magnetic fields to milliGauss (mG) levels at the center of hex cell 4130 such that effective PGC can be applied to the atoms. During PGC, the 3D MOT lasers are left on but detuned –50 MHz or approximately –9.6Γ. After 10 ms of PGC, time-of-flight absorption imaging was performed to measure the temperature and density of the 3D MOT atoms to be approximately T=22.9 μK and $10^{10}$ atoms/cm3, respectively. See graphs 4610 and 4620 respectively in FIGS. 46A and 46B. Polarization gradient cooling leaves the atoms with an energy that is a factor of about 100 smaller than the crossed vortex bottle beam trapping potential and a factor of about 25 smaller than the Gaussian beam array bottle beam trapping potentials. Most importantly, the high atom density remaining after PGC permits the average number of atoms that can be loaded into the crossed vortex BoB traps to be of order unity.

The coil system for generating the larger magnetic quadrupole field for the 3D MOT and the considerably smaller shim fields needed for PGC can provide shim coils for all six hex cell windows in order to bias fields along the optical axis of all cooling beams. Moreover, the system must also provide shim coils for the $\hat{z}$ direction. The coil system includes a set of anti-Helmholtz coils for producing the 3D MOT magnetic fields. The mounting scheme includes a "pagoda" coil mount 4702 as shown in FIG. 47A-D permit optical access to all windows of hex cell 4000. The pagoda coil mount 4702 is 3D printed from ABS plastic and features a heat deflection temperature of 98° C. at 0.46 MPa and 88° C. at 1.8 MPa. A recessed lip 4704 is found on all six vertical faces as well as the top and bottom faces of the pagoda mount to wrap the shim and 3D MOT coils.

Figure 47A:
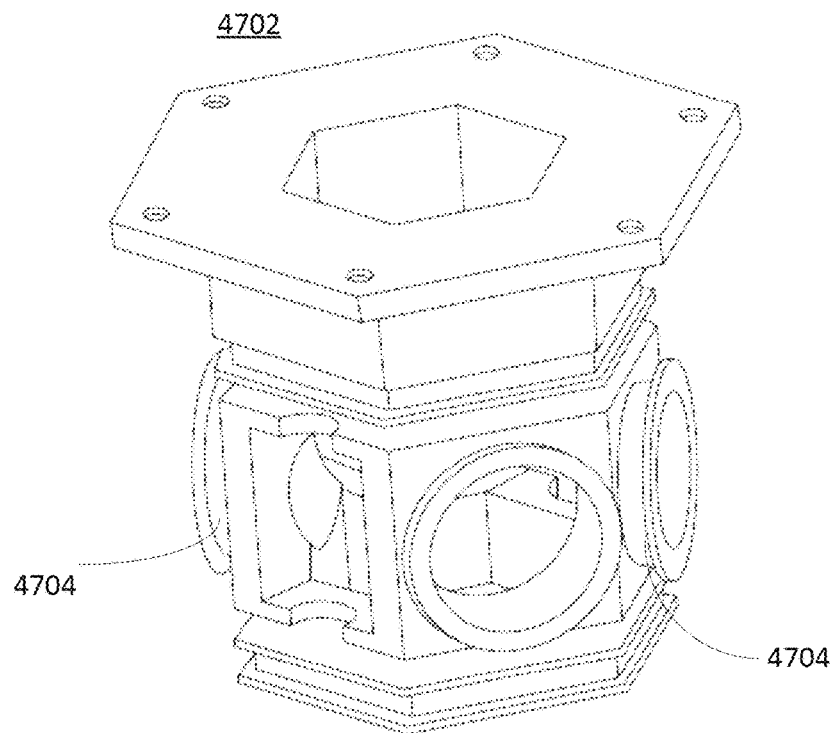
FIG. 47A (4.11a) is a 3D rendering of the pagoda coil mount.
Figure 47B:
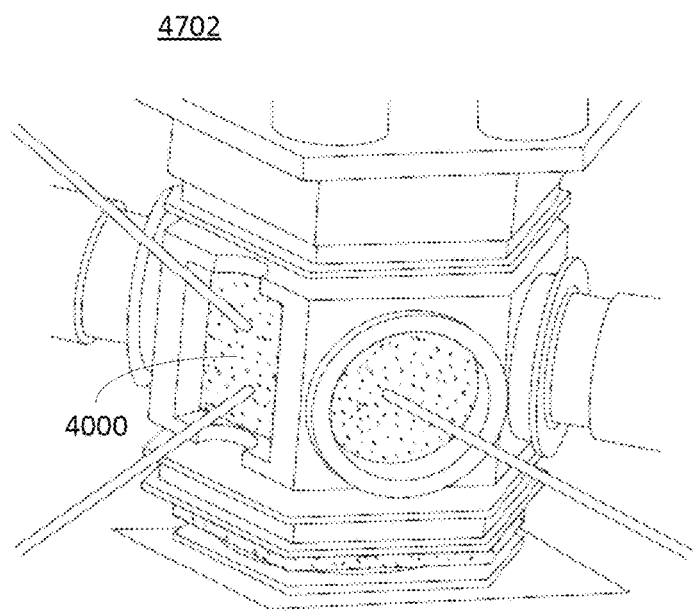
FIG. 47B is a rendering showing the pagoda mount position with respect to the hex cell of FIG. 19, the 3D MOT beams, and high numerical aperture lenses.
Figure 47C:
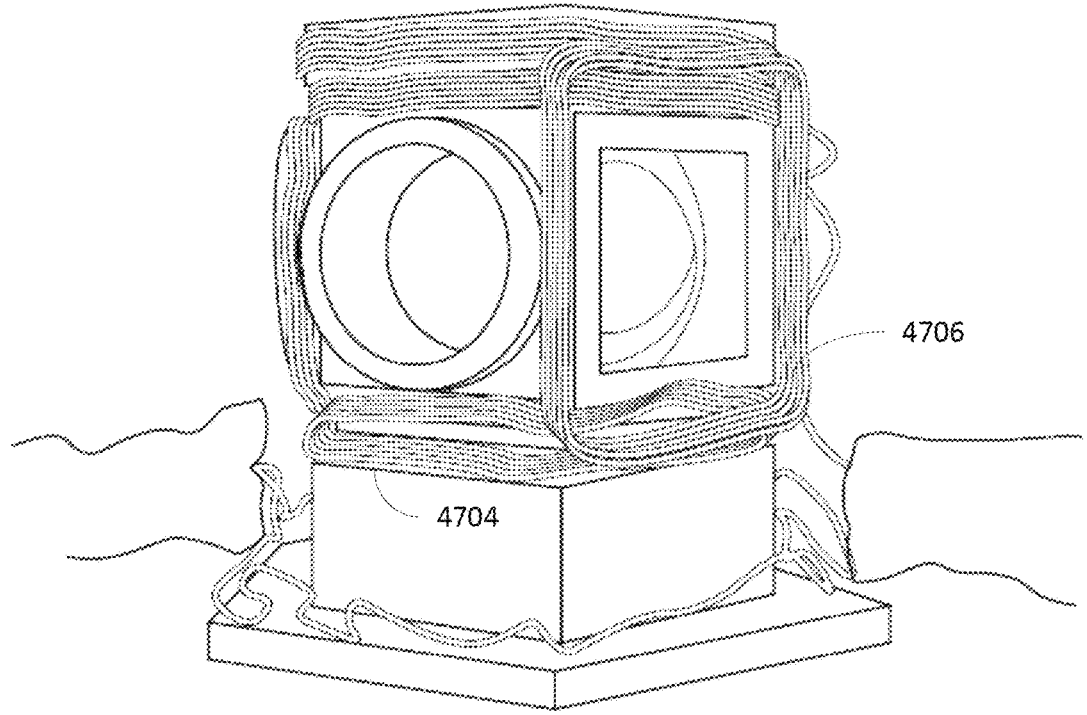
FIG. 47C is perspective view of the pagoda coil system.
Figure 47D:
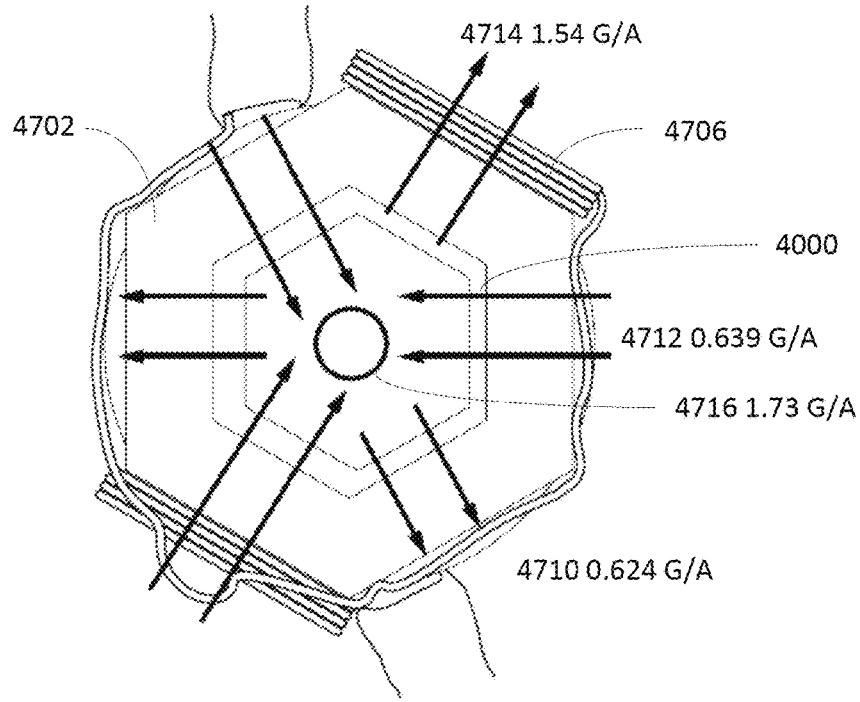
FIG. 47D is a plot showing the direction of the magnetic field gradients from three pairs of x/y shim coils as well as the z-bias coils.

Once each MOT coil 4704 and each shim coil 4706 is wrapped on its respective face of the pagoda mount, each coil can be permanently fastened to the mount using Araldite epoxy. The finished coil system can then be mounted over the hex cell as shown in FIG. 47C. When fixed around the hex cell, there is 5 mm of clearance between the outer surface of the hex cell windows and the inner surface of the pagoda mount. The finished product features 3 pairs of x-y shim coils 4706 for magnetic bias fields oriented normal to the hex cell windows with gradients of 0.624 G/A for field 4710, 0.639 G/A for field 4712, and 1.54 G/A. The 1.54 G/A shim is higher to help cancel residual fields from the 0.624 G/A and 0.639 G/A shims as shown in FIG. 47D. The shim coils oriented in the vertical direction create a magnetic bias field in the 2 direction with a gradient of 1.73 G/A for field

4716. Finally, the set of anti-Helmholtz coils used to create the 3D MOT magnetic quadrupole field has a magnetic field gradient of 16 G/A.

Figure 48:
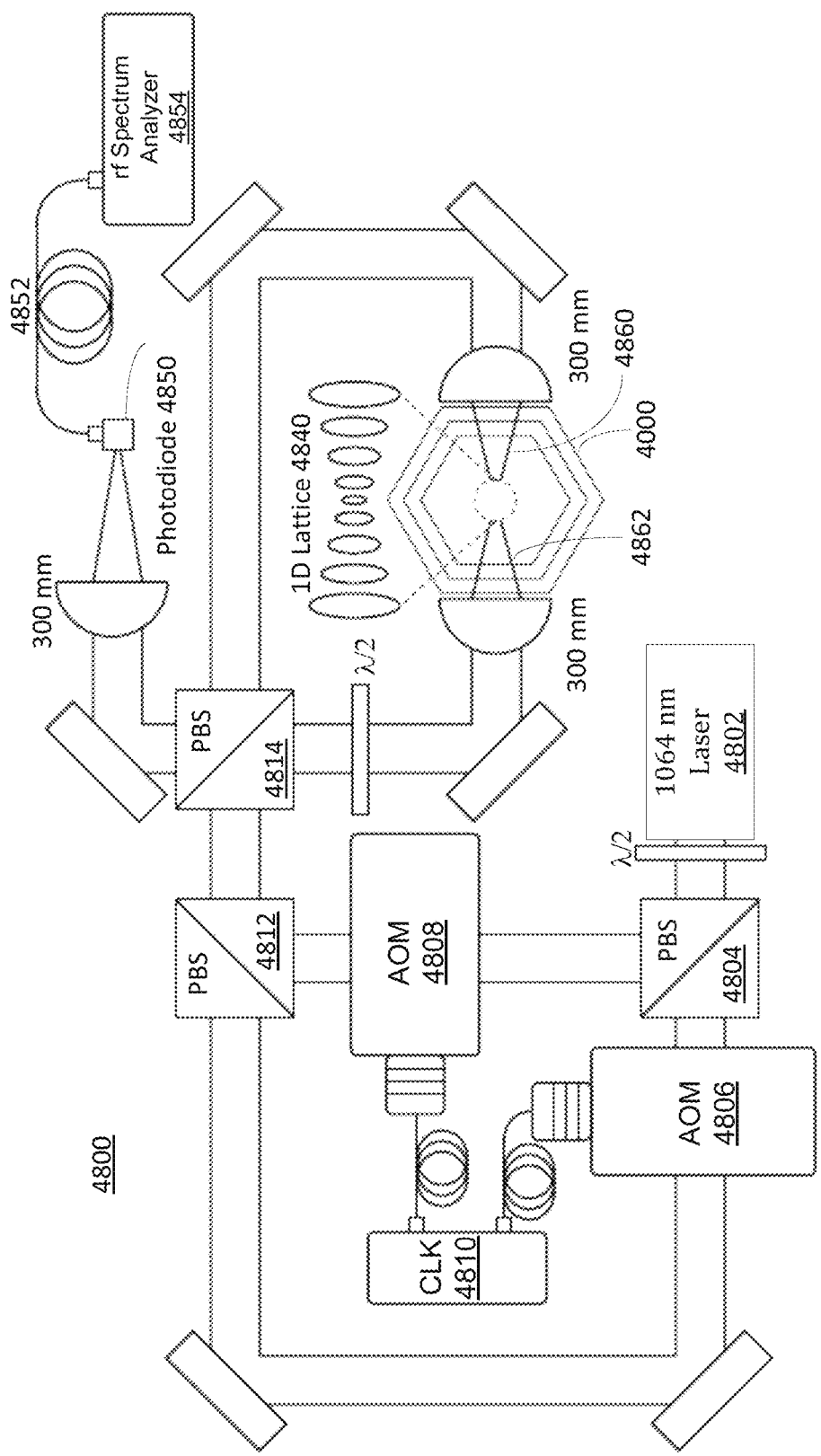
FIG. 48 (4.12) is a schematic of the optics and radio-frequency electronics used to create an optical conveyor belt.

FIG. 48 is a setup 4800 for producing an optical conveyor belt. Atoms are transported from the 3D MOT to a single crossed vortex BoB trap by utilizing an optical conveyor belt 4840. 1064 nm light from a laser 4802 is processed by a half-wave plate $\lambda/2$ and then split by a PBS 4804. A first branch exiting PBS 4804 is modulated using a 2×78 MHz acousto-optical modulator (AOM) 4806, while a second branch exiting PBS 4804 is processed using a 2×78+δ AOM 4808. AOMs 4806 and 4808 are synchronized by a 10 MHz clock 4810. The outputs of AOMs 4806 and 4808 are merged by a PBS 4812.

The merged output from PBS 4812 is split by PBS 4814 into first and second branches, each of which is input to a respective one of opposing faces of hex-cell vacuum chamber 4000, resulting in counter-propagating beams that interfere to form one-dimensional lattice 4840. The two branches differ in frequency by a variable amount δ. Varying δ causes interference fringes from the two branches to move. Atoms trapped by the fringes move with the fringes, so the interference pattern serves as an optical conveyor belt for the atoms.

The first branch from PBS 4814 passes through a 300 mm lens on its way into chamber 4000, while the second branch passes through a half-wave plate $\lambda/2$ and a 300 mm lens on its way into chamber 4000. Light exiting chamber 4000 returns to PBS 4814, which diverts some of the returned light to a photodiode 4850 via another 300 mm lens. A resulting electric signal from photodiode 4850 is conducted over a conductor 4852 to a radio-frequency spectrum analyzer 4854, which measures the velocity of the optical conveyor belt 4840 by measuring $\Delta\omega$ of the lattice beams.

Optical conveyor belt 4840 is a 1D optical lattice potential that can move atoms back and forth along the axial direction of the lattice. The optical conveyor belt is created inside the hex cell by overlapping two P=5 W, $\lambda$=1064 nm, counter-propagating Gaussian laser beams 4860 and 4862 with frequencies $\omega_1$ and $\omega_2$ and equal intensities of I=3.75×10$^1$ mW/cm2. The resulting standing wave potential is $$U(r,z,t) = U_0 \frac{w_0^2}{w(z)^2} \exp\left(-\frac{2r^2}{w(z)^2}\right) \cos^2(\pi\Delta\omega t - kz) \quad (72)(4.4)$$

where $\omega_0$ is the laser beam waist size, $\omega(z)$ is the Gaussian beam waist, k=2π/λ is the wavenumber and $\Delta\omega=\omega_1-\omega_2$ is the detuning between the two 1064 nm beams.

The quantity $U_0$ in equation 72 is the maximum dipole potential and is defined as $$U_0 = \frac{\hbar\Gamma}{2}\frac{P}{\pi w_0^2 I_0}\frac{\Gamma}{\Delta}, \quad (73)(4.5)$$

where $\sim\hbar$=1.05×10$^{-34}$, J is the reduced Planck's constant, P and $I_0$ are the total laser power and saturation intensity at the atoms, $\Delta$=70 THz is the detuning between the 1064 nm beam and the cesium D2 transition frequency, and δ=2π×5.22 MHz is the natural linewidth of the cesium D2 transition. Both $\lambda$=1064 nm lasers have an equal power of P=5 and intensity of I=3.75×10$^8$ mW/cm2. From equation 734 4.5, focusing the beams to a waist of $\omega_0$=30 µm at the center of the hex cell produces a 1D lattice with a maximum trapping depth of $U_0$=kB=-1.88 mK. where $k_B$, =1.38×10$^{23}$, J/K is the Boltzmann constant. The axial and radial harmonic oscillation frequencies $\Omega_i$ and $\Omega_{rad}$ of atoms trapped at the focus of the 1D lattice are $$\Omega_z = 2\pi\sqrt{\frac{2U_0}{m\lambda^2}} = 2\pi \times 454 \text{ kHz} \quad (74)(4.6)$$

$$\Omega_{rad} = \sqrt{\frac{4U_0}{mw_0^2}} = 2\pi \times 3.6 \text{ kHz} \quad (75)(4.7)$$

where the numerical values are computed using the values for $U_0$ and $\omega_0$ listed above.

The velocity v of the lattice potential U(r,z,t) along the axial direction of the lattice is controlled by changing the lattice beam detuning $\Delta\omega$. To understand why detuning the lattice beams induces motion of the lattice, realize that there exists a reference frame moving along the axial direction of the lattice at a velocity v where both lattice beams are Doppler shifted to the same frequency, that is $\Delta\omega$=0 in this frame. From the lab frame of reference, this is consistent with the lattice propagating along the axial direction with the same velocity v. Consequently, atoms that are trapped in this 1D lattice potential U(r,z,t) are also translated with the same velocity v. The velocity of the 1D lattice as a function of laser detuning is $$v = \frac{\lambda\Delta\omega}{4\pi}. \quad (76)(4.8)$$

The value of $\Delta\omega$, and hence v is set by passing each lattice beam through an acousto-optic modulator (AOM) 4806, 4808 initially driven at 78 MHz in a double-pass configuration as shown in FIG. 48. The double-pass geometry allows for changes in laser frequency while avoiding changes in beam pointing, which is critical for maintaining the lattice beam overlap. To minimize phase jitter in the lattice, both AOMs 4810 are driven with independent RF drivers 4812 that are frequency locked and phase synchronized via the RF drivers' 10 MHz clocks 4810.

Figure 49:
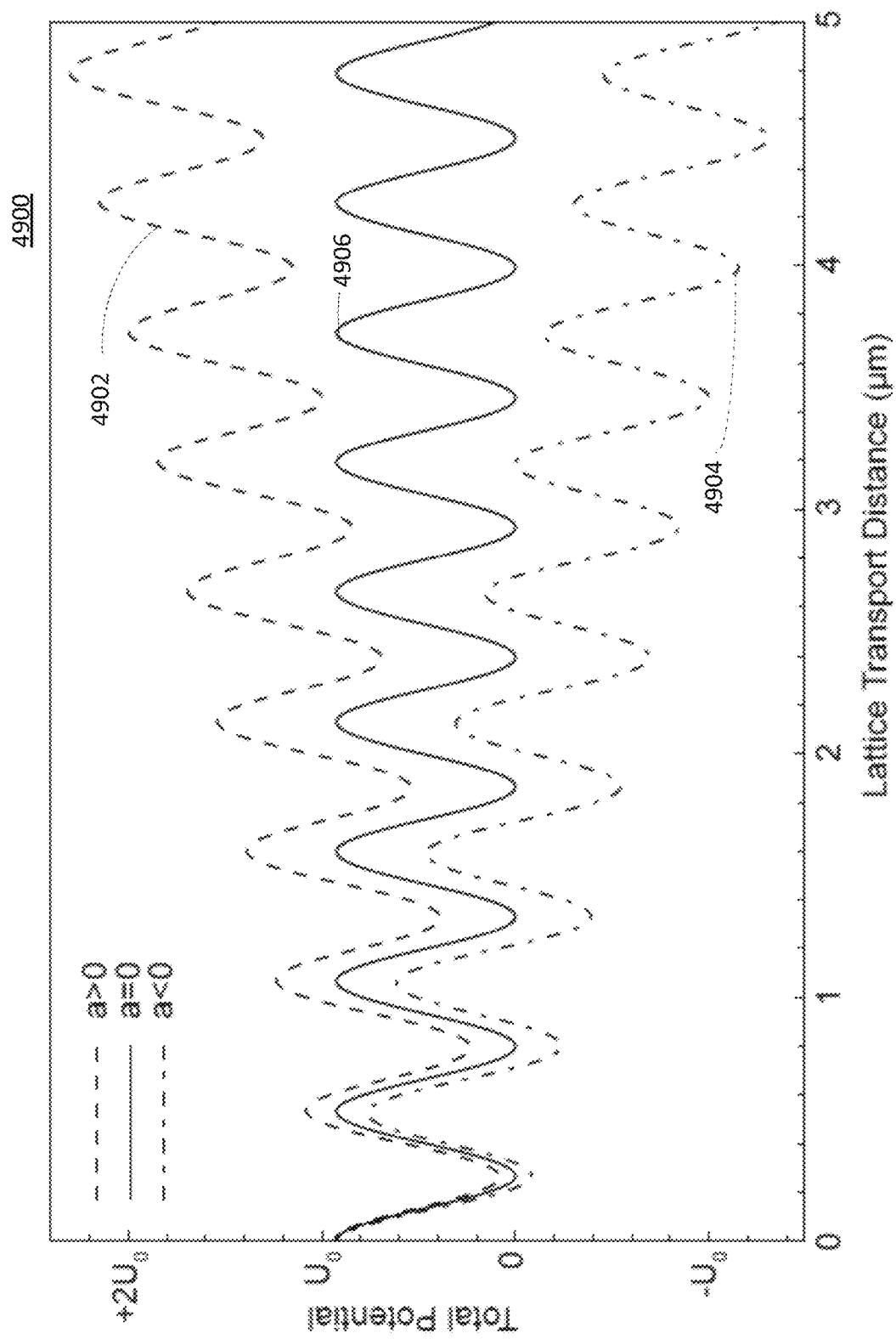
FIG. 49 (4.13) is a plot showing the moving standing wave potential for positive acceleration (a>0), negative acceleration (a<0), and no acceleration (a=0).

It is important to note that the lattice detuning $\Delta\omega$, and hence conveyor belt velocity v, cannot just be "snapped on" instantaneously, as the resulting acceleration can heat the atoms out of the lattice. Rather, motion of the lattice is achieved by adiabatically frequency chirping one lattice beam by $\Delta\omega$. Frequency chirping the beams at an adiabatic rate is important since the total potential experienced by atoms trapped in the optical conveyor belt becomes a tilted lattice potential. In the atom reference frame, the complete optical conveyor belt potential along the direction of the lattice acceleration becomes $$U_{tot}(r=0,z,t) = U_0 \frac{w_0^2}{w(z)^2}\cos^2(kz) + maz \approx U_0\cos^2(kz) + maz \quad (77)(4.9)$$

where a is the acceleration of the atoms. FIG. 49 is a graph 4900 showing the moving standing wave potential for positive acceleration (a>0) 4902, negative acceleration (a<0) 4904, and no acceleration (a=0) 4906.

The total potential is tilted upward or downward when the respective conveyor belt acceleration is positive or negative. During any atom transport sequence, as long as the 1D lattice potential is greater than the maz contributions from atom accelerations, then atoms will remain trapped in the optical conveyor belt. To solve for the maximum permitted acceleration in the tilted, moving potential, the local minimum of equation 77 (4.9) as a function of acceleration a is computed by equating the spatial derivative of $U_{tot}$ to zero:

$$\frac{dU}{dz} = -2U_0 k \cos(kz)\sin(kz) + ma = 0 \qquad (78)(4.10)$$

and solving for a $$a = 2U_0 \frac{k}{m} \cos(kz)\sin(kz). \qquad (79)(4.11)$$

Since the maximum value of cos(kz) sin(kz)=0.5, it immediately follows that the maximum of equation 79 4.11, and hence maximum optical conveyor belt acceleration $a_{max}$, is $$a_{max} = U_0 \frac{k}{m} \approx 5 \times 10^5 \ m/s^2 \qquad (80)(4.12)$$

where the numerical value is computed using the values for $U_0$, k, and m. With the result in equation 80 (4.12), there is an absolute speed limit for how fast the atoms can be transported using the optical conveyor belt. However, this does not tell us how to accelerate the atoms. During transport, a minimal amount of heating can occur when frequency chirping one of the lattice beams in a fashion that minimizes the rate of change of acceleration of the atoms.

Using equation 76 4.8, the velocity of the optical conveyor belt as a function of the mutual lattice beam detuning is $$v = \frac{c}{2} \frac{\Delta\omega}{\Omega_z} \qquad (81)(4.13)$$

where $\omega = 2\pi c/\lambda$ is the initial, un-shifted frequency of the $\lambda$=1064 nm transport laser. It immediately follows that the time rate of change of acceleration of the optical conveyor belt is expressed as $$\frac{da}{dt} = \frac{d^2 v}{dt^2} = \left( \frac{1}{\Omega_z} \frac{d^2\Delta\omega}{dt^2} - \frac{1}{\Omega_z^2} \frac{d\Delta\omega}{dt} + \frac{\Delta\omega}{\Omega_z^3} \right). \qquad (82)(4.14)$$

The lattice chirping $\Delta\omega$ can be a linear ramp. Thus, the $d^2\Delta\omega/dt^2$ term vanishes. Additionally, the lattice axial trap frequency $\Omega_z \gg \Delta\omega$, and thus we can approximate that $\Delta\omega/\Omega^3 \approx 0$. Using these approximations, the magnitude of the time rate of change of the conveyor belt acceleration is $$\left| \frac{da}{dt} \right| = \frac{1}{\Omega_z^2} \left| \frac{d\Delta\omega}{dt} \right|. \qquad (83)(4.15)$$

In order to minimize this function, the lattice chirping must satisfy $$\Omega_z^2 \gg \frac{d\Delta\omega}{dt}. \qquad (84)(4.16)$$

Figure 50:
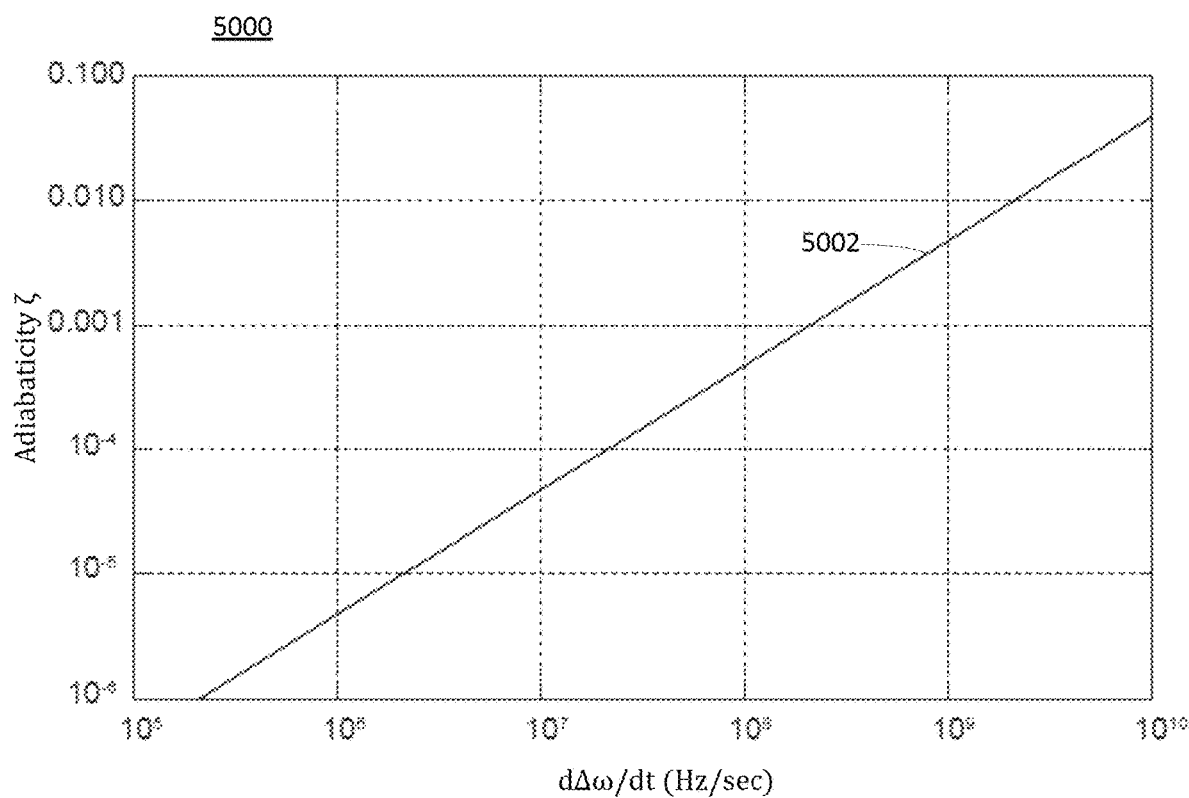
FIG. 50 (4.14) is a plot of an adiabatic parameter $\xi$ as a function of lattice chirping parameters $d\Delta\omega/dt$.

Equation 84 4.16 can be used to define a dimensionless adiabatic chirping parameter $$\xi = \frac{\Omega_z^2}{d\Delta\omega/dt} \qquad (85)(4.17)$$

whereby $\xi \ll 1$ must be satisfied to transport atoms with minimal heating imparted from changes in acceleration of the optical conveyor belt. The desired adiabaticity parameter is $\xi \approx 10^{-3}$. FIG. 50 4.14 is a plot 5000 of the adiabaticity parameter $\xi$ 5002 as a function of the frequency acceleration $d\Delta/dt$ and shows that $\xi = 10^{-3}$ is possible for $d\alpha w/dt \approx 2 \times 10^8$ Hz/sec, which corresponds to a frequency chirp of 500 kHz over 5 ms. Thus, any slower acceleration satisfies the desired $\xi$ parameter.

Figure 51:
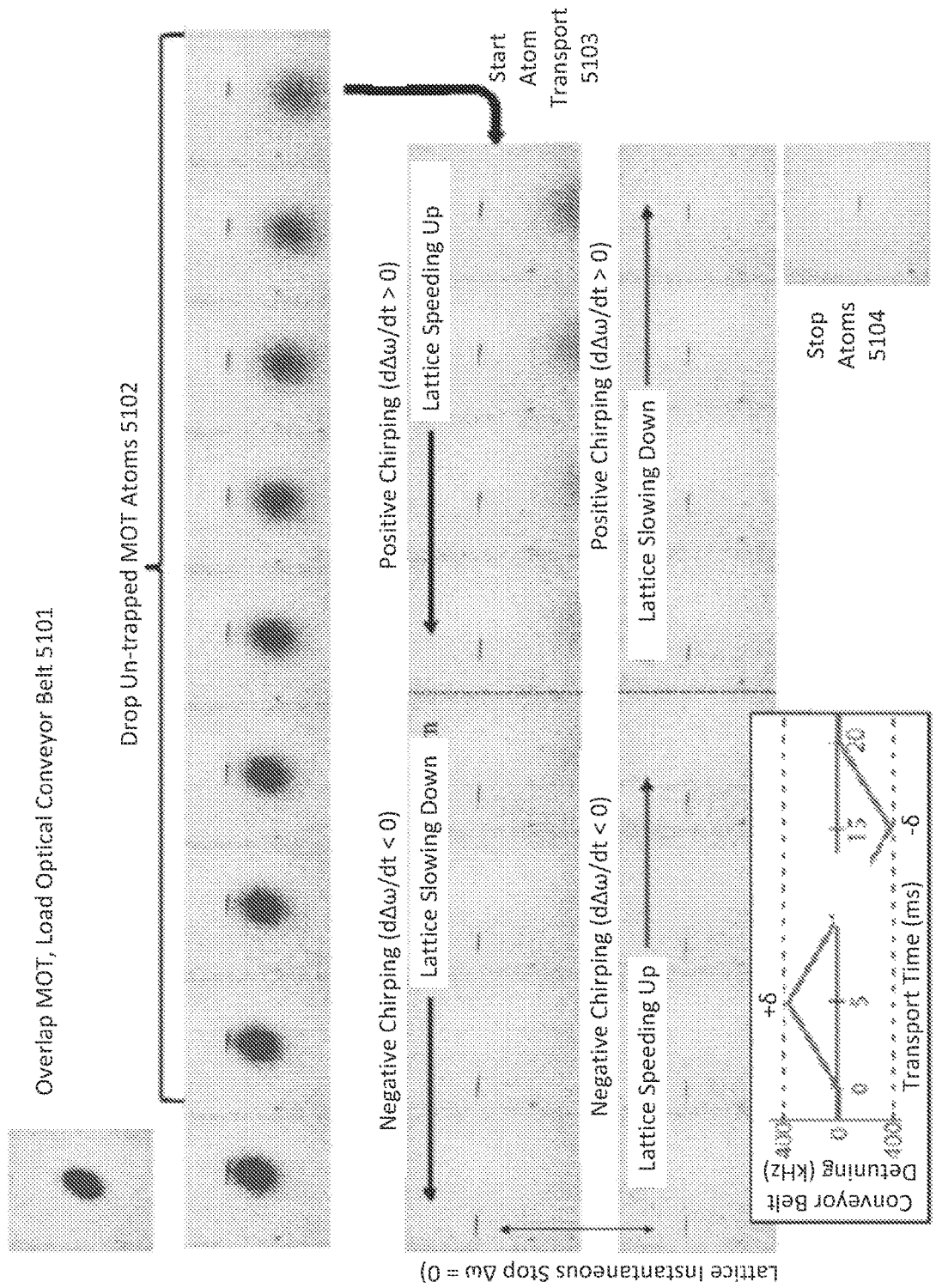
FIG. 51 (4.15) is a time-lapse of an atom transport process.

A composite time-lapse image of an entire transport process 5100 is shown in FIG. 51. At 5101, approximately 6,000 atoms are loaded into the conveyor belt by overlapping the 1D lattice and the 3D MOT for 530 ms. After loading the lattice, the MOT is turned off, leaving behind (dropping), at 51202, a reservoir of cold atoms in the lattice. To transport atoms using this optical conveyor belt, at 5103, one lattice beam is linearly frequency chirped by 200 kHz over 5 ms. The double pass configuration of the AOM calls for a lattice beam detuning of 400 kHz. With 400 kHz detuning, the optical conveyor belt accelerates to a maximum velocity of 212 mm/s. After this acceleration, the lattice beam is linearly chirped down −400 kHz over 5 ms to give zero detuning for the lattice. This process displaces any loaded atoms by 0.53 mm in 10 ms. The atoms are transported back to their original starting location by repeating the process in reverse at 5104. The entire procedure transports the atoms a total distance of 1.1 mm in 20 ms.

As the optical conveyor belt motion abruptly starts and stops, large forces are imparted to atoms trapped in the 1D lattice. Consequently, cold atoms in the conveyor belt can be heated and even ejected from the lattice. This heating effect is achieved by chirping the moving lattice at a much lower rate than the square of the lattice axial oscillation frequency. For motion of the optical conveyor belt the inequality holds as $\Omega_z^2 \sim 10^{12}$ s$^{-2}$ and $d\Delta\omega/dt \sim 10^{18}$ s$^{-2}$. Additionally, this transport process preserves approximately 87% of the atoms trapped in the optical conveyor belt. This atom survival probability is approximately equal to the atom survival in the stationary lattice over the same time period.

Figure 52:
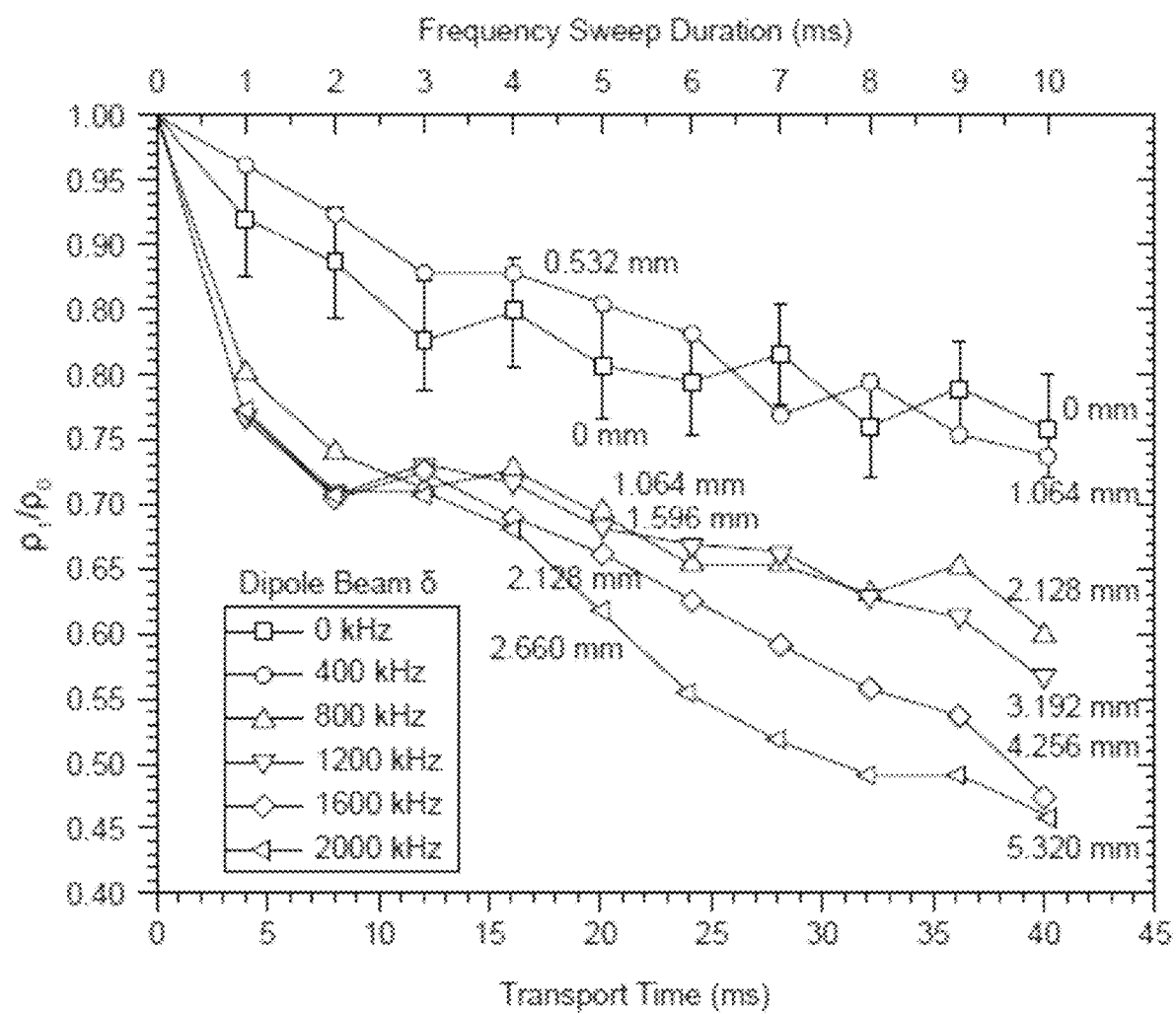
FIG. 52 (4.16) is a graph showing change in atom density (atoms/cm$^3$) in a moving standing wave dipole trap after transport.

FIG. 52 is a graph 5200 of change in atom density (atoms/cm3) in the moving standing wave dipole trap after transport. The final density $\rho_1$ is compared to the initial atom density $\rho_0$ for various AOM detunings and frequency sweep times for the moving standing wave dipole trap. The numbers written inside the plot show the transportation distance for each set of parameters. Note the black points indicate atom survival in the stationary lattice.

Because the process of transferring a single atom from the conveyor belt and loading it into a BoB trap relies heavily on the atom density in the lattice, 400 kHz frequency chirping is used as it permitted the farthest and fastest transport with the highest remaining atom density after transport. Faster transport over greater distances can be achieved by using higher frequency chirps and longer transportation times. While greater transport distances of up to 5.32 mm can be achieved in this way, the more intense accelerations resulted in the atom survival rate rapidly declining to below 50 percent. More importantly, for these more intense accelerations, the remaining atom density after transport drops far below the remaining atom density of the stationary lattice over the same time durations, showing that heating due to these greater accelerations is outweighing the natural heating rate of the lattice.

Figure 53:
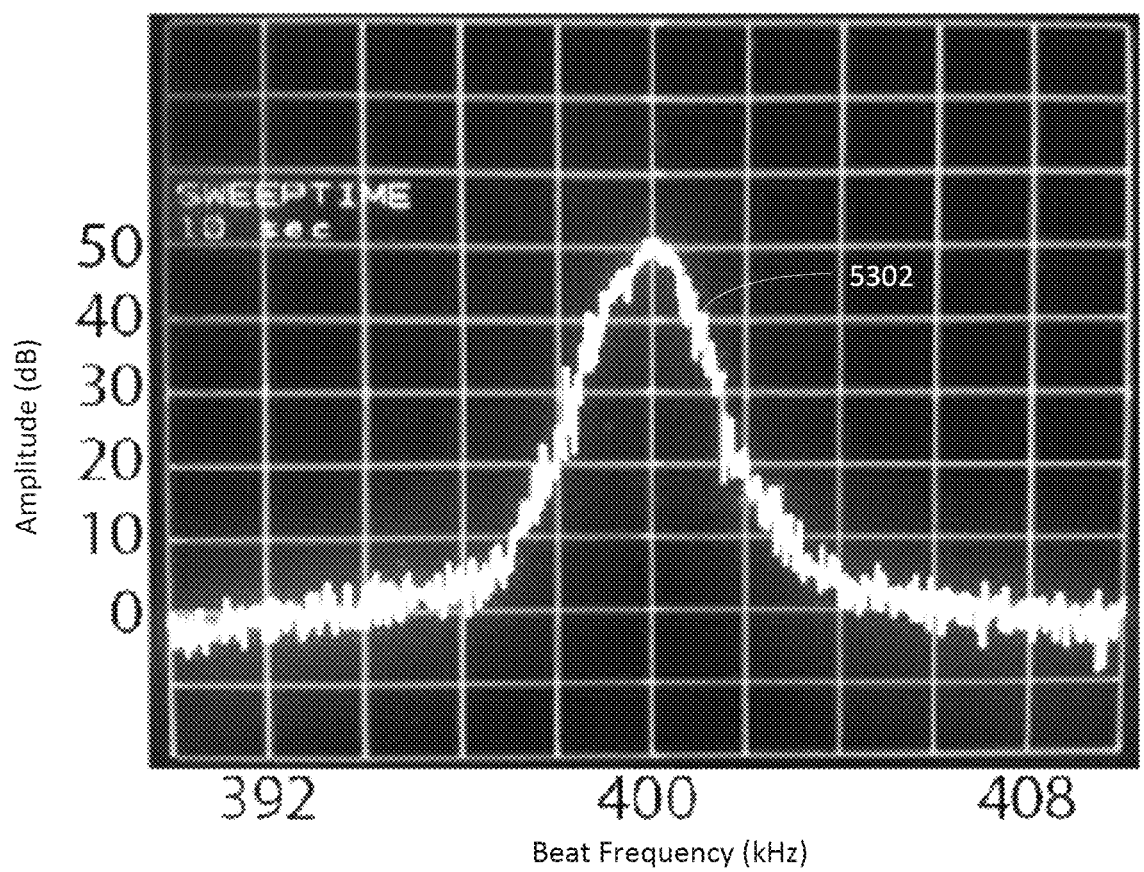
FIG. 53 (4.17) is a beat note spectrum measured by overlapping two 1064 nm optical conveyor belt laser beams.

Successful atom transport with the optical conveyor belt depends critically on the degree of overlap between the two 1064 nm lattice beams and their relative polarization. The amplitude of the beat note $\Delta\omega$ of the 1D lattice beams is a maximum when the beams are entirely overlapped with parallel polarization. Moreover, the line width of the beat note is used to quantify the phase jitter, and hence the axial position fluctuations of the conveyor belt. The beat note is measured by focusing the overlapped 1D lattice beams onto a photodetector that is connected to RF spectrum analyzer 4804 (FIG. 48 (4.12)). The lattice beams are focused using a lens with the same focal length used to focus the lattice in the vacuum cell. FIG. 53 is a beat note spectrum 5302 measured by overlapping the two 1064 nm optical conveyor belt laser beams. The frequency spectrum peaks at 400 kHz and has a full-width at half-max of 1.33 kHz as measured at the −3 dB point. This signal is used to quantify the lattice beam overlap, relative polarization, and phase jitter.

Figure 54:
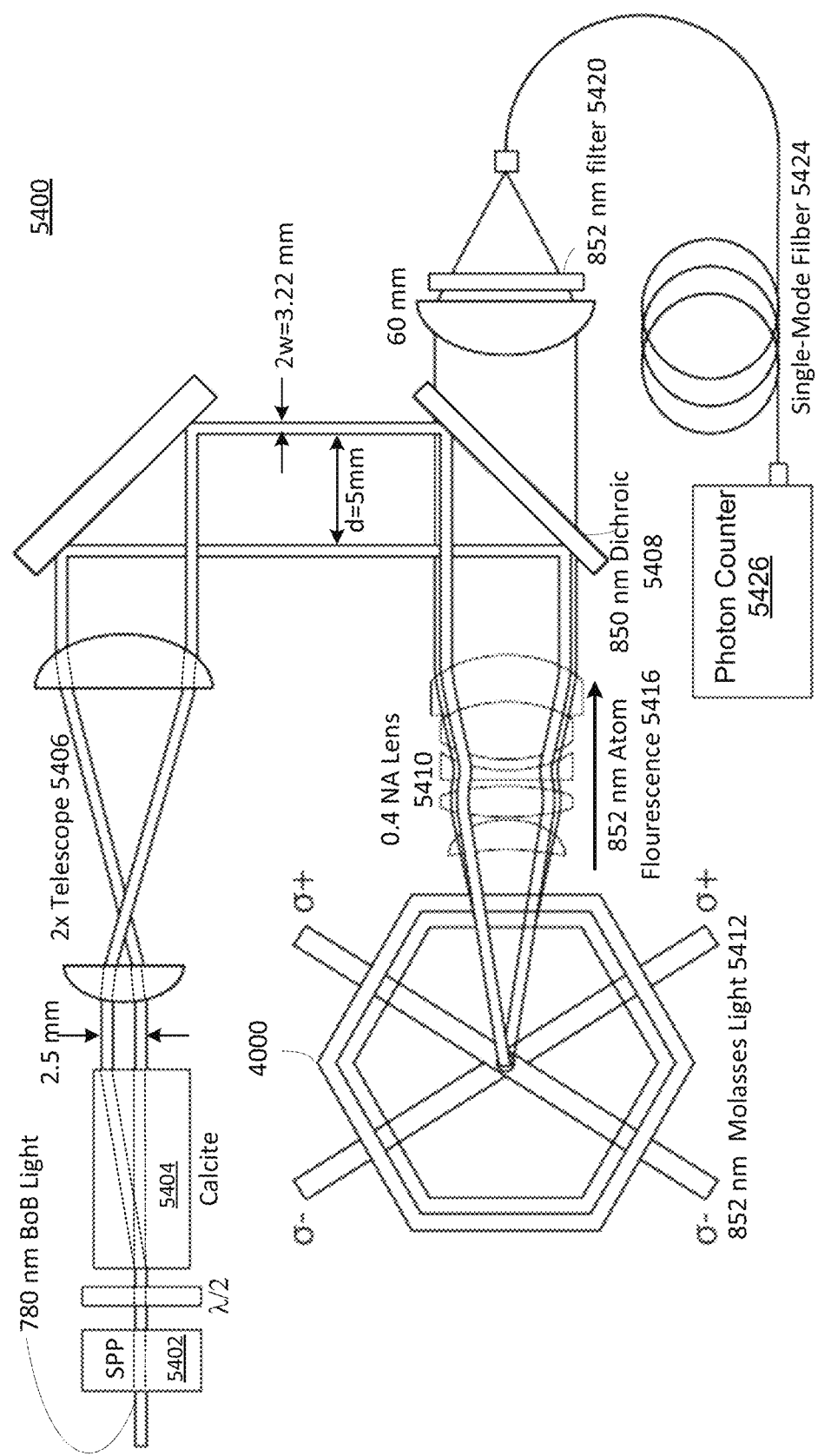
FIG. 54 (4.19a) is a schematic of an optical setup for generating and imaging the crossed vortex bottle beam trap.

As shown in FIG. 54, 780 nm laser light (used to form the bottle-beam traps) is processed by a spiral phase plate 5402, a half-wave plate $\lambda/2$, a birefringent calcite crystal 5404, and 2× telescope 5406. The resulting beams are directed by an 850 nm dichroic 5408 through a 0.4 numeric aperture lens 5410 in to hex-cell vacuum chamber 4000.

Atoms in chamber 4000 are subjected to 852 nm molasses light, that causes 852 nm atom fluorescence, some which is directed on a return path through lens 5410, dichroic 5408, a 60 mm lens, and an 852 nm filter 5420 to be collected by a 10 mm core single-mode fiber 5424 for transfer to a photon counter 5426.

Additionally, to avoid beam distortions on the 780 nm BoB when passing through the 7.3 mm thick cell windows, the front face of 0.4 NA lens 5410 must be aligned normal to the cell walls. Otherwise, the BoB does not completely close in the axial direction, giving atoms an opportunistic path to escape the trap. To have precise control over the position of 0.4 NA lens 5410, the lens is mounted with a compact lens positioner that provides adjustments along the x; y; and z axes in addition to control over $\theta_x$ and $\theta_y$.

To deliver and load an atom into the BoB trap, the foci of the 780 nm and 1064 nm beams must overlap. As shown in FIG. 40, the optical axis of the 1064 nm conveyor belt and 780 nm BoB lie on the same plane but are at a 60° angle with respect to each other. To overlap their foci, an 852 nm resonant beam is sent backwards though the photon collecting fiber 5420 shown in FIG. 54 and is focused through the BoB trap. After transporting atoms to the BoB site, the conveyor belt is held in place while the resonant beam is snapped on. The resonant beam causes any trapped atoms in its path to be ejected from the conveyor belt.

Performing absorption imaging provides visual proof of atoms ejecting from the trap and approximates the degree of overlap between the conveyor belt and BoB trap. Course adjustments of the conveyor belt position can be made until only atoms at the focus of the conveyor belt are observed to be ejected. Fine alignment of the conveyor belt position was made by turning on the 3D MOT lasers after transporting atoms to the BoB site and counting the photons emitted from the atoms while still held in the lattice. Micron-scale adjustments of the conveyor belt position can be made to optimize the fluorescence signal. With the photon counting signal at a maximum, there exists adequate overlap between the foci of the BoB trap, photon detection optics, and conveyor belt lasers. However, this degree of overlap contains the largest source of error for this technique, due to the lack of a distinct, physical reference point for the microscopic BoB trap.

An optical bottle beam (BoB) is an electric field distribution that features a region of low optical intensity completely surrounded by high optical intensity. Herein, the laser light used to form the BoB intensity profiles has wavelength $\lambda=780$ nm and is blue-detuned from resonance. From equations 14 (2.11) and 15 (2.12), by using blue-detuned light, the regions of the BoB with high intensity produce a repulsive potential, forcing the atoms to seek regions of low optical intensity. Thus, atoms can become trapped in the central, dark region of the BoB. While a red-detuned dipole trap is considerably easier to implement for trapping atoms, the upside of the blue-detuned BoB trapping scheme is that it is very useful for confining single cesium atoms for use in quantum computing. Atoms in the dark, blue-detuned traps subsequently scatter less photons than if they were trapped in a red-detuned dipole trap of comparable depth. Since the qubit decoherence time is proportional to the photon scattering rate of the trapped qubit, trapping in blue-detuned BoBs can result in coherence times 300 times longer than those observed in red-detuned dipole traps with similar trapping depths The intensity profiles of the BoBs can generate radial confinement (along $\hat{x}$ and $\hat{y}$) but not axial confinement along the direction of beam propagation $\hat{z}$. To provide confinement along the axial direction, additional blue-detuned light must close the ends of the BoB (i.e., "cap" the bottle beam). A BoB trapping potential can be formed using a high numerical aperture (0.4 NA) lens to tightly cross two co-propagating Laguerre-Gaussian LG01 beams with orthogonal linear polarizations at a tight focus. Because the LG01 beams are sometimes called "vortex beams" this optical configuration gives the trap the appropriate name of "Crossed Vortex Bottle Beam Trap."

The complete, detailed schematic for generating the co-propagating pair of orthogonally polarized LG01 beams with identical beam waists of w=1:61 mm and separated by distance d=5 mm is shown back in FIG. 37 4.3b. With the LG01 beams created, FIG. 54 shows how to form a BoB trap by using a high quality, diffraction-limited 0.4 NA lens 5402 with focal length f=23.125 mm to tightly focus and overlap the LG01 beams at the center of the hex cell 4000.

As the beams are focused with lens 5410, they are rotated by $$\theta = \tan^{-1}\left(\frac{d}{2f}\right) = 6.17°. \quad (86)(4.18)$$

Because the rotation is small ($\theta<10°$) the changes in polarization to each LG01 beam can be neglected. The resulting crossed vortex intensity profile ICV is also shown in FIG. 54 and is given as the sum of both linearly polarized LG01 beams:

$$I_{CV}(r,z)=I_{LP}(r_+,z_+)+I_{LP}(r_-,z_-)=I_{1,0}(r_+,z_+)+I_{1,0}(r_-,z_-) \quad (87)(4.19)$$

where the intensity of each LG beam, $I_{l,p}(r,z)$ is defined in equation 71 (4.3). For the intensities in equation 4.19, the radial coordinates $r_x$ are defined as $$r_{\pm} = \sqrt{y^2 + (x\cos\theta \pm z\sin\theta)^2} \qquad (88)(4.20)$$

and the axial coordinates $z_{\pm}$ are $$z_{\pm} = z\cos\theta \mp x\sin\theta. \qquad (89)(4.21)$$

where the ± subscripts refer to the π, and π linearly polarized LG01 beams, respectively.

Figure 55:
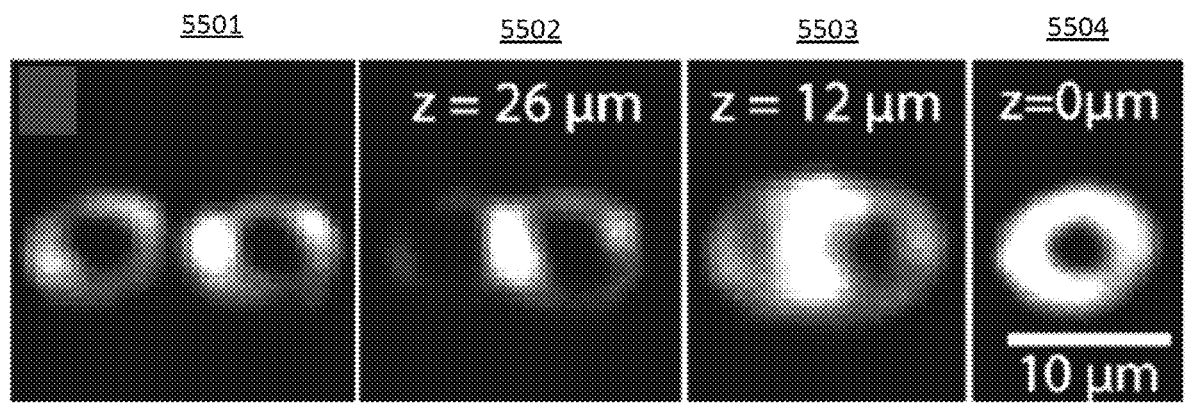
FIG. 55 (4.19b) is a series of intensity profiles at different axial lengths of the crossed vortex bottle-beam trap.

FIG. 55 includes intensity profiles at the crossed vortex bottle-beam trap forming as the two LG01 mode lasers are focused at the focal plane of the 0.4 NA lens 2410. From left to right, the images 5501, 5502, 5503, and 5504 show the trap at axial lengths z=34 μm, z=26 μm, z=12 μm, and z=0, respectively from the focus of the 0.4 NA lens.

Figure 56:
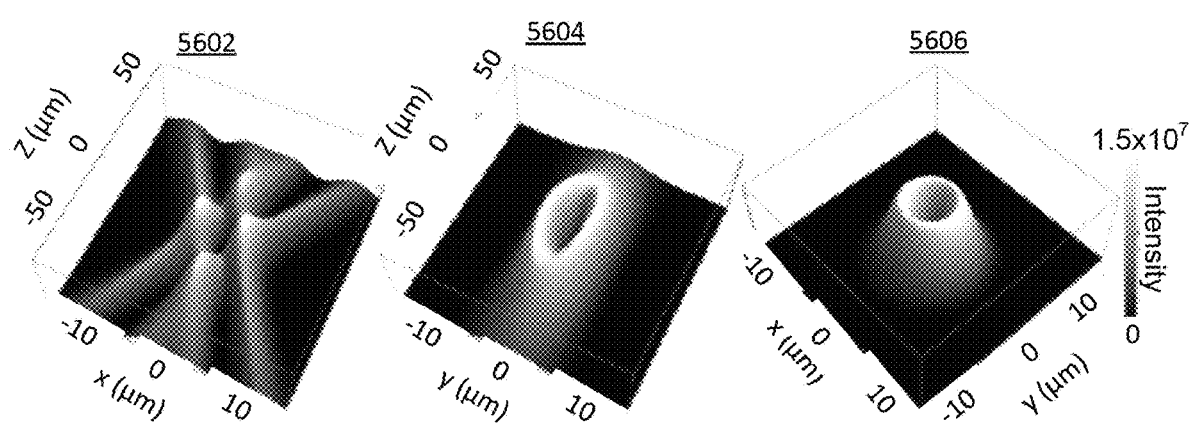
FIG. 56 (4.20) shows crossed vortex bottle beam trapping potentials along xz, yz, and xy planes at the focus of a lens.

The total optical trapping potential of the crossed vortex BoB trap is then numerically calculated by inserting equation 87 (4.1) into equation 14 (2.11). The calculated trapping profiles along the orthogonal xz 5602, yz 5604, and xy 5606 planes at the focus of the crossed vortex BoB are plotted in FIG. 56. With respect to the parameters of this experiment, at the focus of the 0.4 NA, f=23.125 mm lens, the crossed vortex BoB trap has a width of 5.5 μm in the radial direction and an axial length of 52 μm. Using 300 mW of 780 nm light produces a calculated BoB trap depth of U/kB=1.65 mK, with harmonic oscillation trap frequencies of $\Omega_{rad}=2\pi\times51$ kHz in the radial direction 5702 and $\Omega_z=2\pi\times5.3$ kHz in the axial direction 5704, as indicated in FIG. 57.

Finally, in order to get an intuitive understanding of how the final size of the crossed vortex BoB affects the trapping depth, the equations for the trapping potential can be vastly simplified by choosing to perform a Taylor series expansion of the intensity (equation 87 4.19) about the origin. Such expansion of the trap depth about (x=0; y=0; z=0) gives $$U(x) \approx -\frac{2\alpha P\cos^2\theta}{\pi\epsilon_0 c w^4} x^2 \qquad (90A)(4.22a)$$

$$U(y) \approx -\frac{2\alpha P}{\pi\epsilon_0 c w^4} y^2 \qquad (90B)(4.22b)$$

$$U(z) \approx -\frac{2\alpha P\sin^2\theta}{\pi\epsilon_0 c w^4} z^2. \qquad (90C)(4.22c)$$

Equations 90A (4.22a), 90B (4.22b), and 90C (4.22c) convey a very important result that the crossed vortex BoB trap potential scales as $\omega^{-4}$, so meticulous care must be made when focusing the LG01 beams though the thick hex cell walls to ensure that as little distortions as possible occur such that the final beam waist of $\omega_0=5.5$ μm is correct.

Fluorescence imaging is used to detect the presence of a single atom loaded into the crossed vortex BoB trap. When a single atom is loaded, a 3D optical molasses is applied to the trapped atom by turning on the 3D MOT lasers and detuning them −30 MHz. Repump light is also turned on. Additionally, the MOT coils are turned off and shim coils are used to eliminate any residual magnetic fields. This induces atom fluorescence while continuously cooling the trapped single atom.

As shown in FIG. 54 4.19, the fluorescence is collected and collimated with the same 0.4 NA, f=23.125 mm lens 5410 used to focus the BoB trap. Photons collected from the trapped atom are separated from the 780 nm trapping light by an 800 nm short-pass dichroic mirror 5408. The collimated fluorescence is then focused by an f=60 mm achromatic doublet lens into a 10 μm core diameter single mode optical fiber that is coupled into a single photon counting module (SPCM) 5426. The 10 μm fiber functions as a pinhole for spatial filtering of the fluorescence. Since the optical magnification from the BoB trap to the pinhole is 2.6, a window 3.85 μm in diameter is thus selected at the BoB trap focus. Two 852 nm laser line filters 5420 are used to eliminate stray 780 nm BoB light.

The SPCM 5426 works alongside an avalanche photodiode to count individual photons emitted from the trapped atom over an arbitrary time interval. When exposed to optical molasses 5412, the trapped atom scatters on the order of 10' photons over a 50 ms interrogation time. Since the fluorescence collecting lens has an effective focal length of 23.125 mm and an aperture of 18 mm, the collection angle is $\Omega/4\pi$=4.67%. Total transmission of the photon collecting optics is approximately 50% and the quantum efficiency of SPCM 5406 at 852 nm is 54%. Thus, the maximum photon collection efficiency is approximately 1:1%. Additionally, noise of approximately 100 counts/sec of 780 nm light and approximately 25 dark counts/sec is recorded using the photon counter.

To verify that the BoB is capable of trapping a single atom, the BoB trap can be loaded directly from a 3D MOT. The MOT was loaded for 1 second followed by PGC for 10 ms. During the final 5 ms of PGC, the BoB is snapped on in 300 μs and overlaps the central and most dense region of the 3D MOT. If multiple atoms are initially loaded into the BoB trap, a useful process between pairs of atoms called light assisted collisions reduces the trap occupation to zero or one atom.

As atoms confined in the BoB approach each other in the presence of the MOT laser light, there exists a critical inter-atomic separation where the laser light excites a long-range, attractive dipole-dipole interaction between pairs of atoms, which results in the atom pair gaining considerable kinetic energy leading to collisions that expel both atoms from the BoB trap. Consequently, if an even number of atoms occupy the BoB trap, they will all pair-collide until no atoms remain in the trap, whereas an odd number of atoms will pair-collide until only one atom remains in the trap.

Figure 58:
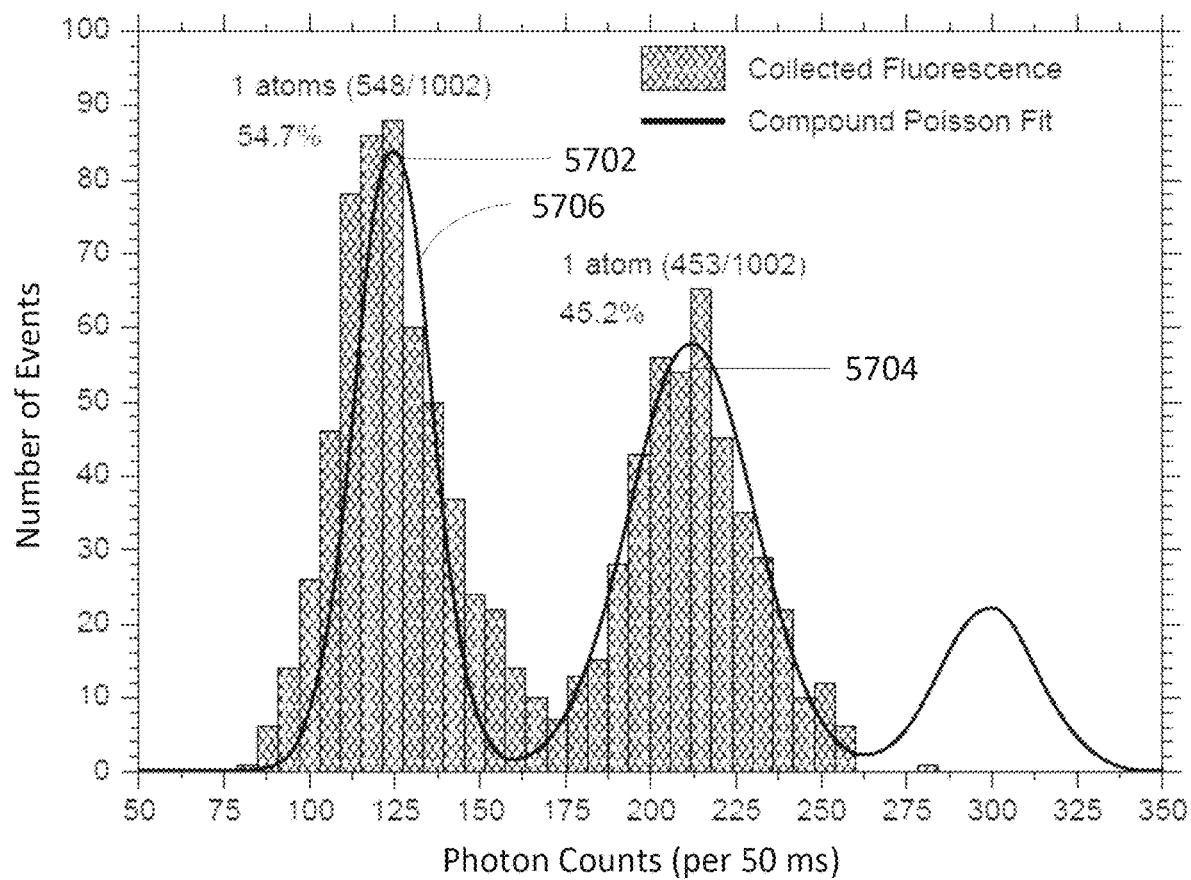
FIG. 58 (4.22) is a histogram of photon counting data recorded during fluorescence imaging of the bottle-beam trap.

After loading the BoB trap and allowing time for light assisted collisions, all MOT lasers are turned off for 20 ms to let any untrapped atoms fall away due to gravity. After this fall time, the MOT beams are turned back on and fluorescence imaging on the trapped single atom is performed. A histogram 5700 of the photon counting data recorded by the SPCM 5426 during fluorescence imaging of the BoB trap is shown in FIG. 58. Two Poisson distributions are present with means of 125 counts and 215 counts, corresponding to 0 5702 or 1 5704 atom present in the BoB trap, respectively. The histogram is fitted with a compound Poisson distribution 5706 over atom and photon number.

The photon counting statistics for 1002 independent atom loading attempts show two Poisson distributions corresponding to either 0 or 1 atom confined in the BoB trap after any given loading. When 0 atoms are present in the BoB trap, a mean of nbg=125 background photons are counted over 50 ms. This signal arises from stray 852 nm molasses light and 780 nm trapping light being collected by the detection optics. During runs when one atom is loaded in the BoB trap, the number of photons detected over 50 ms increases to a mean of $n_t$=215 counts due to the added fluorescence from the atom trapped in the BoB. Photon counting statistics show that a single atom is loaded into the BoB trap in 45.2% of all loading trials. The near complete absence of multi-atom loading events is due to light assisted collisions and the collisional blockade effect.

The photon counting data is fitted to a compound Poisson fit $$\mathcal{P} = A \sum_{k=0}^{2} \frac{N^k e^{-N}}{k!} \frac{1}{\sqrt{2\pi(n_{bg} + kn_1)}} \exp\left[\frac{(n - (n_{bg} + kn_1))^2}{2(n_{bg} + kn_1)}\right] \quad (91)(4.23)$$

For random loading following a Poisson distribution $$P(k) = \frac{N^k e^{-N}}{k!}, \quad (92)(4.24)$$

the probability of loading a single atom (assuming that on average we load one atom) has an upper bound of $P(1)=e^{-1}=0.368$. Thus, following random loading, $P(1) \leq 0.368$. However, from FIG. 58, a single atom is loaded 45.2% of all loading runs, corresponding to a variance of $(\Delta N)^2=0.452N$, which is smaller than the variance of the Poisson distribution, $(\Delta N)^2=0.368N$, which shows that the atom loading is sub-Poissonian in nature.

Each run begins with using the 3D MOT system to create a reservoir of $10^6$ atoms at T≈75 K within 1 second. During the last 480 ms of the 3D MOT loading time, the 1064 nm optical conveyor belt lasers with no mutual detuning ($\Delta\omega=0$) are un-shuttered and overlap the MOT. Approximately 5000 to 6000 of the 3D MOT atoms are loaded into the stationary 1D lattice. Polarization gradient cooling is applied throughout the final 10 ms of the conveyor belt loading time, cooling the loaded atoms to T≈25 $^1$K and increasing the atom density to ρ≈$10^{10}$ atoms/cm3.

The probability of loading a single atom into the BoB trap is directly proportional to the atom density trapped in the optical conveyor belt. With the BoB approximated as an ellipsoid, an upper bound for the BoB trap volume is $$V = 4/3\pi r_{rad}^2 r_z \quad (93)(4.25)$$

where $r_{rad}$ is the radius along the radial direction and $r_z$ is the axial radius. FIG. 54 4.19 shows that $r_{rad}$=2.75 $^1$m and $r_z$=26 $^1$m, which gives a total BoB trapping volume of approximately 8.23×$10^{31}$ $^{10}$ cm. After the entire atom transport sequence (FIG. 51 (4.15)), approximately 3,000 atoms remain in the conveyor belt and the atom density is approximately 1.4×$10^9$ atoms/cm$^3$. Thus, an upper bound to the expected number of atoms that can be overlapped with the BoB trap is $\langle N \rangle = V_{BoB} \times \rho$, which corresponds to overlapping an average of 1 atom per trial. Therefore, maintaining an atom density of $10^9$ atoms/cm$^3$ in the conveyor belt after transport is crucial.

After loading the optimal atom density into the optical conveyor belt, atoms are transported 1.1 mm to the BoB trap site by following the frequency chirping sequence previously outlined where one lattice beam is linearly frequency chirped by 400 kHz over a 5 ms time interval and accelerated to a maximum velocity of 212 mm/s. The lattice beam is then linearly chirped down −400 kHz over another 5 ms period to instantaneously stop the conveyor belt before repeating the chirping sequence in reverse to bring the atoms back to the starting point. This series of lattice beam frequency chirps first transports atoms a distance of 0.530 mm along the axial direction followed by an additional 0.530 mm in the reverse direction for a total transport distance of 1.1 mm in 20 ms. Time-of-flight temperature measurements performed on the transported atoms show that atom temperatures rise to 70 $^1$ K after transport in the conveyor belt. Ballistic expansion in the radial direction of the conveyor belt was chosen for time-of-flight temperature measurements since it expands faster and therefore shows greater temperature dependence than in the axial direction. To load a single atom in the BoB trap from the conveyor belt and also to successfully image the loaded atom, the transported atom temperature should optimally be a factor of 50 colder than the BoB trap depth. To cool the transported atoms to such an optimal temperature, an additional 10 ms of PGC is applied to the atoms immediately after transport while still held in the 1D optical lattice. The intense light shift imparted by the lattice (equation 14 (2.11)) detunes the atoms an additional −8δ, giving a total detuning of −14.6Γ. When applying PGC after transport the atoms have an average temperature of 15 $^1$K as compared to a temperature of 70'K when no extra PGC is applied (FIG. 59B (4.23)).

Figure 59A:
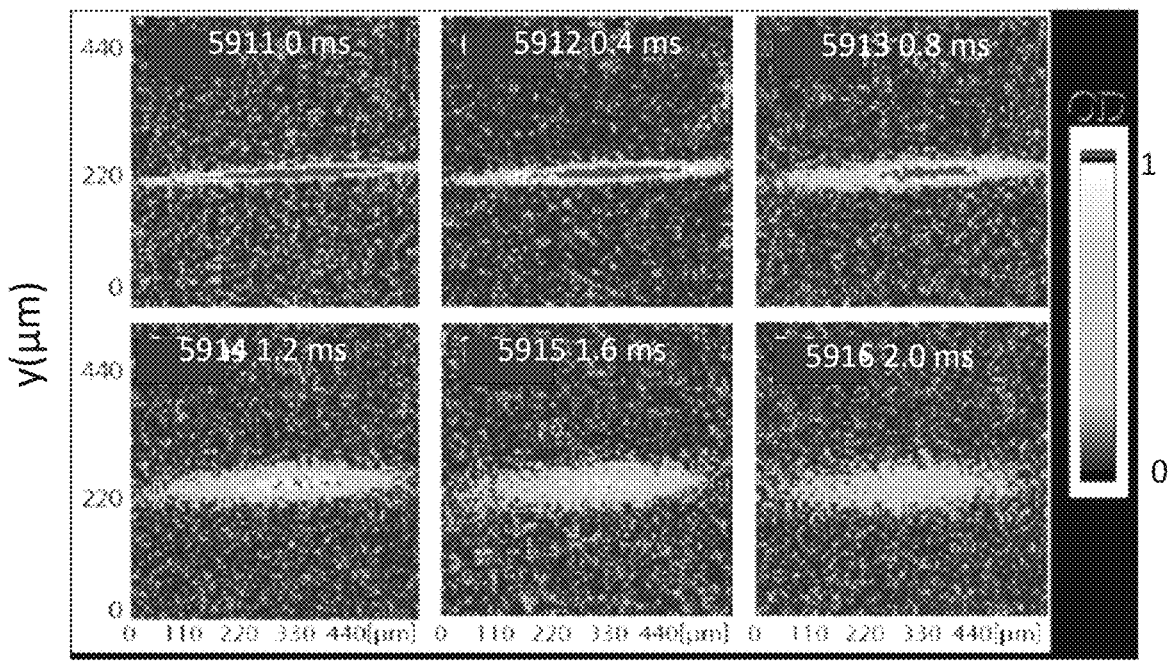
FIG. 59A (4.23a) is a series of profiles of $^{133}$Cs atoms at different time-of-flight expansion times after horizontal impact with an optical conveyor belt.
Figure 59B:
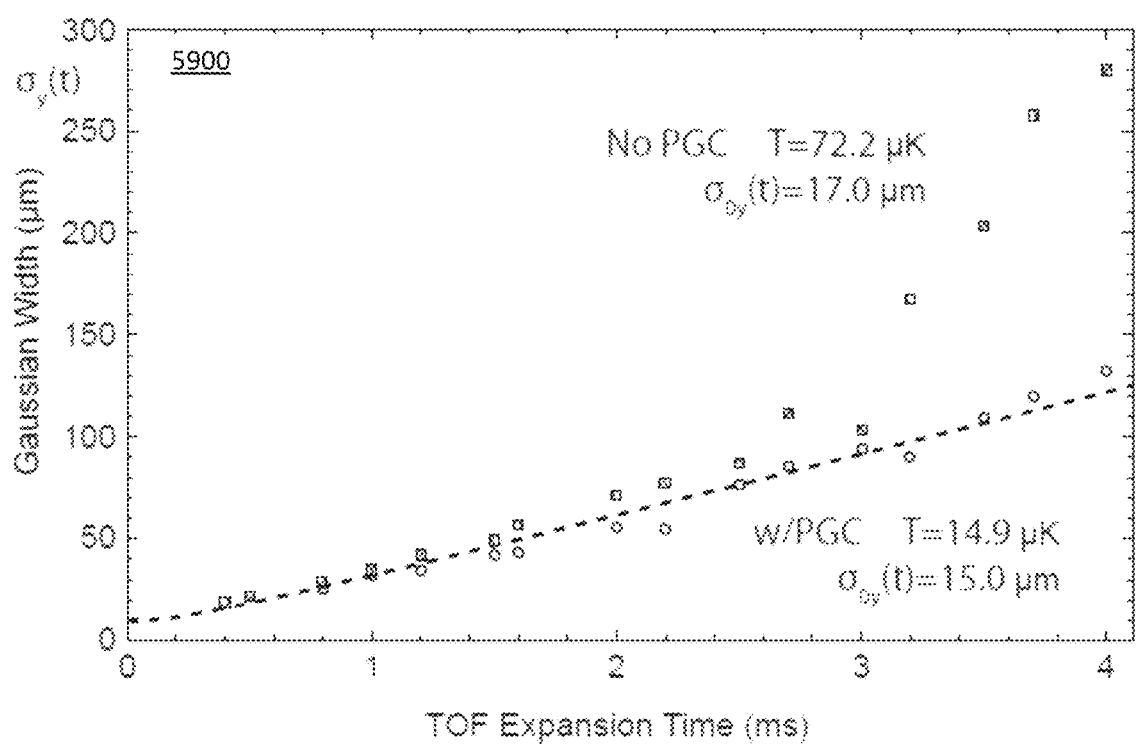

FIG. 59A is a series of density profiles 5911-5916 of $^{133}$Cs atoms at respective time-of-flight (TOF) expansion times 0 ms, 0.4 ms, 0.8 ms, 1.2 ms, 1.6 ms, and 2.0 ms, after horizontal transport with the optical conveyor belt. FIG. 59B is a graph 5920 showing the size of the atom clouds at different TOF expansion times when extra PGC is applied (circles) compared to no PGC (squares). The TOF expansion data shown here corresponds to an atom cloud temperature of 14.9 $^1$K when PGC is applied to the transported atoms. Without the extra PGC, the transported atom temperature is considerably higher at 72.2 $^1$K.

During the final 5 ms of the additional PGC, the BoB trap is snapped on and overlaps the focus of the optical conveyor belt. This permits an atom to load from the transported 1D lattice into the BoB trap. After loading, the optical conveyor belt is turned off while still holding the BoB trap to allow all untrapped atoms to fall away. At this point, the BoB is loaded with either zero or one atom. A complete synopsis of the timing scheme for single atom loading via an optical conveyor belt is presented in FIGS. 60A and 60B (4.24). Approximately 3,000 atoms remain in the conveyor belt after transport.

Figure 60:
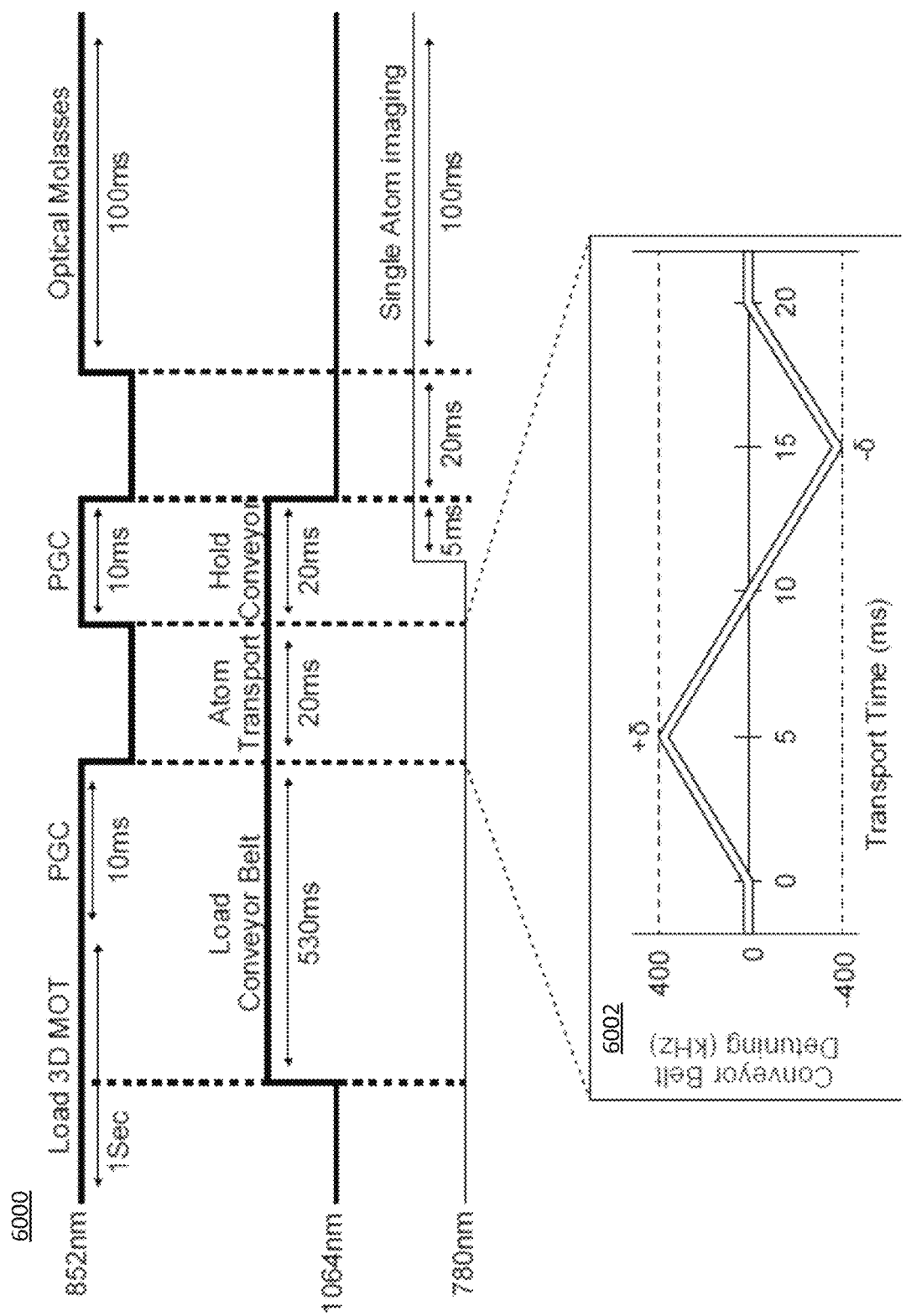
FIG. 60 (4.24 left) is a timing chart for different stages of an atom transport and delivery process.
Figure 61:
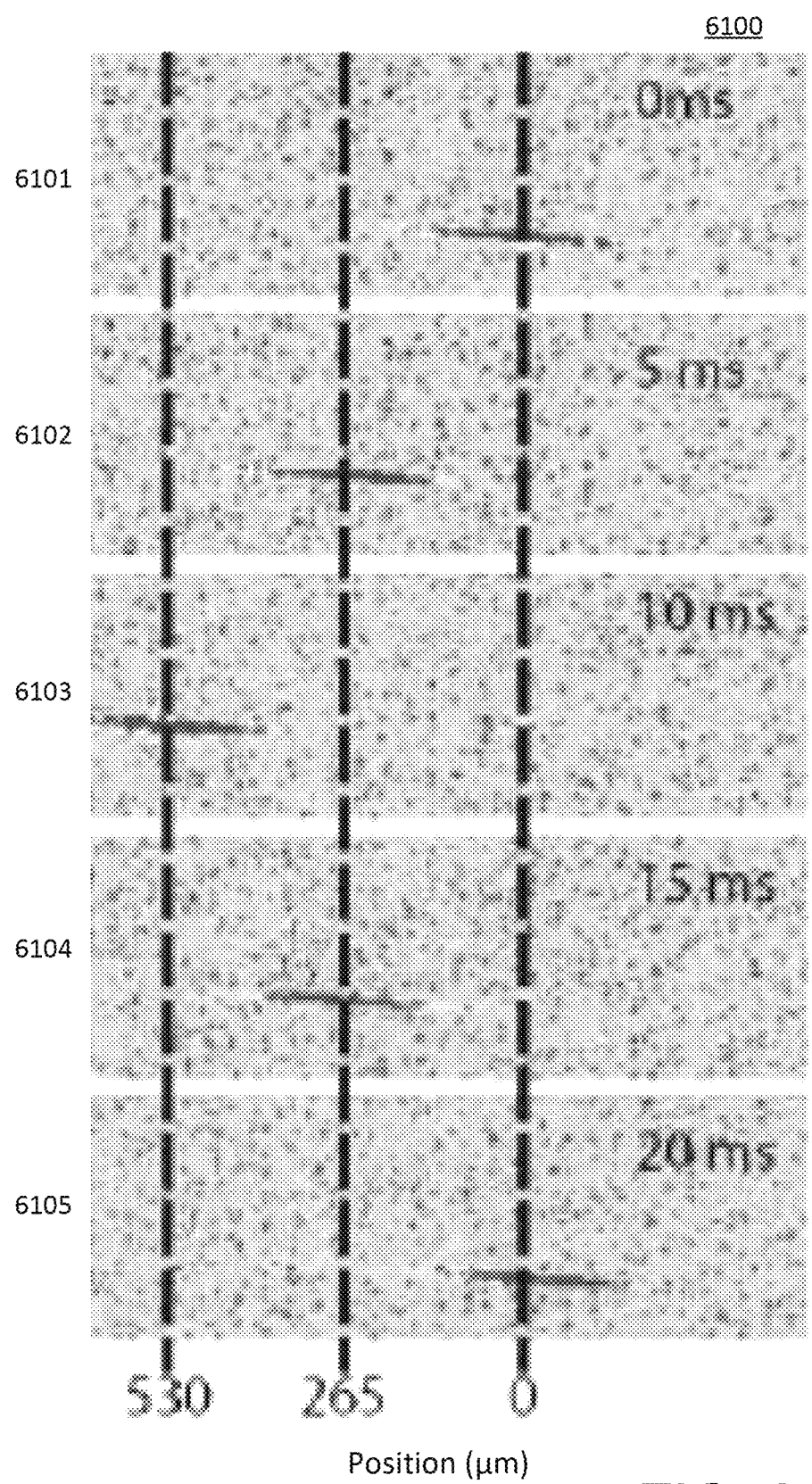
FIG. 61 (4.24 right) is a series of images corresponding to different optical conveyor-belt positions.

FIG. 60 is a diagram 6000 of a timing scheme for different stages of the atom transport and delivery process involving the 780 nm BoB lasers, 852 nm MOT lasers, and the 1064 nm conveyor belt lasers. An inset includes a graph 6002 that shows the mutual detuning Δω between the 1D lattice beams as a function of time during the conveyor belt transport process. FIG. 61 is a series 6100 of absorption images showing atoms transported 1.1 mm with the optical conveyor belt at various times during travel. Panels 6101, 6102, 6103, 6104, and 6105 show the loaded conveyor belt at 0, 5, 10, 15, and 20 ms, respectively. Furthermore, images a) and e) show the conveyor belt at the initial and final transport locations. Images b) and d) show the conveyor belt when it reaches the maximum velocity of 212 mm/s. Image c) shows the conveyor belt at the turn around point.

Figure 62:
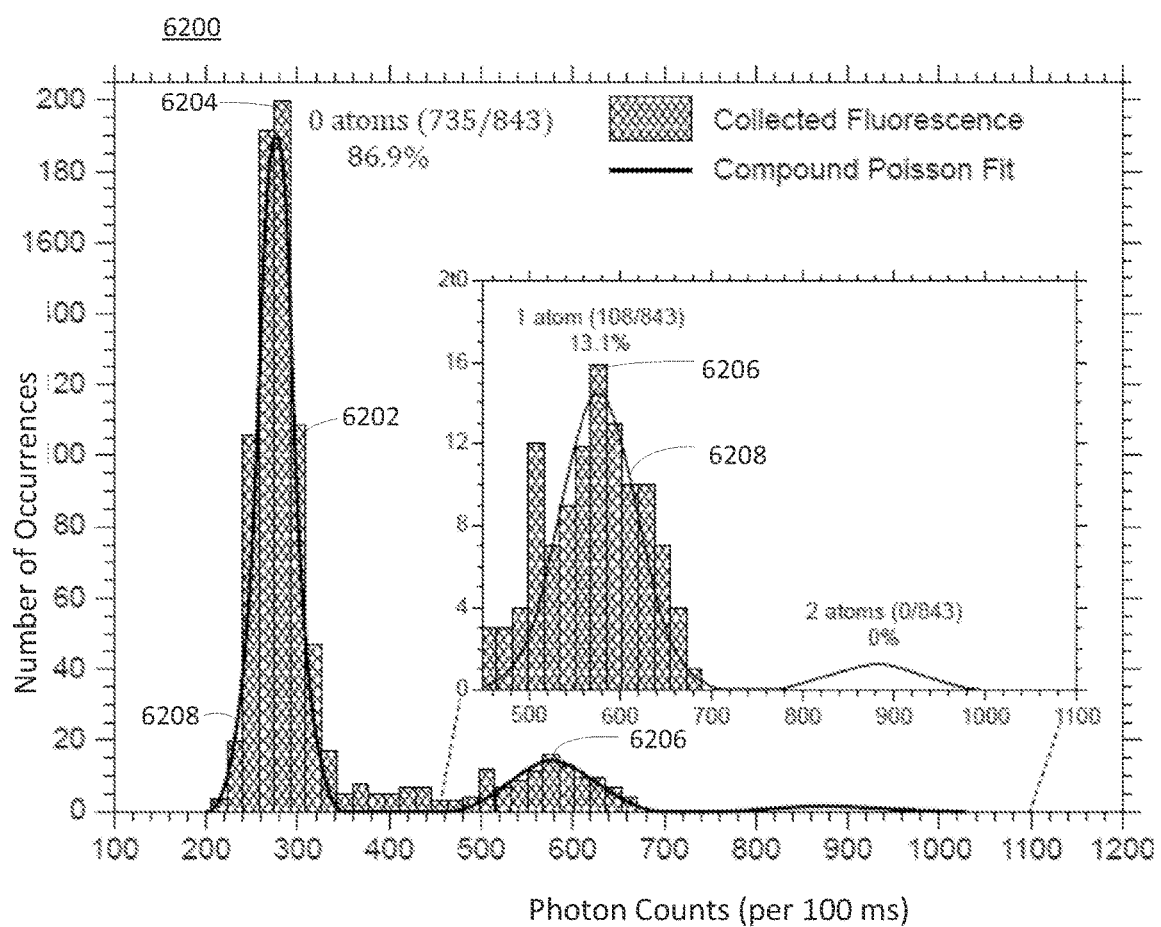
FIG. 62 (4.25) is a histogram of photon counting data recorded during fluorescence imaging of a bottle-beam trap after delivering the atom via an optical conveyor belt.

Fluorescence imaging is performed on the BoB trap for 100 ms to observe if zero or a single atom is successfully delivered and loaded into the trap. FIG. 62 4.25 is a histogram 6200 of photon counting data 6202 recorded during fluorescence imaging of the BoB trap after delivering the atom via an optical conveyor belt. Two Poisson distributions 6204 and 6206 are present with means of 300 counts and 570 counts. The peaks correspond to loading 0 or 1 atom, respectively, in the BoB trap with the optical conveyor belt. The histogram shows that a single atom is delivered into the BoB trap 13.1% of the time. The histogram data is fitted to a compound Poisson distribution 6608 over atom and photon number. During fluorescence imaging, an average of 300 photons is detected when no atom is present in the BoB trap. When an atom is loaded into the BoB trap, the average number of counted photons increases to 570 counts. The photon counting statistics for 843 atom delivery and loading attempts confirm that an atom can be delivered and loaded into the BoB trap 13.1% of the time, with no multi-atom loading events ever recorded.

This technique provides a method for correcting atom loss errors for single atom BoB traps used in neutral atom quantum computing systems. To provide an optimal vacuum environment for trapped qubits and qubit gate operations, the 3D MOT that supplies the source of cold atoms for atom reloading should be located in a separate vacuum chamber positioned adjacent to the chamber that houses the BoB traps. This also permits the 3D MOT to be on continuously, as the MOT footprint does not disturb any previously trapped atoms. Using an uninterrupted 3D MOT, the presented technique for single atom delivery and loading takes a total of 680 ms, as the procedure involves loading the conveyor belt (530 ms), transporting and loading the atom into a BoB trap (50 ms), and then finally imaging to verify the presence or absence of a single atom (100 ms). The total time for delivering and loading an atom can be reduced to a little as 55 ms total, as far-off resonance dipole traps, and hence the optical conveyor belt, can be loaded in as little as 10 ms, depending on the trap detuning, intensity, and the vacuum background pressure, while single atom signals can be observed using fluorescence imaging with exposure times as little as 5-10 ms. Additionally, the BoB hold time can be decreased to 10 ms. Even shorter hold times are possible but at the expense of introducing fluorescence noise from untrapped atoms that may be collected during imaging.

With a 13.1% probability of successful single atom delivery and loading, 33 loading trials will need to run in order to have single atom loading with 99% confidence. Working in the lower limit of a 55 ms loading time, the procedure calls for 1.82 seconds to reload an atom if all 33 attempts are executed, which is within the necessary interval of time of 2 seconds to keep a 49 element qubit array continuously occupied. Additionally, with a 13.1% probability of successful atom reloading, 50 loading trials are required to reload an atom with 99.9% confidence, which consumes 2.75 seconds if all attempts are executed, which is slightly greater than the necessary time to reload a site.

Finally, the single atom loading efficiency of this technique may be improved by incorporating methods that suppress the inherit stochastic characteristics present with using red-detuned, light-assisted collisions to prepare a single atom in the BoB trap. One such method uses a feed-back mechanism to rapidly prepare a 3D MOT with a single atom, while another method uses additional blue-detuned lasers, rather than MOT lasers, to induce repulsive light-assisted collisions to prepare single atoms in dipole traps. These methods have the capabilities to prepare single atoms directly from a MOT within 20-200 ms with average efficiencies ranging from 80% to 90%. If implemented after atoms are delivered to the BoB trap via transport, they may increase the single atom loading efficiency.

The optical conveyor belt is initially loaded with a few thousand atoms. Using the optical conveyor belt, atoms are transported a distance of 1.1 mm to a crossed vortex BoB trap. After transport, a single atom is then loaded into the BoB trap via light assisted collisions. Photon counting data confirms that an atom can be delivered and loaded into the bottle beam trap 13.1% of the time.

Implementing this work to reload a functional qubit array calls for deterministically loading any arbitrary site of an array of BoB traps. An additional pair of acousto-optic modulators for each of the 1D lattice beams can reposition the optical conveyor belt to permit loading of any BoB array site at an arbitrary location. Modifications can be made to the atom transport and loading apparatus to "steer" the optical conveyor belt with the eventual goal of loading any site of an arbitrarily large array of bottle beam traps. Steering the optical conveyor belt involves giving the atom transport system the capabilities of delivering an atom to one BoB trap and the repositioning the conveyor belt and delivering an atom to another array BoB trap.

The optical conveyor belt must be "steerable" to transport and load atoms into specific sites in an array of multiple bottle beam (BoB) traps. The conveyor belt can be transported, not only along its axial direction, but also along the $\hat{x}$ and $\hat{y}$ directions by utilizing an additional pair of acousto-optic modulators for each lattice beam. This allows one to reposition the optical conveyor belt to permit loading of a BoB trap (e.g., within an array of BoB traps) at an arbitrary (x; y; z) location.

The process of making an array of crossed vortex BoB traps involves taking a pair of LG01 beams and using a diffractive optic element (DOE) to replicate or "copy" the beams into an array of LG01 beams on a conjugate plane of the image plane of the final 0.4 NA lens used to focus the BoBs into the hex cell. While this setup concept is relatively simple to construct, it creates extensive problems with the resulting array of crossed vortex BoBs. The calcite beam displacer and DOE result in the tightly crossing BoBs at the image plane having the same polarization, rather than orthogonal polarizations. As a result, considerable phase dependent interference effects commonly arise, making it very difficult to implement as a qubit array capable of performing sensitive quantum computations. Accordingly, the illustrated embodiment employs a "Gaussian-beam array" (GBA) rather than a crossed vortex array. The GBA is used to for an array of BoB traps.

Figure 63:
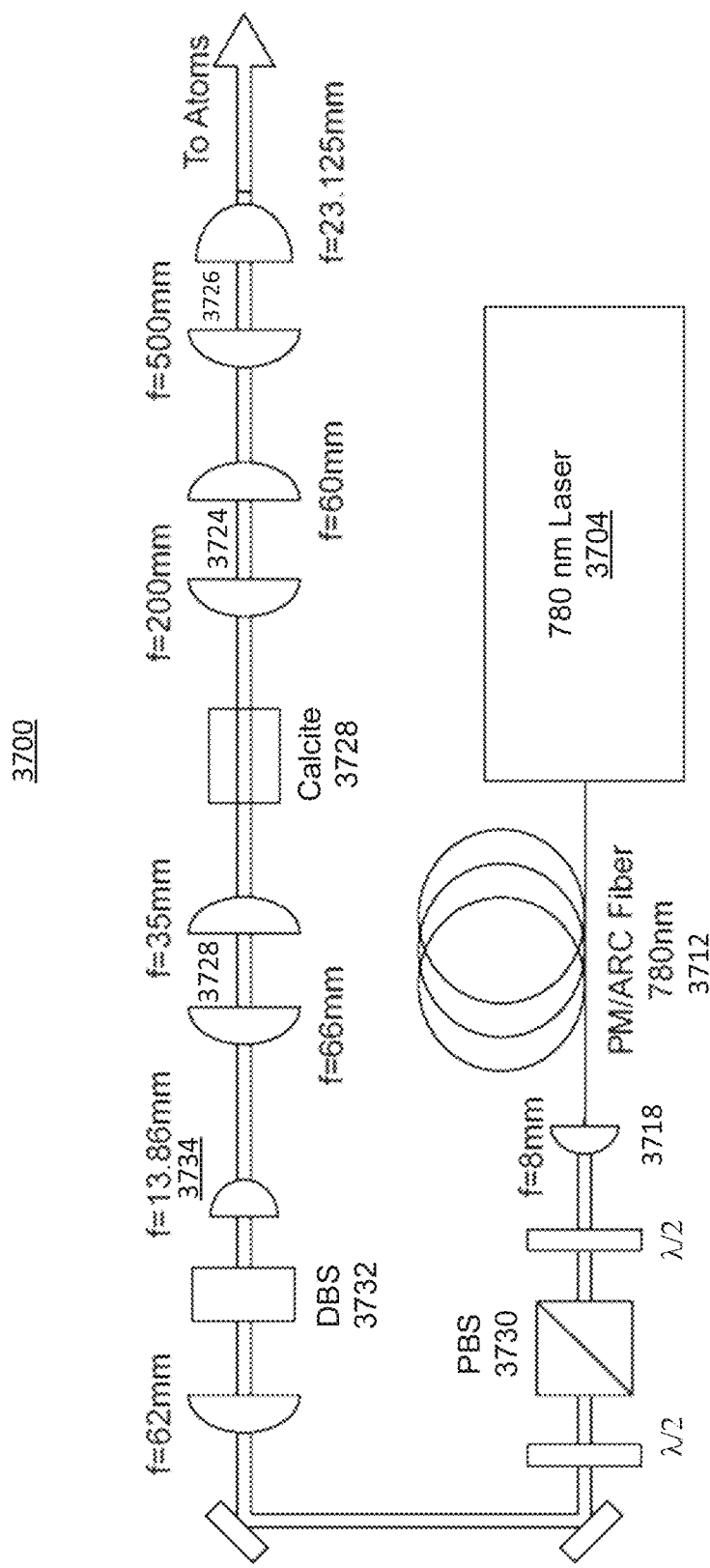
FIG. 63 (5.2a) is a simplified (relative to FIG. 37) illustration of a system for creating bottle beams.

The optical system 3700 for creating the Gaussian beam array (GBA) with two BoB trapping sites is shown formally in FIG. 37 and summarized in FIG. 63. Optical system 3700 includes a Toptica BoosTA Pro 3 Watt 780 nm laser 3704, which sends 3 W of 780 nm light into a polarization maintaining, anti-reflection coated, fiber 3712 with 65% coupling efficiency. After emerging from the fiber, the Gaussian beam is collimated using an f=8 mm lens 3713 and sent through a polarizing beam splitter (PBS) 3730 with half-wave plates λ/2 at both its input and its output. The PBS 3730 serves to keep the polarization of the outgoing beam constant by mapping minor polarization drifts from the TA and fiber into minor power drifts in the beam. This single Gaussian beam is then focused through a Holo/Or MS-248-X-Y-A diffractive beam splitter (DBS) 3732, which diffracts the single beam into a 2×2 array of identical Gaussian beams which are all collimated with a f=13.86 mm aspherical lens 3734.

A 66:35 telescope 3728 then images the 2×2 array pattern through a 353 µm thick calcite crystal 3722 to replicate the 2×2 array into an arrangement of eight identical Gaussian beams separated from their nearest neighbor by d=353 µm. Equal spacing of the eight array beams is achieved by orienting the fast axis of the calcite 45 with respect to the diffractive beam splitter axis. After passing through the calcite 3722, the array of eight Gaussian beams is demagnified by a 200:60 telescope 3724 and then further demagnified and imaged through the walls of the hex cell 4000

(FIG. 40) with a 500:23.125 telescope 3726. At the focus of the 23.125 mm lens, each Gaussian beam has a focused beam waist of $\omega_0=2:21$ µm and is separated from its nearest neighboring beam by a distance d=4:95 µm. The aspect ratio s, which is defined as the ratio of the focused beam spacing to focused beam waist is s=d/ω=2.23.

Figure 64:
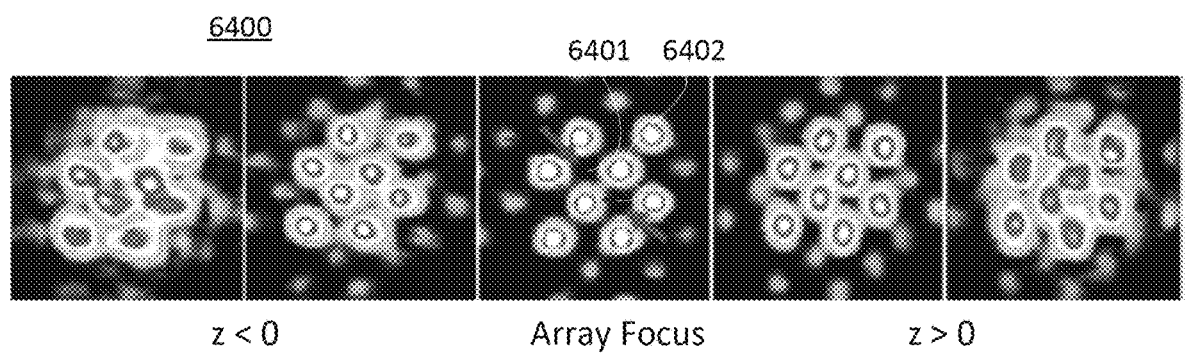
FIG. 64 (5.2b) is a series of images of a Gaussian bottle-beam array.

After passing through all of the optics required to produce the array, the total optical power remaining in the array is 750 mW, which gives a uniform distribution of 47 mW per beam in the array setup. An image 6400 showing the optical intensity of the GBA as it is swept through the focus of the 200:60 telescope is shown in FIG. 64. As this eight-beam array is focused, there exists two regions 6401 and 6402 of low optical intensity surrounded by high optical intensity that creates two distinct BoB traps capable of confining atoms.

FIG. 64 represents intensity images of the GBA as one sweeps through the focus of the array 6400, which defines bottle beam traps 6401 and 6402. As one moves away from the focus in the positive and negative axial direction, each Gaussian beam in the array rapidly diverges and interferes to cap off the bottle beam trap and produce a barrier in the z-direction. This permits the intensity pattern to function as a 3D trapping potential.

Figure 65:
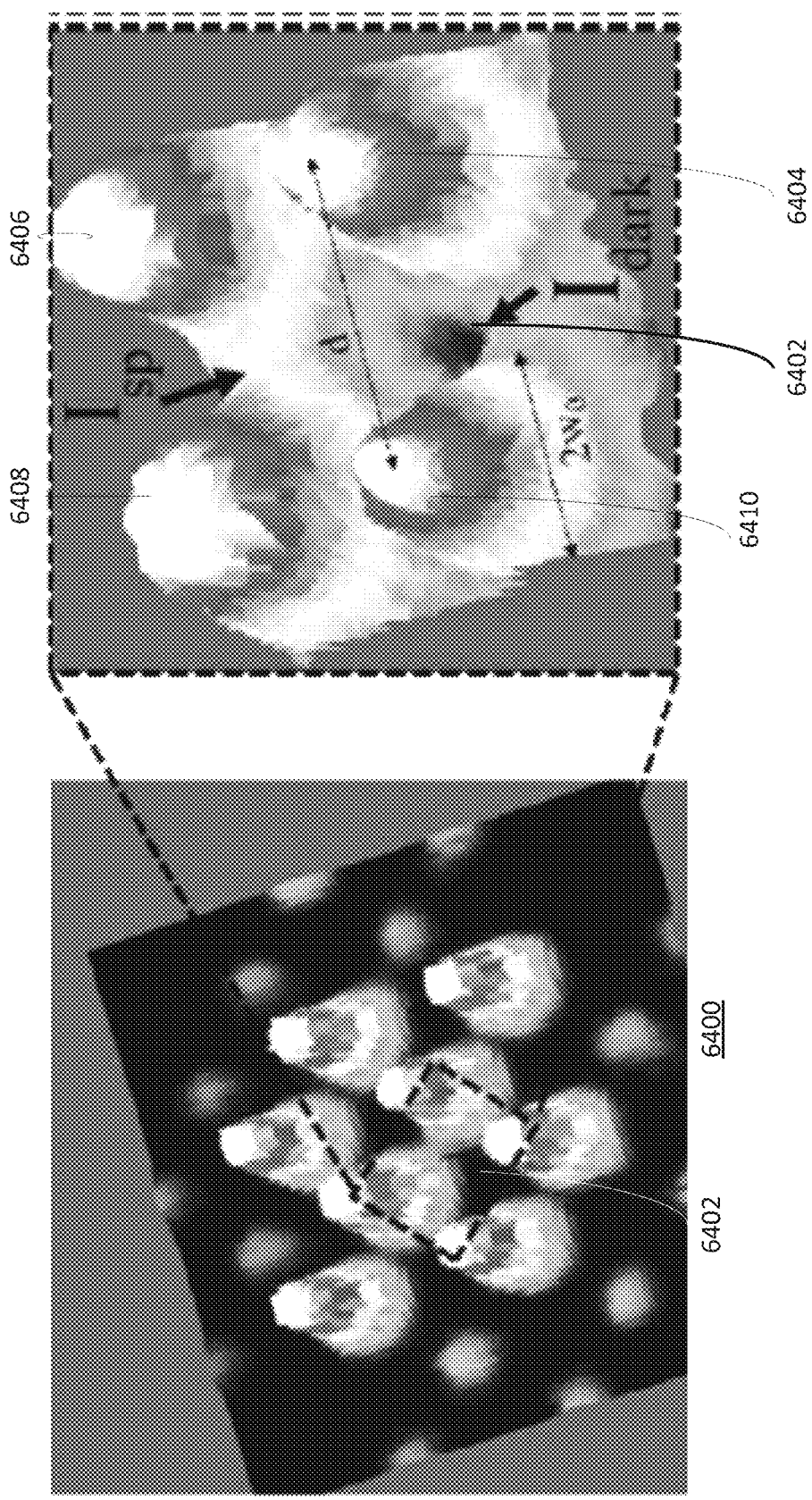
FIG. 65 (5.3) includes and image of a bottle-beam array and a plot showing the intensity difference between a bright saddle-point intensity and a dark central intensity of one trapping site in a Gaussian beam array as a function of the ratio of beam separation to beam waist of a bottle-beam array.

FIG. 65 (5.3) shows one of two identical dark regions 6402 of minimum light intensity surrounded by four intense Gaussian beams 6504, 6506, 6508, and 6510. Each of the four Gaussian beams in this arrangement has intensity $$I(r) = I_0 e^{**}(-2r^2/\omega 2_0^2). \quad (94)(5.1)$$

where $\omega_0$ is the focused beam waist and $I_0$ is the maximum intensity that occurs at r=0. As shown in FIG. 39B (4.5b), each of the four beams has a polarization that is orthogonal to its nearest neighboring beam. Thus, the total optical intensity exactly in-between two nearest-neighboring beams, which corresponds to an array saddle point Isp, is $$I_{sp} = I(d/2) + I(d/2) \quad (95)(5.2)$$
$$= I_0 e^{-2(d/2)^2/w_0^2} + I_0 e^{-2(d/2)^2/w_0^2}$$
$$= 2I_0 e^{-d^2/2w_0^2}$$

where d is the separation between neighboring Gaussian beams. The lowest optical intensity in the central, dark region $I_D$, occurs at a distance r=d/√2 from the middle of each focused beam, and is equal to the sum of intensities from all four Gaussian beams at this central point r=d/√2:

$$I_D = 2 \times \left[ I(d/\sqrt{2}) + I(d/\sqrt{2}) + 2\sqrt{I(d/\sqrt{2})I(d/\sqrt{2})} \cos\phi \right] \quad (96)(5.3)$$
$$= 2 \times \left[ \frac{I_0 e^{-2((d/\sqrt{2})^2/w_0^2} + I_0 e^{-2((d/\sqrt{2})^2/w_0^2} +}{2\sqrt{I_0 e^{-2((d/\sqrt{2})^2/w_0^2} I_0 e^{-2((d/\sqrt{2})^2/w_0^2}}} \right]$$
$$= 2 \times \left[ I_0 e^{-d^2/w_0^2} + I_0 e^{-d^2/w_0^2} + 2I_0 e^{-d^2/w_0^2} \right]$$
$$= 8I_0 e^{-d^2/w_0^2}.$$

Comparing equations 95 (5.2) and 96 (5.3), there exists a non-zero, optical intensity gradient between the bright saddle points $I_{sp}$ and the dark central region 1D. Since the laser light used to create these intensity profiles is blue-detuned from resonance, equations 2.11 and 2.12 state that a potential energy well is created that permits 2D atom confinement at the dark regions; that is, the four beams together form a single 2D BoB trap. Furthermore, from equation 2.11, the total trapping depth is proportional to the difference of bright optical intensity (equation 95 (5.2)) and dark optical intensity (equation 96 (5.3)):

$$I_{trap} = I_S - I_D \quad (97)(5.4)$$
$$= 2I_0 e^{-d^2/2w_0^2} - 8I_0 e^{-d^2/w_0^2}$$
$$= 2I_0 e^{-d^2/2w_0^2}\left(1 - 4e^{-d^2/2w_0^2}\right)$$
$$= 2I_0 e^{-s^2/2}\left(1 - 4e^{-s^2/2}\right)$$

where s≡d/ω₀ is the aspect ratio of the array. Equation 97 (5.4) can be expressed in terms of the average optical intensity of the entire 2D trap (shown in the inset of FIG. 96 (5.3). Since each BoB trap is constructed from four Gaussian beams separated by distance d, the average optical intensity is $$\bar{I} \approx \frac{P}{d^2} = \frac{\pi w_0^2 I_0}{2d^2} = \frac{\pi I_0}{2s^2} \quad (98)(5.5)$$

where P is the total power of all four Gaussian beams combined.

Thus, we can use equation 98 (5.5) to express $I_0$ in terms of the average intensity with $$I_0 \approx \frac{2s^2}{\pi}\bar{I}. \quad (99)(5.6)$$

Inserting equation 5.6 into equation 5.4 gives the total 2D trapping intensity as $$I_{trap} = 4\frac{s^2}{\pi}\bar{I}e^{-s^2/2}\left(1 - 4e^{-s^2/2}\right). \quad (100)(5.7)$$

FIG. 66 includes plots of equation 100. The upper graph 6610 includes plots of the normalized intensity of the bright saddle points $I_{sp}/I_0$ (solid line) 6612 and the central dark region $I_{dark}=I_0$ (dashed line) 6614 as a function of the array aspect ratio s. The lower graph 6620 is a plot of the normalized trapping intensity $I_{trap}/\bar{I}=(I_{sp}-I_{dark})/\bar{I}$(solid line) 6622 between the bright saddle-point and the central dark region of one trapping site in the GBA as a function of the aspect ratio s. The dashed line shows the intensity 6624 of the dark, central region that is present at the same aspect ratio s, thus indicating the non-zero bias to the trap bottom present in the setup. From this plot, it is determined that the deepest trapping depth occurs at s=d/ω₀=2.2. As FIG. 66 indicates, the largest intensity difference, and hence the deepest BoB trap, occurs when the set of four focused Gaussian beams has an aspect ratio of s=d/ω=2.2. This result dictates what lenses and what calcite thicknesses to use when forming the GBA in the Hex cell.

The total optical intensity in equation 100 (5.7) results in 2D atom confinement in the radial direction but provides no confinement in the loose, axial direction of the array. For the array BoBs to trap atoms in three dimensions, a repulsive optical potential in the axial direction must also be formed.

Similar to how tightly overlapping two LG01 beams "caps" off the crossed vortex BoB trap with high light intensity, the overlap of the Gaussian beams as they rapidly diverge when propagating out of the GBA focus (FIG. 64 (5.2b)) "caps" the array BoBs with high optical intensity and provides a repulsive potential barrier to give axial confinement in addition to radial confinement.

Figure 98:
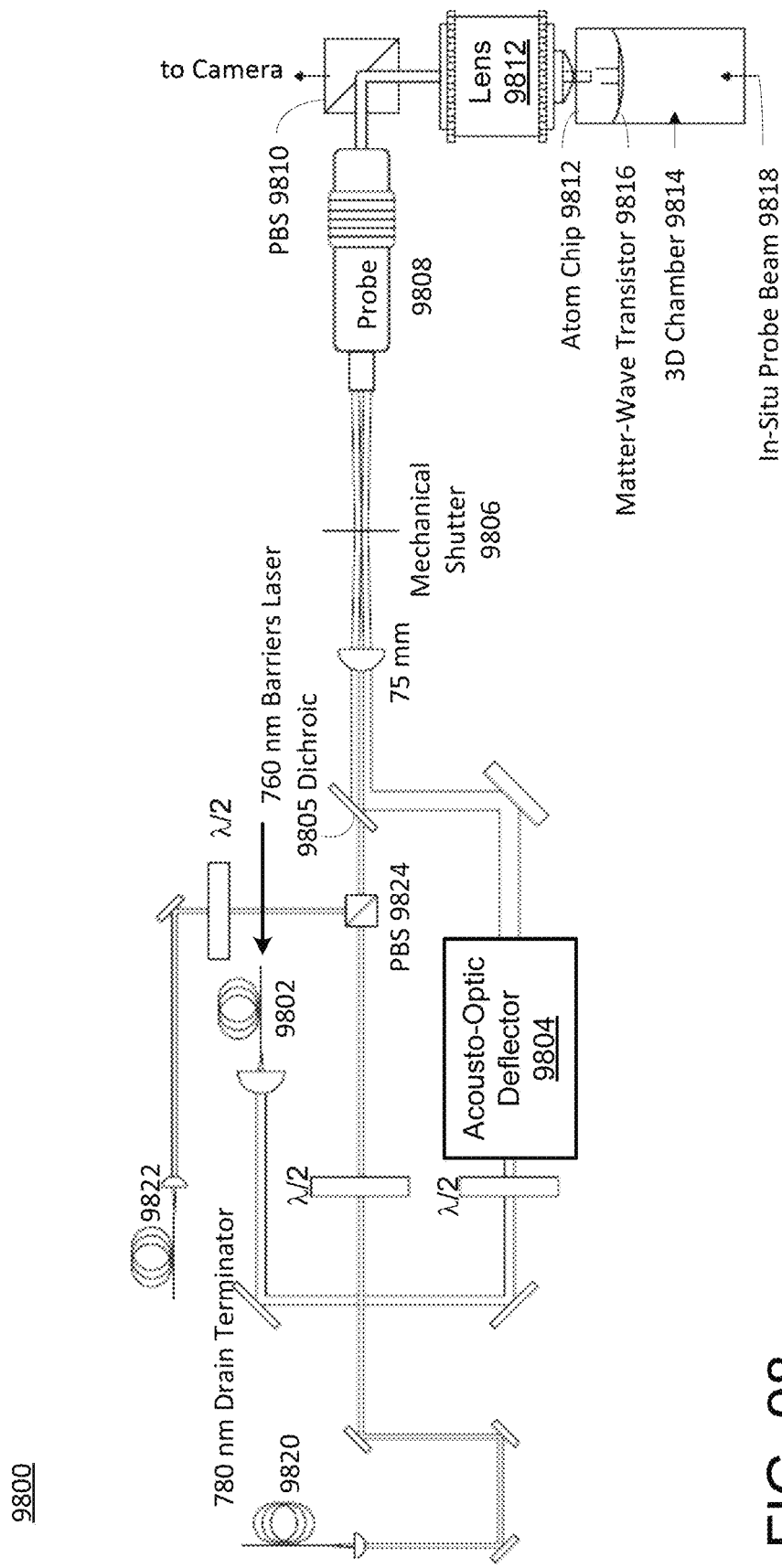
FIG. 98 (8.5a and *b*) is a schematic of an optical setup for producing dynamically controllable source-gate and gate-drain barriers.

When finally focusing the array into the hex cell to its desired size (using with the f=23.125 mm lens), the GBA has focused beam waists of $\omega_0$=2.21 μm and beam separations of d=4.95 μm (FIG. 98 (5.)5). This configuration gives a final aspect ratio of $$s = \frac{d}{w} = 2.23 \qquad (101)(5.8)$$

which is very close to optimal aspect ratio of s=2.20. Note that the focal plane of the array is carefully aligned to overlap with the focus of the optical conveyor belt (FIG. 40 (4.6)). Scrupulous care can be taken when focusing the GBA though the thick Hex cell walls to ensure that as little distortion as possible occurs to the array beams such that the aspect ratio s=2.23 is preserved.

Figure 67:
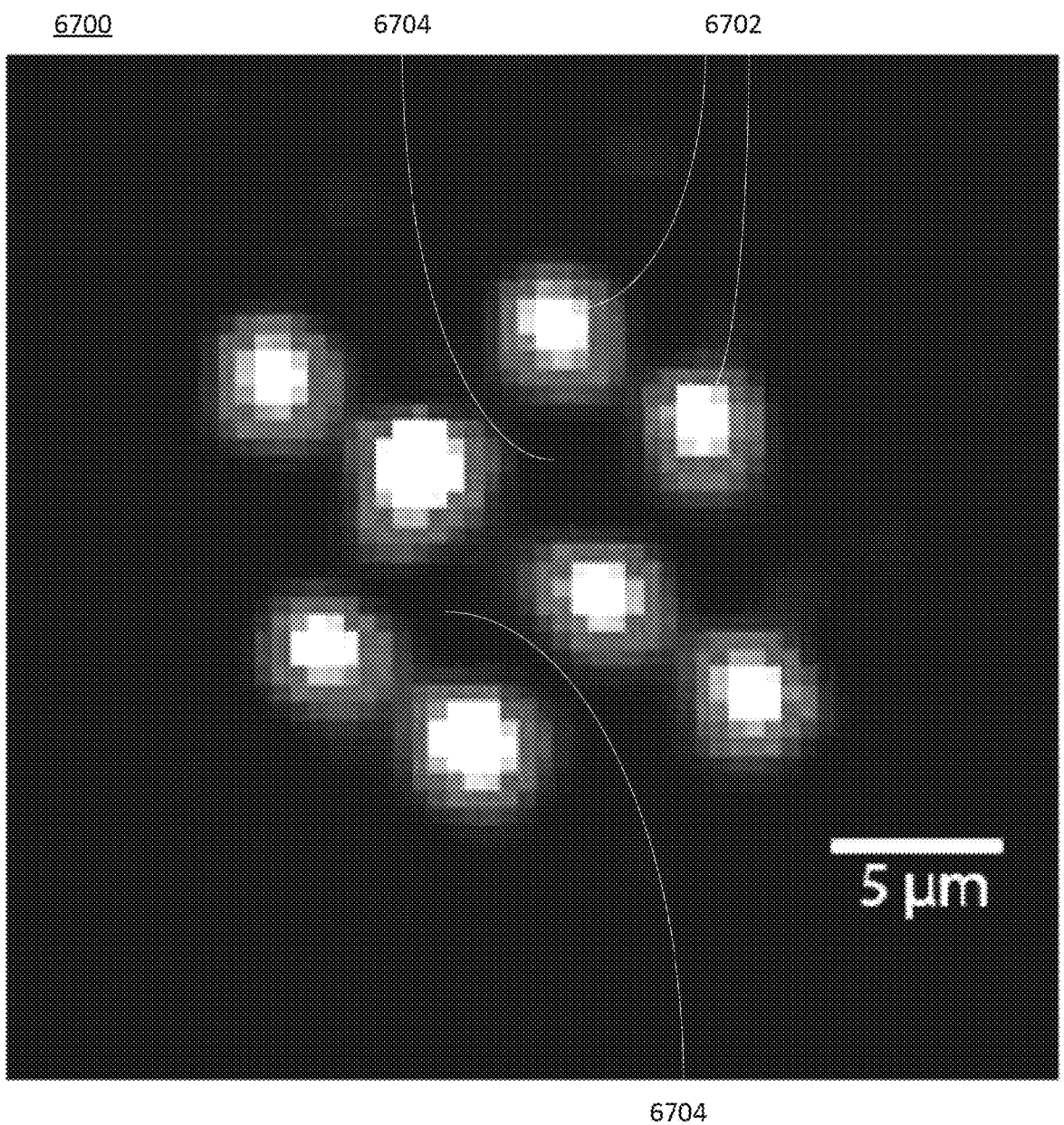
FIG. 67 (5.5) is an image of an intensity distribution for a Gaussian beam array used to form 3D bottle-beam traps.

FIG. 67 represents an intensity distribution 6700 of the Gaussian beam array at the focus of the 0.4 NA f=23.125 mm lens. Each beam 6702 in the array has a beam waist of $\omega_0$=2:21 μm and is separated from its nearest neighbor by d=4.95 μm. This gives an aspect ratio of s=d/ω=2.23. Inspection of FIG. 67 shows that this focused GBA pattern contains two low intensity dark regions 6704 that are each surrounded by four bright saddle points, thus forming two 3D BoB traps.

To get an explicit calculation for the trap depth as a function of the atom position in each BoB, the intensities from each diagonally opposite pairs of Gaussian beams are added:

$$I(x, y, z) = \qquad (102)(5.9)$$
$$\frac{c\epsilon_0}{2} [|E(x-d/2, y-d/2, z) + E(x+d/2, y+d/2, z)|^2] +$$
$$\frac{c\epsilon_0}{2} [|E(x+d/2, y-d/2, z) + E(x-d/2, y+d/2, z)|^2]$$

where c is the velocity of light, $\epsilon_0$ is permittivity of free space, and E(x; y;z) is the electric field of a Gaussian laser beam given as $$E(x, y, z) = E_0\left(\frac{w_0}{w(z)}\right)\exp\left[-\left(\frac{x^2+y^2}{w^2(z)}\right)\right]. \qquad (103)(5.10)$$

Equation 5.9 can be plugged into equation 2.11 to numerically calculate a dipole trapping depth of 547 μK along the radial (x,y) directions and a trap depth of 578 μK along the axial z direction when the total optical power in the entire array is 750 mW. The radial 6810 and axial 6820 trapping potentials for each BoB trap in the array are plotted in FIG. 68. Optical trapping potential produced at the bottle beam locations of the 2×1 array in the radial (x,y) and axial (z) directions. Using 750 mW of λ=780 nm laser power, a trapping barrier of depth 547 μK is created in the x,y radial direction and a trap depth of 578 μK is created in the z, or axial direction. The trapping frequencies for this trap geometry are 8.35 kHz in the radial direction and 2.58 kHz in the axial direction.

The array can be overlapped with the center of a 3D MOT for 500 ms. After loading the array from a background MOT, polarization gradient cooling can be performed on the atoms for 5 ms and then all MOT beams can be extinguished for an additional 25 ms to allow un-trapped atoms to fall away. Fluorescence imaging can be performed using the setup 6900 of FIG. 69 (5.7c) on any trapped atoms by shining a three-dimensional optical molasses detuned −25 MHz from resonance. Inputs to setup 6900 include a 780 nm beam 6902 used to form bottle-beam traps and an 852 nm optical molasses 6904. Beam 6902 is focused by a 23.125 lens 6906 to form bottle-beam array 6908 within hex-cell vacuum chamber 4000. A resulting fluorescence is collimated by another 23.125 mm lens 6910 and split by an 800 LP dichroic mirror 6912. One branch from mirror 6912 is focused by a final imaging lens 6914 onto a CCD detector 6916 via 852 nm filters. Repump light can also be used to sustain the continuous fluorescence of each trapped atom. Each fluorescence image was taken with an Andor iXon EMCCD 6902 with an EM gain of 200, vertical pixel shift speed of 0.5 μs, and a horizontal pixel readout rate of 5 MHz.

Figure 70A:
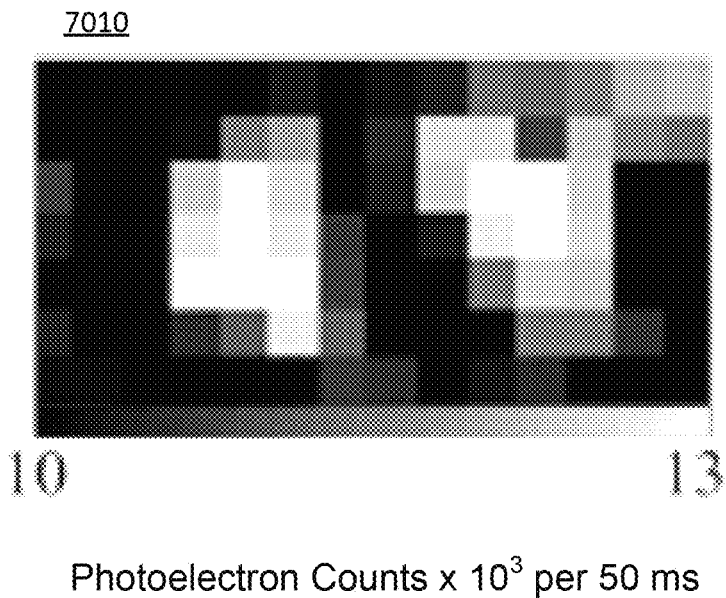
FIGS. 70A and 70B (5.7a and 5.7b) are fluorescence images (respectively at two different resolutions) taken using the fluorescence imaging setup of FIG. 69.
Figure 70B:
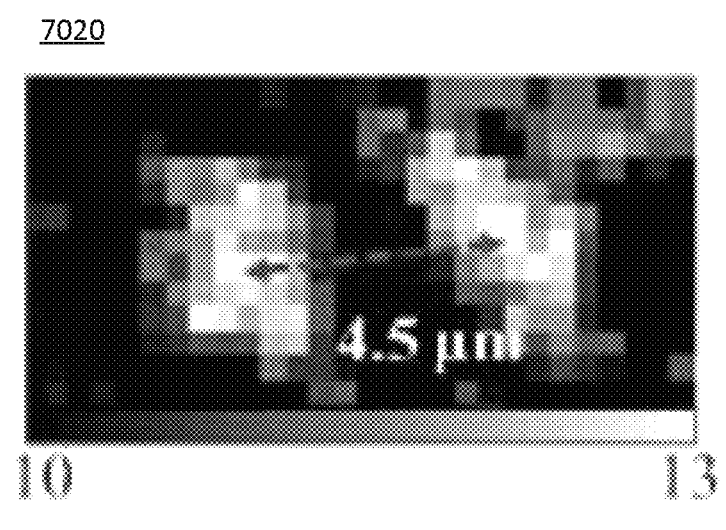

Results of the fluorescence imaging are shown in FIGS. 70A and 70B. The fluorescence image represented in FIG. 70A is taken using a final imaging lens 6914 with a focal length of 500 mm. The fluorescence image represented in FIG. 70B has been taken using a final imaging lens 6914 with a focal length of 1000 mm, resulting in a doubling of the resolution. Each trapping image shows the sum of 10 individual fluorescence imaging results of atoms confined in the two BoB traps. By improving the resolution of the fluorescence imaging system, the separation of the two BoB traps was observed to be 4.5 μm, which is slightly less than the expected separation of 4.95 μm that was observed from the imaged intensity profile in FIG. 67.

Figure 71:
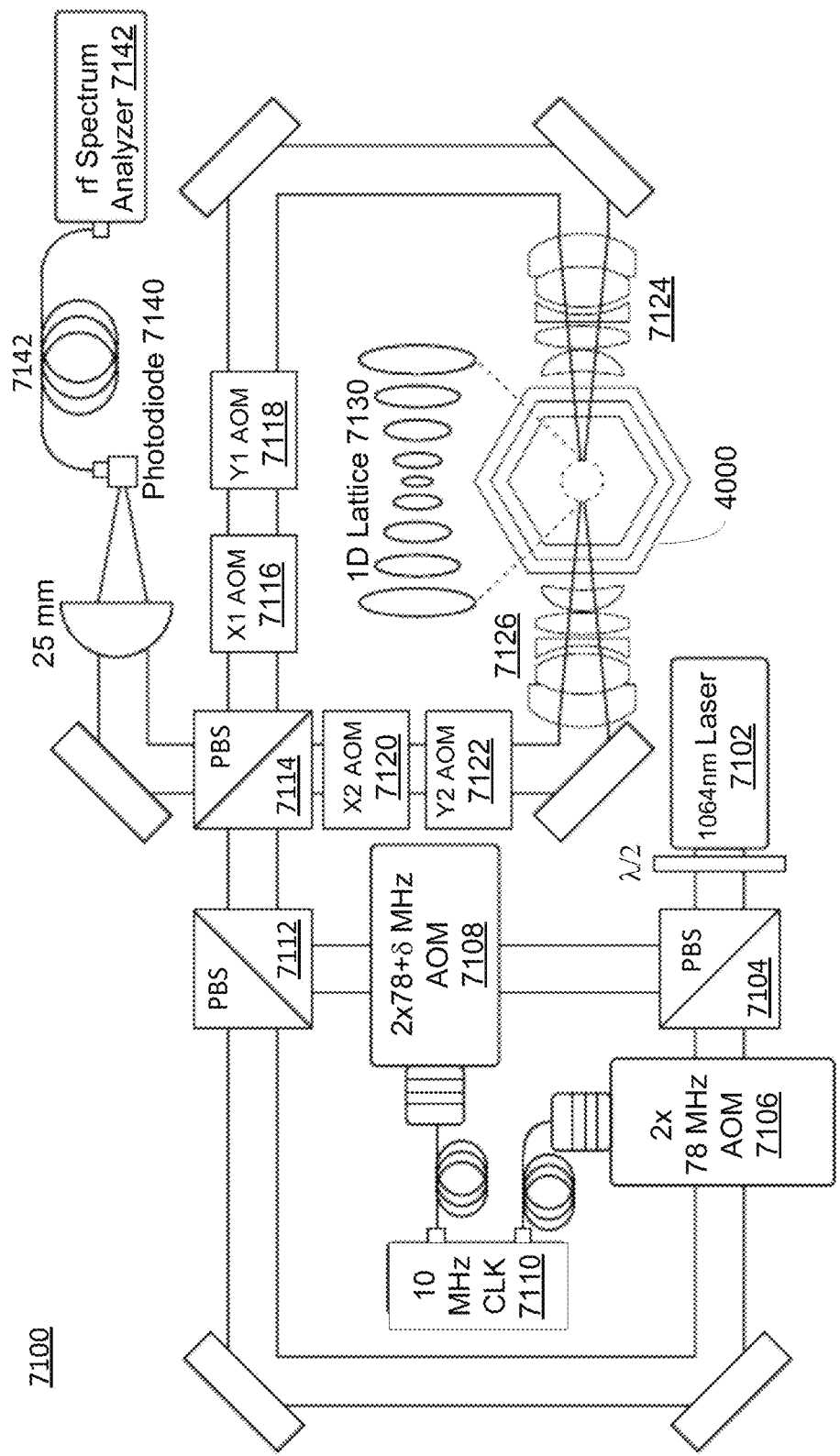
FIG. 71 (5.8) is an optical conveyor belt (1D lattice) setup for delivering atoms to the array of bottle-beam traps of FIG. 69.

A setup 7100 for steering the optical conveyor belt is shown in FIG. 71. Components include a 1064 nm laser 7102, a polarizing beam splitter 7104, a 2×78 MHz acousto-optical modulator 7106, and a 2×78 MHz+δ AOM 7108. AOMs 7106 and 7108 are synchronized using a 10 MHz clock 7110. Out puts of AOMs 7108 and 7108 are merged using a PBS 7112, the output of which is split by a PBS 7114.

One branch beam from PBS 7114 is input to a pair of AOMs, that is an "X1" AOM 7116 and a "Y1" AOM 7118. Another branch beam from PBS 7114 is input to another pair of AOMs, namely, "X2" AOM 7120 and "Y2" AOM 7122. The four AOMs 7116, 7118, 7120, and 7120 are used to steer the optical convey belt so that atoms can be delivered to specific traps in the bottle-beam array. The modulated branches from PBS 7114 are focused into respective opposing faces of hex-cell vacuum chamber 4000 by respective multi-element lenses 7124 and 7126. The branch beams are thus counter-propagating and form interference fringes in the form of a 1D optical lattice 7130 within chamber 4000. The fringes can be moved by changing S in AOM 7108; atoms attracted to bright fringes thus can be "conveyed" by the moving fringes. Return beams can be detected by a photodiode 7140, the output of which (via 7142) can be analyzed using radio-frequency (rf) Spectrum Analyzer 7142.

Setup 7100 results from modifying the dynamic 1D lattice setup shown in FIG. 48 (4.12) by placing two additional 4.2 mm×4.2 mm aperture, 80 MHz acousto-optic modulators (AOMs) 7102 and 7104 along the beam paths of both counter-propagating 1D lattice beams. AOMs 7102 and 7104 execute angular deflections $\theta_x$ and $\theta_y$ of each lattice beam in the respective x and y directions by diffracting each laser into the ±1 order. Because the beam steering system requires each lattice beam to be diffracted via an AOM, power loss can be a factor. Thus, care should be taken to optimize the AOM diffraction efficiency such that 90% of the beam power is diffracted into the +1 order.

Figure 72:
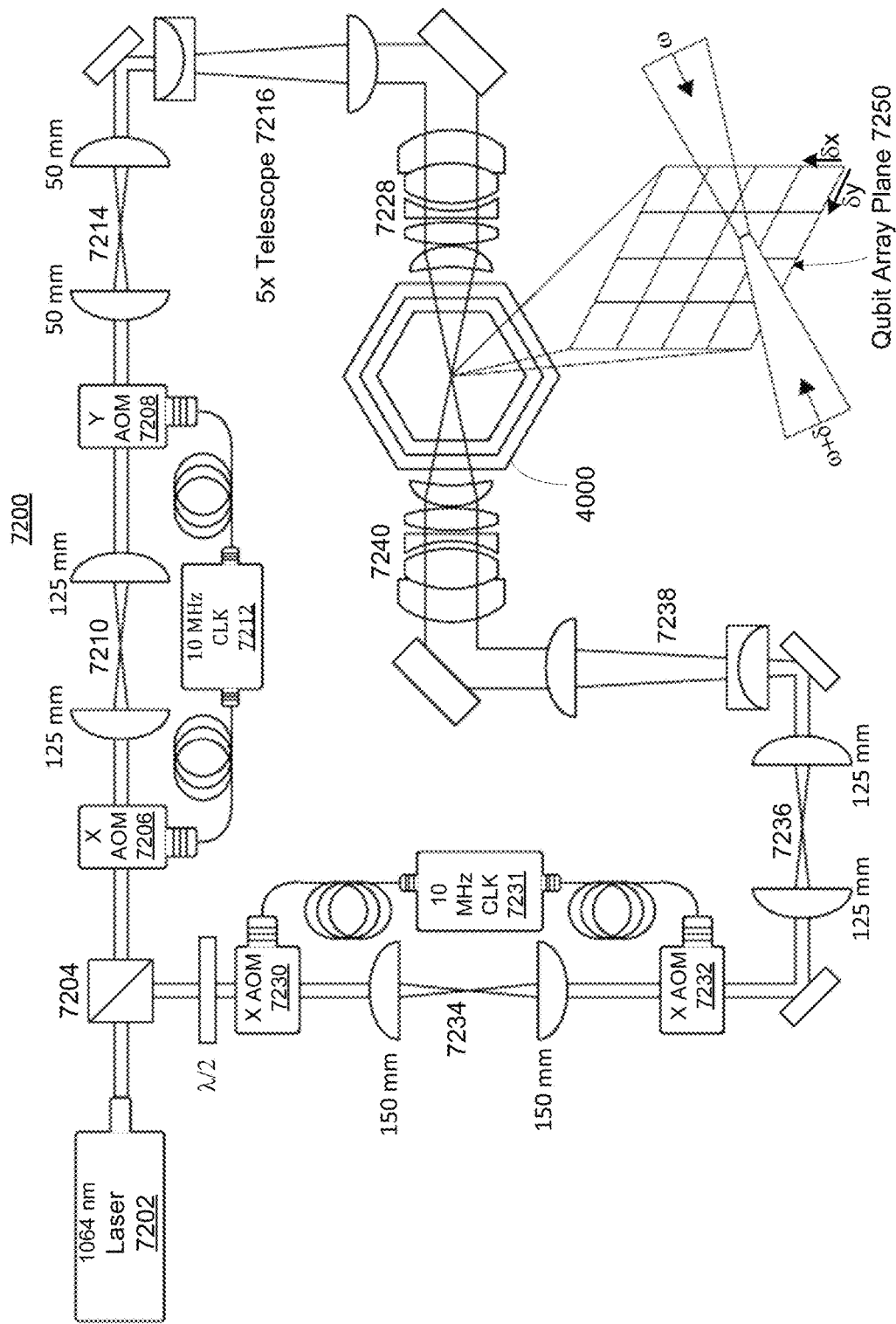
FIG. 72 (5.9) is a schematic of a beam steering system for the optical conveyor belt of FIG. 71.

An optical relay system 7200 shown in FIG. 72 (5.9) was designed to precisely map the angular deflections $\theta_x$ and $\theta_y$ from the x-AOMs 7102 and y-AOMs 7104 into lateral displacements $\delta_x$ and $\delta_x$ at the focus of the 0.4 NA, f=23.125 mm lens 7106. Components of relay system 7200 include a 1064 nm Laser 7202, a PBS 7204, an "X" AOM 7206, a pair 7210 of 125 mm lenses 7210, a "Y" AOM 7208, a 10 MHz Clock 7212, 7231, a pair 7214 of 50 mm lenses, a 5× telescope 7216, and a 0.4 numerical aperture lens 7728, a half-wave plate $\lambda/2$, an "X" AOM 7230, a "Y" AOM 7232, a pair 7234 of 150 mm lenses, a pair 7236 of 125 mm lenses, a 5× telescope 7238, a 0.4 numerical aperture lens 7240, and a qubit array plane 7250.

The 1064 nm beams are split into two beam paths. Each beam passes through an x-AOM 7206, 7230, which alters the angle of the beam in the x dimension. A 1:1 telescope relay 7210, 7234 images the center of the x-AOM 7206, 7230 on the center of the y-AOM 7208, 7232. This y-AOM 7208, 7208 changes the beam angle in the y dimension. A second 1:1 telescope 7214, 7236 relays the center of the y-AOM onto the center of a 5× telescope 7216, 7236, which magnifies the beam to 1 cm in diameter. The beam is then focused with a 0.4 NA custom lens 7228, 7240 onto the qubit array 7250 in hex cell 4000. At the qubit array plane 7250, the x and y positions of the beams can be laterally translated by $\delta x$ and $\delta y$ by varying the x and y angular deflections of the AOMs.

For each lattice beam, the relay system, shown in FIG. 72, works by imaging the center of the x-AOM crystal 7206, 7230 onto the center of the y-AOM crystal 7208, 7232 using a 1:1 telescope. The "center" of the AOM crystal refers to the distance half-way through the crystal and the center of the face of the crystal. Next, a second 1:1 telescope 7214, 7236 images the center of the y-AOM crystal onto the center of the first lens of a 5× enlarging telescope 7216, 7236. Each 1:1 telescope also serves to help minimize any beam walk-off, as each beam is imaged onto the center of the next subsequent optical element. The 5× telescopes 7216, 7238 enlarge the lattice beam to 1 cm in diameter before being focused onto the plane of the BoB array with the 0.4 NA, f=23.125 mm lenses 7228, 7240 to a 1/e beam waist of approximately 1.7 µm. The small beam waist of the optical conveyor belt is used for atom delivery to single BoB traps in the GBA without overlapping adjacent BoB sites that are separated by 4:8 µm. With the smaller beam waist of the conveyor belt beams, only P=500 mW of total power in the beams is required to still obtain trapping depths $U_0=-1:88$ mK (equation 73) and axial trapping frequency $\Omega_z=2\pi*454$ kHz (equation 74) as in section 4.4. However, the radial trapping frequency (equation 75) has increased to $\Omega_{rad}=2\pi*75$ kHz.

As a result of this relay system, by driving the beam deflecting AOMs, each 1D lattice beam can be displaced by $\delta_x$ and $\delta_y$ at a resolution 1.06 µm/MHz. Since the drivers can be controlled to a resolution of $\delta v=10.1$ MHz, the beam steering setup can laterally displace the optical conveyor belt by some distance at a resolution of 0:1 µm. With this setup, for both lattice beams to remain overlapped after repositioning, the x-AOM drivers are set to the same driving frequencies but opposite sign (that is x-AOM1=+$\delta v_x$ and x-AOM2=−$\delta v_x$) while the y-AOM drivers are set to the same frequency (y-AOM1=y-AOM2=$\delta v_y$) in the steerable conveyor belt setup. This can cause a non-zero mutual detuning $\delta \neq 0$ between the transport beams, thus giving it an unwanted velocity. To correct this error, one must simply adjust the detuning $\delta$ in the original frequency chirping AOMs. While each AOM is driven with an independent RF driver, they are all phase locked to the same 10 MHz clock reference signal in order to minimize phase jitter of the lattice beams.

Figure 69:
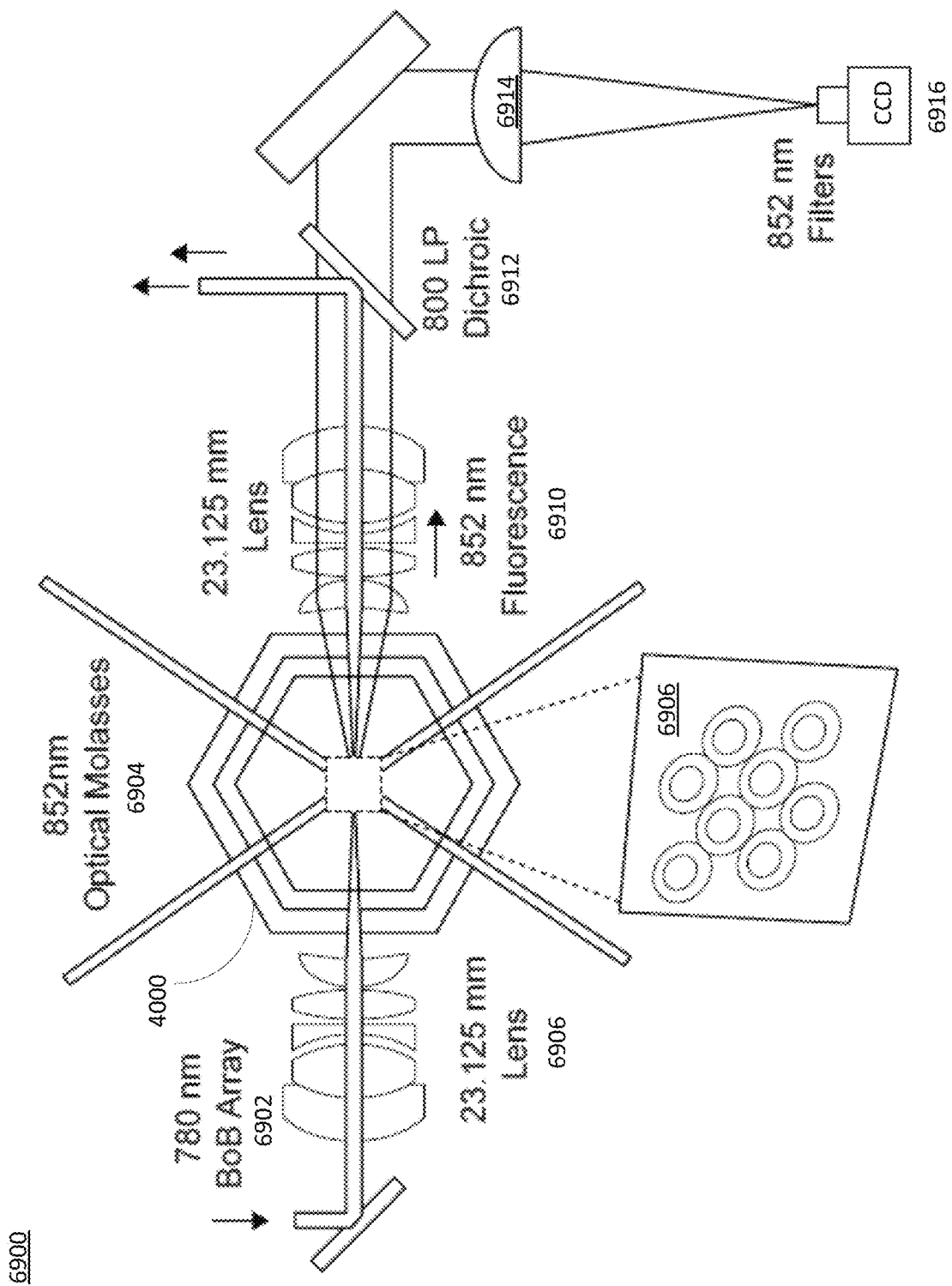
FIG. 69 (5.7c) is a schematic of a setup for fluorescence imaging of an array of bottle-beam traps.

To demonstrate the single BoB site addressing capabilities with the steerable optical conveyor belt, the focused BoB array was imaged onto an Andor iXon EMCCD using the same imaging system used in FIG. 69. Although it must be slightly modified as the optical conveyor belt is not drawn in FIG. 60, both counter-propagating $\lambda=1064$ nm beams spatially overlaps the 780 nm BoB array beams). After passing through the Hex cell, the 1064 nm and 780 nm beams are separated by simply placing 1000 nm low pass dichroic mirror directly after the f=23.125 mm lens. However, 0.1% of the optical conveyor belt light still passes through the dichroic mirror and is then focused onto the Andor iXon EMCCD with an f=500 mm lens. This forms a 23.125:500 confocal microscope that images the focus of the array-conveyor belt combination.

Figure 73:
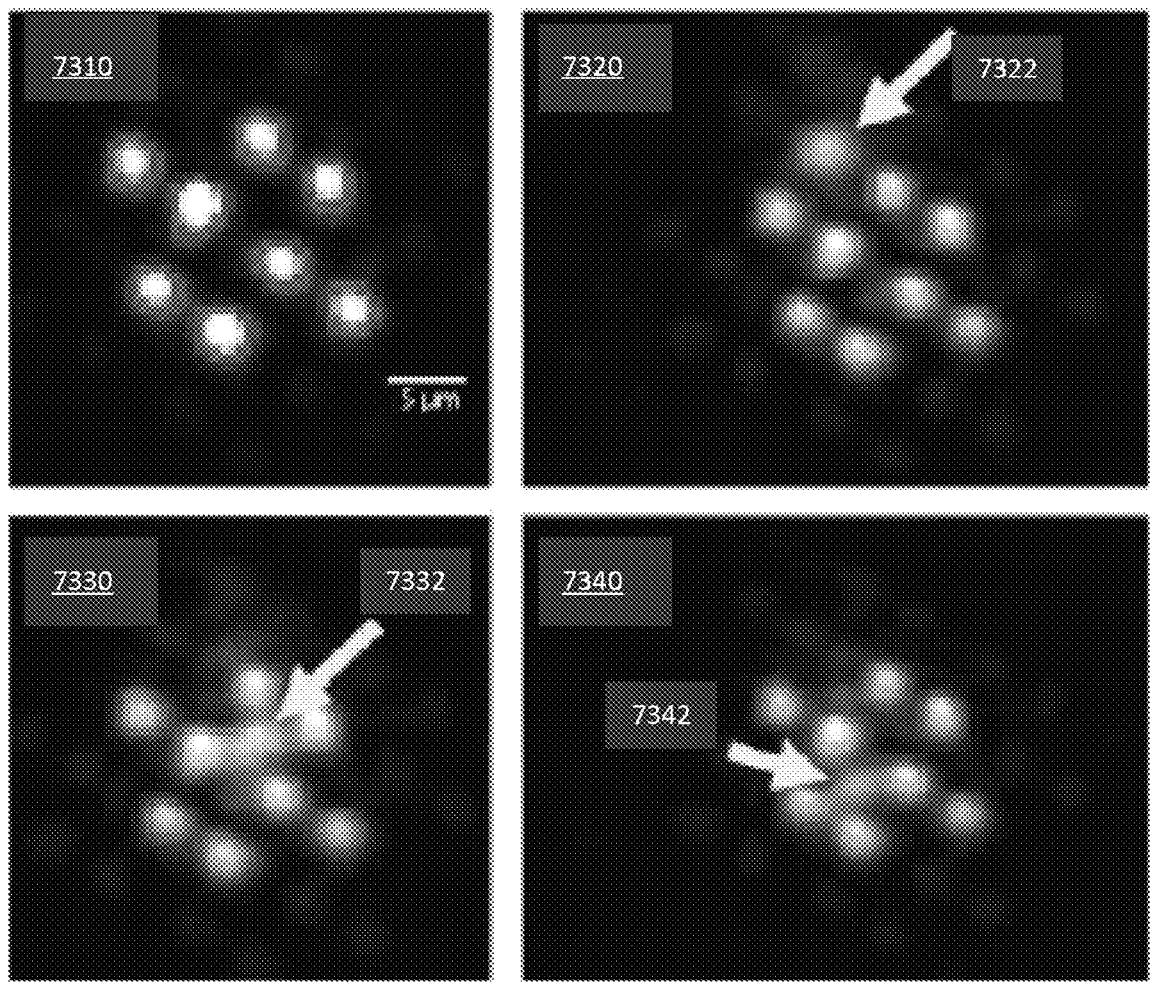
FIG. 73 (5.10) is a representation of four images demonstrating that the steering system of FIG. 72 can deliver atoms to different bottle-beam traps of the array of FIG. 69.

On this image, light from the focused optical conveyor belt can also be seen. By only changing the driving frequencies of the lattice deflecting x-AOMs and y-AOMs, the focus of the optical conveyor belt is repositioned such that it overlaps the center of either of the two BoB traps in the GBA. Images 7310, 7320, 7330, and 7340 demonstrate that the beam steering system is capable of addressing both BoB trapping sites in the GBA. These images were taken by only changing the 1064 nm beam deflecting x-AOM and y-AOM driving frequencies with no manual realignment of any beams. In the image 7310 at the upper left of FIG. 73, a focused GBA is located inside the Hex cell. In the upper right image 7320, the focus of the optical conveyor belt spatially overlaps the focus of the GBA; an arrow 7322 points to light from the focused conveyor belt. Using the lattice deflected x-AOMs and y-AOMs, the optical conveyor belt is repositioned to overlap the first BoB trap as shown in the image 7330 of the lower left, and overlaps the second BoB trap, as shown in image 7340 at the lower right of FIG. 73. The beam deflecting AOM driving frequencies can be adjusted electronically within approximately 10 microseconds, allowing for very fast optical conveyor belt reposition times.

The sequence of delivering atoms to either of the array BoB traps begins by first choosing a BoB trap to deliver atoms to. With the spatial coordinates of both BoB traps known, the driving frequencies of the beam deflecting AOMs can be set to the proper value such that the focus of the optical conveyor belt is repositioned to overlap the center of the target BoB trap. Specifically, in this setup shown in FIG. 72 (5.9): 1) setting the x-AOMs to ±79.83 MHz and setting both y-AOMs to +79:69 MHz positions the focus of the optical conveyor belt at the center of BoB 7332 (FIG. 73); and 2) setting the x-AOMs to ±84.45 MHz and setting both y-AOMs to +79.69 MHz repositions the conveyor belt to overlap BoB 7304. After the optical conveyor belt is repositioned, the degree of overlap for the lattice beams can be verified by using an RF spectrum analyzer to measure the amplitude of the relative beat note between the both lattice beams.

Once a BoB destination is chosen, a 3D MOT is loaded into the hex cell for 1 second. During the final 530 ms of MOT loading, the 1064 nm transport beams are un-shuttered allowing the optical conveyor belt to overlap the MOT where five atoms on average are loaded into the optical conveyor belt. This relatively low average atom payload may be explained by the appearance of the collisional blockade effect due to reducing the lattice beam waists combined with any light assisted collisions from the cooling light, which prevents more than a single atom occupying in each potential well of the 1D lattice potential. After loading the conveyor belt, the MOT was extinguished by shuttering the 852 nm cooling and repump beams as well as turning off the 3D MOT magnetic fields. The conveyor belt can be held in place for 20 ms to allow the remaining untrapped atoms to fall away due to gravity.

Figure 74:
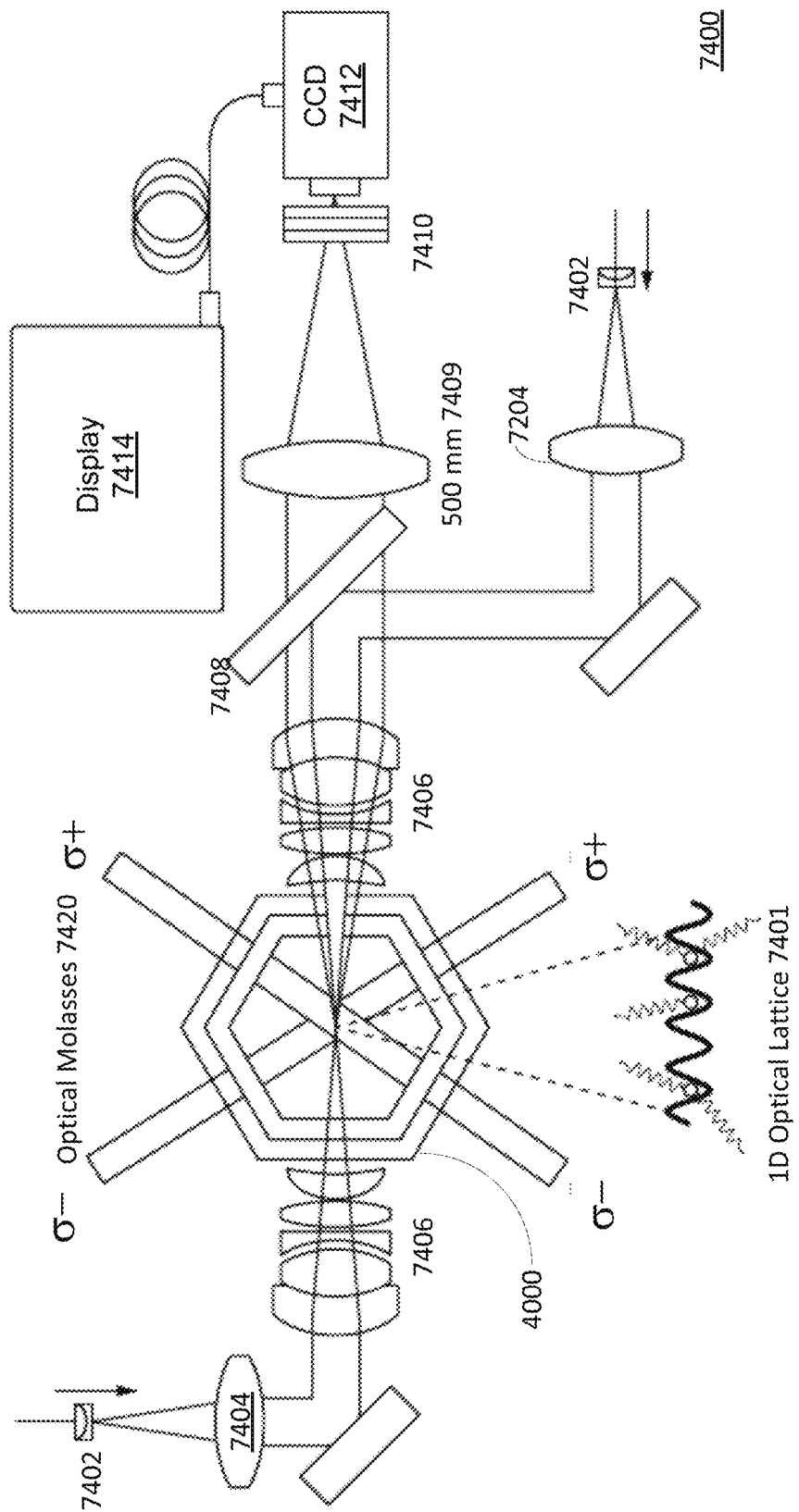
FIG. 74 (5.11a) is a schematic of a setup for imaging the optical conveyor belt of FIG. 71.

A setup 7400 for fluorescence imaging of a 1D optical lattice 7401 is shown in FIG. 74. Components of setup 7400 include a beam expanding lenses 7402, mirrors, collimating lenses 7404, 73.125 mm lenses 7406, hex cell vacuum chamber 4000, a dichroic mirror 7408, a 500 mm lens 7409, 852 mm filters 7410, an Andor iXon EMCCD 7408 7412, and a display 7414.

An optical molasses 7420 is applied to atoms trapped in the 1D lattice 7401 and a fraction of the induced fluorescence is collected with the 0.4 NA custom lens 7406 and focused onto an Andor iXon EMCCD 7412. The occupancy of a conveyor belt can be measured by illuminating it with a 3D optical molasses by turning on 3D MOT lasers and detuning them −30 MHz. Repump light can also be turned on. Additionally, shim coils are used to eliminate any residual magnetic fields. As a result, the 3D molasses light induces atom fluorescence from any atoms loaded into the optical conveyor belt. The 852 nm scattered fluorescence light is collimated with one of the 0.4 NA, f=23.125 mm lenses 7406 used to focus the conveyor belt and separated from the 1064 nm trapping light 7412 with a 900 nm short pass dichroic mirror 7408. Using an f=500 mm achromatic lens 7409, the fluorescence light is then focused onto the Andor iXon EMCCD 7412 with single photon sensitivity where photon counting is performed over a 10 ms time interval. The overall imaging system 7400 features a magnification of 21.6 and results in a 0.740 μm/pixel ratio for EMCCD 7412. A set of three 852 nm laser line filters 7410 are used to eliminate any stray 1064 nm lattice light.

Figure 75:
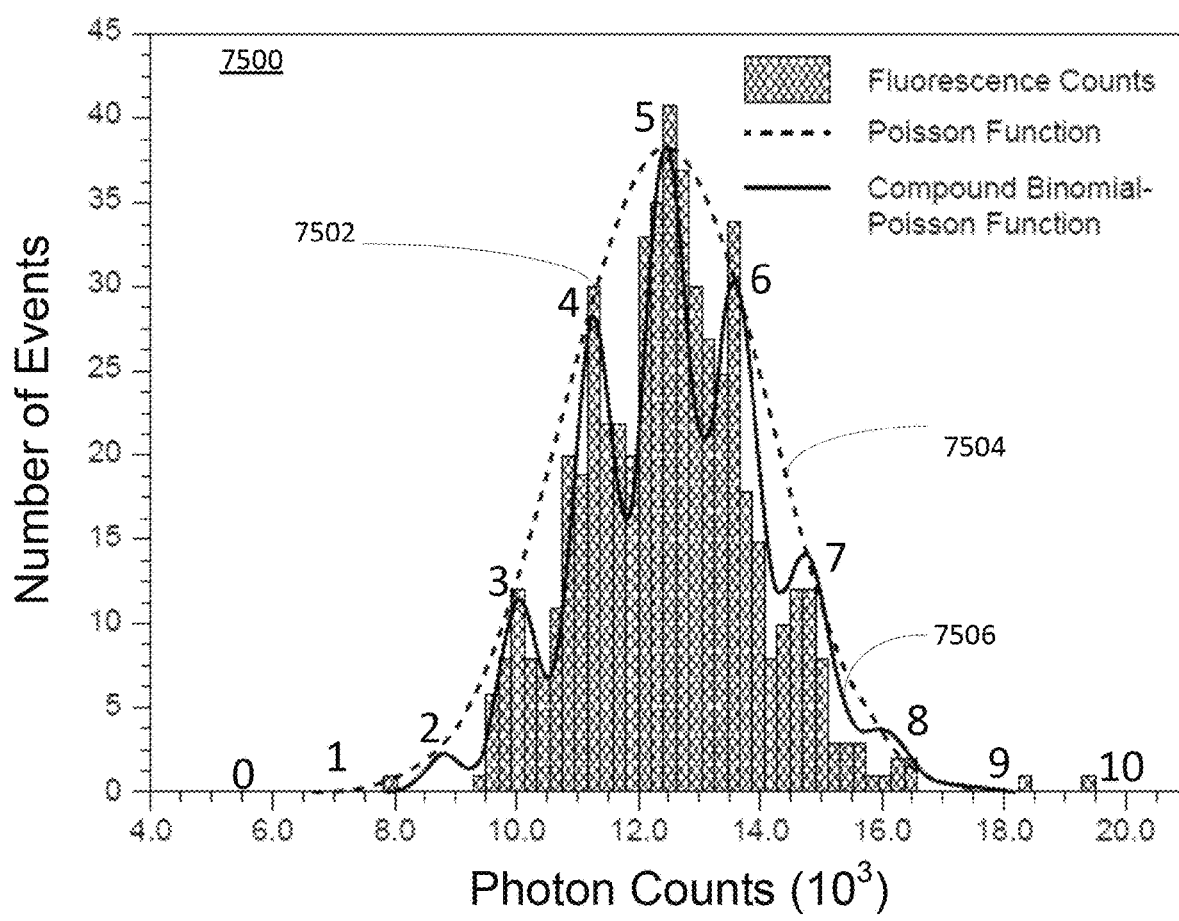
FIG. 75 (5.11b) is a histogram of photon counting data recorded during fluorescence imaging of the optical conveyor belt of FIG. 71.

FIG. 75 is a histogram 7500 of photon counting data 7502 recorded during fluorescence imaging of the 1D lattice 7402 over 500 individual loading sequences. The data shows multiple Poisson distributions that emerge due to different amounts of atoms loaded in the 1D lattice. Each number N shows the Poisson distribution 7504 corresponding to loading N atoms in the lattice. The distribution is fitted to a compound binomial-quasi Poisson function 7504, which accounts for the random and discrete atom loading along with the sub-Poissonian spread of observed photon counts.

The statistics show that the most probable loading number is five atoms. The appearance of this compound probability distribution is due to the combination of: 1) the random, discrete number of atoms loading into the optical conveyor belt; and 2) the Poissonian spread of observed photon counts from each of the loaded atoms. The fitting result is $\mu=0.5$, $N=5$, $n=10$, $n_{bg}=120$, and $n1=120$. The appearance of multiple peaks in the photon counting histogram (as compared to 2 peaks in FIG. 58 (4.22)) is due to loading more than one atom in the conveyor belt. From the photon counting statistics the most probable loading number is 5 atoms.

Unlike the crossed vortex BoB trap loading, the BoB traps formed by the GBA are never turned off during the atom transport sequence. Turning off the GBA in order to reload a new atom to an empty BoB trap would ruin any previously loaded traps and ongoing quantum computations would also be ruined, Because the GBA and this optical conveyor belt are focused through the same 0.4 NA, f=23.125 mm lens, the conveyor belt will pierce atoms through the weaker, axial confining potential of the array BoBs. During this process, atoms confined to the conveyor belt are not expelled, as the axial trapping frequency of the conveyor belt, $\Omega_z=2\mathrm{I}*450$ kHz is considerably greater than the axial potential of the array BoB trap $\Omega_z=2T*2.58$ kHz.

To transport the small number of loaded atoms to the desired array BoB trap, one lattice beam is linearly frequency chirped by S=20 kHz over 5 ms. Because the frequency chirping AOMs 7102 and 7104 in FIG. 71 (5.8) are in the double pass configuration, this causes a total lattice beam detuning of 40 kHz. With 40 kHz detuning, the optical conveyor belt accelerates to a maximum velocity of 21 mm/s. After this frequency chirp, the lattice beam is linearly chirped down −40 kHz over 5 ms to bring the conveyor belt to a halt. The entire procedure transports the atoms a total distance of approximately 100 m in 10 ms. This 100 μm transport distance is considerably smaller than the 1.1 mm transport distance in FIG. 60 (4.24 left). This is due to the steerable optical conveyor belt having a focused beam waist of $\omega_0=1.7$ μm, giving it a Rayleigh range approximately 225 times smaller than the optical conveyor belt in FIG. 60 (4.24 left). Additionally, the adiabatic criterion for accelerating the optical conveyor belt (equation 85 (4.17)) is satisfied, as the moving lattice is being chirped at a much lower rate than the square of the lattice axial oscillation frequency. That is $\Omega_z^2 \gg d\omega/dt$, where $\Omega_z^2$ $10^{12}$ $s^{-2}$ and $d\omega/dt \approx 10^7$ $s^{-2}$. Fluorescence imaging is performed for 10 ms to observe atoms transported into either BoB trap.

Figure 76:
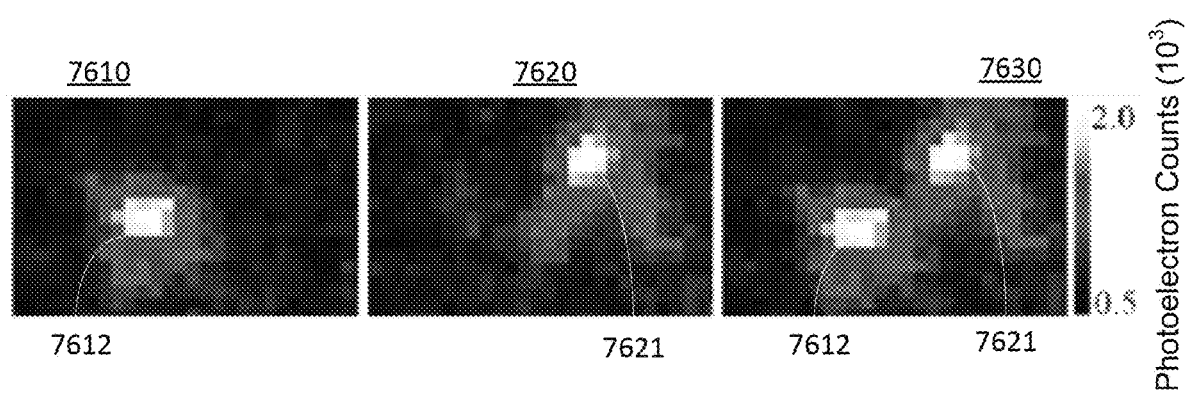
FIG. 76 (5.12) is a set of representations of fluorescence images, all showing all showing the same area of interest, of approximately 5 atoms after being transported 100 m from a 3D MOT to an empty array bottle-beam trap using the optical conveyor belt of FIG. 71.

FIG. 76 is a series of fluorescence images 7610, 7620, and 7630, all showing the same area of interest, of approximately five atoms after being transported 100 μm from a 3D MOT to an empty array BoB trap using the optical conveyor belt. The left 7610 and center 7620 images shows atoms transported to BoB2 7612 and BoB1 7621, respectively. The image 7630 to the right is a combination of the other two images to show their spatial separation of 5 μm.

Demands for maintaining a satisfactory vacuum environment for trapped qubits and qubit gate operations call for locating the 3D MOT which supplies the source of cold atoms for atom reloading in a separate vacuum chamber positioned adjacent to the cell that houses the BoB array. Being in a separate chamber permits the 3D MOT to be on continuously, as the MOT footprint does not disturb any previously trapped atoms. One practical atom reloading sequence transports atoms vertically from the 3D MOT, using what is called a Moving Molasses MOT, to a position in a hex cell that is off-axis from the BoB array.

Figure 77:
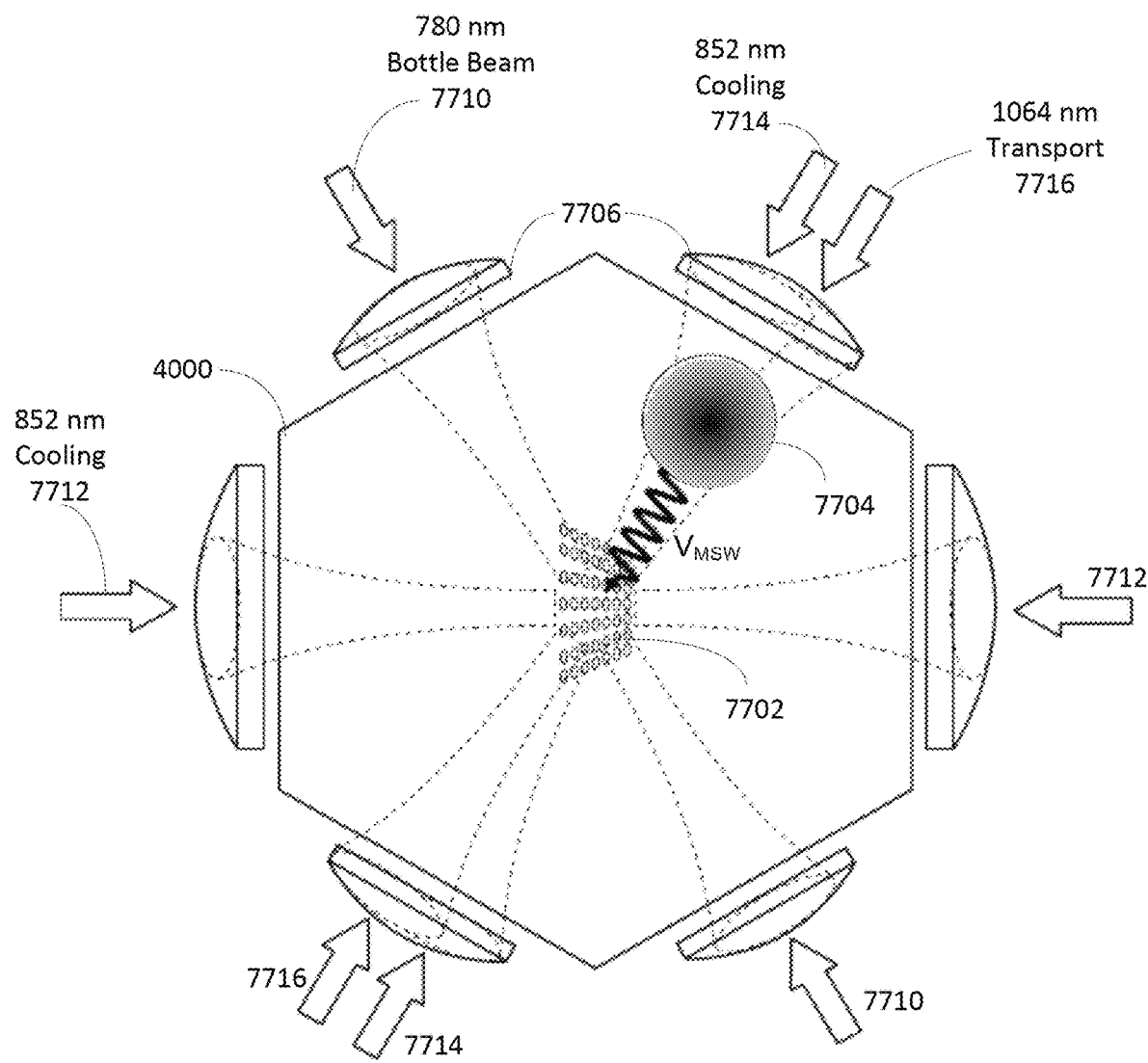
FIG. 77 (6.2a) is a schematic of a qubit array reparation system showing the location of the \secondary cold atom reservoir" in relation to the Hex cell lasers and bottle-beam traps.

In the setup 7700 of FIG. 77, a bottle-beam array 7702 and a secondary cold atom reservoir 7704 are located within hex-cell vacuum chamber 4000. Bottle-beam array 7702 is formed using counter-propagating 780 nm "bottle-beam" laser beams 7710. Cooling is provided using two pairs of counter-propagating 852 nm cooling lasers 7712 and 7714. A counter-propagating pair of 1064 transport lasers 7716 is used to form the 1D optical conveyor belt used to transport atoms from reservoir 7707 to selected sites of bottle-beam array 7702 reservoir 7704 is maintained in part using Hex cell lasers 7711, 7712, 7713, 7714, 7715, and 7716 and the BoB traps 7720.

By making a 6-Beam MOT with three pairs of counter-propagating cooling beams in a 2D magnetic field, the entire MOT can be propelled vertically, in what a Moving Molasses MOT, by mutually detuning the vertically oriented MOT beams by $\delta\omega$. Similar to the physics behind the optical conveyor belt, this detuning creates a reference frame where both pairs of cooling beams are Doppler shifted to the same frequency. This frame moves vertically (as an atom fountain) with velocity $v=\sqrt{2}2\lambda\delta\omega$. A 12 W, 1064 nm dipole trapping beam helps to guide the atoms upwards. Once the atoms reach a maximum height in the Hex cell, they are trapped in a crossed dipole trap which serves as secondary cold atom reservoir 7704. The atoms from this secondary reservoir are then horizontally transported to a BoB site using an optical conveyor belt. Using this transport scheme, while considerably more difficult, maintains a better vacuum in the Hex cell, and solves isolation issues by keeping the cold atom reservoir from disrupting any concurrently operating qubit gates taking place in the array, which allows for a continuous atom reloading.

Figure 78:
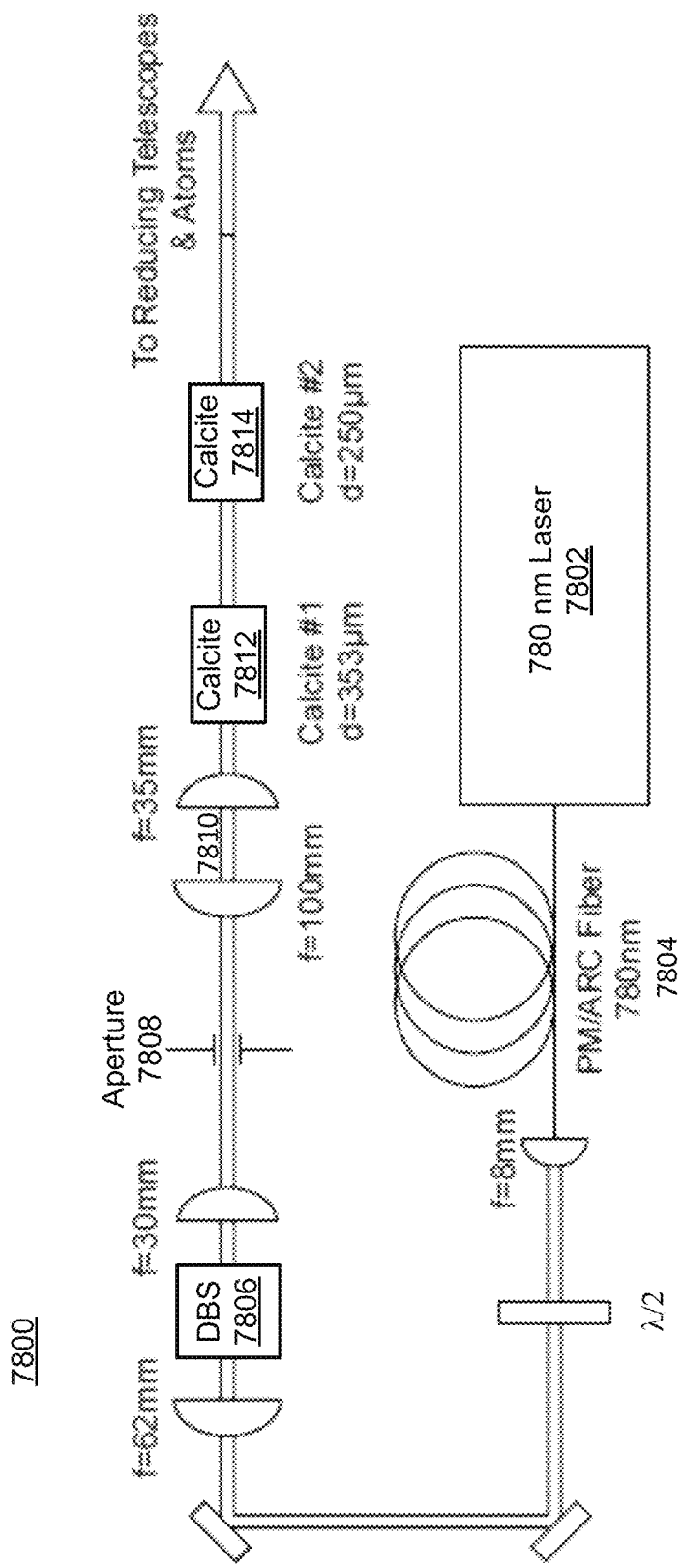
FIG. 78 (6.3a) is a schematic of an optical setup for restoring of a 2×3 bottle-beam array.

A optical system 7800 for steering an optical conveyor belt to address six BoB traps is shown in FIG. 78, which is a modification of optical system 3700 shown in FIG. 63. Components include a Toptica TA Pro 3 W 780 nm laser 7802, a 780 nm PM/ARC optical fiber 7804, an 8 mm lens, a half-wave plate $\lambda/2$, mirrors, a 62 mm lens 6806, a Holo/Or MS-248-X-Y-A 78 diffractive beam splitter 7806, an aperture 7808, a 100:35 telescope 7810, a first calcite crystal 7812 with d=353 μm and $\varphi=\pi/2$, and a second calcite crystal 7814 with d=250 μm and $\varphi=\pi/2$.

Optical system 7800 provides fully capable atom reloading system for a qubit array without disturbing neighboring, previously loaded BoB traps. A 2×2 array of identical Gaussian beams is created by Holo/Or MS-248-X-Y-A diffractive beam splitter 7806. The 100:35 telescope 7810 images the arrays in between two calcites 7812 and 7814. The first calcite 7812 replicates the 2×2 array into an array of eight identical Gaussian beams separated by 353 μm, while the second calcite 7808 duplicates the 8 beams into a full 16-beam array with each beam separated by 250 μm.

Figure 79:
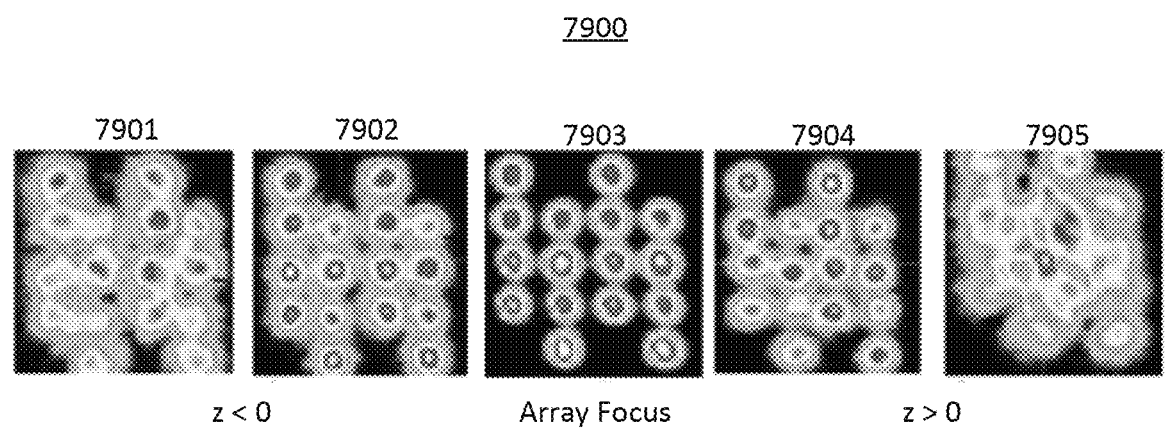
FIG. 79 (6.3b) is a series of images showing the results of steering an optical conveyor belt to address all six bottle-beam traps in the 2×3 array of FIG. 78.

FIG. 79 represents a series 7900 of images 7901, 7902, 7903, 7904, and 7905 of the 2×3 array as one sweeps through the focus of the array. Image 7903 is focused on the array. Images 7901 and 7903 are taken with the image focus on one side of the array focus, while images 7904 and 7905 are taken with the image focus on the other side. The focuses of images 7901 and 7905 are further from the array than are the focuses of images 7904 and 7905.

Figure 80:
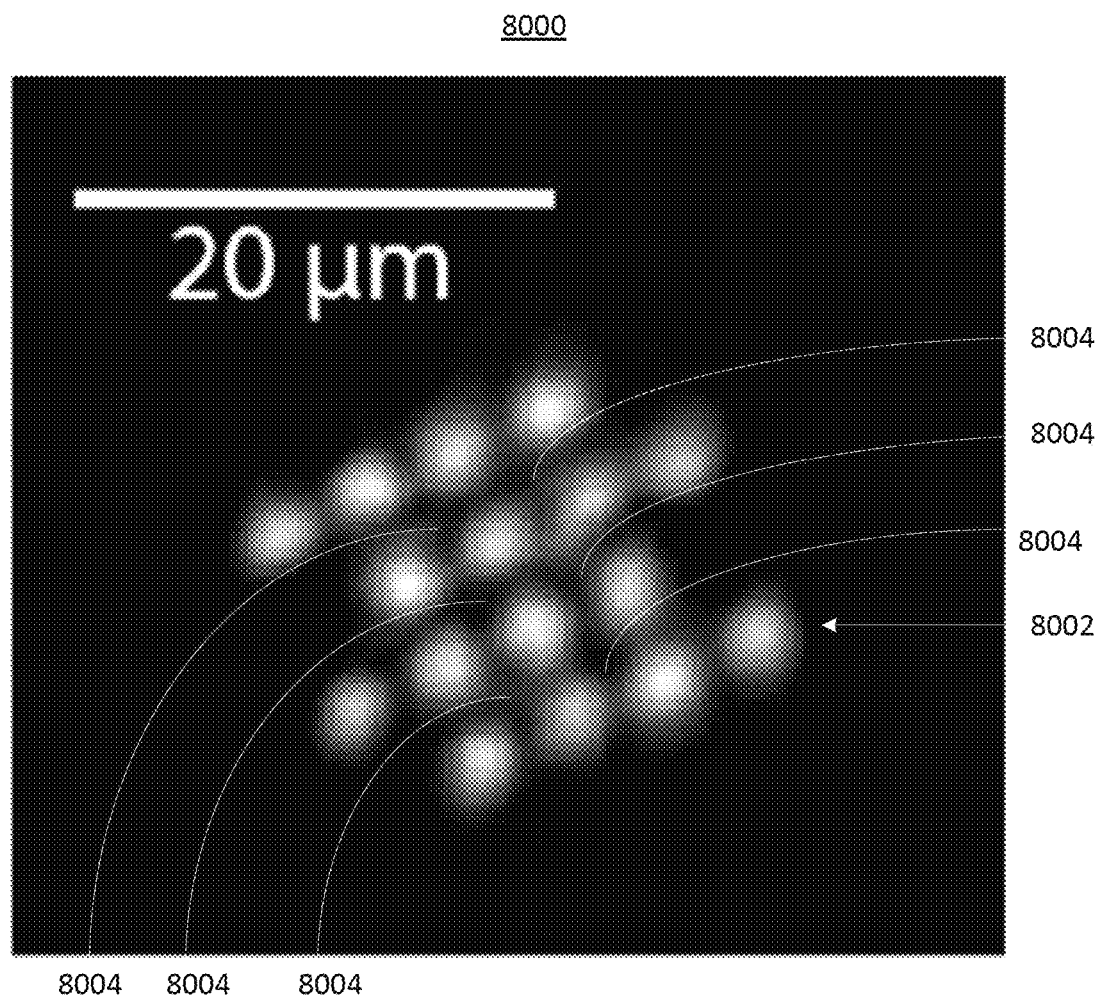
FIG. 80 (6.4a) is a representation of an image of the 2×3 bottle-beam array of FIG. 78.
Figure 81:
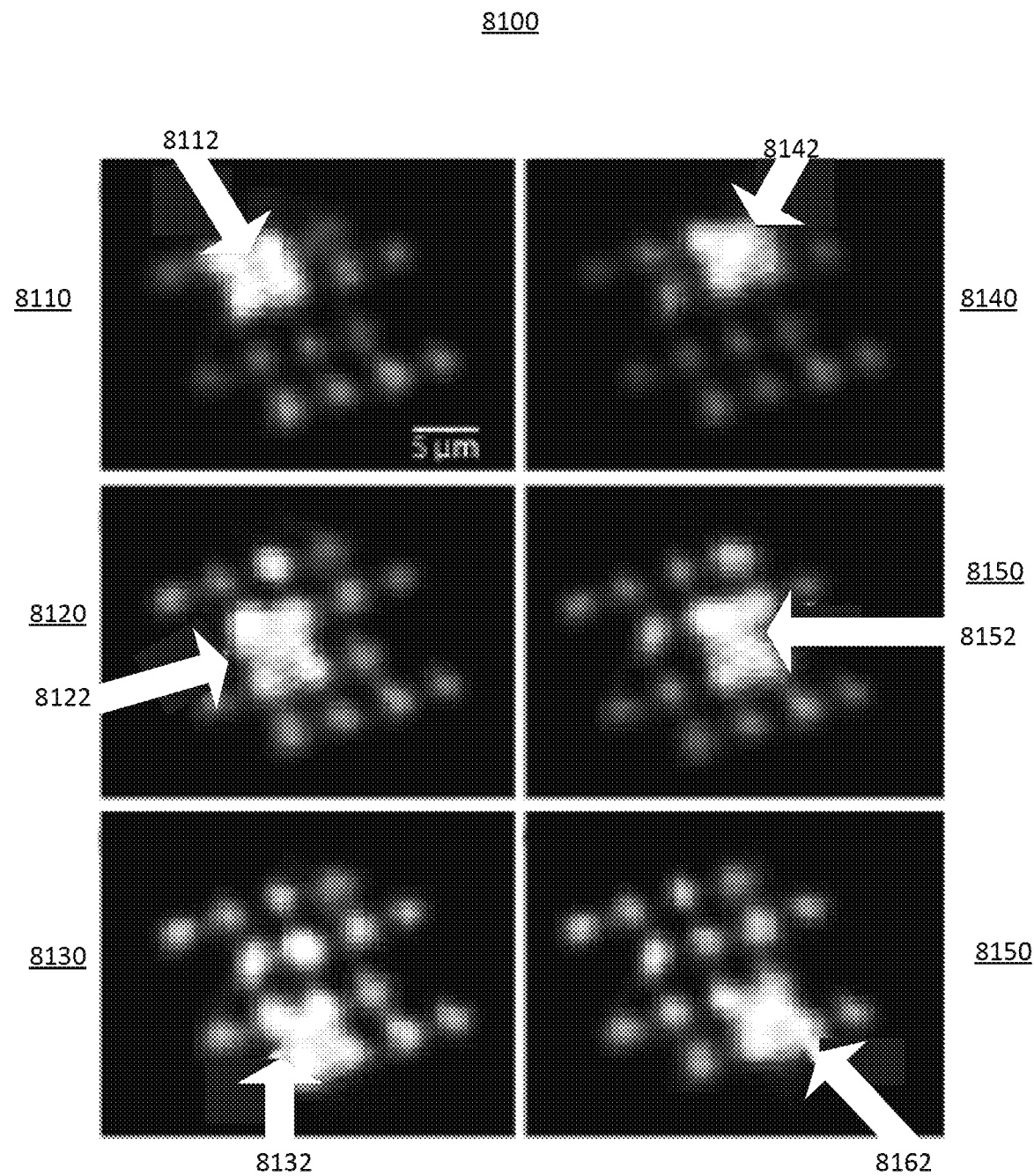
FIG. 81 (6.4b) is a series of six images showing the optical conveyor belt relative to each of the six bottle-beam traps of the bottle-beam array of FIG. 78.

In order to have equal spacing of each array site, the fast axis of each of the calcites is rotated by 45° with respect to each other. After passing through both calcites, the 2×3 array of Gaussian beams is demagnified by a 200:60 telescope to give each beam a waist of 34 μm and beam separation of 74 μm. The array is then demagnified one final time with a 500:23.125 telescope to image the array through the hex cell. At the focus of the 0.4 NA, f=23.125 mm lens, each beam has a separation of d=4.67 μm and each beam waist is $\omega=2.22$ μm, giving an aspect ratio of d=w=2.10. FIG. 80 is an image 8000 of a 2×3 BoB trapping array 8002 at the focus of the 0.4 NA, f=23:125 mm lens. The optical configuration creates six BoB traps 8004 separated by d=4:67 μm. The steerable conveyor belt system can be used to address all six BoB traps, as shown collectively by the set 8100 of images 8110, 8120, 8130, 8140, 8150, and 8160 of FIG. 81, in which respective arrows 8112, 8122, 8132, 8142, 8152, and 8162 point to the optical conveyor belt light.

An Ultra-cold Gain Mechanism for a Matterwave Transistor Oscillator introduces a new gain mechanism for a matterwave transistor oscillator. Atomtronics is an emerging field of ultra-cold atomic physics that focuses on quantum circuits that operate as atom analogues to electrical circuits, where an atom current takes the place of an electron current and the chemical potential takes the place of a voltage. In their design, atomtronic circuits are drastically different from their electronic circuit counterparts, as they involve manipulating ensembles of ultra-cold atoms to flow through a variety of potential energy landscapes, such as: 1) optical potentials produced from laser beams; 2) harmonic magnetic potentials created with atom chips; and 3) a hybrid combination of optical and magnetic potentials, such as the transistor potential used throughout.

At the heart of all atomtronic circuits is a Bose-Einstein condensate (BEC), which supplies a source of coherent, ultra-cold atoms that are controlled to flow throughout a network of quantum potentials. Some recently demonstrated atomtronic circuits of note include BECs flowing throughout double-well and triple-well potentials, as well as BECs owing through 1D optical lattices and optical ring lattices. Irrespective of the circuit potential geometry, the objective of atomtronics remains the same: to manipulate a current of ultra-cold atoms in some tailored potential to study fundamental physics or to create purely quantum mechanical technologies.

Accompanied with such high aspirations of atomtronics comes a difficult, inherent challenge ingrained in the field: such ultra-cold atom circuits are inherently a many-bodied, open quantum system, since atoms and BECs interact and dissipate as they flow throughout the circuit from some source to a sink or drain. While this immensely complicates the theoretical description of atomtronic circuits, complete descriptions are usually simplified by invoking various approximations, such as: 1) Neglecting dissipation and treating the atomtronic circuit as a closed system; 2) reducing the many-bodied system from a very large number to a three or four-body problem; 3) ignoring the BEC mean-field interaction effects.

The transistor oscillator model described herein uses all three of the above bulleted approximations and justifies the validity of each when applied to this transistor oscillator model. Despite the necessity of using approximations just to solve for something, atomtronics has made unwavering progress in ultra-cold atom technologies such as realizing quantum simulators, improving precision measurements, creating an atomtronic analogue to a SQUID (called an AQUID, or atomtronic quantum interference device), and realizing an atom. Moreover, if used in conjunction with well-established matter-wave interferometry, atomtronics can help enhance inertial sensing and gravimetry sensitivities by up to 10 orders of magnitude as compared to their light wave interferometry counterparts. Finally, atomtronics can conceive new types of quantum technologies by combining various atomtronic circuit elements into an integrated ultra-cold atom circuit. One such integrated ultra-cold circuities a matter-wave transistor oscillator.

Figure 82:
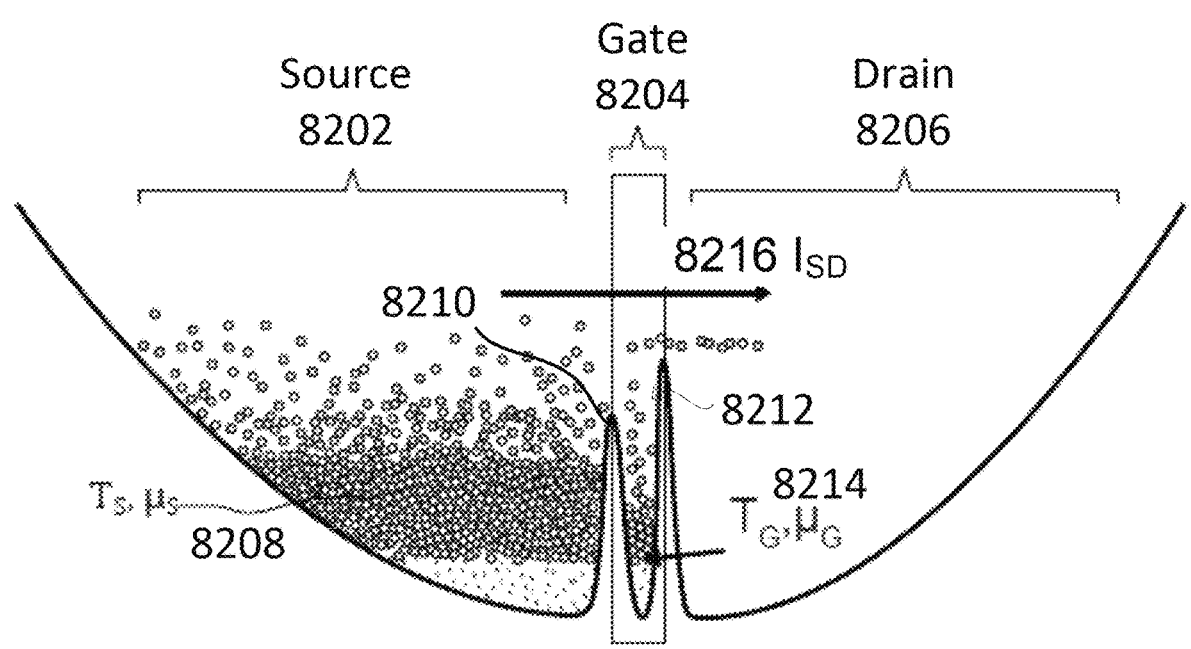
FIG. 82 (7.1) is a schematic illustration of a semi-classical atomtronic transistor.

Fundamental to many technological developments, the transistor is a three-terminal semiconductor electronic device that uses an applied voltage or current on one terminal to amplify or switch electrical signals on another terminal. An atomtronic transistor behaves analogously to its semiconductor counterpart by switching or amplifying atom, or matter-wave, currents rather than electrical currents. Moreover, in place of three electrical terminals (commonly known as the source, gate and drain terminals) found on semiconductor transistors, an atomtronic transistor features three quantum potential energy wells that are capable of confining ultra-cold atoms, as shown in FIG. 82 (7.1). In similar form and function to the semiconductor transistor, these three potential energy wells, which are labeled the source well, the gate well, and the drain well, together behave as an atomtronic transistor source (to source an ultra-cold atom ensemble to flow through the system) a gate (confining an additional ultra-cold ensemble to provide a gain mechanism), and a drain (which functions as the output port of the transistor).

Figure 3B:
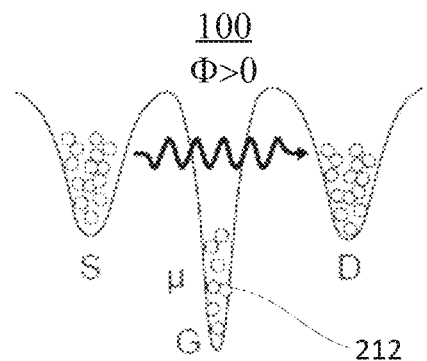
FIG. 3B (7.1b) is a schematic elevational view of the matter-wave transistor of FIG. 3A in which the gate-well includes a DOBEC, resulting in a positive source-to-drain matter-wave flux.
Figure 3C:
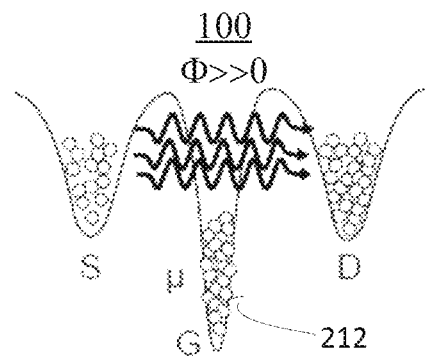
FIG. 3C (7.1c) is a schematic elevational view of the matter-wave transistor of FIG. 3A in which the DOBEC is more populated (has more matte-wave particles) than it does in FIG. 3B, resulting in a relatively large source-to-drain matter-wave flux.

Most importantly, for such source-gate-drain system to be called an atomtronic transistor, it must display a gain mechanism for a matter-wave or atom current. The overall concept of an atom current gain mechanism in an atomtronic transistor is shown in FIGS. 3A, 3B, and 3C (7.1). As matter waves flow from source, to gate, to drain via tunneling between each potential energy well, the gain mechanism emerges due to a change in the gate-well chemical potential (as a result of an ultra-cold atom population building up in gate-well) resulting in an increase of tunneling probability to flow through the gate-well and into the drain-well. This manifests itself in an increase of the atom flux, i.e., atoms per unit time, flowing through the potential.

In a semi-classical formalism, transistor-like behavior of ultracold atoms flowing through networks of quantum potential energy wells involve creating matter-wave analogues of Kirchoff's current and voltage laws for atoms flowing across a double Gaussian barrier potential. Compared to the quantum model, the semi-classical picture is defined as the set of conditions where the thermal energy of the atoms flowing through the transistor potential is much larger than the energy level spacing of the transistor gate-well. In the semi-classical model atom currents are driven by collisions and their flow is described using classical Boltzmann statistics. Atoms that have enough thermal energy to traverse the Gaussian barriers flow into the drain and establish an atom current Is. A non-intuitive result of the semi-classical model is that given an initially empty gate-well, an atom population quickly grows in the gate and rapidly condenses into a Bose-Einstein condensate. The BEC steady state population influences the atom current ISD flowing from source to drain, which is characteristic of a gain mechanism.

As shown in FIG. 82 (7.2), a semi-classical atomtronic transistor 8200 has a source well 8202, a gate well 8204, and a drain-well 8206. A source-well ensemble of atoms 8208 at a chemical potential $\mu_S$ and temperature Ts flow with current $I_{SD}$ 8216 into drain well 8206 by classically traversing the barriers 8210 and 8212 respectively separating the centrally located gate well 8204 from the source well 8202 and drain well 8206. As the current flows, some atoms rapidly form a BEC 8214 in gate well 8204 with a well-defined, steady state chemical potential pc and $T_G$. The occupancy of this BEC 8214 can increase or decrease the current flowing from to source to drain, which provides an atom current gain mechanism.

There are major differences between the semi-classical and the quantum transistor models. Namely, in the quantum model: 1) the thermal energy of the source-well atom ensemble is comparable (ideally equal) to the gate-well energy level spacing; 2) atoms flowing through the transistor potential are described as matter waves; 3) the gate-well condensate is treated as a coherent state; the ow of atoms through the transistor is a result of resonant tunneling from the source well, through the gate-well, and into the drain-well (as opposed to the collisions primarily driving the semi-classical atom current); and 4) when the atom current reaches low enough energies, a new interaction, not observed in the semi-classical model or experiment, arises in the gate-well between the gate-well BEC and the atom current.

This new interaction, which arises due to the motional state of an oscillating gate-well BEC coupling high lying gate-well energy eigenstates, is similar to the Rabi model interaction between two-level atoms and a photon field. The interaction serves to increase the atom current by ultimately amplifying the matter-wave probability amplitude in the transistor drain-well. This introduces an additional gain mechanism that only appears when the atom current is at sufficiently low enough temperatures for the BEC coupling (described above) to occur.)

The matter-wave transistor oscillator described herein is constructed by overlapping a harmonic, magnetic potential with two repulsive Gaussian barriers. This setup forms three potential energy wells which are labeled the source well, gate well, and drain well (FIG. 1, (7.3a)). Because the barriers separate the source-well from the gate-well and the gate-well from the drain-well, they are fittingly labeled the "source-gate" (SG) and "gate-drain" (GD) barriers.

Given a thermal atom ensemble originating in the source-well, a flux $\Phi$ of atoms per unit time flows through the transistor potential and into the drain-well by resonantly tunneling through the transistor gate-well. Our model operates with the assumption that only the phenomenon of tunneling facilitates the flow of atoms throughout the transistor potential and does not allow atoms to classically traverse the SG or GD barriers. Thus, the atoms are hereafter described as matter waves. This definition leads to a first principle of our matter-wave transistor model: "Only the source matter-waves satisfying the resonant tunneling boundary conditions of the gate-well successfully flow with flux $\Phi$ into the drain-well (FIG. 2A 7.3b)). This means that the incident source matter-waves must match gate-well boundary conditions (i.e. a gate-well energy eigenstate) to experience transmission into the drain. Otherwise the matter-wave is reflected off of the GD barrier with probability unity.

This leads to the second principle of our matter-wave transistor model: "by placing a dipole oscillating BEC in the gate-well, the matter-wave current flowing into the drain-well with flux $\Phi'$ is amplified due to the BEC broadening the resonant tunneling boundary conditions (FIG. 2b (7.3c)).

The mechanism responsible for this increase of matter-wave current is the emergence of an atom-BEC interaction that occurs only when the motional state of a gate-well BEC couples high lying gate-well energy eigenstates. An interesting consequence is the atom-BEC interaction allows matter-waves that do not initially match a resonance condition of the gate-well to absorb energy from or deposit energy into the interaction, allowing off-resonant matter-waves to shift their energy and satisfy the resonant boundary conditions of the gate-well. The now-resonant matter-waves are then permitted to resonate and build up inside the gate-well followed by subsequent flow out into the drain. Combining the first and second principles yields: "when a dipole oscillating BEC occupies the transistor gate well, the matter-wave current flowing into the drain with flux $\Phi'$ is greater than the flux D when the BEC is absent. This characteristic shows the presence of a gain mechanism, where gain g is defined as $$\mathcal{G} = \Phi'/\Phi > 1 \qquad (104)(7.1)$$

Figure 83:
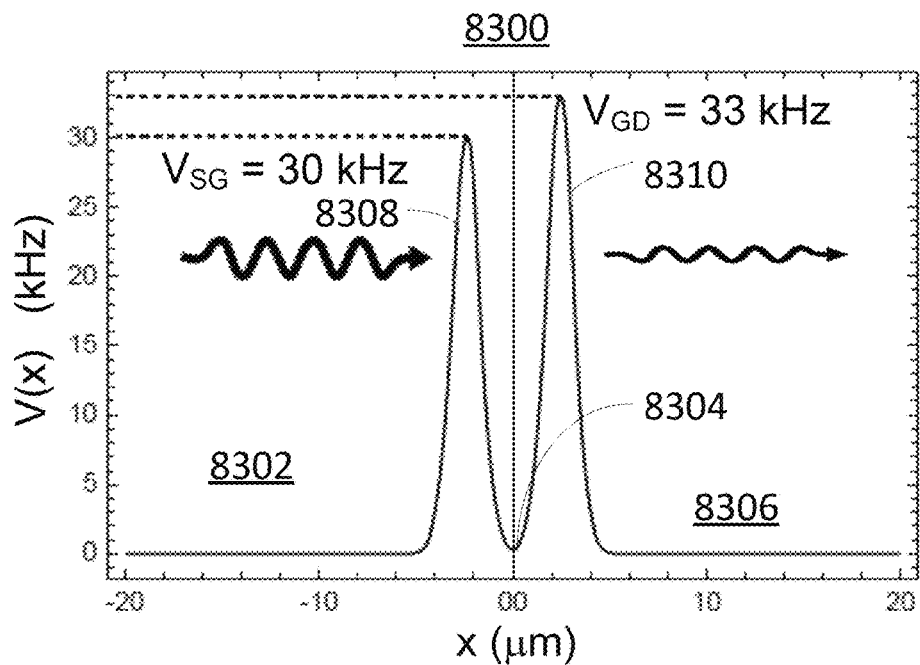
FIG. 83 (7.4a) is a one-dimensional potential energy diagram of a triple-well matter-wave transistor.

FIG. 83 (7.4a) is a one-dimensional potential energy diagram of the triple-well matter-wave transistor 8300 where an ensemble of atoms at a chemical potential p and temperature T occupy the source well 8302 with the gate 8304 separated from the source well 8302 and drain well 8306 by the SG barrier 8308 and the GD barrier 8310. Considering the flow of matter-waves through a transistor potential in one dimension only. both the source and drain wells are treated as constant, at potentials $V_S(x)$ and $V_D(x)$ with $$V_S(x)=V_D(x)=0 \quad (105)(7.2)$$

where matter-waves are described for free particles and the source and drain wave functions, $\Psi_S(x;t)$ and $\Psi_D(x,t)$ are given as plane wave solutions $$\Psi_S(x,t)=A_S e^{\pm i(k_S x-\omega_S t)}$$

$$\Psi_D(x,t)=A_D e^{\pm i(k_D x-\omega_D t)} \quad (106)(7.3)$$

where wavenumber $k_i=\sqrt{2mE_i}/\hbar$ for kinetic energy $E_i$ (where i=S, D for source and drain) and mass m. The centrally located gate-well is separated from the source-well and drain-well by the SG and GD repulsive Gaussian barriers featuring equal 1/e waists of $\omega_0=2$ m and asymmetric heights 1 of $V_{SG}/\hbar=30$ kHz and $V_{GD}/\hbar=33$ kHz. The asymmetry in the barrier heights is chosen such that the ratio $\nu \equiv (V_{SG}-V_{GD})/T_s$, called the "feedback parameter" of the transistor oscillator, is equal to $\nu=1$. When barrier heights $V_{SG}$, $V_{GD}$ and source-well ensemble temperature $T_s$ give a feedback parameter $\nu=1$, there is an optimal balance of particle and energy currents flowing into and out of the gate-well to yield a stable atom ensemble in the gate well with high enough phase-space density to condense in steady state. This remarkable behavior is equivalent to a resistor with negative resistance since the source atoms at temperature $T_s$ that enter the gate and condense into a BEC are cooled to a lower temperature. If one were to flip the barrier heights so that $V_{SG}=33$ kHz and $V_{GD}=30$ kHz, the atom current would actually heat up upon entering the gate and no BEC would form. This latter case is equivalent to a resistor with positive resistance. Thus, the barrier height asymmetry in the model allows for a steady-state BEC to collect in the gate-well as source atoms flow through the gate and into the drain-well.

Figure 84:
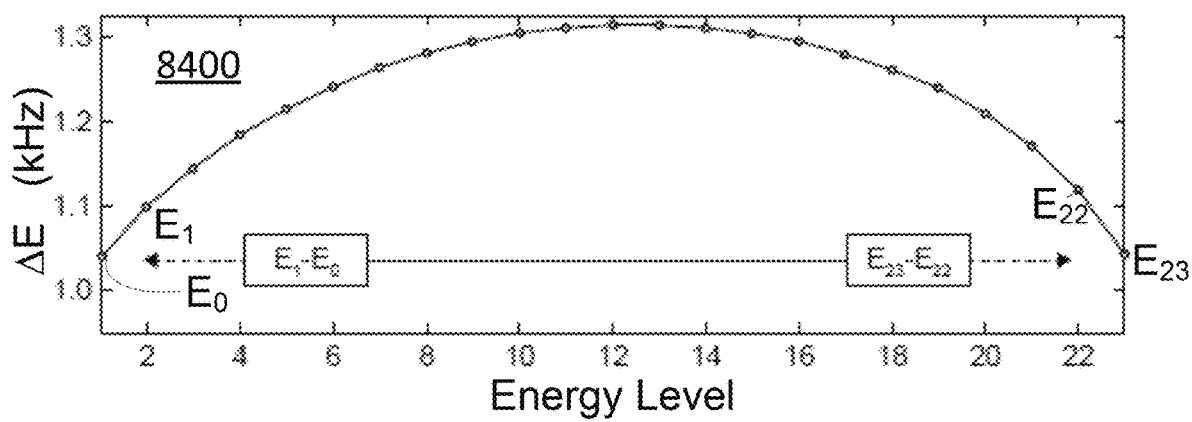
FIG. 84 (7.4b) is a graph of energy differences between adjacent eigenstates of a triple-well matter-wave transistor.

By separating the SG and GD barriers by a distance d=4:85 μm, the gate-well becomes a slightly anharmonic, asymmetric oscillator potential capable of confining ultra-cold atoms. The anharmonicity establishes a degeneracy amongst transitions between the gate-well ground and first excited states and the highest lying pair of bound energy eigenstates. FIG. 84 is a plot 8400 of the change in energy level associated with energy levels $E_0$ to-$E_{23}$. In other words the relationship $E_{23}-E_{22}=E_1-E_0$, as shown in FIG. 84, exists among eigenstates. Additionally, this degeneracy (with difference ΔE) is unique to this particular pair of transitions and does not exist between any other pairs of states. By varying the 1/e widths $\omega_0$ and the separation d of the SG and GD barriers, the degeneracy between the lowest lying and highest lying energy eigenstates can be transferred between various pairs of eigenstates or even removed entirely.

Finally, despite the slight anharmonicity of the gate-well, the gate-well wavefuctions n(x; t) can be approximated as solutions to the quantum harmonic oscillator with $$\psi_n(x)=\frac{1}{\sqrt{2^n n!}}\left(\frac{m\omega}{\pi\hbar}\right)^{1/4} H_n\left(\sqrt{\frac{m\omega}{\hbar}} x\right) e^{-m\omega x^2/2\hbar} \quad (107)(7.4)$$

where n corresponds to the nth energy eigenstate of the gate well and $H_n(x)$ is the nth Hermite polynomial. With the gate-well eigenfunctions assumed to be harmonic oscillator solutions, as well as noting the gate-well potential used in this model features 24 bound energy eigenstates, the degeneracy described above exists between gate-well energy eigenstates $\psi_0(x,t)$ and $\psi_1(x,t)$ with $\psi_{22}(x,t)$ and $\psi_{23}(x,t)$.

With the degeneracy between lowest and highest lying pairs of eigenstates present, we can write that $$E_1-E_0=E_{23}-E_{22}=\hbar\omega_P \quad (108)(7.5)$$

where each $E_n$ is the energy eigenvalue for the $\psi_n$ gate well eigenstate and $\omega_p$ is the fundamental oscillation frequency of the gate well potential defined as $E_0=\hbar\omega_P/2$. As a consequence of this degeneracy (equation 108 (7.5)), given a gate-well BEC occupying $\psi_0$ with an excited portion occupying $\psi_1$ and undergoing dipole oscillation at frequency $\omega_P$, the BEC couples the highest lying pair of energy eigenstates, $\psi_{22}$ and $\psi_{23}$. Therefore, as atoms occupying $\psi_{22}$ and $\psi_{23}$ collide with the oscillating BEC, stimulated emission and absorption of phonons with energy $\hbar\omega_p$ results in continuous Rabi flopping between the upper two energy eigenstates. It is from this continuous atom-BEC interaction (as a result of the BEC coupling the highest lying pair of states) that leads to a gain mechanism in the transistor oscillator model. The presence and effects of such gain mechanism emerges directly from the gate-well many-bodied Hamiltonian.

Figure 86:
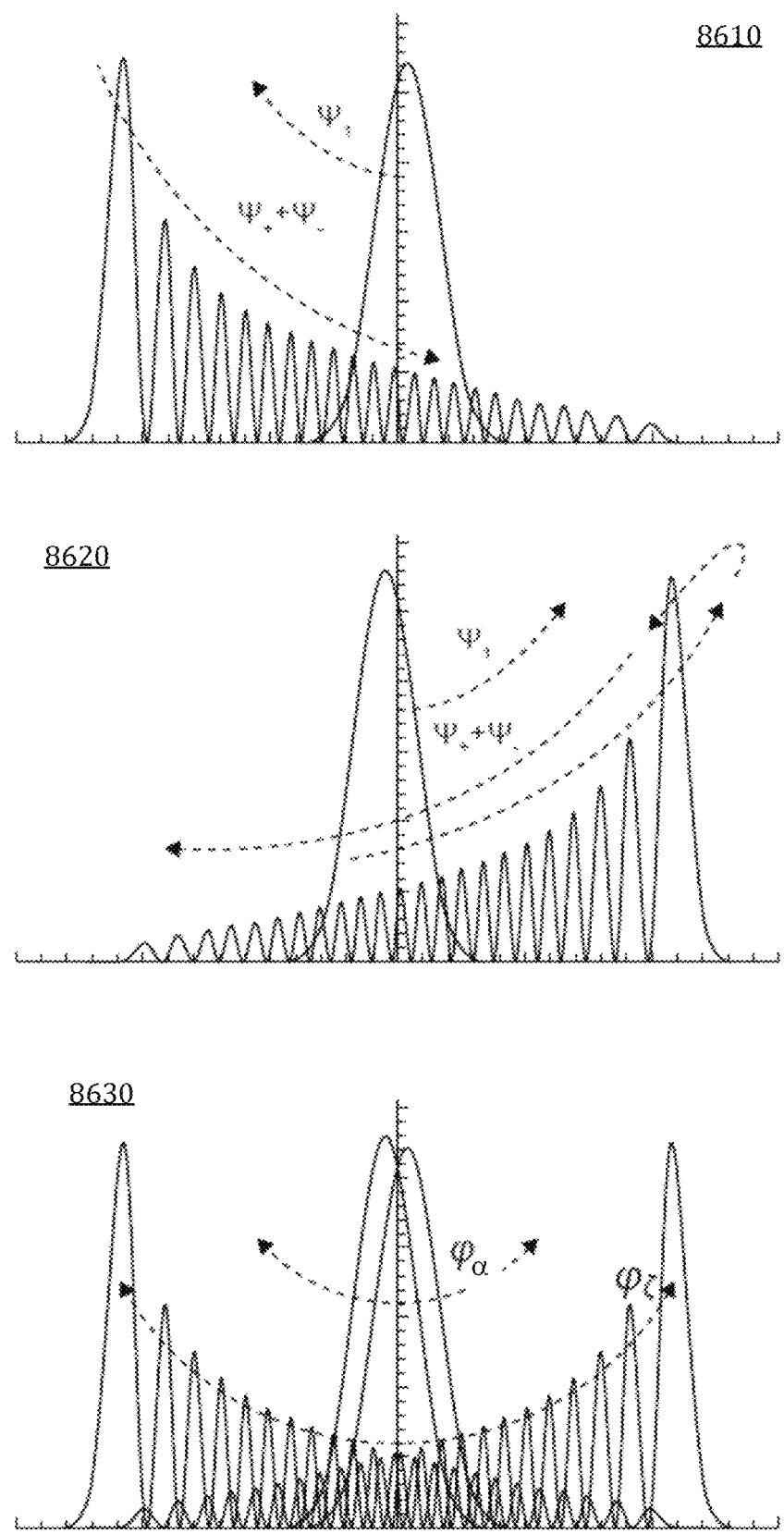
FIG. 86 (7.8) is a series of plots representing a time lapse of the matterwave superposition of normal modes occupying high-eigenvalue states and oscillating as well as the oscillating excited condensate occupying state.

Since the dipole oscillating BEC couples only the highest lying pair of energy eigenstates and is decoupled from any other transition, the quantized energy structure of the gate-well can be simplified by ignoring any intermediate energy eigenstates located in-between the lowest and highest lying pairs of states. That is, the model only considers states 0, 1, 22 and 23. Using this approximation, the gate well is reduced from 24 states to a four-level system. Accordingly, the pertinent energy eigenstates can be relabeled to $|0\rangle$, $|1\rangle$, $|2\rangle$ and $|3\rangle$, where the first two states ($|0\rangle$ and $|1\rangle$) are the ground and first excited states and the latter two states ($|2\rangle$ and $|3\rangle$) pertain to the highest lying pair of bound energy eigenstates in the gate well as shown in FIG. 86 (7.7). The respective corresponding energy eigenvalues are $E_0$, $E_1$, $E_2$, and $E_3$, where $$E_1-E_0=E_3-E_2=\hbar\omega_P \quad (109)(7.6)$$

In this reduced representation, as atoms transition between upper states $|2\rangle$ and $|3\rangle$ by colliding with the BEC, the excited condensate occupying $|1\rangle$ consequently gains (or loses) a phonon of energy $\hbar\omega_P$ by by absorbing (or depositing) a quanta of energy $\hbar\omega_P$ from (or into) $|0\rangle$. This is completely analogous to the Rahi model for two-level atoms interacting with a quantized electromagnetic field. Where the Rabi model features transitions between excited and ground electronic states $|e\rangle$ and $|g\rangle$ by absorbing (and emitting) photons from an oscillating electric field, the matter-wave transistor features similar transitions between upper harmonic oscillator states $|2\rangle$ and $|3\rangle$ by absorbing (and emitting) phonons from an oscillating BEC.

The intermediate eigenstates (3-21) of the gate-well may be ignored since omitting such states does not change the final results of the quantum model. Regardless of how many energy eigenstates make up the transistor oscillator gate-well, the model only requires a dipole oscillating BEC in the ground and first excited states to couple the highest lying pair of bound eigenstates and no other states. Whether the gate well has 24 states, 100 states, or 4 states, as long as this constraint is fulfilled, the gate-well many-bodied Hamiltonian, as well as the results of the model, will remain unchanged.

Figure 85:
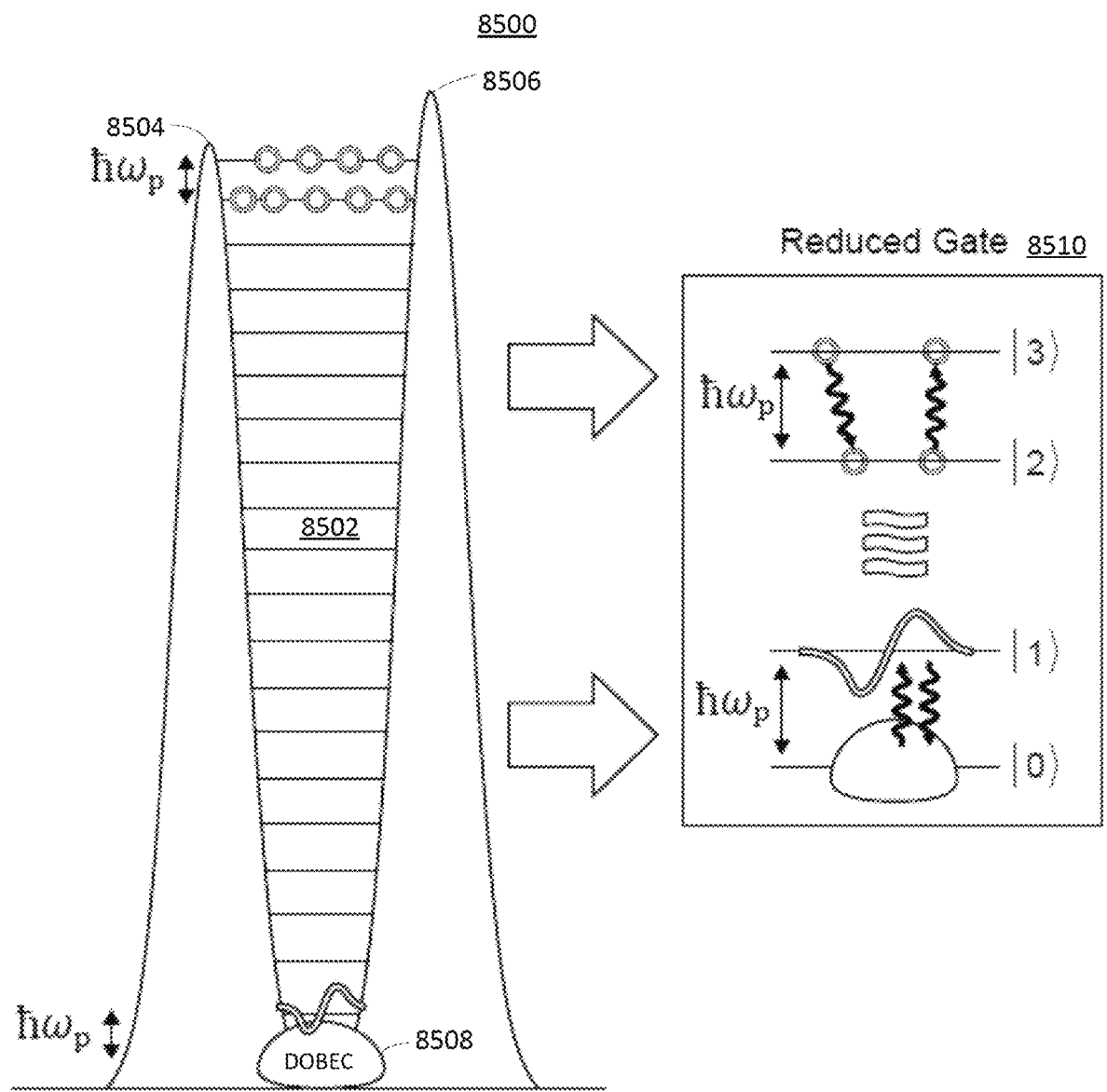
FIG. 85 (7.7) is a diagram showing the reduced representation of the transistor gate well where the system has been reduced from a 24-state to a 4-state system.

To explicitly show the emergence of a transistor oscillator gain mechanism in this model, the many-bodied Hamiltonian of the reduced gate-well confining a BEC undergoing dipole oscillation with frequency $\omega_p$ can be formulated. In FIG. 85, a gate well 8500 extends from a source-gate barrier 8504 to a gate-drain barrier 8506 and contains a DOBEC 8508. A reduced gate-well 8510, is shown in FIG. 85 as a closed system with four energy eigenstates $|0\rangle$, $|1\rangle$, $|2\rangle$ and $|3\rangle$, for which the many-bodied Hamiltonian takes the form $$H = \sum_{i,l=0}^{3} \langle i|\hbar\omega_i|l\rangle a_i^\dagger a_l + \frac{g}{2}\sum_{i,j,k,l=0}^{3} \langle ij|V|kl\rangle a_i^\dagger a_j^\dagger a_k a_l. \quad (110)(7.7)$$

where $\hbar\omega i$ is the single particle energy of gate well eigenstate $|1\rangle$ and where $a_i^\dagger$ and $a_i$ are the eigenstate's corresponding creation and annihilation operators. The factor of ½ in equation 7.7 prevents double counting of atom-BEC interactions. Since the quantum model uses harmonic oscillator eigenfunctions, the operators are defined in the number state basis as $$a_i|N_i\rangle = \sqrt{N_i}|N_i-1\rangle$$
$$a_i^\dagger|N_i\rangle = \sqrt{N_i+1}|N_i+1\rangle$$
$$[a_i,a_i^\dagger]=1$$
$$[a_i,a_j^\dagger]=0. \quad (111)(7.8)$$

Equation 7.8 shows the ground state annihilation and creation operators are $a_0|N_0\rangle = \sqrt{N_0}|N_0-1\rangle$ and $a_0^\dagger|N_0\rangle = \sqrt{N_0+1}|N_0+1\rangle$. However, if the BEC contains a large number of atoms, then $N_0 \approx N_0-1$ and reasonably approximate $a_0|N_0\rangle \approx \sqrt{N_0}|N_0\rangle$. Therefore, the result of this Bogoliubov approximation is to replace the ground state operators $a_0$ and $a_0^\dagger$ with the real $\sqrt{N_0}$.

The factor g in equation 110 (7.7) is the interaction energy between two low energy, long wavelength atoms with equal masses m, given as $$g = \frac{4\pi\hbar^2}{m}a \quad (112)(7.9)$$

where a is the s-wave scattering length of the colliding atoms. Finally, the inner product $\langle ij|V|kl\rangle$ is the overlap integral over four harmonic oscillator eigenfunctions (of equation 107 (7.4)).

$$\langle ij|V|kl\rangle = V_{ijkl} = \int \psi_i(x)\psi_j^*(x)\psi_k(x)\psi_l^*(x)dx \quad (113)(7.10)$$

giving the relative amplitude of a transition $a_i^\dagger a_j^\dagger a_k a_l$ between the normalized reduced gate well eigenstates $|I\rangle$, $|j\rangle$, $|k\rangle$ and $|I\rangle$. Using the definitions in equations 111 (7.8), 112 (7.9), and 113 (7.10), the first summation of equation 111(7.7) physically represents all energy contributions from individual gate atoms occupying eigenstates $|l\rangle$, $|j\rangle$, $|k\rangle$ and $|l\rangle$, while the second summation is energy contributions from atom-BEC collisions that result in transitions $a_i^\dagger a_j^\dagger a_k a_l$ between gate-well eigenstates.

Since the gate-well eigenstates are orthogonal, expanding the single-particle contributions to equation 111 (7.7) (H0) yields $$H_0 = \sum_{il}^{3}\langle i|\hbar\omega_i|l\rangle a_i^\dagger a_l = \sum_{il}^{3}\hbar\omega_i a_i^\dagger a_l \delta_{ij}$$
$$= \hbar\omega_0 a_0^\dagger a_0 + \hbar\omega_1 a_1^\dagger a_1 + \hbar\omega_2 a_2^\dagger a_2 + \hbar\omega_3 a_3^\dagger a_3 \quad (114)(7.11)$$

where $\delta_{ij}$ is the Kronecker delta. The model treats the BEC occupying state $|0\rangle$ of the gate-well as a macroscopic occupation of the gate-well ground state and accordingly uses the Bogoliubov approximation to state:

$$a_0 \approx \sqrt{N_0} \quad (115)(7.12)$$

where $N_0$ is the number of atoms in the ground state BEC. Using this approximation, equation 114 (7.11) can be expressed as $$H_0 = \hbar\omega_0 N_0 + \hbar\omega_1 a_1^\dagger a_1 + \hbar\omega_2 a_2^\dagger a_2 + \hbar\omega_3 a_3^\dagger a_3. \quad (116)(7.13)$$

From equation 110 (7.7), the summation for energy contributions due to atom-BEC collisions, given $$H = \frac{g}{2}\sum_{i,j,k,l=0}^{3}\langle ij|V|kl\rangle a_i^\dagger a_j^\dagger a_k a_l. \quad (117)(7.14)$$

is considerably larger than the summation for single particle energies (equation 7.11) and contains 256 terms when evaluated exactly. Thankfully, some helpful approximations can eliminate all but four of the terms without altering the results of the model. Justification for excluding certain collective sets of terms in the summation in equation 7.14 is provided as follows.

First, mean-field energy shifts are neglected. That is, terms in the summation containing factors of $a_i^\dagger a_i^\dagger a_i a_i$ or $a_i^\dagger a_i^\dagger a_k a_i$ are excluded from the model. Since mean-field shifts increase all gate-well energy levels equally, the shifts do not change the overall eigenstate layout of the gate-well and, more importantly, preserve the coupling between the highest pair of bound eigenstates via the oscillating condensate. Whether the mean-field energy shifts are included or not, the physics of the model remains unchanged. Accordingly, the model ignores the mean-field terms in equation 117 (7.14). Second, nonsensical transitions with the form $a_i^\dagger a_i^\dagger a_i a_j$ are ignored by the model. These represent meaningless transitions that are either unphysical such as $a_3^\dagger a_3^\dagger a_3 a_0$ or transitions that leave the system unchanged, such as $a_3^\dagger a_3 a_3 a_3^\dagger a_1^\dagger a_1 a_1$ $a_0^1$. Third, the rotating wave approximation is used to eliminate the terms $a_0^\dagger a_1^\dagger a_2 a_3$. These contributions in equation 117 (7.14) oscillate rapidly compared to the other terms and thus average approximately to zero. Fourth, the Bogoliubov approximation (equation 115 (7.12)) is once again used since the number of atoms occupying the ground state BEC is considered to be large.

Using the first two bullet points in the above described set of approximations, the Hamiltonian for atom-BEC collisions, which is now labeled the interaction Hamiltonian $H_{int}$, is reduced to $$H_{int} = \frac{g}{2}\sum_{ijkl}^{3}\langle ij|V|kl\rangle a_i^\dagger a_j^\dagger a_k a_l = \quad (118)(7.15)$$

-continued $$\frac{1}{2}V[a_0^\dagger a_1^\dagger a_2 a_3 + a_0^\dagger a_1^\dagger a_3 a_2 + a_1^\dagger a_0^\dagger a_2 a_3 + a_1^\dagger a_0^\dagger a_3 a_2 +$$
$$a_0^\dagger a_2^\dagger a_1 a_3 + a_0^\dagger a_2^\dagger a_3 a_1 + a_2^\dagger a_0^\dagger a_1 a_3 + a_2^\dagger a_0^\dagger a_3 a_1 +$$
$$a_0^\dagger a_3^\dagger a_2 a_1 + a_0^\dagger a_3^\dagger a_1 a_2 + a_3^\dagger a_0^\dagger a_1 a_2 + a_3^\dagger a_0^\dagger a_2 a_1 +$$
$$a_1^\dagger a_2^\dagger a_3 a_0 + a_1^\dagger a_2^\dagger a_0 a_3 + a_2^\dagger a_1^\dagger a_3 a_0 + a_2^\dagger a_1^\dagger a_0 a_3 +$$
$$a_1^\dagger a_3^\dagger a_0 a_2 + a_1^\dagger a_3^\dagger a_2 a_0 + a_3^\dagger a_1^\dagger a_2 a_0 + a_3^\dagger a_1^\dagger a_0 a_2 +$$
$$a_2^\dagger a_3^\dagger a_0 a_1 + a_2^\dagger a_3^\dagger a_1 a_0 + a_3^\dagger a_2^\dagger a_0 a_1 + a_3^\dagger a_2^\dagger a_1 a_0].$$

Using the commutation relations for creation and annihilation operators $[a_i^\dagger a_j^\dagger]=[a_i, a_j^\dagger]=\delta_{ij}$, equation 7.15 is further reduced to only six unique terms and is expressed as $$H_{int} = \frac{g}{2}\sum_{ijkl}^{3}\langle ij|V|kl\rangle a_i^\dagger a_j^\dagger a_k a_l = \quad (119)(7.16)$$
$$V[a_0^\dagger a_1^\dagger a_2 a_3 + a_0^\dagger a_1 a_2^\dagger a_3 + a_0^\dagger a_1 a_3^\dagger a_2 +$$
$$a_1^\dagger a_0 a_2^\dagger a_3 + a_1^\dagger a_0 a_3^\dagger a_2 + a_0 a_1 a_2^\dagger a_3^\dagger].$$

Finally, using the third and fourth of approximations, the rotating wave and Bogoliubov approximations reduce the interaction Hamiltonian to its most condensed form in the harmonic oscillator basis:

$$H_{int} = \frac{g}{2}\sum_{ijkl}^{3}\langle ij|V|kl\rangle a_i^\dagger a_j^\dagger a_k a_l \quad (120)(7.17)$$
$$= gV\sqrt{N_0}\left(a_1[a_2^\dagger a_3 + a_3^\dagger a_2] + a_1^\dagger[a_2^\dagger a_3 + a_3^\dagger a_2]\right)$$
$$= gV\sqrt{N_0}\left(a_1 + a_1^\dagger\right)(a_2^\dagger a_3 + a_3^\dagger a_2).$$

The Hamiltonians H0 (equation 116 (7.13)) and Hit (equation 120 (7.17)) for single-particle and atom-BEC contributions to the gate well many-bodied Hamiltonian are expressed in the harmonic oscillator (or number) basis. Considering that the dipole oscillating BEC couples upper states |2⟩ and |3⟩, the reduced gate-well (shown in FIG. 86 (7.7)) is a coupled harmonic oscillator and it proves to be much more illuminating to express the many-bodied Hamiltonian in a basis where the symmetric and antisymmetric normal modes of the reduced gate-well are the energy eigenstates. This new "normal mode" basis, has orthogonal basis states $$|+\rangle = \frac{1}{\sqrt{2}}(|2\rangle + |3\rangle) \quad (121a)(7.18a)$$

$$|-\rangle = \frac{i}{\sqrt{2}}(|2\rangle - |3\rangle) \quad (121b)(7.18b)$$

where |+⟩ and |−⟩ are the symmetric and antisymmetric normal modes, respectively. (The normal mode basis, with eigenstates |+⟩ and |−⟩, is simply a 2D vector space rotated $\theta=\pi/4$ from the original |2⟩ and |3⟩ basis states.) Additionally, in the normal mode basis, the oscillating, excited portion of the gate-well condensate that occupies |1⟩ is described as a coherent state |α⟩ with magnitude |α|.

When using matrix notation, the symmetric and antisymmetric modes given in equations 7.18a and 7.18b are defined as $$|+\rangle = \begin{pmatrix}1\\0\end{pmatrix}, |-\rangle = \begin{pmatrix}0\\1\end{pmatrix}. \quad (122)(7.19)$$

To convert $H_0$ (equation 116 (7.13)) and $H_{int}$ (equation 120 (7.17)) into the normal mode basis, the following symmetric and antisymmetric operator transformations are introduced:

$$a_+ \equiv \frac{1}{\sqrt{2}}(a_3 + a_2) \quad (123a)(7.20a)$$

$$a_- \equiv \frac{i}{\sqrt{2}}(a_3 - a_2) \quad (123b)(7.20a)$$

$$a \equiv a_1. \quad (123c)(7.20c)$$

Applying the operator transformations 123a, 123b, and 123c (7.20a, 7.20b, and 7.20c) to equation 116 (7.13) outputs $$H_0 = \sum_{il}^{3}\langle i|\hbar\omega_i|l\rangle a_i^\dagger a_l \quad (124)(7.21)$$
$$= \hbar\omega_0 N_0 + \hbar\omega_1 a^\dagger a + \frac{\hbar\omega_2}{2}(a_+^\dagger - ia_-^\dagger)(a_+ + ia_-) +$$
$$\frac{\hbar\omega_3}{2}(a_+^\dagger + ia_-^\dagger)(a_+ - ia_-)$$

and applying the operator transforms to equation 120 (7.17) produces $$H_{int} = \frac{g}{2}\sum_{ijkl}^{3}\langle ij|V|kt\rangle a_i^\dagger a_j^\dagger a_k a_l \quad (125)(7.22)$$
$$= gV\sqrt{N_0}\{a[a_+^\dagger a_+ - a_-^\dagger a_-] + a^\dagger[a_+^\dagger a_+ - a_-^\dagger a_-]\}$$
$$= gV\sqrt{N_0}\{(a + a^\dagger)(a_+^\dagger a_-)\}.$$

Combining equations 124 (7.21) and 125 (7.22) gives the many-bodied Hamiltonian for the reduced gate-well in the normal mode basis:

$$H = H_0 + H_{int} = \quad (126)(7.23)$$
$$\hbar\omega_0 N_0 + \hbar\omega_1 a^\dagger a + \frac{\hbar\omega_2}{2}(a_+^\dagger - ia_-^\dagger)(a_+ + ia_-) +$$
$$\frac{\hbar\omega_3}{2}(a_+^\dagger + ia_-^\dagger)(a_+ - ia_-) +$$
$$gV\sqrt{N_0}\{(a + a^\dagger)(a_+^\dagger a_+ - a_-^\dagger a_-)\}.$$

Equation 7.23 can be simplified further by using the following identities:

$$a_+^\dagger a_+ = |+\rangle\langle+| \quad (127a)(7.24a)$$

$$a_-^\dagger a_- = |-\rangle\langle-| \quad (127b)(7.24b)$$

$$(a_+^\dagger \pm ia_+^\dagger)(a_+ \mp ia_-) = 1 \pm \sigma_2 \quad (127c)(7.24c)$$

$$(a+a^\dagger)(a_+^\dagger a_+ - a_-^\dagger a_-) = (a=a^\dagger)\sigma_3 \quad (127d)(7.24d)$$

where 1 is the identity matrix, $\sigma_2$ is the Pauli y-matrix, and $\sigma_3$ is the Pauli z-matrix defined as $$1 = \begin{pmatrix} 1 & 0 \\ 0 & 1 \end{pmatrix}, \sigma_2 = \begin{pmatrix} 0 & -i \\ i & 0 \end{pmatrix}, \sigma_3 = \begin{pmatrix} 1 & 0 \\ 0 & -1 \end{pmatrix}. \quad (128)(7.25)$$

Plugging equations 127a-127d (7.24a-7.24d) into equation 126 (7.23) and simplifying gives the many-bodied Hamiltonian for the reduced gate-well in the normal mode basis as $$H = H_0 + H_{int} \quad (129)(7.26)$$

$$= \hbar\omega_0 N_0 + \hbar\omega_1 a^\dagger a + \frac{\hbar}{2}(\omega_2 + \omega_3)\mathbf{1} -$$

$$\frac{\hbar}{2}(\omega_3 - \omega_2)\sigma_2 + gV\sqrt{N_0}\,(a + a^\dagger)\sigma_3.$$

Figure 88:
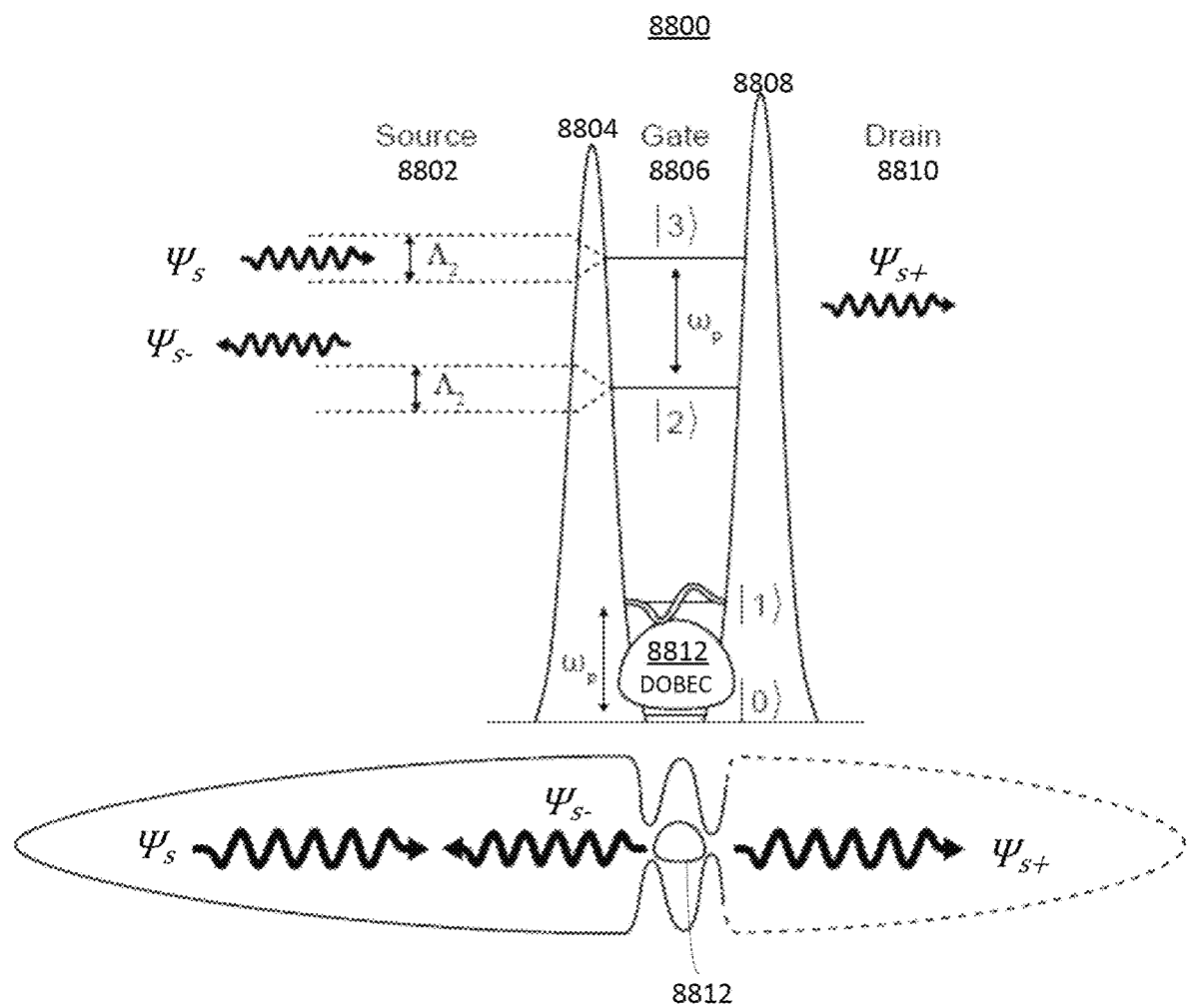
FIG. 88 (7.10) includes an upper diagram showing how the presence of a dipole oscillating Bose-Einstein Condensate (DOBEC) in the transistor gate well that specifically couples the highest lying pair of bound gate-well energy eigenstates broadens the gate-well resonant tunneling bandwidths by introducing the interaction Hamiltonian and a lower diagram showing a matter-wave flow that results from the interaction with the DOBEC.

Since the normal modes $|+\rangle$i and $|-\rangle$ are orthogonal and complete, matter-waves can be treated as occupying the reduced, coupled gate-well as a linear combination of normal modes:

$$\Psi_G(x) = \frac{1}{\sqrt{2}}[A_+|+\rangle + A_-|-\rangle] \quad (130)(7.27)$$

where $A_\pm$ are the probability amplitudes for the $|\pm\rangle$ modes, there exists matter-wave interference between the constituent (and simultaneously occupying) $|+\rangle$ and $|-\rangle$ modes. As a result, the total wave function in the gate-well has a beat note that oscillates with a relative phase $\phi_\xi$. This phase described here is a relative phase defined with respect to some reference in the gate well, such as the ground state BEC occupying $|0\rangle$. An example of the superposition of gate well normal modes, as well as the relative phase, is shown in FIG. 88 (7.8), which is a series of three plots 8702, 8704, and 8706 showing a time lapse of the matter-wave superposition of normal modes $\omega_+ + \psi_-$ occupying states $\psi_2$ and $\psi_3$ and oscillating with a phase $\phi_\xi$ as well as the excited condensate occupying state $\psi_1$ and oscillating with a phase $\psi_\alpha$. The phase $\varphi$ used for determining the eigenvalue of the interaction Hamiltonian is the difference of these phases, given as $\varphi = \phi_\xi - \phi_\alpha$.

The amplitude of the atom-BEC interaction Hamiltonian, $gV\sqrt{N_0}$, gains a phase dependence and can be expressed as a complex valued function $\xi$ as $$\xi = gV\sqrt{N_0}\,e^{i\phi_\xi} \quad (131)(7.28)$$

Using equation 131 (7.28) in equation 129 (7.26), the entire gate-well many-bodied Hamiltonian can be expressed in the normal mode basis as a sum of a free space term $H_0$, a condensate term $H_c$, and the atom-BEC interaction term $H_{int}$ as $$H_G = H_0 + H_c + H_{int} \quad (132)(7.29)$$

$$= \underbrace{\hbar\varpi - \frac{1}{2}\hbar\omega_p\sigma_2}_{\text{free space}} + \underbrace{\hbar\omega_0 N_0 + \hbar\omega_p a^\dagger a}_{\text{condensate}} +$$

$$\underbrace{(\zeta^* a + \zeta a^\dagger)\sigma_3}_{\text{interaction}}$$

where $\overline{\omega} = (w_2 + w_3)/2$ and $\omega_p = \omega_3 - \omega_2$ is the phonon frequency.

Other than a change of basis and the fixed condensate energy, equation 132 (7.29) is identical to the Rabi Hamiltonian for a two-level atom interacting with an electromagnetic field. Similar to the Rabi Hamiltonian, in the gate-well free space Hamiltonian component $H_0$ derived in equation 132 (7.29), the $\sigma_2$ term represents spontaneous emission: $H_{se} = (\omega_3 - \omega_2)\sigma_2\hbar/2$ and couples states of opposite symmetric or anti-symmetric parity. Where the Rabi Hamiltonian has electronic states interacting with photons, the gate-well Hamiltonian HG involves center-of-mass states (meaning the symmetric and antisymmetric normal modes) interacting with phonons.

As shown in equation 7.29, the atom-BEC interaction Hamiltonian expressed in the normal mode basis is $$H_{int}(\xi^* a + \xi a^\dagger)\sigma_3 \quad (133)(7.30)$$

Eigenstates of the interaction Hamiltonian are $|\alpha, \pm\rangle = |\alpha\rangle \otimes |\pm\rangle$, where $|\alpha\rangle$ is a coherent state with magnitude $|\alpha|$, and $|\pm\rangle$ are the symmetric and antisymmetric normal modes of the gate-well. The corresponding eigenvalues $E_{int}$ of the interaction Hamiltonian are $$E_{int} = \langle \alpha, \pm | H_{int} | \alpha, \pm\rangle \quad (134)(7.31)$$

$$= \pm(\zeta^*\alpha + \zeta\alpha^*)$$

$$= \pm 2|\zeta||\alpha|\cos(\phi_\zeta - \phi_\alpha)$$

$$= \pm 2|\zeta\alpha|\cos\varphi$$

where $\varphi$ is the relative phase difference between $\phi_\xi$, the phase of the matter-wave interference of the gate-well normal modes, and $\phi_\alpha$, the phase of the gate-well dipole oscillating BEC. Therefore, the physical interpretation of $\varphi = \phi_\xi - \phi_\alpha$ is that it represents the phase of a difference of phases. The oscillating condensate and matter-wave interference are shown relative to each other in FIG. 85 (7.8) in order to conceptualize the phases $\phi_\alpha$, and $\varphi$. It immediately follows from the domain of equation 134 (7.31) that the eigenvalues of the interaction Hamiltonian take on a range of values depending on the relative phase $\varphi$:

$$-2|\xi\alpha| \leq E_{int} \leq +2|\xi\alpha| \quad (135)(7.32)$$

The interaction energy eigenvalue in equation 7.31 can be written in a more complete form by taking the expressions for g (equation 48 (2.41)) and V (equation 113 (7.10)) and plugging them into the expression for $\xi$ (equation 131 (7.28)), giving $$\zeta = \sqrt{N_0}\left(\frac{4\pi\hbar^2}{m}\frac{a}{v}\right)e^{i\phi}\int_{-\infty}^{\infty}\psi_0^*(x)\psi_1(x)\psi_2^*(x)\psi_3(x)dx. \quad (136)(7.33)$$

Additionally, since the dipole oscillating BEC occupying $|1\rangle$ is described as a coherent state $|\alpha\rangle$ the definition of the coherent state magnitude can be used to write $$|\alpha| = \sqrt{N_0} \quad (137)(7.34)$$

Taking the results of equation 136 (7.33) and 137 (7.34) and inserting them into equation 134 (7.31) yields a complete expression for the eigenvalue of the interaction Hamiltonian $H_{int}$ in the normal mode basis:

$$\langle \alpha, \pm |H_{int}|\alpha, \pm \rangle = \pm 2|\zeta\alpha|\cos\varphi \qquad (138)(7.35)$$

$$= \pm 2\sqrt{N_0 N_1}\left(\frac{4\pi\hbar^2}{m}\frac{a}{v}\right)$$

$$\left(\int_{-\infty}^{\infty}\psi_0^*(x)\psi_1(x)\psi_2^*(x)\psi_3(x)dx\right)\cos\varphi.$$

The gain mechanism of the matter-wave transistor oscillator can be understood by comparing the flow of a matter-wave current resonantly tunneling from the source-well, through the gate-well, and into the drain-well in two different cases: 1) when no dipole oscillating BEC occupies the transistor gate-well; that is when the gate-well is "empty" and $H_{int}=0$; and 2) when a dipole oscillating BEC occupies the gate-well and couples high lying gate-well eigenstates; that is when $H_{int}\neq 0$.

A greater flux of source-well matter-waves flows via resonant tunneling through the gate-well and into the drain-well when a dipole oscillating BEC occupies the gate (when $H_{int}\neq 0$) as opposed to when the gate has no such BEC (when $H_{int}=0$). As a result, a greater matter-wave probability amplitude exists in the transistor drain-well when the interaction potential $H_{int}$ is present compared to when it is missing from the system, thus the interaction potential $H_{int}$ qualifies as a matterwave gain mechanism.

Consider the triple-well transistor potential with an "empty" gate, that is, no oscillating BEC present in the gate-well. As a source-well matterwaves flows through the gate-well, it's probability amplitude in the drain-well is a function of the transmission coefficients of the gate-well. Such transmission coefficients are calculated for our specific gate-well potential by utilizing a numerical technique called the general impedance method, which cleverly formulates an equivalence between matterwaves tunneling through the gate-well (whose solutions are governed by the 1D time-independent Schrödinger equation) and electromagnetic waves propagating through transmission line junctions (whose solutions are governed by transmission line theory from classical electrodynamics). The general impedance method is capable of calculating transmission coefficients for arbitrary potential barriers in quantum systems, making it useful for determining transmission properties of the asymmetric, double Gaussian gate-well for the atomtronic transistor.

FIG. 86 (7.9) includes plots 8610, 8620, and 8630 showing a time lapse of a matterwave superposition of normal modes $\psi_+ + \psi_-$ occupying states $\psi_2+\psi_3$ and oscillating with a phase $\phi_g$ as well as the excited condensate occupying state $\psi_1$ and oscillating with a phase $\phi_\alpha$. The phase $\varphi$ used for determining the eigenvalue of the interaction Hamiltonian is the difference of these phases, given as $\varphi=\phi_g-\phi_\alpha$.

Figure 87:
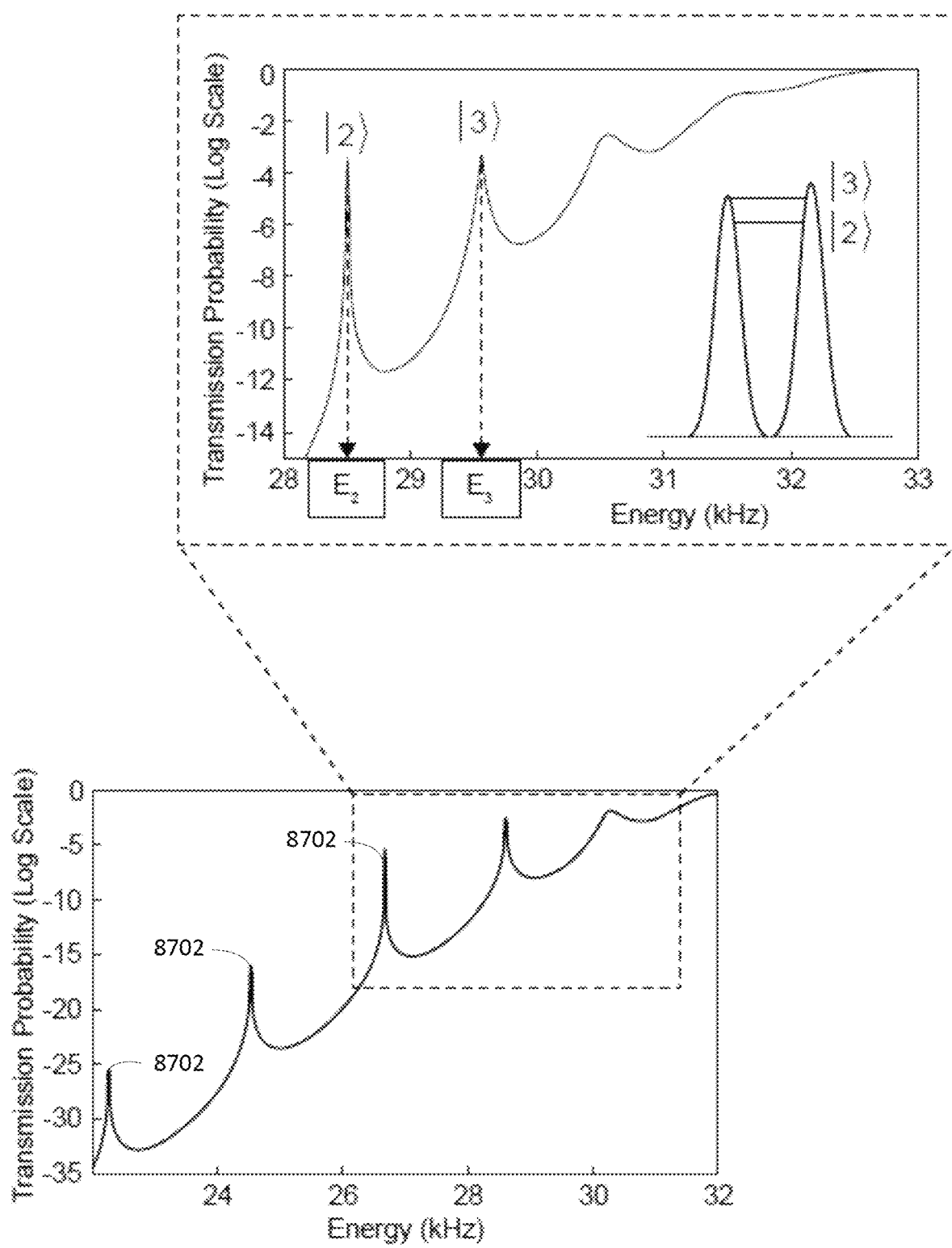
FIG. 87 (7.9) is a plot of transition probability versus energy for certain gate-well eigenstates.

Examination of the transmission spectrum, FIG. 87, reveals that sharp resonances 8702 in the gate-well tunneling probability occur when the energy of incident source-well matterwave coincides with an energy eigenstate of the gate-well. This transmission behavior is synonymous with Fabry-Perot resonators, resonant tunneling diodes, and other systems that feature maximum transition when incident fields match resonance boundary conditions.

Using the reduced gate-well nomenclature, when incident source-well matterwaves match a gate-well resonance boundary condition by having energy $E_2$ or $E_3$, the matterwaves couple into the gate-well and resonate in the gate-well, followed by subsequent tunneling into the drain-well with probability $\tau_2\approx 10^{-4}$ or $\tau_3\approx 10^{-4}$, respectively. Slight deviations from these transmission resonances (by having an energy E just off-resonance from $E_2$ or $E_3$) results in a substantial decrease in matterwave probability amplitudes in the drain well. Consequently, for the case of no BEC in the gate well: the resulting observable effect is that an appreciable atom flux $\Phi$ flows into the drain-well only when source-well atoms are initially prepared to match a gate-well eigenstate.

With the presence of the BEC, the atom-BEC interaction Hamiltonian $H_{int}$ (equation 133 (7.30)) must be included in the gate-well many bodied Hamiltonian. By including $H_{int}$, the matterwave current (an atom flux) flowing from source to drain increases. To understand why the current is increased, consider a single matterwave $\psi s(x,t)$ with frequency $\omega_s$ originating in the source-well and whose energy does not coincide with a gate-well eigenstate; that is $\omega_s\neq\omega_2\neq\omega_3$. The model treats the source-well matterwaves as plane wave solutions (equation 106 (7.3)). The model operates in the normal mode basis and additionally, treats the source-well matterwave as a linear combination of the gate-well symmetric $s_+(x,t)$ and antisymmetric $\psi_{s-}(x,t)$ normal modes:

$$\psi_s(x,t)=A_+\psi_{s+}(x,t)+A_-\psi_{s-}(x,t) \qquad (139)(7.36)$$

with amplitudes A+ and A (and s denotes a source-well quantity). Using the definitions for the symmetric and antisymmetric modes (equation 7.18a and 7.18b) produces expressions for $\psi_{s+}(x,t)$ and $\omega_{s-}(x,t)$ as $$\psi_{s+}(x, t) = \frac{1}{\sqrt{2}}[\psi_{s3}(x, t) + \psi_{s2}(x, t)] \qquad (140a)(7.37a)$$

$$= A_{s+}(x, t)e^{i(k_s x - \omega_s t)}\cos\left(\frac{\omega_p}{2}t + \varphi\right)$$

$$\psi_{s-}(x, t) = \frac{1}{\sqrt{2}}[\psi_{s3}(x, t) - \psi_{s2}(x, t)] \qquad (140b)(7.37b)$$

$$= A_{s-}(x, t)e^{i(k_s x - \omega_s t)}\cos\left(\frac{\omega_p}{2}t + \varphi\right)$$

with wavenumber $k_s$ and frequency $\omega_s$. Since the symmetric (equation 140a (7.37a)) and antisymmetric (equation 140b (7.37b)) components of $\psi_s(x,t)$ are sinusoids that are offset by $\pi/2$ radians, they are characterized as the in-phase and quadrature components of the source-well matterwave, respectively.

Using the above source-well matterwave definitions, when $\psi_s(x,t)$ penetrates the SG barrier and enters the gate-well, the atom-BEC interaction, described by Hine, occurs. For the incoming wave $\psi_s(x,t)$ to simultaneously match the gate-well boundary conditions and conserve energy, the wave must deposit energy into, or absorb energy from the atom-BEC interaction energy. The energy shift $\Delta E$ imparted by the atom-BEC interaction is calculated in equation 134 (7.31) as $\Delta E=\pm 2|\xi\alpha|\cos\varphi$ where the sign of the energy shift is positive for the symmetric component $\psi_{s+}(x,t)$ and negative for the antisymmetric component $\psi_{s-}(x,t)$. It follows that for an initially off-resonant matterwave $\psi_s(x,t)$ with frequency $\omega s$ to match a gate-well eigenstate with frequency $\omega_g$ and satisfy gate-well resonance boundary conditions, the atom-BEC interaction must change the incoming wave energy by $\Delta=\hbar\ \omega_s-\omega_g$. Using equation 134 (7.31), this energy shift defines an in-phase condition $$\varphi = -\cos\left(\frac{\omega_g - \omega_s}{2|\zeta\alpha|}\right) \tag{141}(7.38)$$

whereby, if satisfied, the in-phase, symmetric component $\psi_{s+}(x,t)$ (equation 140a (7.37a)) is shifted onto a gate-well eigenstate and couples into the gate-well, while the quadrature, antisymmetric component $\psi_{s-}(x,t)$ (equation 7.37b) is completely reflected since $\psi_{s-}(x,t)$ is shifted even further from the gate-well resonance. Note, one could, without changing the model results, define instead a quadrature condition of $$\varphi = -\cos\left(\frac{\omega_g - \omega_s}{2|\zeta\alpha|} + \frac{\pi}{2}\right) = \sin\left(\frac{\omega_g - \omega_s}{2|\zeta\alpha|}\right) \tag{142}$$

whereby, if satisfied, the antisymmetric component $\psi_{s-}(x,t)$ couples into the gate with the in-phase, symmetric component being reflected.

The domain of equation 141 (7.38) reveals that the range of source-well matterwave frequencies $\psi_s$ that may be shifted onto a gate-well resonance with frequency $\omega_g$ via the atom-BEC interaction is given by $$\omega_g - 2\left(\frac{|\zeta\alpha|}{\hbar}\right) \le \omega_s \le \omega_g + 2\left(\frac{|\zeta\alpha|}{\hbar}\right) \tag{143}(7.39)$$

which indicates the interaction Hamiltonian broadens the gate-well resonant tunneling bandwidths A from the very narrow peaks shown at the left in in FIG. 87 to the wider bands $$\Lambda_2 = \omega_2 \pm 2\left(\frac{|\zeta\alpha|}{\hbar}\right) \tag{144a}(7.40a)$$

$$\Lambda_3 = \omega_3 \pm 2\left(\frac{|\zeta\alpha|}{\hbar}\right) \tag{144b}(7.40b)$$

where subscripts 2 and 3 correspond to the resonant frequencies $\omega_2$ or $\omega_3$ of gate-well eigenstates $|2\rangle$ and $|3\rangle$, respectively.

The result of equations 144a and 144b are shown pictorially in FIG. 88 (7.10). The upper portion of FIG. 89 is a diagram showing how the presence of a DOBEC in the transistor gate well that specifically couples the highest lying pair of bound gate-well energy eigenstates broadens the gate-well resonant tunneling bandwidths by introducing the interaction Hamiltonian, $H_{int}$(equation 133 (7.30)). The resonant tunneling bandwidths are broadened from a very narrow transmission resonance (as shown in FIG. 87), to a wider band $\Lambda_2$ and $\Lambda_3$ (given in equation 144a (7.40a) and equation 144b (7.40b)). Referring to the lower portion of FIG. 88, as a result of the interaction Hamiltonian, a source-well matterwave $\psi_s$, initially off-resonance from a gate-well eigenstate, enters the gate-well, the interaction Hamiltonian permits the atom to exchange energy with the dipole oscillating BEC in order to match gate-well resonant boundary conditions while conserving energy. Consequently, the symmetric mode $\psi_{s+}$ couples into the gate-well with subsequent flow into the drain while the antisymmetric mode $\omega_{s-}$ is reflected with probability unity. The net effect is the interaction potential has permitted a matterwave to resonantly tunnel through the gate well and into the drain with considerably greater probability than if the interaction potential was missing.

From equations 144a (7.40a) and 144b (7.40b), it is apparent that the resonant tunneling bandwidth is controlled by the magnitude $|\xi\alpha|$, which is a tunable parameter in the sense that the larger the gate-well condensate, the greater the magnitude of $|\xi\alpha|$, and hence a larger interaction potential $H_{int}$, which results in broader resonant tunneling bandwidths $\Lambda_2$ and $\Lambda_3$.

By comparing the matterwave flux with and without a gate-well BEC, it is apparent that there is a matterwave gain mechanism for the transistor oscillator. Compared to when no BEC is present in the gate-well, the atom-BEC interaction $H_{int}$ increases the range of matterwaves that may couple into the gate well with subsequent resonant tunneling out to the drain well. The gain mechanism thus amplifies the matterwave probability density in the drain-well, which results in the observable effect of intensifying the atom flux tunneling into the drain-well when a gate well BEC is present compared to when it is absent.

Since each of the symmetric and antisymmetric components $\psi_{s+}(x,t)$ and $\psi_{s-}(x,t)$ constitute fractions $|A_+|^2$ and $|A_-|^2$ of the total wavefunction $\psi_s(x,t)$, thus, given a gate-well dipole oscillating BEC described by $|\alpha\rangle$ with magnitude $|\alpha|^2$ that couples gate-well eigenstates $|2\rangle$ and $|3\rangle$, if a source-well matterwave with frequency $\psi_s$ is within either frequency bands $\Lambda_2$ or $\Lambda_3$, then the symmetric component $\psi_{s+}(x,t)$ is transmitted through the gate-well $100 \times |A_+|^2$ percent of the time with probability $\tau_2$ or $\tau_3$, respectively. The remaining fraction is reflected with certainty.

The physics in the transistor oscillator model draws very similar comparisons to the cold atom micromaser, where a slow, excited-state atom approaching a microwave cavity is randomly reflected from or transmitted through with 50% probability. This behavior occurs due to a coherent interaction between a quantized field of microwave photons and two-level atoms, which creates a potential barrier that reflects one component of the atom wave function with certainty and transmits the other component with probability close to unity. In the micromaser case, since each of the components constitutes half of the wave function, about half of the atoms are transmitted through the maser cavity with the other half reflected. The matterwave transistor oscillator is analogous, except that it additionally demands resonant tunneling for transmission.

Figure 89A:
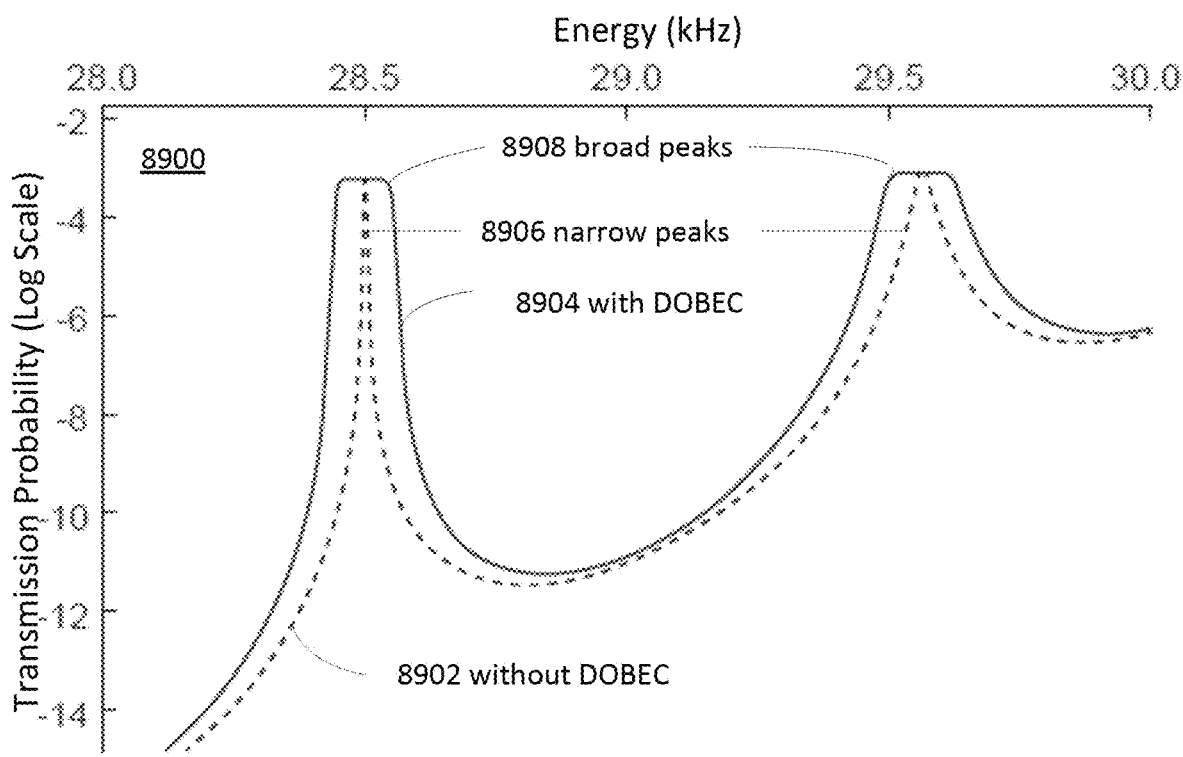
FIG. 89A (7.11a) is a plot showing the gate-well resonant tunneling transmission probability for the case, described above, without the DOBEC.
Figure 89B:
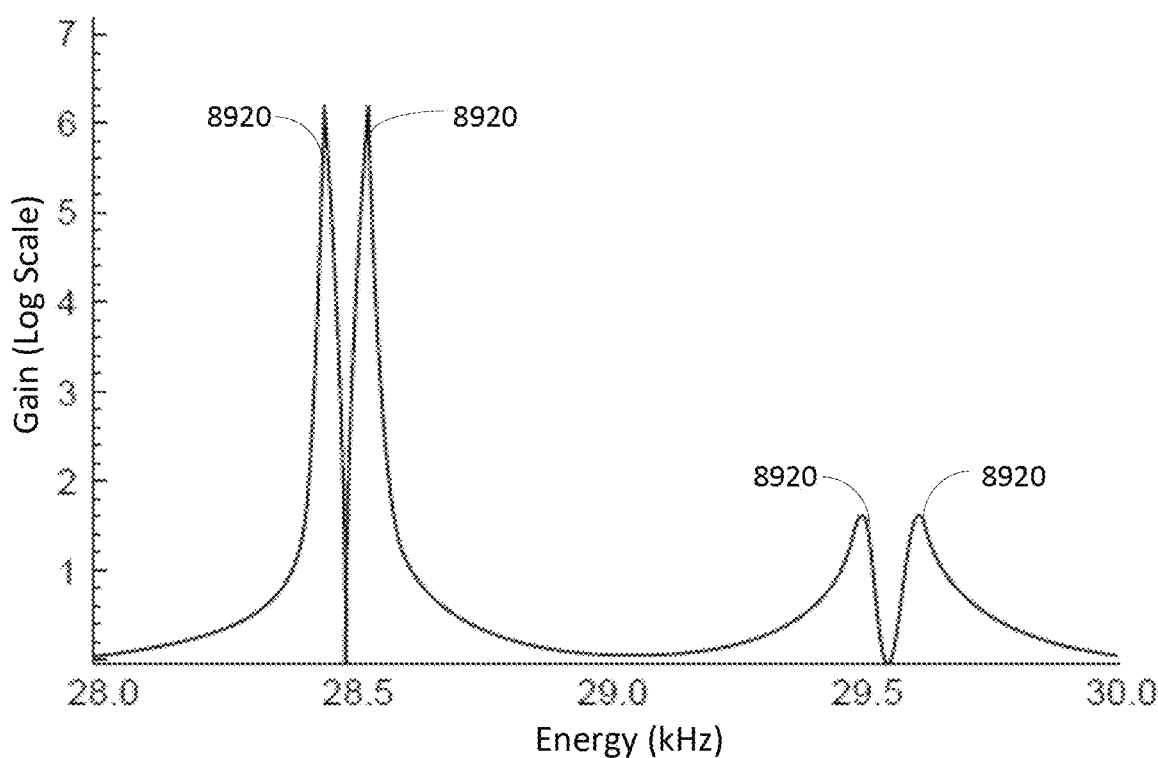
FIG. 89B (7.11b) is a plot of the ratio of matterwave resonant tunneling transmission curves when the DOBEC is present to when the DOBEC is absent.

Finally, as an example to characterize the gain mechanism, the general impedance method is used to numerically calculate the gate-well transmission spectrum when a dipole oscillating BEC (described as a coherent state $|0\rangle$) with $N_0 = 20,000$ atoms occupies the ground state $|0\rangle$ and $N_1 = |\alpha|^2 = 5$ atoms occupies the first excited state $|1\rangle$ of the gate-well. The transmission spectrum for this specific case is shown in FIG. 89A (7.11a) and is compared to the transmission spectrum for the exact same gate well, but without a BEC present. FIG. 89A is a plot 8900 showing the gate-well resonant tunneling transmission probability for the case, described above, without the DOBEC 8902 and interaction potential (dashed line) and when a DOBEC occupies the gate-well 8904 with $H_{int} \ne 0$ (solid line). Advantageously, the resonant peaks for the with DOBEC case 8908 are broader than the resonant peaks for the case 8906 without DOBEC so that the probability of tunneling through barriers is greater with a DOBEC resident in the gate well. The resulting gain is plotted in FIG. 89B, the peaks 8920 of which represent energies of atoms that can tunnel when a DOBEC is present that could not when no DOBEC is present in the gate well.

With the DOBEC coupling upper states |2⟩ and |3⟩, the atom-BEC interaction potential described by $H_{int}$ (equation 133 (7.30)) broadens the resonant transmission peaks by $\Lambda_2=\Lambda_3=150$ Hz (equations 144A and 144B (7.40a and 7.40b). To approximate the gain of the transistor oscillator in this example, the ratio of matterwave transmission curves when the BEC is present to when the BEC is absent is plotted in FIG. 89B (7.11b), which is a plot of gain as a function of energy, that is, the ratio of matterwave resonant tunneling transmission curves when the BEC is present to when the BEC is absent. The gain plot shows that with the DOBEC coupling upper states |2⟩ and |3⟩, matterwaves have their transmission probabilities increased by the interaction potential from as low as $\tau_0 \approx 10^{-12}$ (in the empty-gate well case) to $\tau \approx 10^{-3}$ (when the gate-well DOBEC is present), which subsequently increases matterwave current flowing from source to drain, giving a gain G>1.

A finite temperature $^7$Rb Bose-Einstein condensate of approximately $7*10^3$ atoms at a temperature of 50 nanoKelvin (nK) serves as the atom ensemble used to source the transistor oscillator system. The BEC is formed using an atom chip in the Atomtronics Double MOT UHV of FIG. 24 (3.5).

Figure 90:
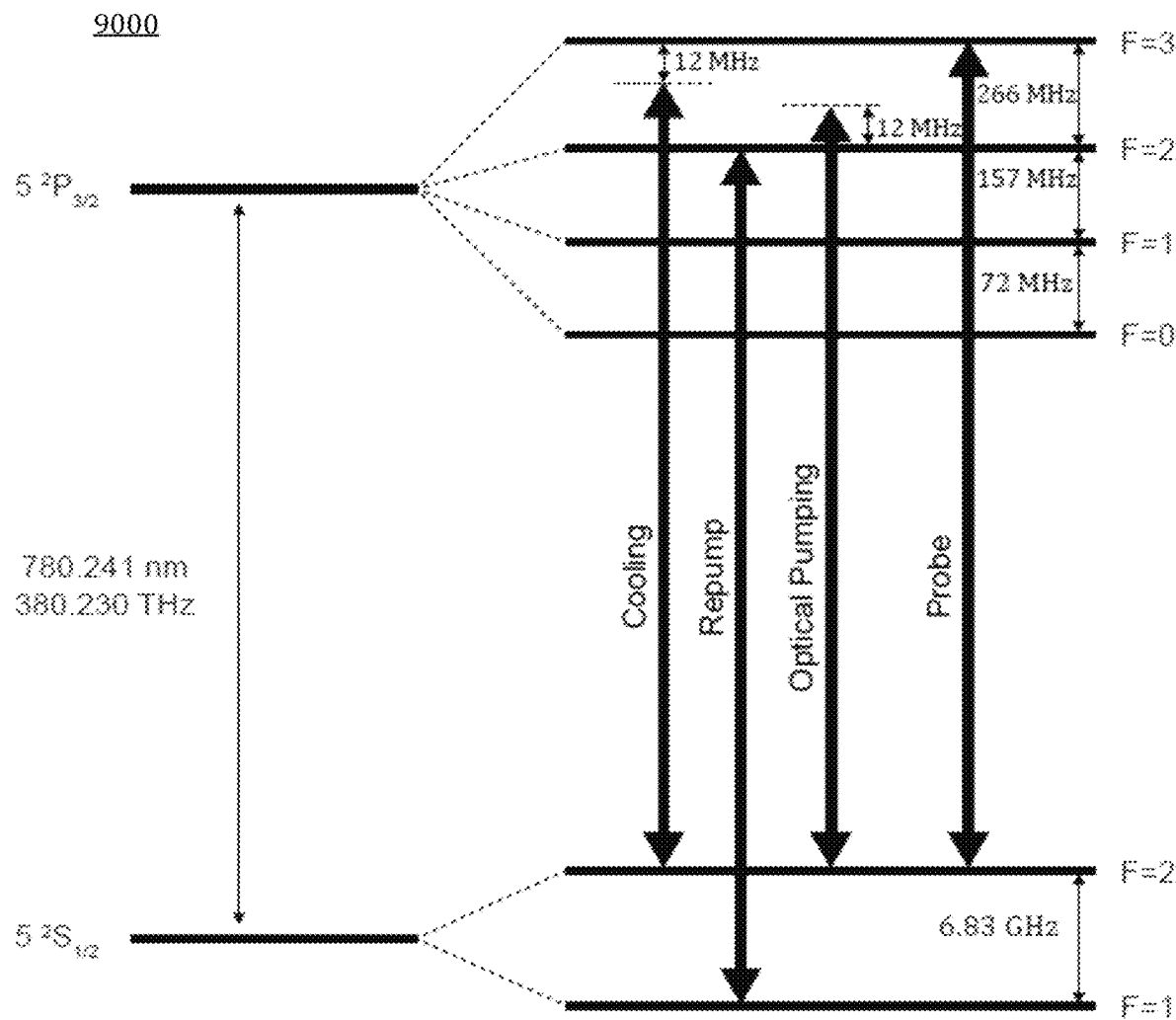
FIG. 90 (8.2) is a diagram showing transitions for 780 nm cooling, repump, optical pumping and probe lasers.

A summary 9000 of all laser cooling, repump, optical pumping, and probe transitions are shown in FIG. 90 and the specific 780 nm laser setup used to produce a BEC is shown in FIGS. 91-95. Note that all rubidium transitions in these figures refer to the D2 line. With respect to the cooling, repump, and optical pumping setups, each features a JILA made 3-master external cavity diode laser (ECDL) that is used to injection lock a slave laser.

Figure 91:
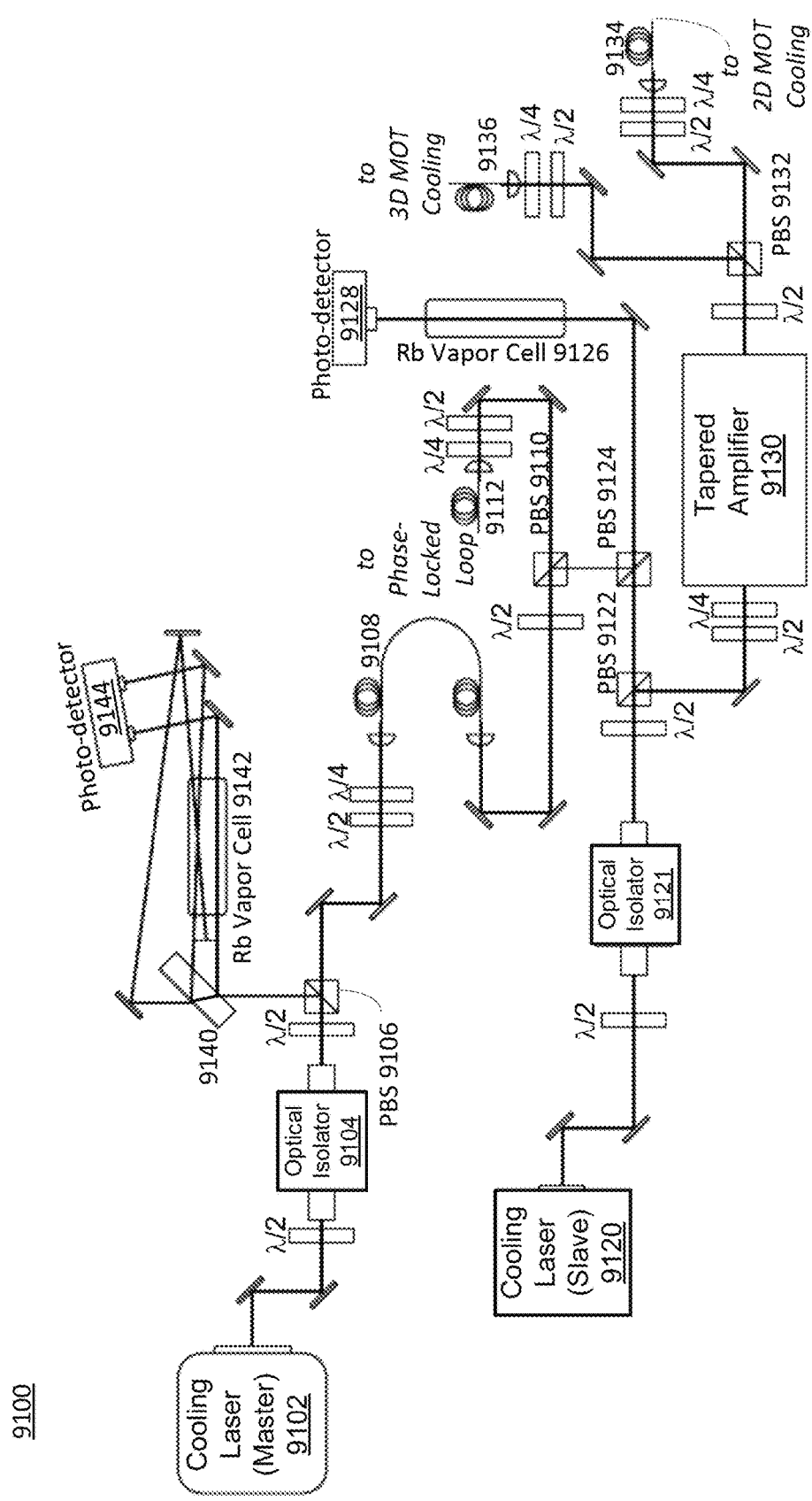
FIG. 91 (8.2) is a schematic of a setup for a cooling lasers.

Cooling setup 9100 is shown in FIG. 91. Components include a 780 nm "cooling" laser (master) 9102, half-wave plates λ/2, mirrors, a 30 dB optical isolator 9104, polarizing beam splitter (PBS) 9106, optical fiber 9108, PBS 110, optical fiber 9112 to a phase-locked loop, a 780 nm slave laser 9120, a 30 dB optical isolator 9121, a PBS 9122, PBS 9124, rubidium (Rb) vapor cell 9126, photo-detector 9128, a Toptica tapered amplifier 9130, a PBS 9132, and an optical fiber 9134 leading to 2D MOT cooling, an optical element 9140, an Rb vapor cell 9142, and a photo-detector 9144.

The 780 nm cooling master ECDL is locked to the $^{85}$Rb |F=3⟩→|F'=2⟩/|F'=4⟩ crossover transition by picking off a small amount of light from the output of the ECDL using Doppler free saturated absorption spectroscopy. An additional 5 mW of cooling light is picked off from the main ECDL output to be used as a frequency reference which is stabilized using a phase locked loop. Using a frequency offset locking setup, the light is blue-shifted 1.2 GHz such that the laser is red-detuned by 2Γ from the $^{87}$Rb|F=2⟩→|F=3⟩ cooling transition. Additionally, 40 mW of cooling light is used to seed a Toptica BoosTA tapered amplifier, which then outputs 1000 mW of 780 nm laser light. Using a polarizing beam splitter 9132, the TA output is split into two paths, where 500 mW of 2D MOT cooling light and 70 mW of 3D MOT cooling light are coupled with 50% efficiency into their individual polarization maintaining fibers and sent to the apparatus.

Figure 92:
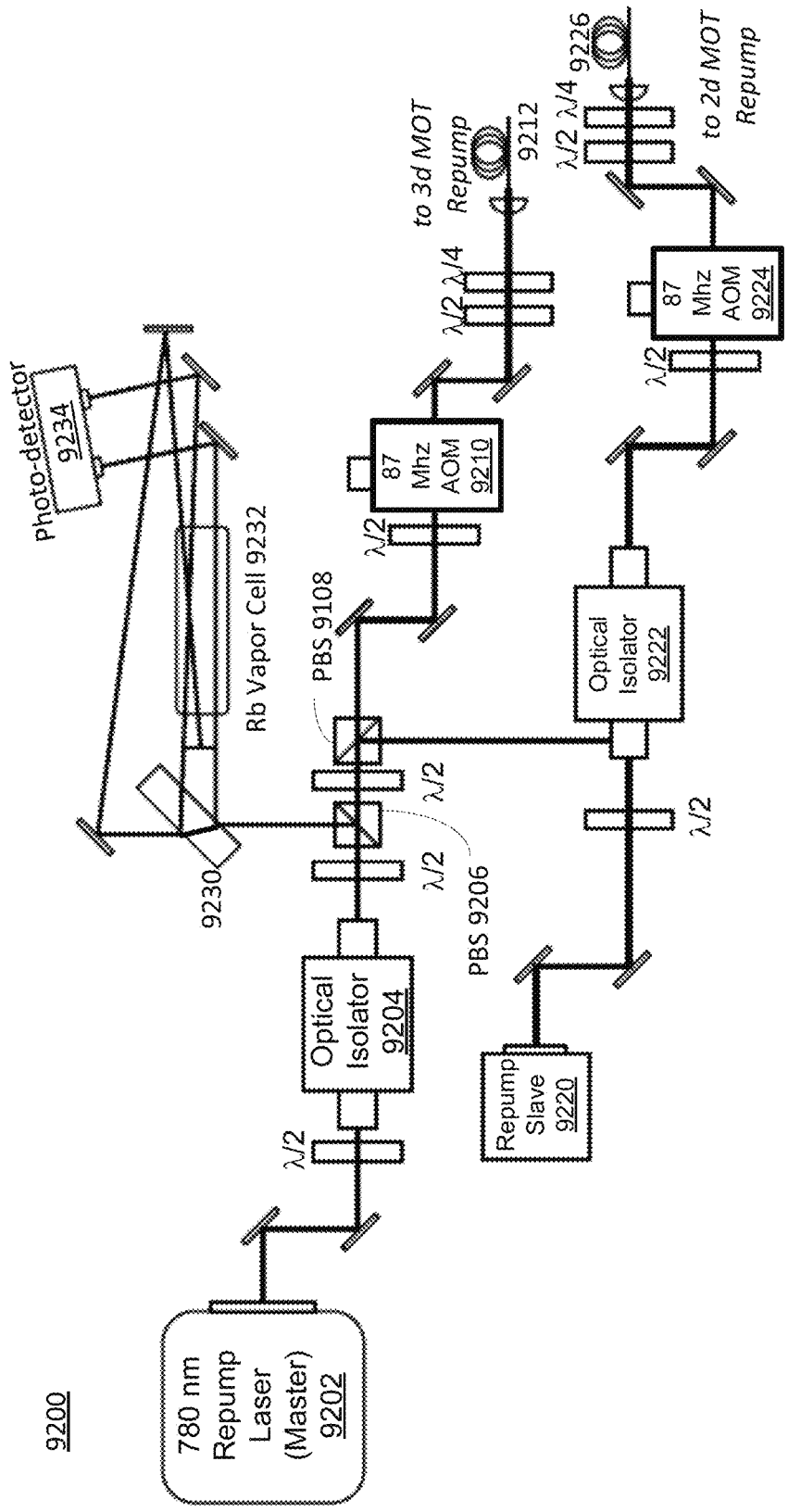
FIG. 92 (8.2) is a schematic of setup for repump lasers.

A repump setup 9200 is shown in FIG. 92. Components include mirrors, half-waver plates λ/2, a 30 dB optical isolator 9204, a PBS 9206, a PBS 9208, an 87 Mhz acousto-optical modulator 9210, and an optical fiber 9212 (with coupling lens) providing for 3D MOT repump, a 780 nm slave repump laser 9220, a 30 dB optical isolator 9222, an 87 MHz acousto-optical modulator 9224, and an optical fiber (with coupling lens) 9226 providing for 2D MOT repump, an optical element 9230, a rubidium vapor cell 9232, and a photo-detector 9234.

For repumping light, a 780 nm repump master ECDL 9202 is locked to the $^{87}$Rb |F=1⟩→|F=1⟩/|F'=2⟩ crossover transition by picking off a small amount of light from the output of the ECDL and using Doppler free saturated absorption spectroscopy. Approximately 1 mW of repump light is picked off from the main beam line and used to seed a repump slave laser 9220. The output of both the master and slave lasers are each sent through a respective AOM 9210, 9224 driven at 87 MHz to blue-shift the beams onto resonance with the $^{87}$Rb|F=1⟩→|F'=2⟩ transition. Each beam is then coupled into a polarization maintaining fiber 9212, 9226, where the master light is sent to the 2D MOT and the slave light is sent to the 3D MOT. With the described configuration, the master repump setup provides 1 mW of 3D repump light and the slave provides 12 mW of 2D repump light.

Figure 93:
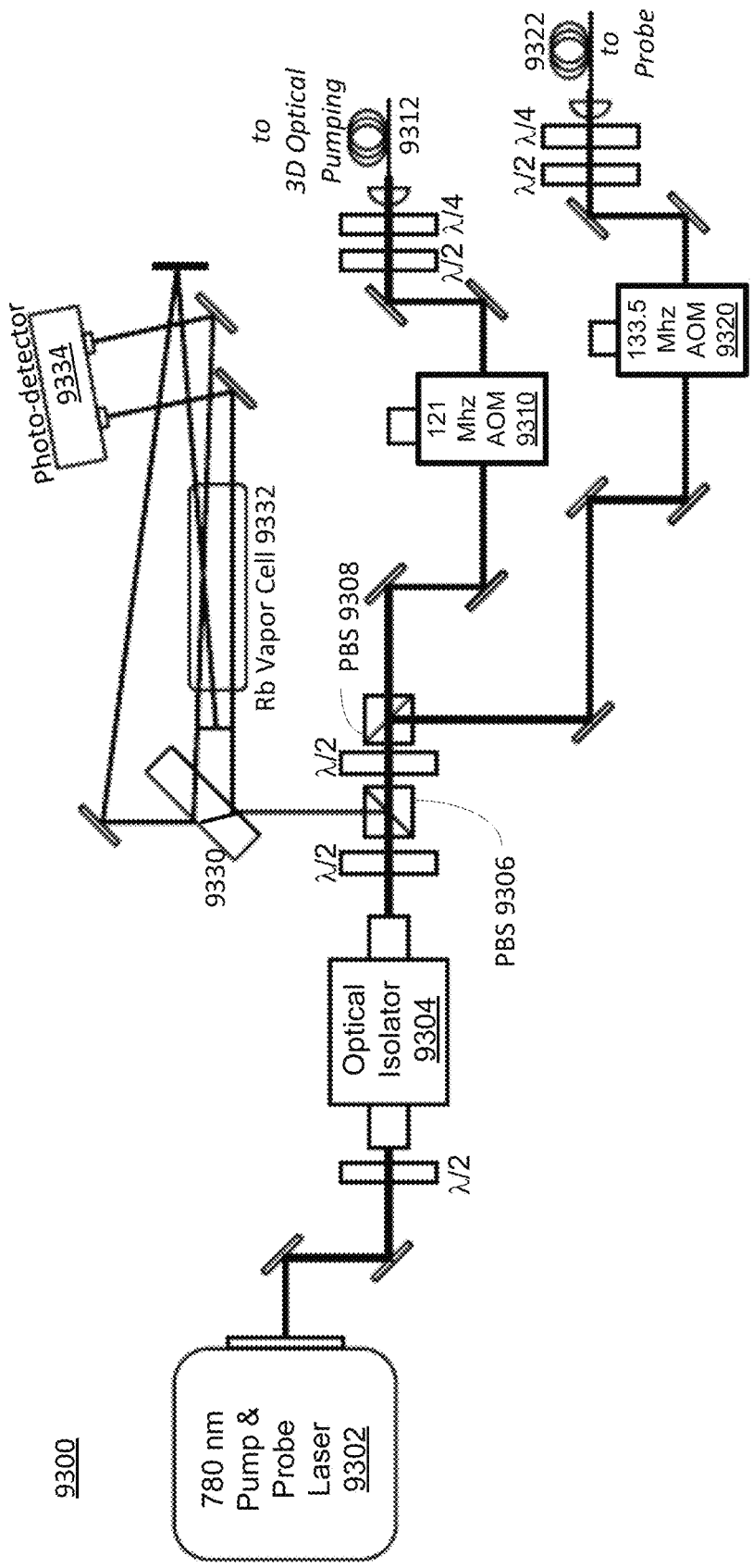
FIG. 93 (8.2) is a schematic of a setup for 780 nm pump and probe laser.

A pump and probe laser setup 9300 is shown in FIG. 93. Components include a 780 nm "pump and probe" laser 9302, mirrors, half-wave plates λ/2, a 30 dB optical isolator 9304, a PBS 9306, a PBS 9308, a 121 MHz acousto-optical modulator 9310, and an optical fiber (with coupling lens) 9312 leading to 3D optical pumping, a 133.5 MHz acousto-optical modulator 9320, and an optical fiber (with coupling lens) 9322 leading to a probe, an optical element 9330, a rubidium vapor cell 9332, and a photo-detector 9334.

The system used for producing a BEC is the optical pumping and probe setup 9300 shown in FIG. 93. The pump-probe master ECDL laser 9302 is locked to the $^{87}$Rb|F=2⟩→|F'=2⟩/P=3⟩ crossover transition by picking off a small amount of the main ECDL light and using Doppler free saturated absorption spectroscopy. The main beam line is then split into two paths using a polarizing beam splitter 9308, with one beam used for optical pumping and the other for a resonant probe beam. With respect to the optical pumping light, an AOM red-shifts the beam by 121 MHz such that the pump light is blue-detuned 2Γ from the $^{87}$Rb |F=2⟩→|F'0=2⟩ transition. Moreover, the probe light is blue-shifted by 133.5 MHz onto resonance with the |F=2⟩→|F'=3⟩ cooling transition. After passing through their respective AOMs, a total of 3 mW of optical pumping light and 3 mW of resonant probe light are each coupled into their own polarization maintaining fiber 9312, 9322, where the light is then sent to the atomtronics UHV cell. The above described laser system can create a BEC using the atom chip located at the top of the atomtronics UHV cell.

Figure 94:
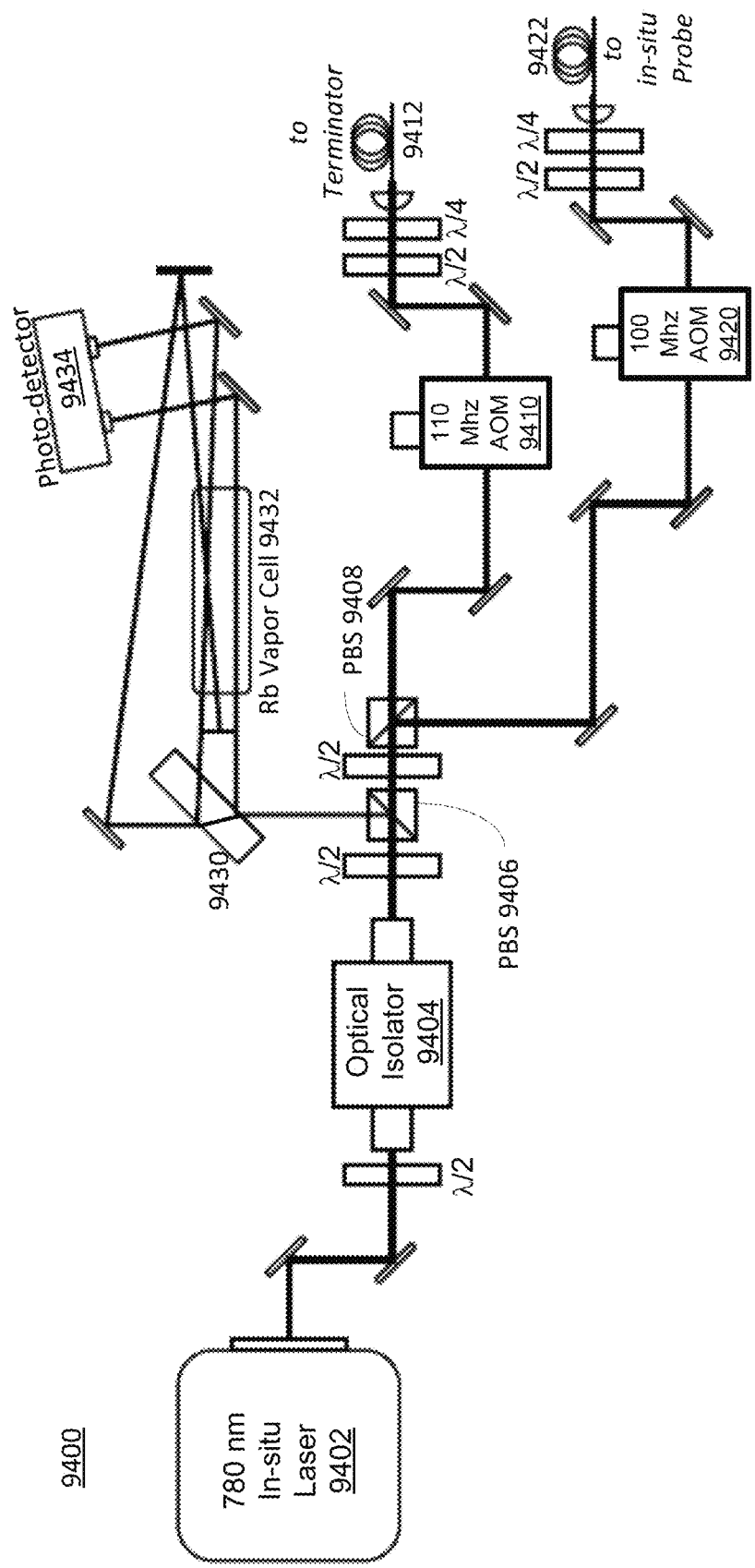
FIG. 94 (8.2) is a schematic of a setup for a 780 nm in-situ laser.

An in-situ laser setup 9400 is shown in FIG. 94. Components include a 780 nm "in-situ" laser 9402, mirrors, half-wave plates λ/2, a 30 dB optical isolator 9404, a PBS 9406, a PBS 9408, a 121 MHz acousto-optical modulator 9410, and an optical fiber (with coupling lens) 9412 leading to a terminator, a 133.5 MHz acousto-optical modulator 9420, and an optical fiber (with coupling lens) 9422 leading to an in-situ probe, an optical element 9430, a rubidium vapor cell 9432, and a photo-detector 9434. Other than the frequencies of the acousto-optical modulators and the destinations of the outputs, setup 9400 is similar to setup 93 (FIG. 93).

Figure 96A:
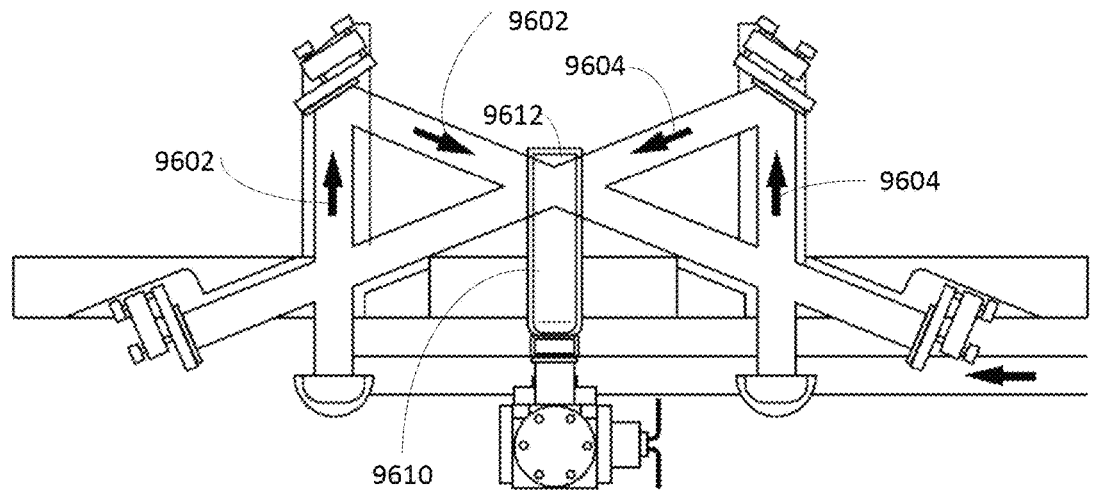
FIGS. 96A (8.5B) and 96B (8.5c) are diagrams showing the orientation of the 3D MOT lasers with respect to the atomtronics vacuum system.
Figure 96B:
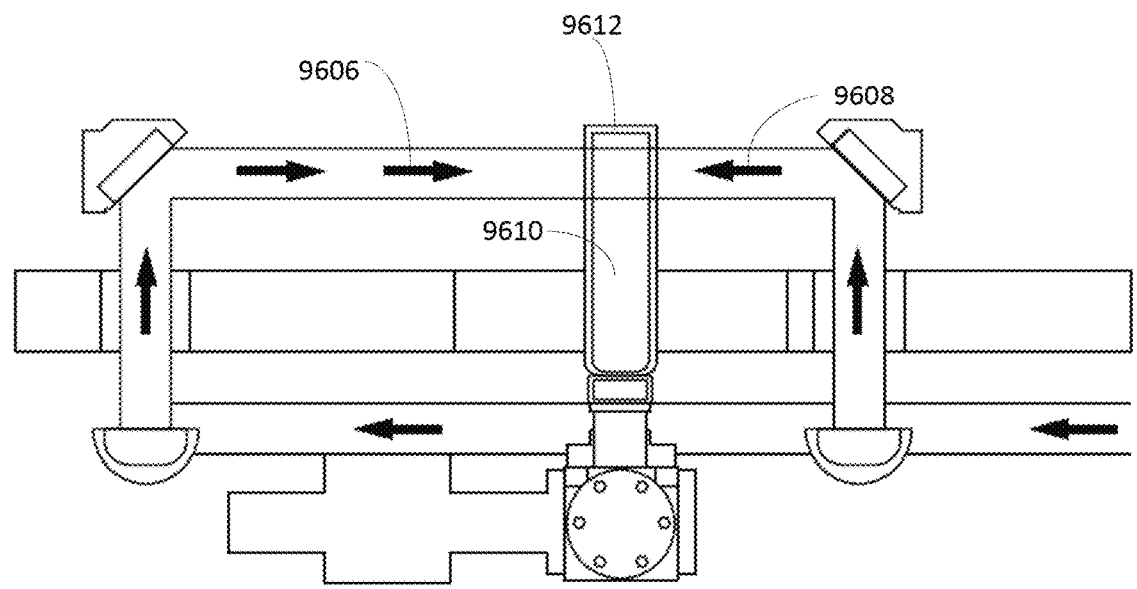

The production of a BEC in the Atomtronics Double MOT UHV cell begins by generating a 3D MOT of $^{87}$Rb inside the 3D chamber of the UHV cell (FIG. 24 (3.5). The 3D MOT is created by retroreflecting three pairs of 10 mW, 780 nm cooling laser beams with orthogonal $\sigma_+/\sigma_-$ circular polarization and a beam waist of $\omega_0=5$ mm. The MOT beams are spatially overlapped with 3D repump light and all three pairs of lasers intersect at an angle of 90° with respect to each other approximately 15 mm below the bottom surface of the atom chip. FIGS. 96A and 96B show the orientation of the 3D MOT lasers with respect to the atomtronics vacuum cell 9610. FIG. 96A represents the pair of vertically oriented MOT beams 9602 and 9604 intersecting in an X shape 15 mm below the bottom surface of the atom chip 9602. FIG. 96B represents the third set of MOT beams 9606, 9608 oriented normal to the X shape beams. Note that FIGS. 96A and 96B are rotated 90° degrees with respect to each other.

This configuration provides 3D cooling along the orthogonal $\hat{x}$, $\hat{y}$, and $\hat{z}$ directions. Anti-Helmholtz coils oriented around the 3D chamber as in FIG. 92B (8.3b) provide a position dependent 8 G/cm magnetic field gradient necessary for creating the 3D MOT. Atoms are sourced into the 3D MOT from a 2D+ MOT formed in the adjacent 2D MOT vacuum chamber located below the 3D chamber (FIG. 24 (3.5)). During BEC production, a typical 3D MOT contains approximately 109 atoms and is loaded within 40 seconds.

After loading the 3D MOT, the 2D MOT lasers are shuttered and the 3D MOT is compressed into a CMOT by ramping the anti-Helmholtz field gradient up an additional 10 G/cm while simultaneously detuning the cooling lasers by an additional 40 MHz and attenuating the 3D repump to 50 µW of optical power. Typically, the CMOT stage lasts 15 ms and the MOT atom temperature after compression is approximately T≈130 to 160 µK. After CMOT, sub-Doppler cooling is performed. The MOT anti-Helmoltz coils are switched off while x-bias, y-bias, and z-bias coils are turned on in order to eliminate any stray magnetic fields at the location of the atoms such that a PGC stage can properly be performed. After eliminating stray magnetic fields at the atoms, w the 3D cooling lasers are red-detuned an additional 105 MHz for 3 ms, which cools the atoms to temperatures of approximately T≈20 µK. After PGC, all cooling light is extinguished while optical pumping light illuminates the atoms for 800 µs to pump as many atoms as possible to the |F=2, $m_F$=2⟩ Zeeman magnetic sublevel. As shown in equations 24 and 25 (2.18 and 2.19), since mF>0, this permits the optically pumped atoms to be trapped in a minimum of a spatially varying magnetic field. At the conclusion of the optical pumping stage, all lasers are extinguished and no more laser cooling stages are applied.

Given that the atoms are prepared in the |F=2, $m_F$=2⟩ Zeeman sublevel, if current through the 3D MOT coils is linearly ramped in the Helmholtz configuration over a span of 35 ms, the optically pumped atoms are then captured in a magnetic quadrupole field with a 60 G/cm field gradient. To vertically transport the atoms from the location of the 3D MOT up to the atom chip, current is linearly run through a pair of magnetic transport coils, also in the Helmholtz configuration to produce a transport field gradient of 110 G/cm while the quadrupole field is linearly ramped to zero over the same time period. This operation vertically shifts the zero point of the quadrupole field that the atoms are trapped in. As long as the movement is done adiabatically, the atoms remain trapped in the magnetic quadrupole field as it is transported vertically. Upon reaching the height of the atom chip, the transported atoms are transferred into a single-guide wire Ioffe-Pritchard trap produced on the atom chip.

To transfer atoms into this chip trap, the transport field is first compressed over a time span of 65 ms such that the magnetic quadrupole field gradient matches the (anticipated) chip trap gradients. After such compression, the chip guidewire and H-wire currents, as well as the y-bias current are linearly ramped on over a span of 10 ms and a magnetic potential, as shown in section 3.3.1, is formed. Approximately $20*10^6$ atoms at a temperature of 17 to 20 µK remain in the Ioffe-Pritchard trap after this transfer sequence and are located approximately 150 µm below the bottom surface of the atom chip.

To condense the atoms into a BEC, a forced RF evaporation stage is applied to the trapped atom ensemble to further cool the atoms below the BEC critical temperature (equation 2.29) necessary for condensation to occur. In order to perform efficient RF evaporation, the chip magnetic trap is compressed along the radial and longitudinal directions in 500 ms in order to increase the atom collision and rethermalization rate during the evaporative cooling stage. Using an RF antenna located 3 mm above the top surface of the atom chip, RF radiation with a frequency of $v_{RF}$=40 MHz is illuminated onto the atoms. The RF frequency is then linearly swept from $v_{RF}$=40 MHz to 26 MHz in 150 ms, which expels the absolute warmest atoms from the chip trap. Afterwards, the RF frequency is swept over a span of 1800 ms from $$v_{RF}=26 \text{ MHz} \rightarrow 11 \text{ MHz} \rightarrow 6.5 \text{ MHz} \rightarrow 4.8 \text{ MHz} \rightarrow 2.62 \text{ MHz} \quad (145)(8.2)$$

where the final RF value is approximately 100-200 kHz above the trap bottom, leaving on the coldest of the cold atoms remaining in the magnetic trap.

After the above described RF evaporation sequence, a Bose-Einstein condensate of about $7*10^3$ atoms is produced in the chip guide-wire trap. This BEC is produced under the chip guide wire and thus blocks optical access to the condensate. To move the BEC out from under the wire and align it with the center of the atom chip window (as shown in FIG. 26 (3.6b)), a current of equal magnitude but opposite direction is slowly ramped through the second chip guidewire in 80 ms. This adiabatically deforms the single guide-wire magnetic trap into the split guide-wire magnetic trap located 150 µm below the center of the atom chip window. At this final location, a Bose-Einstein condensate of $7*10^3$ is confined to a cigar-shaped magnetic potential with trapping frequencies along the $\hat{x}$, $\hat{y}$, and $\hat{z}$ directions of $$\omega(x,y,z)=2\pi \times (67,1500,1500) \text{Hz}. \quad (146)(8.3)$$

Figure 97:
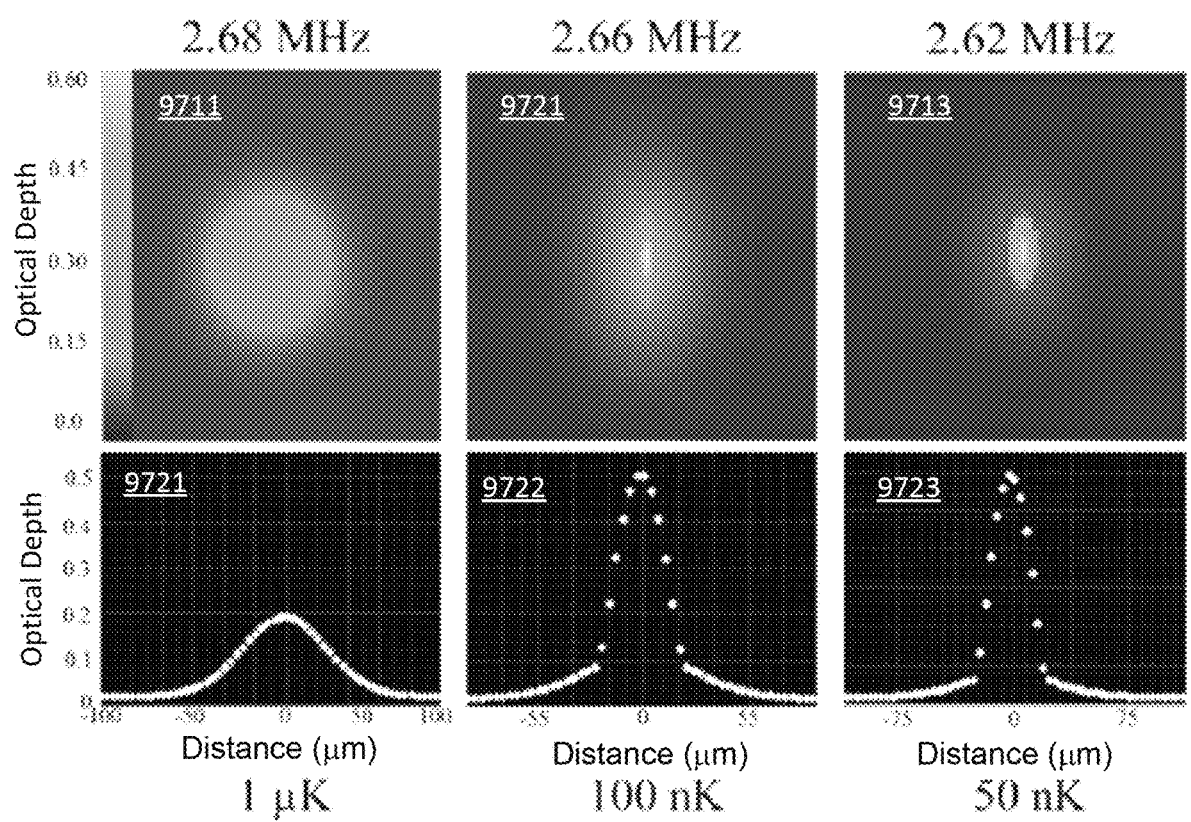
FIG. 97 (8.4) is a series of time-of-flight images-plus-plots just before formation of the condensate (right), at the appearance of the condensate (center), and at nearly a pure condensate (right).

Absorption images 9711, 9712, and 9713, shown in FIG. 97 show the momentum distribution of atoms taken at final RF evaporation frequencies of 2.68 MHz, 2.66 MHz, and 2.62 MHz, respectively. These distributions have the appearance of an inverted parabola profile, which (as derived in equation 46 (2.39)) is characteristic of atoms that have undergone a phase transition to a Bose-Einstein condensate. Time-of-flight absorption images 9721, 9722, and 9723 show the momentum distribution of the atomic cloud after a 22 ms TOF. Image 9721 shows the atom cloud momentum just before the condensate, image 9722 shows the momentum at the appearance of the condensate, and image 9723 shows the momentum at nearly a pure condensate. The transition to a BEC occurs during the forced RF evaporation stage for RF frequencies of approximately 2.66 MHz. At this stage, the condensate temperature can be T=50 nK. The appearance of an inverted parabola profile shown in the central and right image is characteristic of the onset of a BEC as derived in equation 2.46 and shown in FIG. 28.

The atom density profile of the condensate shown in FIG. 97 can be fitted to a binomial distribution, which is the sum of a Gaussian distribution (representing the thermal atoms in the ensemble) and an inverted parabola (for the condensed atoms in the ensemble). The final temperature of the condensate was measured by performing time-of-flight imaging on the expansion of the Gaussian tails of the BEC density profile. Using a final RF evaporation frequency of 2.62 MHz, the BEC temperature was measured at approximately T=50 nK.

The triple-well transistor oscillator potential is formed by overlapping a harmonic magnetic potential with two repulsive Gaussian barriers. The harmonic magnetic potential is the same cigar shaped Ioffe-Pritchard trap with radial and longitudinal trapping frequencies of $\omega_{rad}=2\pi*67$ Hz and $\omega_{rad}=2\pi*1600$ Hz, respectively that confines the 50 nK BEC. The magnetic potential is located approximately 150 μm below the bottom surface of the atom chip window. Next, the repulsive source-gate (SG) and gate-drain (GD) barriers are formed by focusing two blue-detuned, 760 nm Gaussian laser beams with equal beam waists of $\omega_0=2:0$ μm and a separation of d=4.8 m onto the center of this harmonic magnetic potential.

Figure 95:
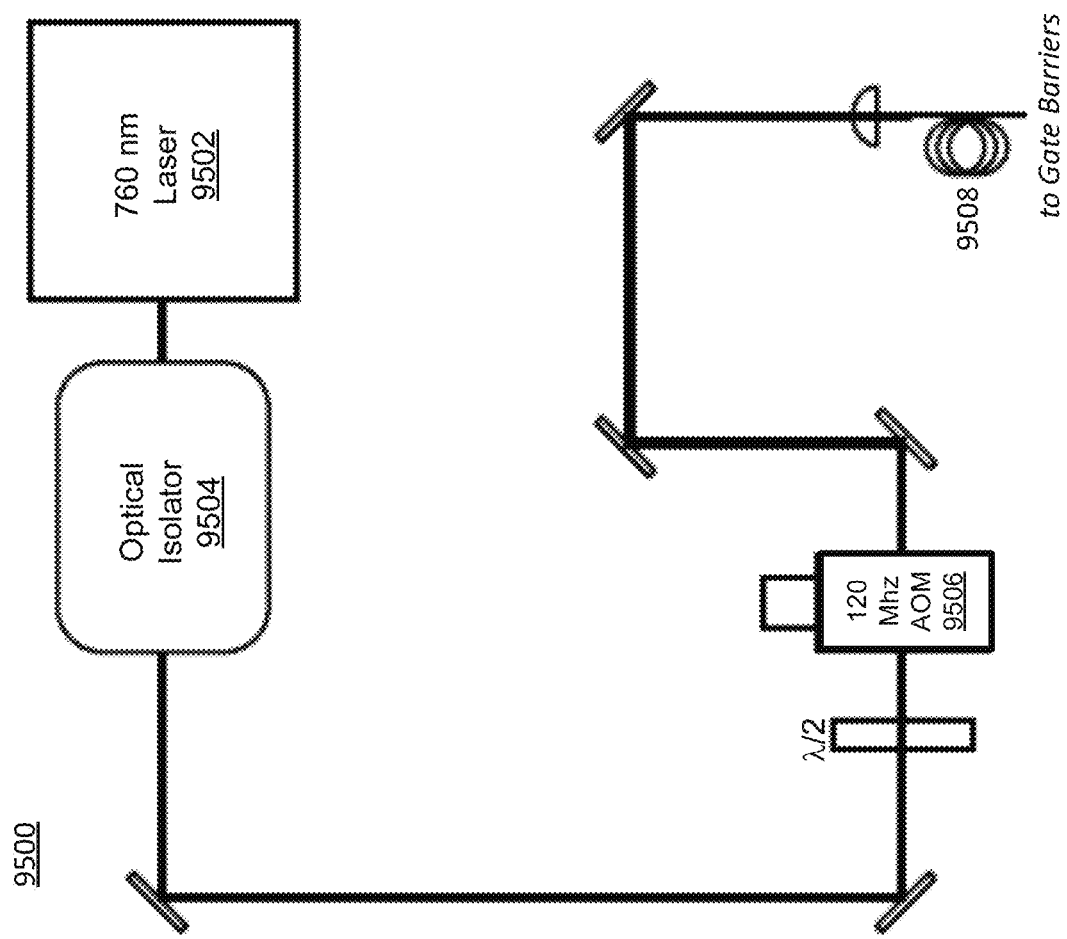
FIG. 95 (8.2) is a schematic of a setup for a 760 nm barrier laser.

The 760 nm laser setup for producing the SG and GD barriers is shown in FIG. 95, which shows a gate-barrier setup 9500. Components include a Topica 760 nm laser 9502, a 30 dB optical isolator 9504, mirrors, a half-wave plate, a 120 MHz acousto-optical modulator 9506, and an optical fiber (with coupling lens) 9508 providing an output for forming transistor gate barriers.

A schematic for projecting the SG and GD barriers onto the magnetic potential is shown in FIG. 98. FIG. 98 is a schematic of an optical setup 9800 for producing dynamically controllable SG and GD barriers for projecting the SG and GD barriers through atom chip window and onto the harmonic magnetic potential. Components include an optical fiber (with coupling lens) 9802 arrange to receive a 760 nm Barriers laser, an acousto-optic deflector 9804, a dichroic mirror 9805, a mechanical shutter 9806, a probe 9808, a polarizing beam splitter 9810, a lens 9812, an atom chip, a 3D chamber 9814 within which the matter-wave transistor 9816 is formed, an in-situ probe beam 9818, an optical fiber 9820 for receiving a 780 nm drain terminator beam, an optical fiber 9822 for receiving a 780 nm source terminator beam, and a polarizing beam splitter 9824 for merging the terminator beams along a common path through dichroic mirror 9805 and onto 3D chamber 9814. Probe 9808 can be an Infinity Probe TS-160. Lens 9812 can be a Zeiss LD Plan Neofluar objective lens with a 0.6 numerical aperture and a ×40 magnification. Poalrizing beam splitter 9810 output a return beam to a camera, which can be a Andor iXon EMCCD.

Figure 99:
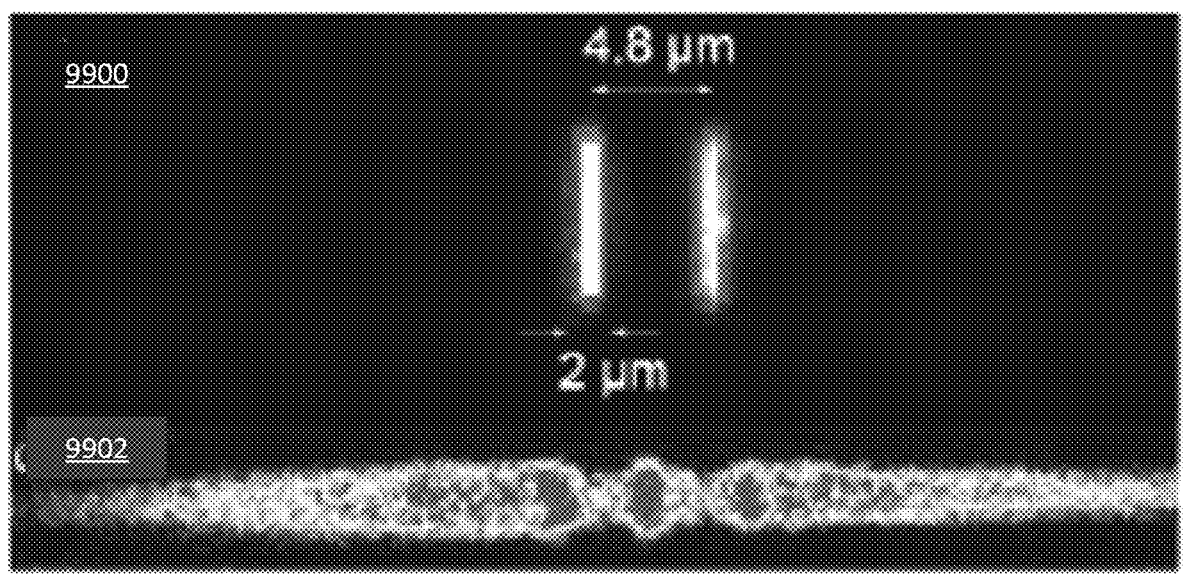
FIG. 99 includes an upper portion that is an optical intensity image of the focused source-gate and gate-drain barriers and a lower portion which is an in-situ absorption image taken through the atom chip window showing ultracold atoms trapped in the triple-well transistor potential.

The same lens 9812 hat focuses the barriers also serves to for in-situ absorption imaging of atoms, e.g., such as image 9900 in the upper portion of FIG. 99, which represents an optical intensity image of the focused SG and GD barriers with beam waists of $\omega_0=2$ μm and a separation of d=4:8 μm. A lower portion of FIG. 99 is an in-situ absorption image 9902 taken through the atom chip window showing ultracold atoms trapped in the triple-well transistor potential.

A total of 35 mW of 760 nm laser light enters the barrier projection system from a polarization maintaining, single mode fiber and is collimated to a beam waist of ω=4 mm with an f=15 mm aspherical lens. The 760 nm light then propagates into an IntraAction Corp DTD-6010RH29 2D acousto-optic detector (AOD) 9804, which can dynamically control the shape and positions of the SG and GD barriers. (The 0 order beams are blocked leaving only the +1, +1 diffracted order beams.)

To generate the longitudinal (or x) position of the barriers, two RF tones, one for each barrier, drive the AOD and diffracts each beam into its +1 order along the $\hat{x}$ direction. The RF tone for the GD barrier is generated by a VCO while the tone for the SG barrier is produced by a Lecroy Arb-Studio Arbitrary Waveform Generator (AWG). Because the RF driving voltages are easily adjustable, this scheme provides a mechanism to dynamically change the longitudinal positions of the SG and GD barriers. The radial (or y) position of the both SG and GD barriers is generated by using a second channel of the AWG to continuously raster the SG and GD barriers back-and-forth in the y direction at a frequency of 20 kHz.

Figure 8:
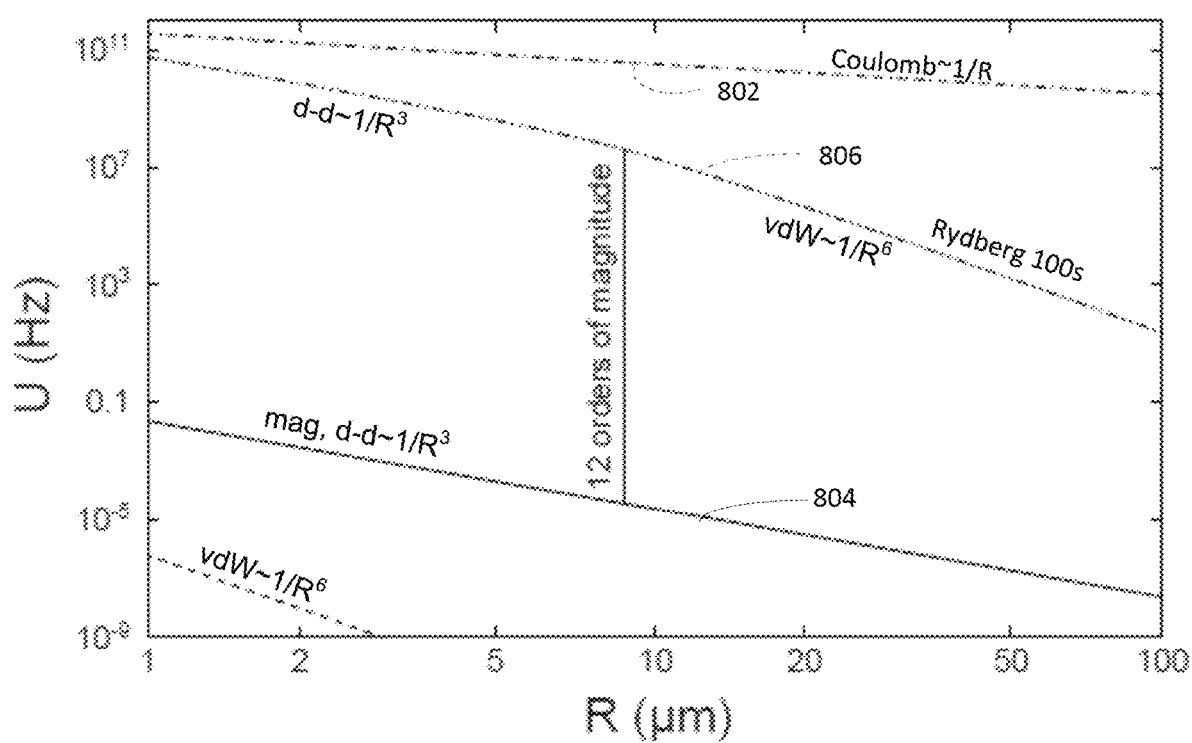
FIG. 8 (1.2a) is a graph of interaction strength as a function of distance between ions, ground state atoms, and Rydberg atoms.

Using an Infinity Probe TS-160 objective in conjunction with a Zeiss LD Plan Neouar 0.6 NA, 40× magnification microscope objective, the optical barrier potential is projected onto the harmonic magnetic potential (FIG. 96A 8.5b). Note that the barriers are focused through the 2 mm wide, 0.420 μm thick atom chip window (as shown in FIG. 26 (3.6b)). The Zeiss objective features an adjustable correction collar to eliminate aberration introduced when the light focuses through the 0.42 μm thick window. Additionally, because the 20 kHz raster frequency of the barriers in the radial direction is considerably faster than the 1.6 kHz radial trapping frequencies of the magnetic potential, atoms confined in the magnetic potential encounter the constant time-averaged optical intensity of the laser beams in the $\hat{y}$ direction. Thus, the above description produces two barriers with optical intensity profiles that are Gaussian beams (with width ω=2 μm) in the longitudinal direction and a "top hat" potential (with length 8 μm) in the radial direction (FIG. 96B (8.5c)). By overlapping an atom ensemble in the magnetic potential, the SG and GD barriers can section off the potential into the source-well, the gate-well, and the drain-well (lower portion of FIG. 96B (8.5d)).

This barrier projection system also doubles as an imaging system to observe the flow of ultra-cold atoms through the triple-well transistor potential. To observe atoms in the transistor potential, in-situ absorption imaging is performed (as opposed to time-of-flight imaging) while the atoms are still confined to the triple well potential. A probe beam resonant with the $^{87}$Rb D2|F=2⟩ →|F'=3μ transition is propagated vertically through the vacuum cell (entering through the base of the 2D MOT chamber and exiting though the atom chip window, see FIG. 96A (8.5b)) where it intersects ultracold atoms trapped in the hybrid magnetic and optical transistor potential. Positioned 3 mm above the outside surface of the atom chip, the same Zeiss 0.6 NA microscope objective that focuses the barriers is used to collect and collimate the absorption image signal. An Infinity PhotoOptical KC Lens then focuses the probe light onto an Andor iXon EMCCD for imaging. An absorption image of approximately 20,000 ultracold atoms trapped in the triple-well transistor potential is shown in the lower portion of FIG. 96B (8.5d).

Figure 100A:
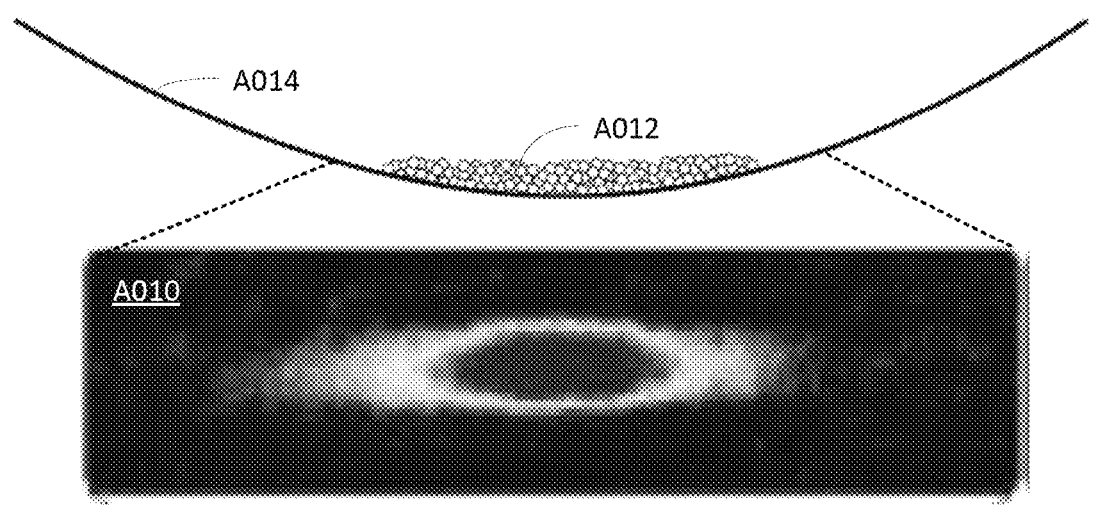
FIGS. 100A-D (8.7a-d) are a series of in-situ absorption images together with respective diagrams of ultracold atoms at various stages of preparing a source-well ensemble.
Figure 100B:
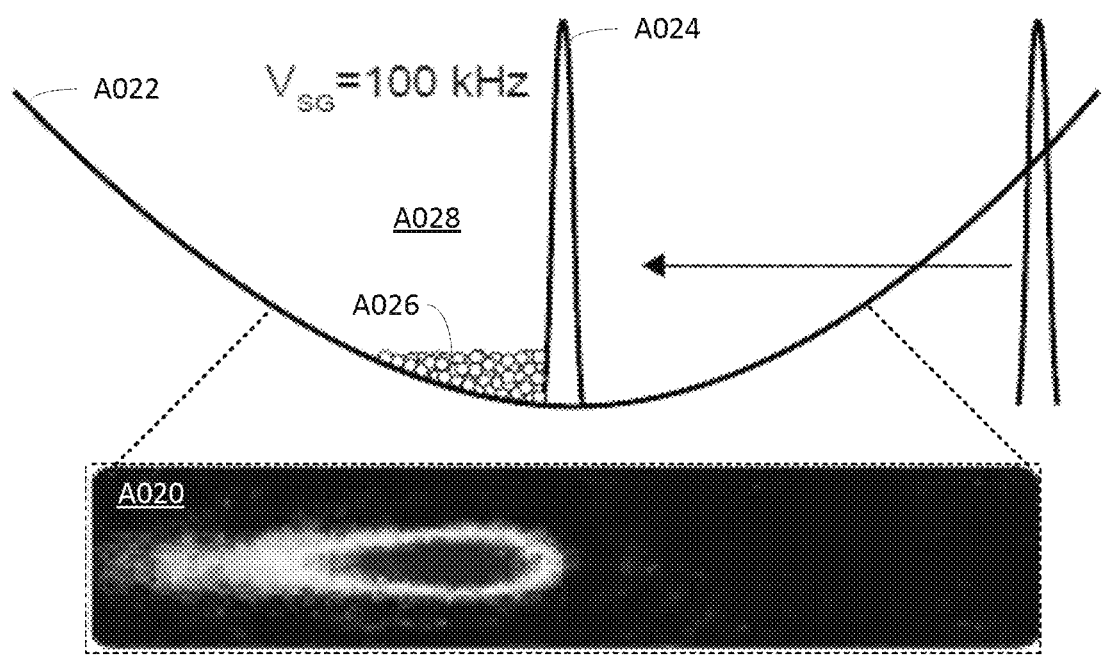

A Bose-Einstein condensate of approximately 7*103 atoms with a temperature of T=50 nK (FIG. 94) can be loaded into a harmonic magnetic potential located 150 μm below the center of the atom chip window. FIGS. 100A-D represent in-situ absorption images of ultra-cold atoms at respective stages of preparing the source-well ensemble; associated with each image is a diagram presenting the respective stage. FIG. 97A (8.8a) includes an image A010 of a Bose-Einstein condensate with approximately 6,000 atoms A1012 at a temperature of 50 nK loaded into the harmonic magnetic potential A014. Image A020 of FIG. 100B shows atoms A026 shifted to the right of center; as indicated in the diagram of FIG. 100B a source-gate barrier A24 has been that swept (right to left) from the (right) longitudinal edge of the magnetic potential A022, nearly all atoms A026 are confined into the just-formed transistor source-well A028.

In FIG. 97C, the SG barrier A032 is lowered to its desired height of 30 kHz and the GD barrier A033 is raised to 31 kHz, thus forming the gate well A036 and the drain well A037. FIG. 97D shows the source-well atom ensemble A035 after raising the source-well chemical potential A042. By allowing source-well atoms to flow into the gate-well, the size of the gate-well can be measured directly to verify the SG and GD barriers are separated by d=4:8 µm.

Ultra-cold atoms are loaded into the transistor source-well by turning on the SG barrier and adiabatically sweeping it from the right-most longitudinal boundary of the harmonic magnetic potential to near the center of the magnetic potential in 40 ms (FIG. 100B. As the SG barrier is swept across the magnetic potential, the barrier height is set at $V_{SG}$=100 kHz, which is considerably higher than the corresponding temperature of the trapped atoms (T=50 nK≈1 kHz) and as a result, nearly all of the atoms are compressed into the transistor source well by the repulsive SG barrier (FIG. 100B). Any atoms that happen to remain in the adjacent drain well are quickly removed by optically pumping them to the $|m_F=-2\rangle$ anti-trapping state by illuminating a laser beam, called the drain terminator, that is locked to the $^{87}$Rb $|F=2\rangle \rightarrow |F'=2\rangle$ transition.

The drain terminator, which is a $10^{-13}$ W, 780 nm beam focused to a waist of 16 µm, is projected onto the center of the transistor drain-well using the same optical projection system for the SG and GD barriers and can remove all drain-well atoms within 5 ms without disturbing any atoms confined to the source or gate well. After clearing any residual atoms not swept into the source-well, the SG barrier height is ramped down to its desired height of $V_{SG}$=30 kHz while simultaneously, the GD barrier is ramped on to a height of $V_{GD}$=31 kHz and is displaced from the SG barrier by a distance d=4:8 µm. After this sequence, the matterwave transistor is prepared in a state shown in FIG. 100C.

Figure 100C:
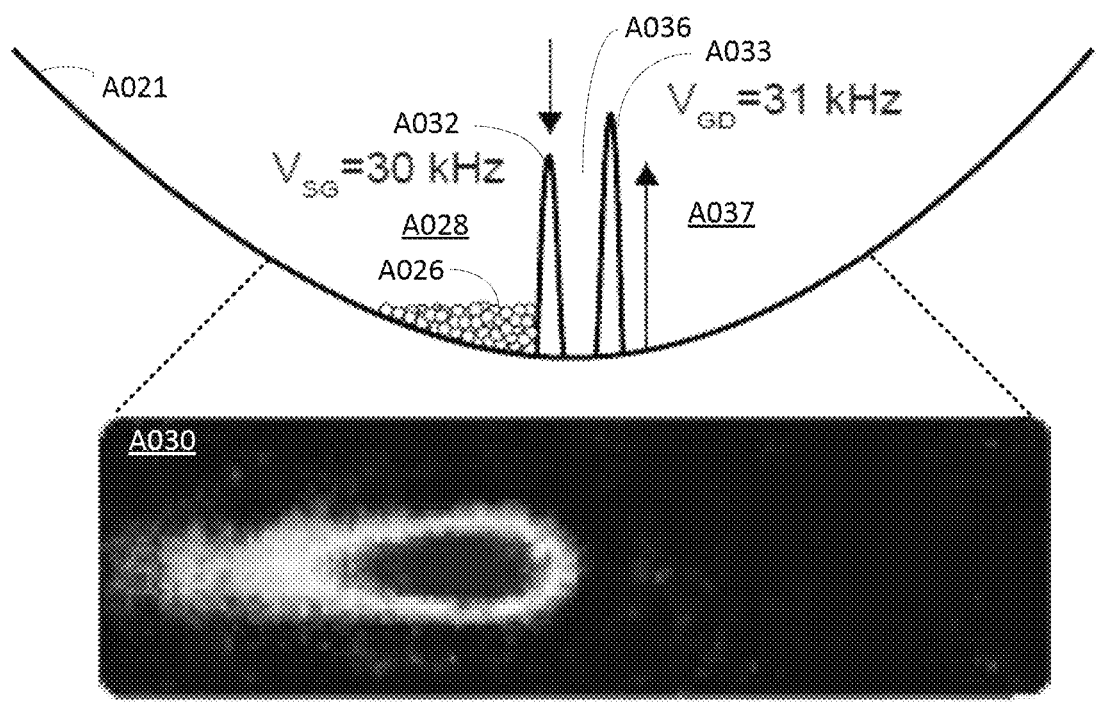
Figure 100D:
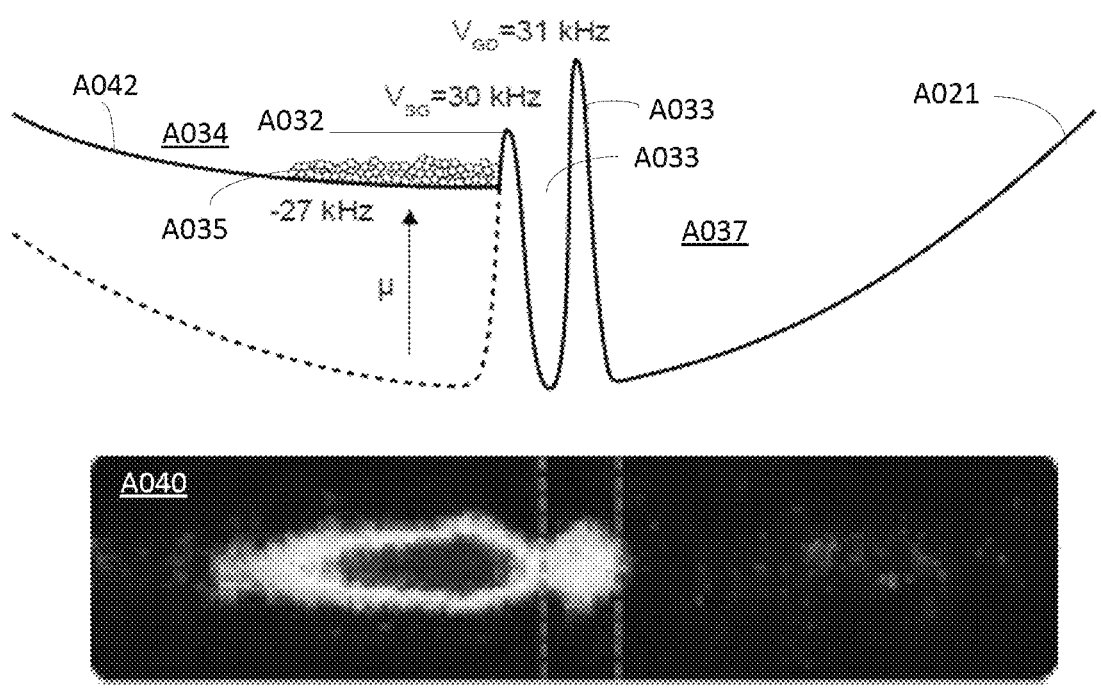

With a current energy of approximately 1 kHz, the source-well atom ensemble does not flow through the transistor-oscillator potential. As shown in FIG. 100C, the energy of the atoms places the source-well ensemble at the base of the SG barrier making subsequent flow into the gate and drain-wells highly unlikely. In this condition, the source-well in the atomtronic transistor is equivalent to an electronic battery with insufficient energy to power an electrical circuit. To raise the energy of the source-well atom ensemble to high enough energies such that an atom current flows, the source-well chemical potential is raised from 0 to approximately µs≈27 kHz (FIG. 100D).

This is accomplished by rapidly sweeping the SG barrier back-and-forth at a frequency of 19 kHz, extending over a majority of the source well, while ramping up the optical power of laser beam forming the SG barrier. Specifically, an arbitrary waveform generator (AWG) is used to ramp the driving voltage of the acousto-optic deflector (AOD) that controls the longitudinal position of the SG barrier.

Figure 101:
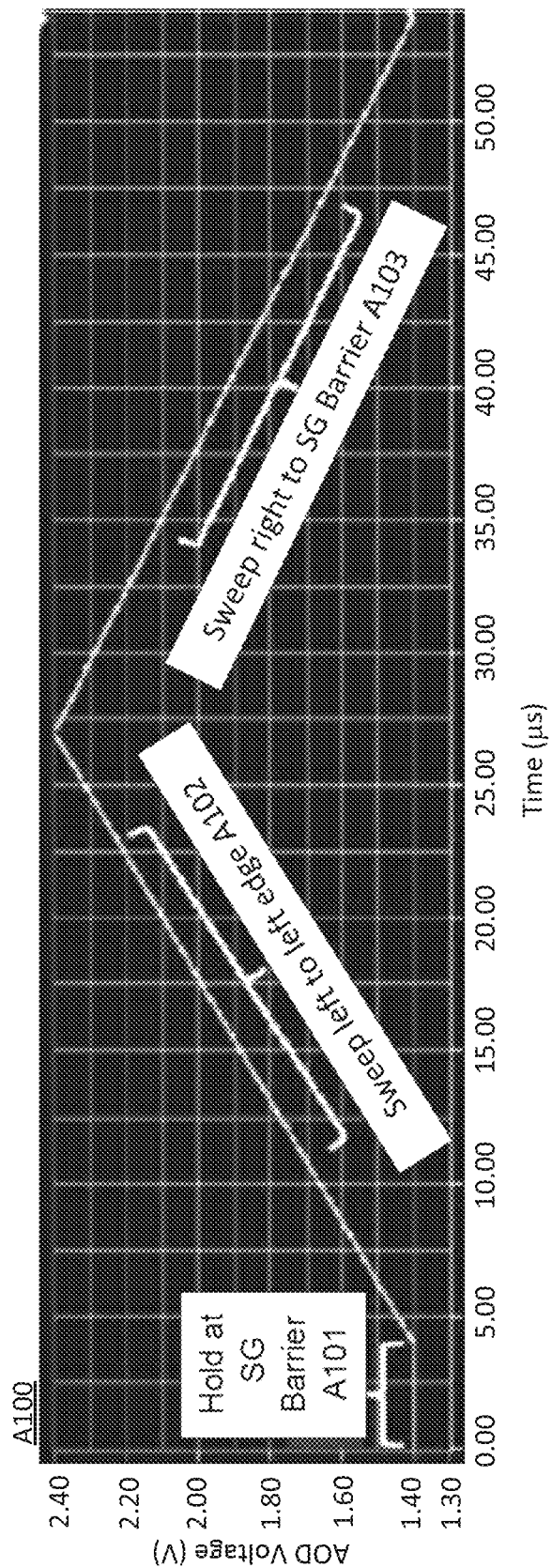
FIG. 101 (8.8a) is a plot of a voltage used to drive an acousto-optic deflector (AOD) that controls the position of a source-gate barrier as a function of time.
Figure 102A:
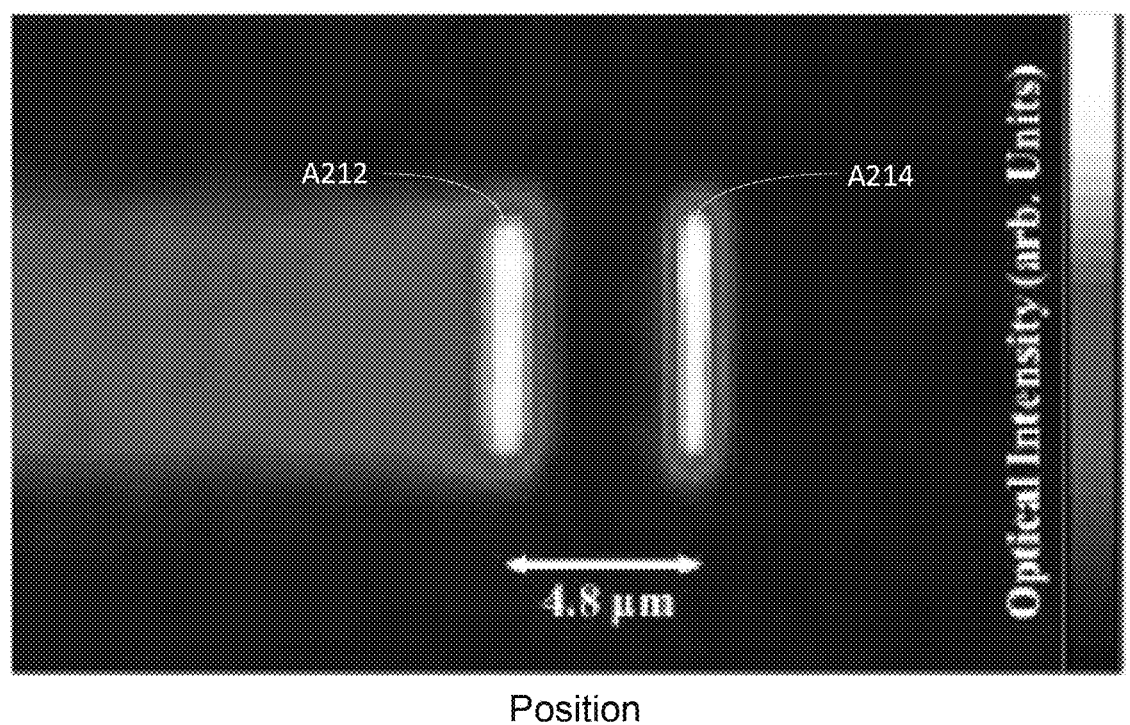
FIG. 102A (8.8b) is an intensity image of source-gate and gate-drain barriers after the sweeping function of FIG. 101.

FIG. 101 is a graph A100 showing the Voltage driving the AOD that controls the x (or longitudinal) position of the SG barrier as a function of time. The sweeping sequence begins at A101 by holding the SG barrier at its initial position for 4 µs. Then, the AOD driving voltage is ramped up by 1 V over the span of 24 µs at A102. This serves to sweep the SG barrier from its initial position to the left-most attainable longitudinal position such that the barrier sweeps over as much length of the source-well as possible. The AOD voltage is then ramped down over 22 µs at A103, bringing the SG barrier back to its starting point, where the sweeping sequence is repeated. Note that the longer the barrier is held at its starting point, the higher the SG barrier will be. By using this sweeping function for the SG barrier, the time averaged optical potential for the SG barrier is shown in FIG. 102A, which is an intensity image of the SG and GD barriers after the above sweeping function. This serves to raise the source-well chemical potential with the corresponding transistor potential shown in FIG. 102 (8.8c)).

Figure 102B:
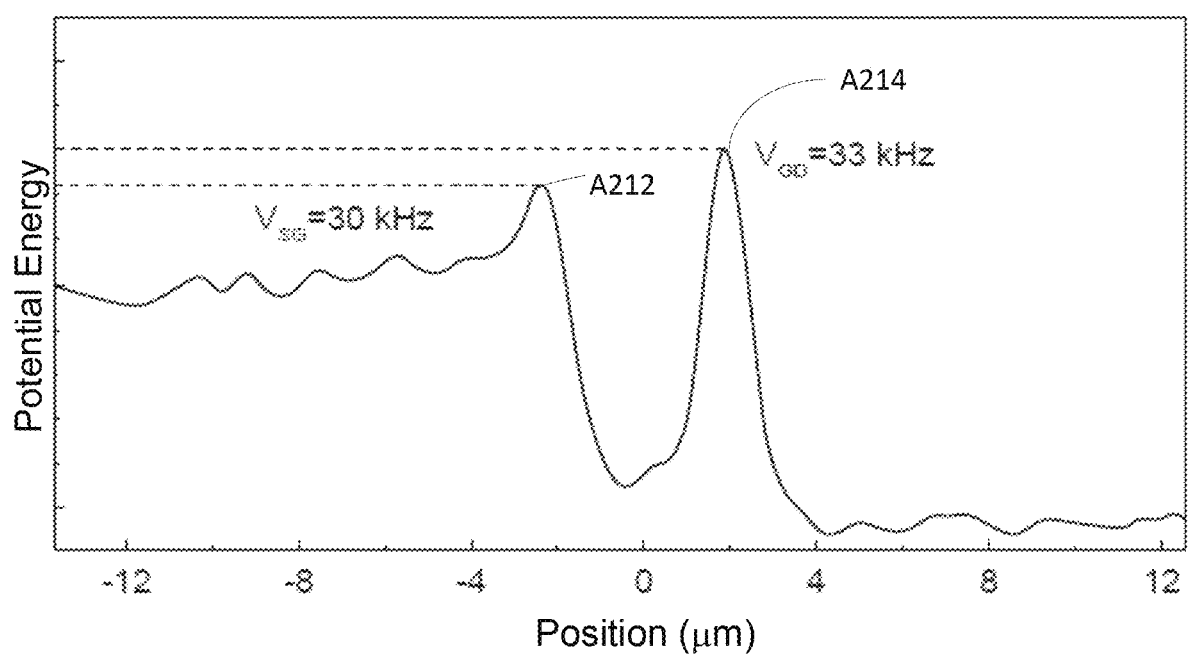
FIG. 102B is a plot of the corresponding transistor potential.

The total sweeping frequency of the SG barrier is 19 kHz, which is considerably larger than both the 1.6 kHz and 125 Hz radial and longitudinal trapping frequencies of the transistor source well potential. As a result, by continuously repeating this waveform, the atoms experience the time averaged intensity of the sweeping optical field, which is shown in FIG. 102A. As the SG barrier is swept back-and-forth, the optical power of the laser beam forming the SG barrier is linearly ramped from its initial value of 1.7 mW to 2.5 mW over a span 10 ms. This process serves to raise the bottom of the source-well potential from 0 to 27 kHz and places the source-well ensemble at a much higher chemical potential of µs=27 kHz. Finally, by supplying 2.5 mW and 0.8 mW of optical power to the laser beams that form the SG and GD barriers respectively, the final time averaged optical intensity of the barriers still maintains a gate-well with SG and GD barrier heights of $V_{SG}$=30 kHz and $V_{GD}$=31 kHz in addition to the raised source-well with chemical potential µ$_s$=27 kHz (FIG. 102B). The source-well is thus prepared in a state shown in FIG. 100C where an ultra-cold atom current may flow into the transistor gate-well and subsequently into the drain.

Time-of-flight imaging performed on the atom ensemble in the raised source-well shows that the atom temperature increases to approximately 78 nK and the ensemble is no longer condensed into a BEC. The heating is attributed to technical noise from position fluctuations of the magnetic potential due to current noise of 35 nA/√Hz in the current drivers that supply the atom chip currents $I_x$ and 120 nA/√Hz in the current drivers that form the z-bias field $\beta_z$ account for a 1 nK/ms heating rate. No measureable heating has been observed from sweeping the SG barrier back and forth.

With an ultracold atom ensemble prepared in the raised source-well, the flow of an atom current through the transistor oscillator is observed by probing the system in-situ. The raised source-well can be loaded with approximately N=7*10$^3$ atoms at a temperature of approximately $T_s$=78 nK and a chemical potential of µ$_s$=27 kHz. The atom current begins to flow at time t=0, which is defined as the time when the source-well chemical potential is raised to µ$_s$=27 kHz and the SG and GD barriers are set to their desired heights of $V_{SG}$=30 kHz and $V_{GD}$=31 kHz.

The transistor oscillator system is allowed to evolve for sometime Δt, during which an atom current flows throughout the transistor potential landscape. As the system evolves, the drain-well is constantly illuminated with the drain terminator beam to remove any atoms that flow into the drain-well. The terminator ultimately prevents the transistor oscillator system from reaching an equilibrium. Note however, that the terminator beam is extinguished approximately 6 ms prior to taking an absorption image in order to take an instantaneous snapshot of the atom current accumulating in the drain-well. The 6 ms corresponds to approximately ¼$v_x$ where $v_x$ is the longitudinal trapping frequency of the harmonic magnetic potential.

Figure 103:
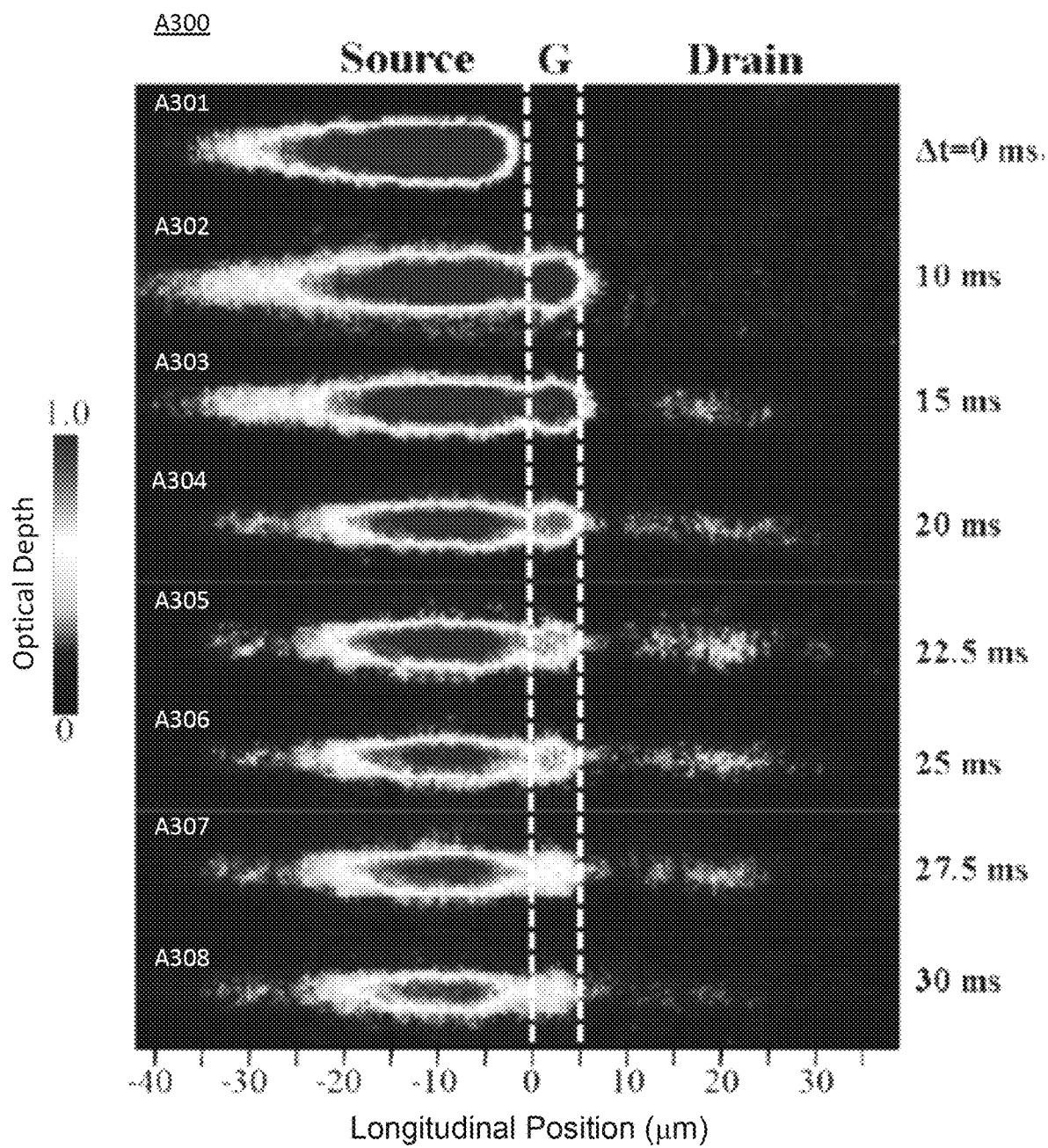
FIG. 103 (8.9) is a series of in-situ absorption images of the transistor oscillator at various flow times as an atom current flows from the source-well, through the gate-well and into the drain-well.

After an ultracold atom current flows for sometime Δt, the occupancy of the source, gate, and drain wells of the transistor oscillator is observed by performing in-situ absorption imaging. FIG. 103 includes a series A300 of absorption images A301-A308 demonstrating the flow of an atom current from source-well, through the gate-well, and into the drain-well at various flow times. The spatial locations of the SG and GD barriers are indicated with the dashed lines. In FIG. 103, the top image A301 shows the source-well atom ensemble at a chemical potential of $\mu_s$=27 kHz and temperature of T=78 nK immediately before the start of an atom current at t=0. As shown at A302, within 10 ms, a very large population of atoms becomes trapped in the gate-well. However as shown at A303, it takes approximately another 5 ms for the current flow into the drain-well and collect at the drain classical turning point. Over the next 7.5 ms, as shown in image A305, the atom current flowing into the drain-well steadily increases, with a corresponding decrease in the gate-well occupation. At $\Delta t$=22.5 ms (image A305), the atom flux owing into the drain-well reaches a maximum, and subsequently starts to decay, decreasing over the next 6.5 ms until the current stops flowing into the drain-well. After a flow time of $\Delta t$=30 ms (image A308), no atom current is observed to flow into the drain-well.

Figure 104:
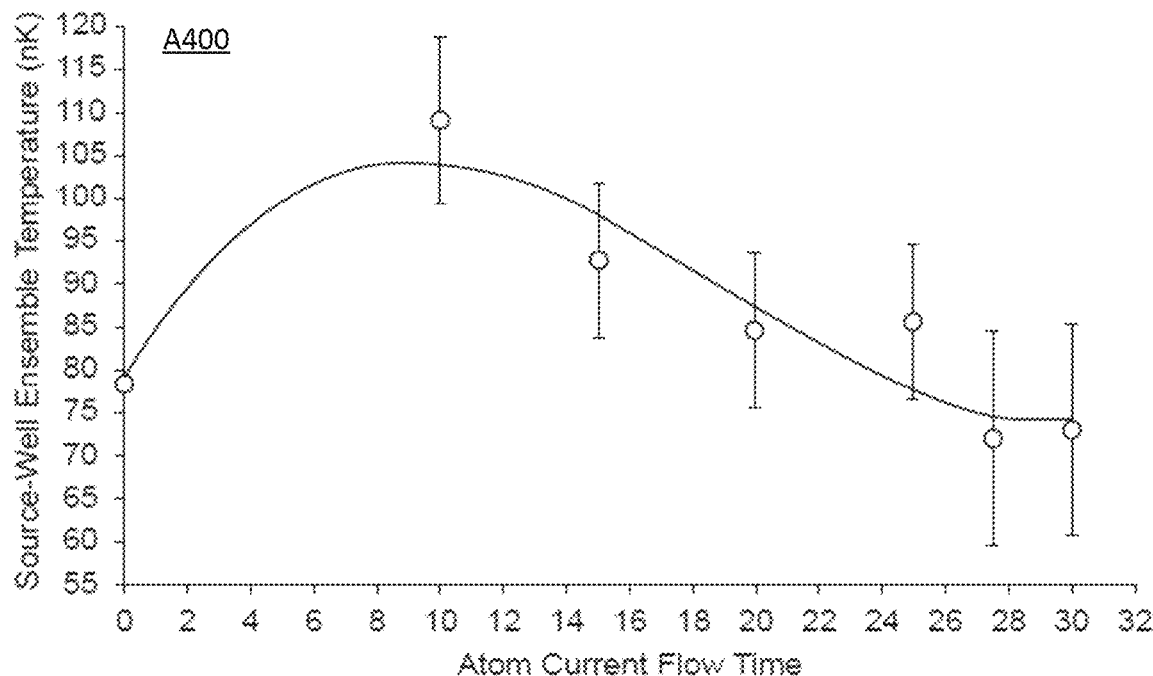
FIG. 104 (8.10) is a plot showing the temperature of a source-well atom ensemble as a function of atom current flow time.

Time-of-flight measurements show that during the first 10 ms of the atom current flow time, the source-well ensemble temperature increases from 78 nK to approximately 109 nK. However, once the current begins to flow into the drain-well, the source-well ensemble continuously cools. This shows that as the atom current flows into the gate and drain wells, it carries away energy from the source-well. This source-well heating and cooling behavior can be expected since the in-situ absorption images show that an atom current isn't flowing during the first 10 ms, indicating that there is no flow of energy out of the source well. Once current begins to flow into the gate and drain wells, there is a noticeable drop in source-well temperature. FIG. 104 is a plot showing the temperature $T_s$ of the source-well atom ensemble as a function of atom current flow time. The source-well ensemble temperature in each data point was measured using time-of-flight imaging after each subsequent current flow time. Error bars are propagated from the standard error of the mean for $T_s$.

Figure 105:
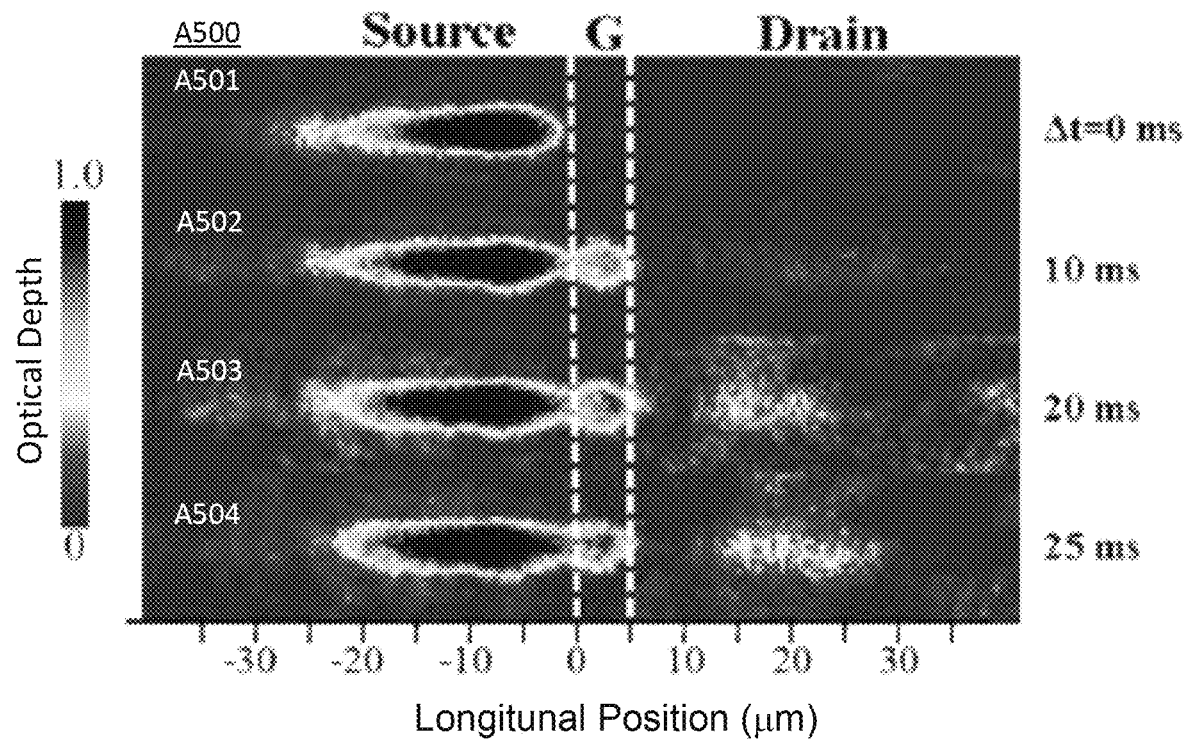
FIG. 105 (8.11a) is a series of in-situ absorption images of a transistor oscillator at various flow times as a Bose-Einstein condensate flows from the source-well, through the gate-well and into the drain-well.
Figure 106A:
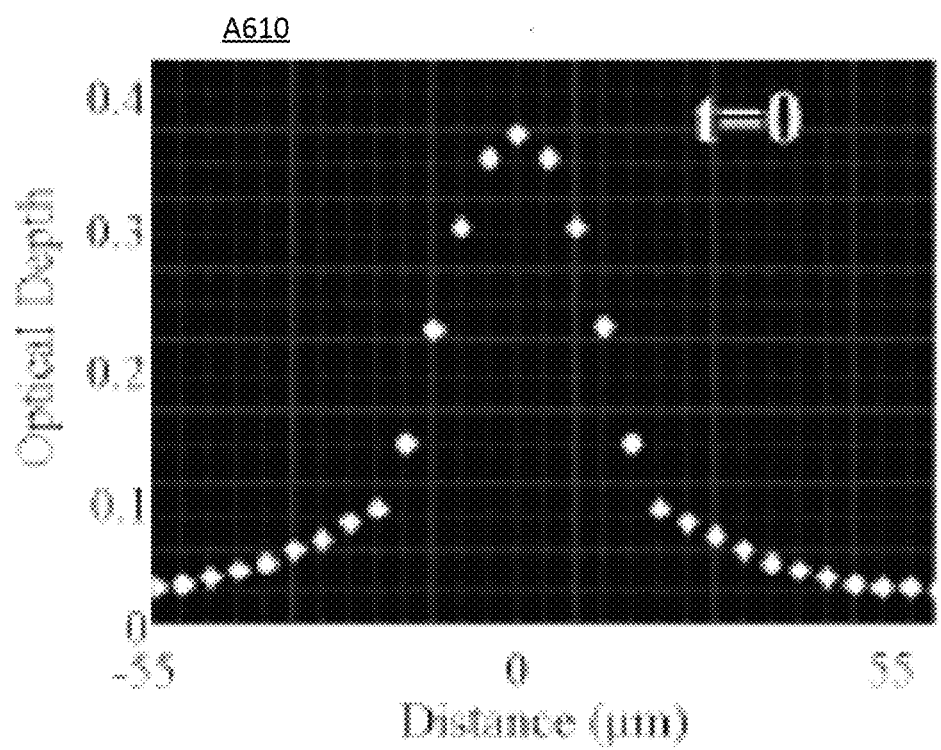
FIGS. 106A and 106B (8.11b) and (8.11c) are plots longitudinal density profiles of a source-well ensemble immediately before the flow of the BEC of FIG. 105 (at t=0) and after an atom current flow time of Δt=25 ms.
Figure 106B:
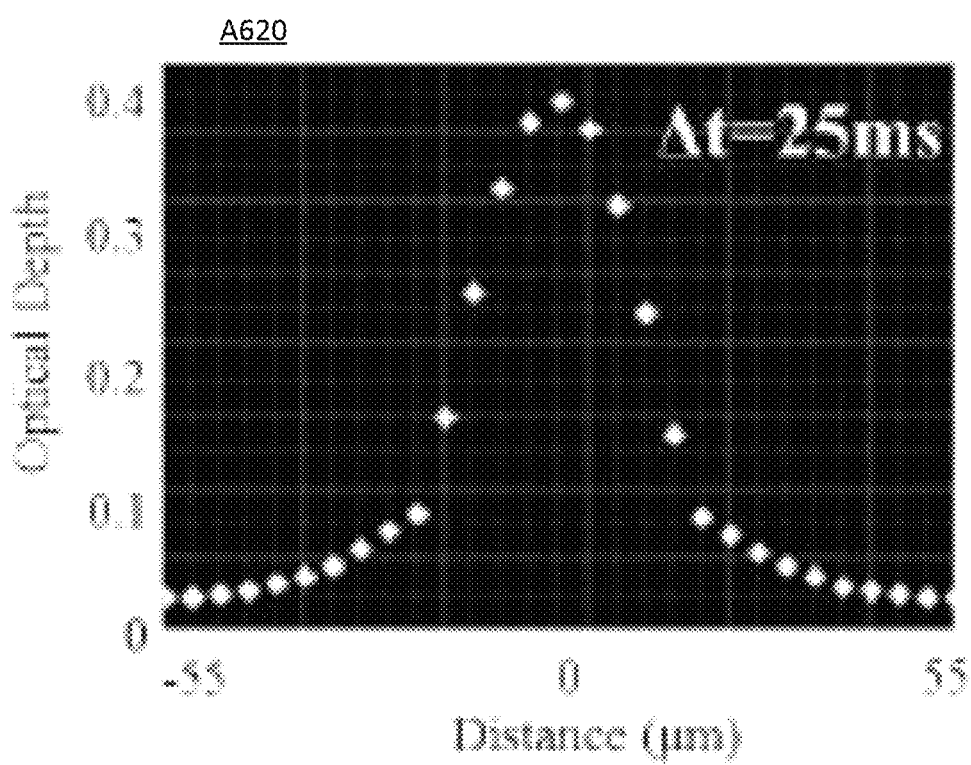

The ultracold atom current flowing through the transistor oscillator in FIG. 100 begins at a temperature of T=78 nK, but is not condensed into a BEC. At the cost of a smaller source-well atom number, a more intense RF evaporation stage can be used when preparing the source-well ensemble, by using a higher intensity of RF radiation. With the more intense RF evaporation, the atom ensemble in the raised source-well is at T≈54 nK. More importantly, the ensemble remains condensed in a BEC. When the source-well ensemble is a BEC, the flow atom current through the transistor oscillator is as shown in FIG. 105. FIG. 105 represents a series A500 of in-situ absorption images A501, A502, A503, A504, and A505 of the transistor oscillator at various flow times as an atom current flows from the source-well, through the gate-well and into the drain-well. The spatial locations of the SG and GD barriers are indicated with dashed lines. Additionally, time-of-flight (TOF) absorption images A610 and A620 of the source-well ensemble following a 22 ms TOF show the presence of a source-well condensate at times immediately before the flow of atom currents (t=0, FIG. 106A) and after an atom current flow time of 25 ms (FIG. 106B).

The longitudinal position of the atoms collecting in the drain-well is indicative of their energy. The greater total energy the drain-well atoms have, the greater distance they flow into the drain-well until reaching the classical turning point. A corollary of this is that the longitudinal position of the drain-well atoms is also an indication of their momentum. It follows that the longitudinal width of the drain-well ensemble is thus a measurement of the distribution of the momenta of the drain-well current. For example, if every single atom entering the drain-well had the same momentum, every single atom would travel to the same longitudinal turning point in the drain-well. However, if the drain-well current contains atoms with a spread of momenta $\Delta p$, then there will be a corresponding spread of the drain-well ensemble at the location of the longitudinal turning point.

By comparing the drain-well ensembles in which the current either does or does not form a BEC, it is clear that when a significant atom current flows into the drain-well, the BEC drain atom flux of FIG. 105 covers a wider longitudinal range than the non-BEC flux of FIG. 103. This result indicates that the atoms comprising the drain-well atom current in FIG. 105 has a broader range of momenta than the drain-well current in FIG. 103. This result cannot be explained using the semi-classical model. To understand why this behavior is observed, the flow of the atom current must be understood using a quantum mechanical, matter-wave interference, description.

Figure 107A:
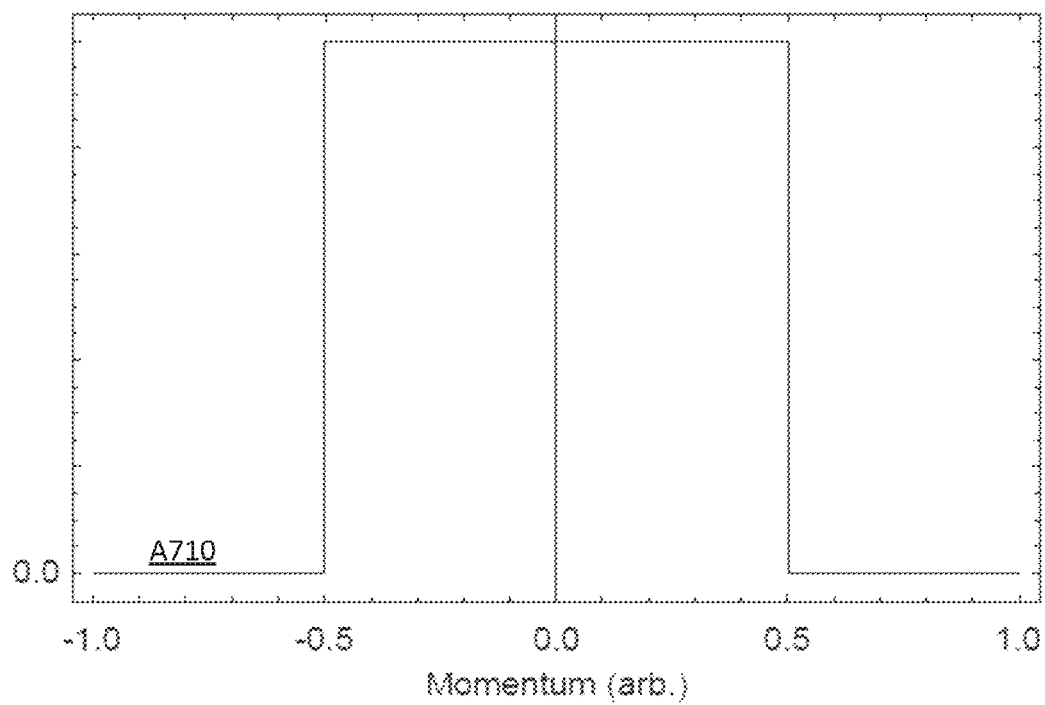
FIG. 107A (8.12a) is a plot of an envelope of a total momentum space wavefunction at the longitudinal turning point of the drain well.
Figure 107B:
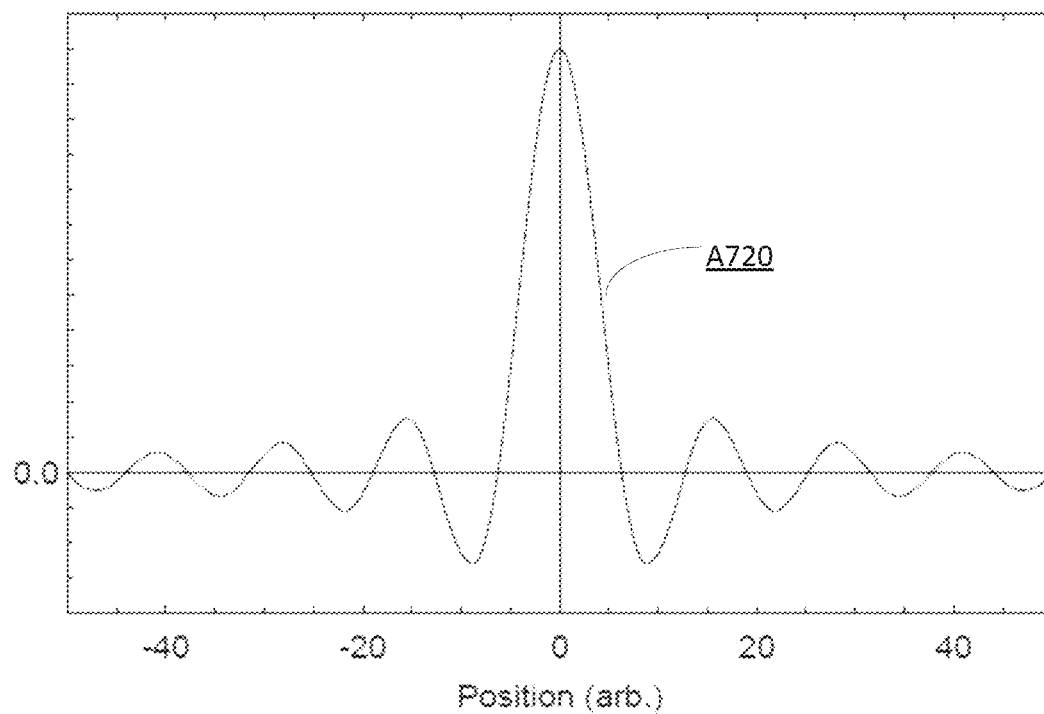
FIG. 107B (8.2b) is a plot of a corresponding envelope of the total position space wavefunction of the gate-well.

The absorption images in FIGS. 103 and 105 are also measurements of the atom current probability amplitudes at all longitudinal positions of the transistor oscillator. Careful examination of the drain-well ensembles shows that at the longitudinal turning points, the spread of momenta of the atom flux is relatively uniform. Using this observation, the envelope of the drain-well momentum wavefunction $\Phi(p)$ can be expressed as:

$$\Phi(p) \propto P; P = \text{constant} \tag{147)(8.4}$$

where $\Phi(p)$ is centered about the longitudinal turning point of the drain-well and where the width of $\Phi(p)$ is proportional to the spread of momenta of the atom flux flowing into the drain-well, resulting in the step function A710 of some constant height and width shown in FIG. 107A, which represents an empirically observed envelope of the total momentum space wavefunction at the longitudinal turning point of the drain well. FIG. 107B shows a corresponding envelope of the total position space wavefunction A720 of the gate-well. Because momentum and position are canonically conjugate variables, the Fourier transform of the drain-well momentum space wavefunction yields the gate-well position space wavefunction.

Consider an ensemble of atoms confined to a harmonic oscillator potential. As the ensemble evolves in the harmonic oscillator potential, the atoms have a minimum momentum and a maximum displacement from the center of the potential when they reach the longitudinal turning points. Consequently, when located at the center of the harmonic oscillator potential, the atom displacement is at a minimum and the atom momentum is at a maximum. That is, position and momentum are conjugate variables and are Fourier transform duals. The drain-well momentum wavefunction $\Phi(p)$ and the gate-well position wavefunction $\Psi(x)$ can be treated as canonically conjugate variables that are Fourier transform duals of each other. Since the total momentum space wavefunction $\Phi(p)$ of the atom current in the drain-well is a step function (or for lack of better term, a "box function"), the envelope of the total position space wavefunction $\Psi(x)$ in the gate-well can be obtained by performing the Fourier transform of $\Phi(p)$. That is $$\Psi(x) \propto \text{sinc}(x) \tag{148)(8.5}$$

as shown in FIG. 104B (8.12b).

When an atom current begins to flow out of the source-well and atoms become trapped in the gate-well, the wavefunctions of all of the atoms confined in the gate-well interfere in a superposition and the resulting envelope of the total position space wavefunction $\Psi(x)$ is a sinc function (equation 148 (8.)5). Source-well matterwaves that couple into the gate and flow into the drain also interfere in the drain-well. The matterwave probability amplitudes suggest that destructive interference occurs in the drain-well between the GD barrier and the drain-well longitudinal turning point. On the contrary, constructive interference occurs at the turning point. The resulting superposition creates an envelope of nearly constant probability amplitude (equation 147 (8.4)) at the drain-well turning point whose width is directly proportional to the range of unique matterwave momenta able to couple into the transistor gate-well.

Recalling the gain mechanism theorized above, matterwave currents that feature a greater coupling strength to the gate-well, as a result of the gain mechanism, will have a greater range of energies (and by extension, a greater range of momentum) permitted to flow into the drain-well. This gain mechanism theory can be descried using the above definitions for $\Psi(x)$ and $\Phi(p)$. Using a wavefunction description, since $\Psi(x)$ and $\Phi(p)$ are Fourier duals, matterwave currents that feature a greater coupling to the gate-well, as a result of the gain mechanism, have a broader momentum distribution in the drain-well and corresponding tighter spatial distribution in the gate-well. This exact behavior was observed in FIG. 103 and FIG. 105 and is summarized in FIG. 108.

Figure 108:
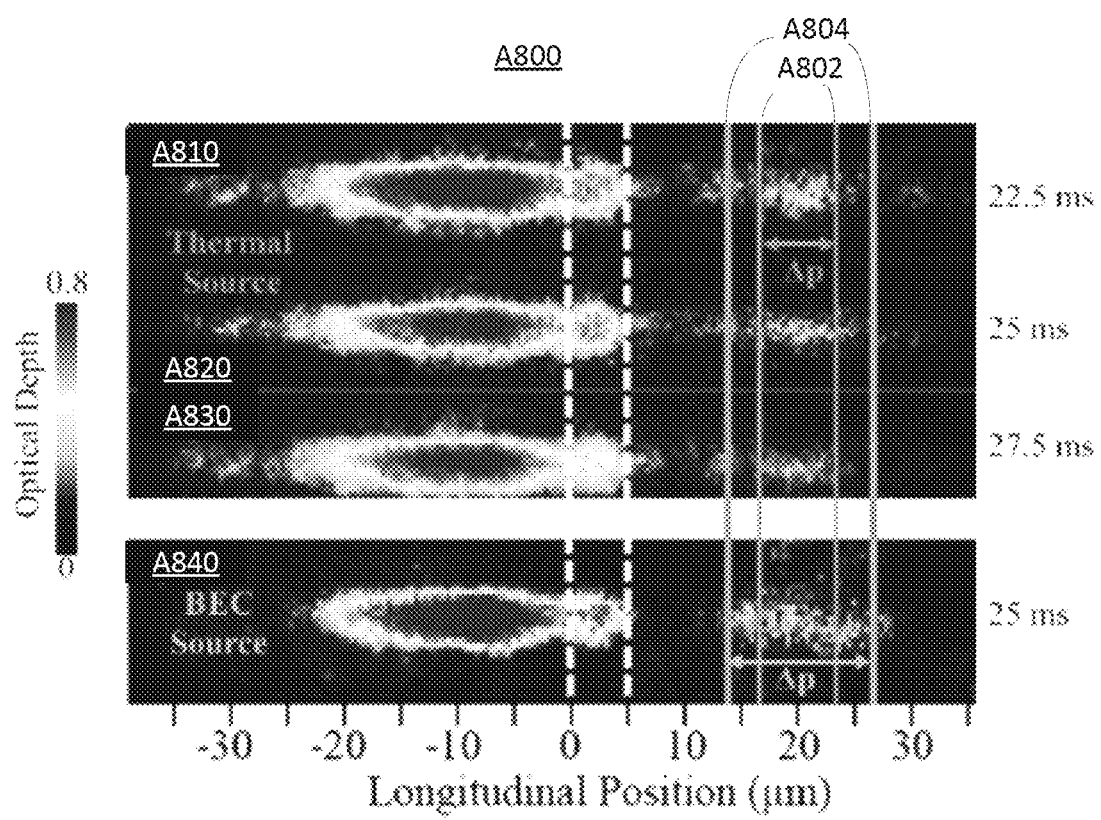
FIG. 108 (8.13) represents in-situ absorption images showing the flow of ultracold atoms through the transistor potential for ow times corresponding to the maximum drain-well flux. The top set of images shows snapshots of the current when the source-well is a thermal source and the bottom image is the current when the source-well ensemble is a Bose-Einstein condensate.

FIG. 108 includes a series A800 in-situ absorption images showing the flow of ultracold atoms through the transistor potential for flow times corresponding to the maximum drain-well flux. The top set of images A810, A820, and A830 shows snapshots of the current when the source-well is a thermal (non-BEC) source and the bottom image A840 represents the current when the source-well ensemble is a condensate. On the plot, the solid thin lines A802 show the spread $\Delta p$ of the drain-well momentum when the source-well contains a thermal ensemble and the solid thick lines A804 show the spread of the drain-well momentum when the source-well contains a condensate. From the plot, it is apparent that a wider range of matterwave momentum flow into the drain-well when the current is sourced with a BEC, rather than a thermal source. The increase in momentum spread is a result of a greater matterwave coupling to the gate-well. As a corollary, as the source-well ensemble becomes colder, the matterwave current has a greater coupling to the gate-well and displays an increased spread in the matterwave momenta that flows into the drain-well.

Additionally, depending on whether the prepared source-well atom ensemble is a purely thermal ensemble or a condensate, different spreads of momenta occur in the drain-well current. This indicates that the gate-well coupling strengths for a matterwave current depends on the temperature and coherence of the ultracold atoms flowing through the transistor. When preparing the source-well with a purely thermal atom ensemble with initial temperature of T=78 nK, the imaging results in FIG. 10 show the drain-well flux has a narrower momentum spread than when a condensate is prepared in the source well with initial temperature T=57 nK. Consequently, the images in FIG. 108 also show that the gate-well wavefunction is broader in the case of a purely thermal source compared to a condensate source.

FIG. 108 clearly shows the broadening of T(x) in the thermal case clearly, as a population of atoms can be seen immediately after the GD barrier. On the contrary, atoms do not appear at this location when a condensate was loaded into the source-well. Atoms appear just to the right of the GD barrier in the thermal case due to the envelope of P(x) broadening wider than the gate-well width and having considerably greater probability amplitudes outside the gate-well, as compared to the case of a condensate in source-well.

The observed increase in the spread of the drain-well momentum wavefunction $\Phi(p)$, which is also an indication of a greater matterwave coupling to the drain well, when using colder atoms as bottom image A804 of FIG. 108 compared to that of warmer atoms upper images A801, A802, and A803 of FIG. 108 is a predicted by the quantum transistor model. The model states that as the source-well atom temperature gets closer to the corresponding difference between gate-well energy eigenstates, the matterwave gain mechanism (and interaction potential, equation 133 (30) becomes more significant and the gain mechanism permits a greater range of matterwave energies to flow into the drain-well. There is a greater range of matterwave momenta (and hence energy) flowing through the gate well and into the drain when the source-well ensemble initially has lower temperature, coherent atoms as opposed to a purely thermal source. This empirical result suggests that a matterwave gain mechanism, is present in the transistor gate-well and that the matterwave gain mechanism is coherent.

The results of the matterwave current in FIG. 103 (8.9) and FIG. 105 (8.11) also show evidence suggesting coherence in the matterwave gain mechanism. These images show that a drain-well atom flux only appears at the longitudinal turning point of the drain. (Although a small population of atoms appears in between the GD barrier and the drain well at $\Delta t=20$ ms in FIG. 103 (8.9). This would indicate a lesser degree of coherence in the gain mechanism for that specific result.)

This fact that a drain-well atom flux only appears at the longitudinal turning point of the drain-well is attributed to destructive interference occurring within the matterwave superposition at longitudinal positions between the GD barrier and the drain-well turning point. Moreover, at the drain-well turning point, the matterwave superposition constructively interferes, which results in the observed drain-well atom flux. This result suggests that the gain mechanism is a coherent gain mechanism. This coherence can be credited to the gain mechanism only transmitting a symmetric (or antisymmetric) matterwave while always reflecting the mode of opposite parity. The transmitted modes, all of which have the same symmetric (or antisymmetric) parity, add up coherently in the drain-well, resulting in destructive interference at longitudinal positions after the GD barrier and constructive interference at the drain-well turning point.

Figure 109:
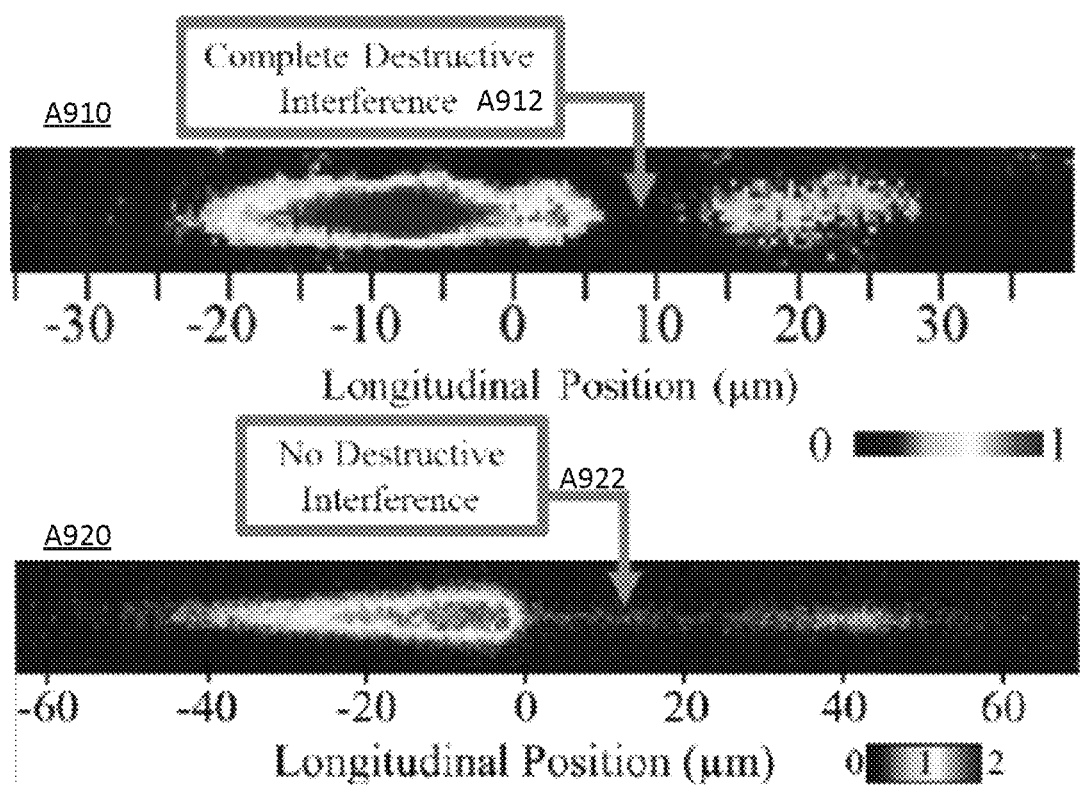
FIG. 109 (8.14) represents a pair of in-situ absorption images showing the observed difference of a drain-well matterwave current of coherent (upper portion) and incoherent (lower portion) matterwaves.

If the atom current was incoherent, then matterwave destructive interference in the drain-well cannot occur and atoms will appear in all locations throughout the entire drain-well as shown in FIG. 109, which represents in-situ absorption images A910 and A920 respectively showing the difference of a drain-well matterwave current of coherent and incoherent matterwaves. In the upper portion of FIG. 109, the superposition of a current of coherent matterwaves displays evidence of destructive interference after flowing into the drain-well. No drain-well atoms are observed at longitudinal positions A912 from the GD barrier to the turning point. The flux of atoms located at the longitudinal turning point of the drain-well suggests that constructive interference occurs between the superposition of matterwaves at this location. In the lower portion of FIG. 109, with an incoherent matterwave current, no such interferences occur. Thus, atoms can be observed at all locations A922 in the drain-well. More atoms still collect at the turning point, not due to constructive interference of a matterwave superposition, but rather due to classical conservation of energy.

Finally, the empirical observation of the canonically conjugate relationship between the envelopes of the gate-well position space wavefunction T(x) and the drain-well momentum space wavefunction Φ(p) is also suggestive that the matterwaves flowing into the drain-well have coherence. Without coherence, this canonically conjugate relationship would not be observed in the transistor oscillator results.

The quantum model predicts dynamics different from the semi-classical results only when the atoms flowing through the transistor oscillator have sufficiently low enough temperatures such that the motional state of a dipole oscillating BEC, placed in the transistor itself, couples atom transitions between high lying transistor energy eigenstates. In this ultracold temperature regime, interesting physics that were not observed in the semi-classical theory or experiments occurs, specifically the manifestation of a coherent gain mechanism that broadens the range of energy (and by extension, momenta) of a matterwave current flowing from the source-well, through the gate-well, and into the drain-well.

Time-of-flight temperature measurements of the transistor source-well ensemble confirm that as an atomic current flows through the transistor, the current constantly carries energy away from the source-well ensemble, which provides continuous cooling to the source-well atoms. Interestingly, our experimental results showed that a wider momentum spread in the atom flux flowing into the drain-well is detected when the source-well ensemble contains a condensate, compared to when the source-well ensemble is a purely thermal collection of atoms. Thus, the atom current sourced with a condensate has a greater coupling to the transistor gate-well. Additionally, this result confirms a canonically conjugate relationship between the spatial wavefunction of the gate-well and the momentum wavefunction of the drain-well, which suggests coherence in the transistor gain mechanism and the drain-well atom current. Evidence of a coherent drain-well atom current can also be observed in the complete absence of an atom flux at all positions in the drain-well with the exception of an atom flux located at the longitudinal turning point. This observation is due to a superposition of coherent matterwaves where destructive interference occurs throughout the entire drain-well except at the longitudinal turning point, where the matterwave superposition constructively interferes.

In order to measure the differential matterwave gain due to the atom-BEC interaction (equation 133 7.30) change in atom flux owing into the drain-well as a function of the change of occupancy of the gate-well BEC must be measured. In an experimental regime where a matterwave current only flows via tunneling through the SG and GD barriers, this measurement provides a more robust method of quantifying matterwave gain, as it removes any impact of stray source-well atoms that may randomly enter the gate and drain-wells (as noise) by classically traversing the SG and GD barriers. Changes in drain-well flux as a function of the change in gate-well occupancy, rather than strictly measuring the drain-well flux as a function of gate-well atom number could be measured. This method would essentially "ignore" noise in the atom flux.

A challenge of measuring differential gain is changing the occupancy of the gate-well BEC without altering the gate-well potential. From the semi-classical models and experiments, the size of the gate-well BEC is controlled by the ratio of SG and GD barrier heights, $V_{SG}$ and $V_{GD}$. While we can readily control the BEC occupancy by adjusting $V_{SG}$ and $V_{GD}$, the quantum model shows that doing so changes the degeneracy (and subsequent coupling) between the dipole oscillating BEC and the highest lying pair of gate-well eigenstates. This degeneracy and coupling, being an essential precondition to matterwave gain, cannot be altered. Instead, we can adjust the flux of source-well atoms that enter the gate-well by increasing or decreasing the source-well chemical potential, μs. Extending the semiclassical formalism, an atom current flowing from the source-well to the gate-well ISG is proportional to the fugacity factor $$I_{SG} \propto \exp(\mu_s/kT_s) \qquad (149)(9.1)$$

where k is the Boltzmann constant, Ts is the source-well temperature, and $\mu_s$ is the source-well chemical potential. Since the source-well chemical potential can be freely adjusted, the parameter $\mu_s$ becomes a tunable characteristic of the transistor without impacting the SG and GD barrier heights or the gate-well eigenstates. From this, there is an experimentally adjustable "knob" that one can use to control the amount of atoms that enter the gate-well, allowing us to measure the transistor differential gain.

Explicitly measuring the transmission of the gate-well symmetric or antisymmetric modes $\psi_+(x)$ and $\psi_-(x)$ can be accomplished by performing a Hermite-Gaussian transform of the drain-well atom flux in-situ absorption images. A Hermite-Gaussian transform is a mathematical operation that decomposes the drain-well probability amplitude signal (which note is just the drain-well absorption image), such as in FIG. 100, which is a function of position, into the Hermite-Gaussian functions that make it up. That is, the Hermite-Gaussian transform could decompose a drain-well absorption image signal into the harmonic oscillator functions (and thus gate-well modes) that make it up. To further investigate this idea, the Hermite-Gaussian transform is defined as: given some Hermite function $H_m(x)$ of order in, the Hermite Gaussian transform $\{H_n(x)\}$ is defined as $$\mathcal{H}\{H_m(x)\} = \int_{-\infty}^{\infty} e^{-x^2} H_n(x) H_m(x) dx = \sqrt{\pi} 2^n n! \delta(n-m). \qquad (150)(9.2)$$

This operation is completely analogous to the Fourier transform which decomposes a function of time into the frequencies that make it up. FIGS. 110A and 110B compare two-pairs of plots B010 and B020. Pair B010 of FIG. 110A includes: 1) an upper plot of some function $f(x)$ B012 composed of sine waves with various frequencies; and 2) a lower plot B020 that is the Fourier transform B014 of $f(x)$ showing what frequencies are present in $f(x)$. Pair B020 of FIG. 110B includes: 1) an upper plot at the upper right that is a function (ω) B022 that is comprised of a linear combination of harmonic oscillator functions (equation 107); and 2) a lower plot at the lower right is the Hermite-Gaussian transform B024 of (ω) which shows what harmonic modes are present in the function (ω).

To give an example comparing the Fourier and Hermite-Gaussian transforms, consider some sine wave function, such as $f(x)=\sin(2x)+\sin(5x)$. The Fourier transform of $f(x)$ is expressed in the frequency basis and would feature delta functions $F(\omega)=\delta(\omega\pm 2)+\delta(\omega\pm 5)$ corresponding to the frequencies ω=2 and ω=5 present in the original function $f(x)$. Now, given some harmonic oscillator wavefunction, such as $\psi(\omega)=2(x)+5(x)$, the Hermite-Gaussian transform of $\Psi(\omega)$ decomposes the function to the harmonic oscillator basis and would feature delta functions $\mathcal{H}(n)=\delta(n-2)+\delta(n-5)$ corresponding to the Hermite-Gaussian modes n=2 and n=5 present in $\Psi(\omega)$.

In the transistor-oscillator, the observable signal (i.e. the drain-well in-situ absorption image) is comprised of the square of Hermite-Gaussian functions (since the absorption image really represents the matterwave probability amplitude squared). Thus, the transform of the square of the wavefunction is taken. The corresponding Hermite-Gaussian transform for this signal can be found by taking the definition of the Hermite-Gaussian transform (equation 150 9.2) and applying the convolution theorem to arrive at $$\mathcal{H}\{H_m(x)\} = \int_{-\infty}^{\infty} e^{-x^2} H_n(x) H_m(x) dx = \sqrt{\pi} 2^n n! \delta(n-m). \quad (151)(9.3)$$

It then follows that the Hermite-Gaussian transform of a product of Hermite-Gaussian functions is $$\mathcal{H} = \{H_m(x) \quad H_l(x)\} \quad (152)(9.4)$$
$$= (\sqrt{\pi} 2^n n!)(\sqrt{\pi} 2^l l!)[\delta(n-m) \odot \delta(m-l)]$$
$$= \pi 2^{n+p} n! l! [\delta(n-m-l)]$$

where the "⊙" operation denotes the convolution. This formalism can be applied to determine the expected Hermite-Gaussian transform of the drain-well signal. Given the symmetric mode that transmits into the drain-well is $$\psi_+(x) = [\psi_{22}(x) + \psi_{23}(x)]/\sqrt{2} \quad (153)(9.5)$$

the observable signal is $$|\psi_+^*(x)\psi_+(x)| = \frac{1}{2}[|\psi_{22}(x)|^2 + |\psi_{23}(x)|^2 + 2|\psi_{22}(x)\psi_{23}(x)|]. \quad (154)(9.6)$$

Applying equation 151 (9.3) to take the Hermite-Gaussian transform of each product, yields:

$$\mathcal{H}\{|\psi_+(x)|^2\} = \frac{1}{2}[\mathcal{H}\{|\psi_{22}\psi_{22}(x)|\} + \mathcal{H}\{|\psi_{23}\psi_{23}(x)|\} + \mathcal{H}\{|\psi_{22}\psi_{23}(x)|\}]$$

$$\propto \delta(n-44) + \delta(n-45) + \delta(n-46) \quad (155)(9.7)$$

Therefore, the Hermite-Gaussian transform of the observed symmetric mode transmitted into the drain-well takes the form of three delta functions in the harmonic oscillator basis: a first at twice the mode number corresponding to the highest lying gate-well eigenstate (corresponding to |3⟩ in the reduced model); a second at twice the mode number corresponding to the second highest lying gate-well eigenstate (corresponding to |2⟩ in the reduced model); and a third at the sum of both gate-well eigenstate modes making up the symmetric normal mode.

Figures 111A, 111B:
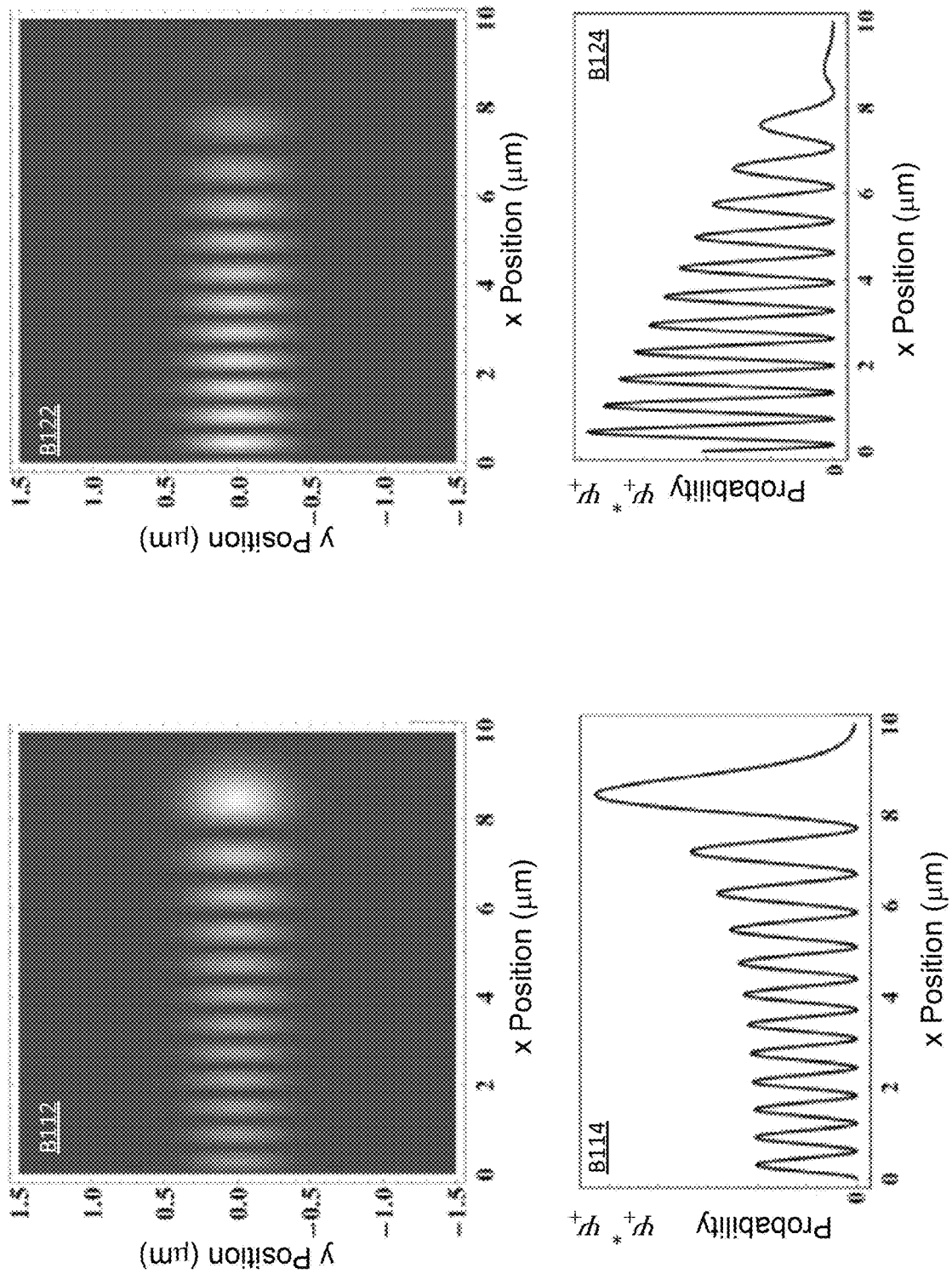
FIGS. 111A and 111B (9.2) present a set of plots showing how a harmonic oscillator response can be obtained for a symmetric mode. The image of FIG. 111A shows a 2D image plot of for a symmetric mode located in a transistor drain well and with a first oscillation phase. Immediately below the image of FIG. 111A is a plot showing corresponding probability amplitudes. The image of FIG. 111B shows a 2D image plot of for a symmetric mode located in a transistor drain well and with a second oscillation phase. Immediately below the image of FIG. 111B is a plot showing corresponding probability amplitudes for the second phase.
Figure 112:
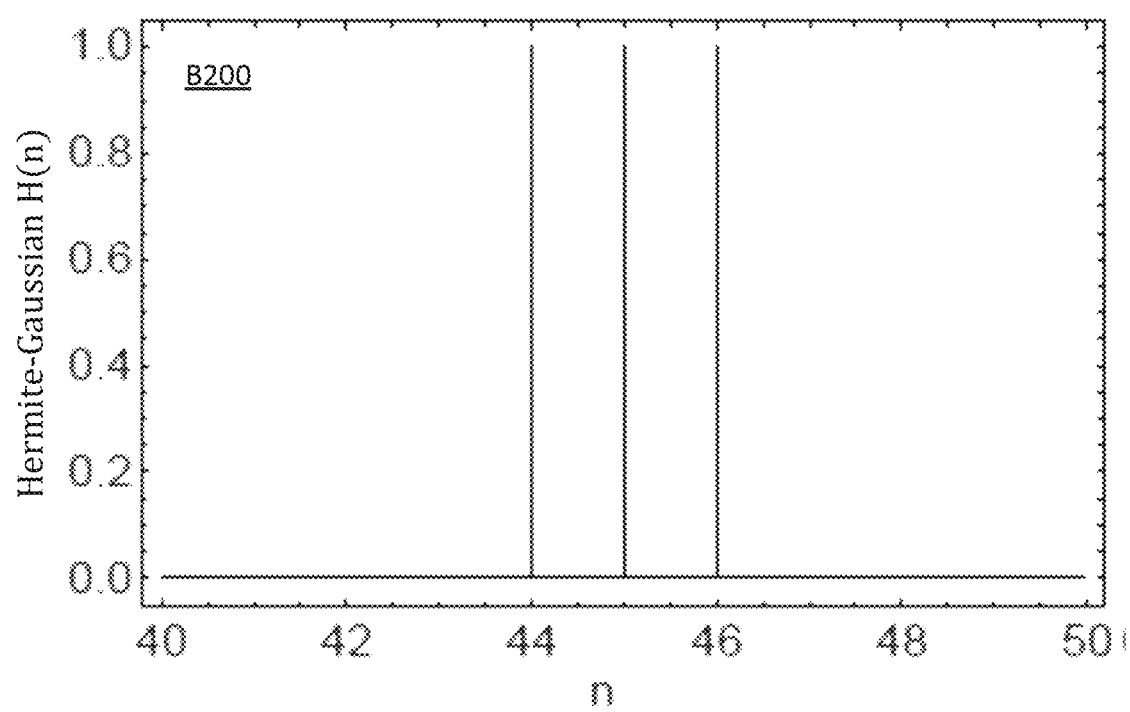
FIG. 112 is a plot of the Hermite-Gaussian transform of $|\Psi_+(x)|^2$, showing that the transmitted symmetric mode is comprised of harmonic oscillator modes $\Psi_{22}(x)+\Psi_{23}(x)$.

A plot showing the result of a Hermite-Gaussian transform applied to a hypothetical transmitted symmetric mode is shown in FIGS. 111A and 111B. FIG. 111A includes an image B112 representing a 2D plot of $|\psi_+(x)|^2$ for the symmetric mode $\psi_+(x) = [\psi_{22}(x) + \psi_{23}(x)]/\sqrt{2}$ (which corresponds to $\psi_+ = [\omega_2(x) + \psi_3(x)]/\sqrt{2}$ in the reduced gate well model) located in the transistor drain well for a first oscillation phase; and 2) a plot B114 of a respective oscillation phase. FIG. 111B includes an image B122 representing a 2D plot of $|\psi_+(x)|^2$ for the same symmetric mode for a second oscillation phase; and 2) a plot 2124 of a respective oscillation phase. FIG. 112 represents the Hermite-Gaussian transform of $|\psi_+(x)|^2$, showing that the transmitted symmetric mode is comprised of Harmonic oscillator modes $\psi_{22}(x) + \psi_{23}(x)$.

This explicitly measures what mode has transmitted into the transistor gate-well, which identifies which modes are having their probability amplified as a result the gate-well gain mechanism. As a generalized extension of equation 154 (9.6) and 155 (9.7), if the constructed gate-well potential has N bound energy eigenstates, then the Hermite-Gaussian transform of the drain-well signal in the presence of the ultracold gain mechanism is $$\mathcal{H}\{|\psi_+(x)|^2\} \propto \delta(n-(2N-2)) + \delta(n-(2N-1)) + \delta(n-2N) \quad (156)(9.8)$$

As is apparent from equation 134 (7.31), the atom-BEC interaction responsible for transmitting symmetric (or antisymmetric) modes into the drain well has a phase dependence φ. Consequently, the phase of the transmitted symmetric mode that enters the drain-well may not be the same for each successive run of the experiment. This complicates the problem of averaging drain-well images (such as averaging in-situ absorption images to filter random noise) due to the symmetric mode having a different phase between shot-to-shot. Because the Hermite-Gaussian transform of the drain-well signal produces the same result irrespective of the phase of the transmitted symmetric mode, one must perform many data runs of the experiment and average all of the Hermite-Gaussian transforms of the absorption images rather than the raw absorption image themselves in order to collect reliable data to verify the presence of a specific symmetric of antisymmetric normal mode owing into the drain-well.

The foregoing demonstrates a coherent matterwave gain mechanism as the operating principle of a matter-wave transistor that can serve as a building block for complex multi-transistor integrated atomtronic circuit, e.g., permitting atomtronic equivalents of logic gates. For example, an atomtronic controlled NOT (CNOT) gate can be implemented with two independently controlled matter-wave transistors. The CNOT gate is a "universal" gate in that any other logic gate can be constructed from sets of CNOT gates. The atomtronic CNOT gate can thus be used to build atomtronic computers.

In addition, the matter-wave transistor can be used to implement a continuous, coherent matterwave source, i.e., an atom laser. The continuous coherent matterwaves can be used to source integrated matterwave circuits. These integrated circuits leverage the physics of coherent matterwaves launched into waveguides where the matterwave current can switched, divided, and recombined as the matterwaves flow throughout the system. The matter-wave transistor can be used as a continuous, rather than pulsed, coherent matter-wave source.

As explained above, a source-to-drain matterwave flux can be increased by switching from a first matter-wave transistor state to a second matter-wave transistor state, where, in the second state, the gate well of the matter-wave transistor includes a DOBEC, and, in the first state, the gate well does not include a DOBEC. For example, in the first state, the gate well: 1) may not contain any matter-wave particles; 2) may include matter-wave particles that have not formed a BEC; or 3) may include a BEC that is not without an oscillating dipole. In case where a gate well includes a DOBEC, the source-to-drain matter-wave flux can be increased by increasing the population of the DOBEC. Herein, "ultra-cold" means less than 100 nanoKelvin; in some embodiments, the matter-wave flux is characterized by a temperature below 60 nanoKelvin. Likewise, the matter-wave flux may or may not include a BEC.

Herein, "resonant tunneling conditions" refers to conditions, e.g., of a gate well and/or its barriers with a source well and a drain well, that affect the likelihood of a particle tunneling through a source-gate barrier and/or a gate-drain barrier. The "breadth" of resonant tunneling conditions refers to a range or a combination of ranges of resonant conditions affecting the likelihoods of tunneling through a barrier.

Herein, all art labeled "prior art", if any, is admitted prior art; all art not labelled "prior art", if any, is not admitted prior art. The illustrated embodiments, variations thereupon and modifications thereto are provided for by the present invention, the scope of which is defined by the following claims.

What is claimed is:

1. A quantum tunneling matter-wave transistor process comprising:
    causing a source well of a matter-wave transistor to be populated with matter-wave particles, the matterwave transistor including a source well, a source-gate barrier, a gate well, a gate-drain barrier, and a drain well; and
    changing the source-to-drain matterwave current tunneling through the source-gate barrier and the gate-drain barrier by changing resonant tunneling conditions of the gate well.

2. The quantum tunneling matter-wave transistor process of claim 1 wherein the changing resonant conditions of the gate well includes switching the matterwave transistor from a first state in which the gate well does not include a dipole-oscillating Bose-Einstein condensate (DOBEC), to a second state in which the gate well includes the DOBEC in the gate well.

3. The quantum tunneling matter-wave transistor process of claim 1 wherein the changing of resonant conditions of the gate well includes changing the particle population of a dipole-oscillating Bose-Einstein condensate (DOBEC).

4. The quantum tunneling matter-wave transistor process of claim 1 further comprising forming the matter-wave transistor so that the gate well is characterized by an anharmonic asymmetric oscillator potential.

5. The quantum tunneling matter-wave transistor process of claim 4 wherein the anharmonicity establishes a degeneracy between transitions between first and second gate-well eigenstate transitions, the first transition being between a ground eigenstate and a first excited eigenstate, the second transition being between a highest pair of energy eigenstates.

6. The quantum tunneling matter-wave transistor process of claim 1 wherein a temperature of the matterwave current is below 60 nanoKelvins.

7. The quantum tunneling matter-wave transistor process of claim 1 wherein the matterwave current includes a Bose-Einstein condensate (BEC).

8. The quantum tunneling matter-wave transistor process of claim 1 wherein the matterwave current does not include a Bose-Einstein condensate (BEC).

9. A quantum tunneling matter-wave transistor comprising a source well, a source-gate barrier, a gate well, a gate-drain barrier, and a drain well, the matterwave transistor having first and second states, the first state being characterized by resonant tunneling conditions of the gate well having a first breadth, the second state being characterized by resonant tunneling conditions of the gate well having a second breadth, such that a source-to-drain matterwave current of ultracold particles tunneling through the source-gate barrier and the gate-drain barrier can be changed by switching between the first state and the second state.

10. The quantum tunneling matter-wave transistor of claim 9 wherein, in the second state, the gate well includes a dipole oscillating Bose-Einstein condensate (DOBEC) that causes relatively broad source-gate resonant boundary conditions, and, in the first state, the gate well does not include a DOBEC so that source-gate resonant boundary conditions are relatively narrow.

11. The quantum tunneling matter-wave transistor of claim 9 wherein a particle population of a dipole oscillating Bose-Einstein condensate (DOBEC) in the gate well is different in the second state than it is in the first state.

12. The quantum tunneling matter-wave transistor system of claim 9 wherein the gate well is characterized by an anharmonic asymmetric oscillator potential.

13. The quantum tunneling matter-wave transistor system of claim 12 wherein the anharmonicity establishes a degeneracy between transitions between first and second gate-well eigenstate transitions, the first transition being between a ground eigenstate and a first excited eigenstate, the second transition being between a highest pair of energy eigenstates.

14. The quantum tunneling matter-wave transistor process of claim 9 wherein a temperature of the matterwave current is below 60 nanoKelvins.

15. The quantum tunneling matter-wave transistor process of claim 9 wherein the source-to-drain matterwave current includes a Bose-Einstein condensate (BEC).

16. The quantum tunneling matter-wave transistor process of claim 9 wherein the source-to-drain matterwave current does not include a Bose-Einstein condensate (BEC).

* * * * *